US011139437B2

(12) United States Patent
Seda et al.

(10) Patent No.: US 11,139,437 B2
(45) Date of Patent: Oct. 5, 2021

(54) COMPOUND AND ORGANIC ELECTROLUMINESCENCE DEVICE

(71) Applicant: IDEMITSU KOSAN CO., LTD., Tokyo (JP)

(72) Inventors: Keita Seda, Sodegaura (JP); Ryota Takahashi, Sodegaura (JP); Tomoki Kato, Sodegaura (JP); Hidetsugu Ikeda, Sodegaura (JP); Yuki Nakano, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 328 days.

(21) Appl. No.: 16/234,275

(22) Filed: Dec. 27, 2018

(65) Prior Publication Data

US 2019/0214579 A1 Jul. 11, 2019

(30) Foreign Application Priority Data

Dec. 28, 2017 (JP) ............................ JP2017-253413

(51) Int. Cl.
*H01L 51/00* (2006.01)
*C07F 5/02* (2006.01)
*H01L 51/50* (2006.01)

(52) U.S. Cl.
CPC ............ *H01L 51/0074* (2013.01); *C07F 5/02* (2013.01); *C07F 5/027* (2013.01); *H01L 51/008* (2013.01);

(Continued)

(58) Field of Classification Search
None
See application file for complete search history.

(56) References Cited

U.S. PATENT DOCUMENTS

2015/0236274 A1 8/2015 Hatakeyama et al.
2019/0115538 A1* 4/2019 Lim .................... H01L 51/0052

* cited by examiner

*Primary Examiner* — Jay Yang
(74) *Attorney, Agent, or Firm* — Foley & Lardner LLP

(57) ABSTRACT

A compound represented by the formula (1) below. At least one set of two or more adjacent groups among $R_1$ to $R_{11}$ forms a substituted or unsubstituted heterocyclic ring, or forms a ring represented by the formula (2) below, or at least one of $R_1$ to $R_4$ is a group represented by the formula (3) below.

(1)

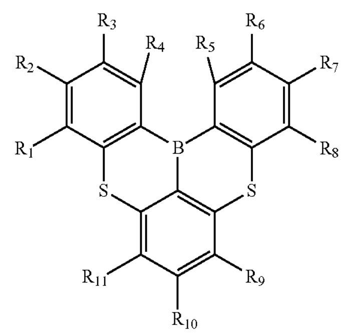

(2)

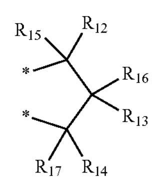

(3)

$$-L_{11}-Ar_{11}$$

24 Claims, 1 Drawing Sheet

(52) U.S. Cl.
CPC ...... *H01L 51/0058* (2013.01); *H01L 51/0061* (2013.01); *H01L 51/0072* (2013.01); *H01L 51/0073* (2013.01); *H01L 51/5012* (2013.01)

[Fig. 1]
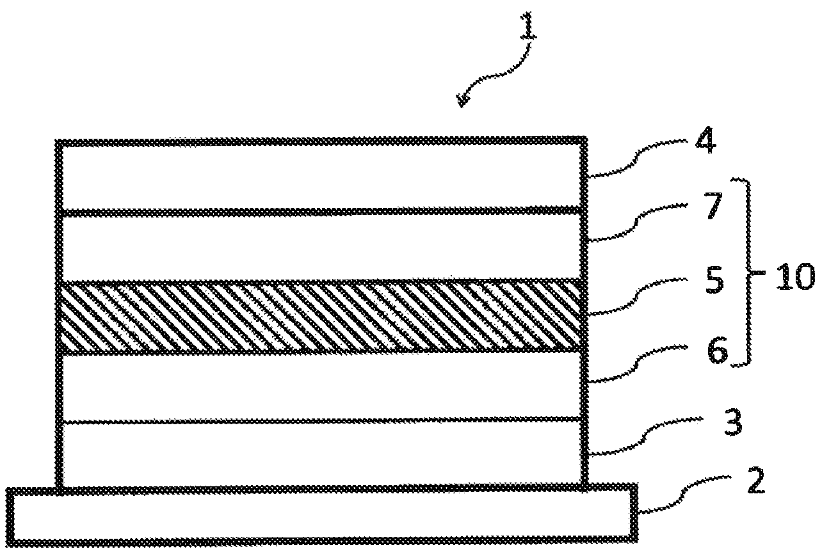
[Fig. 2]
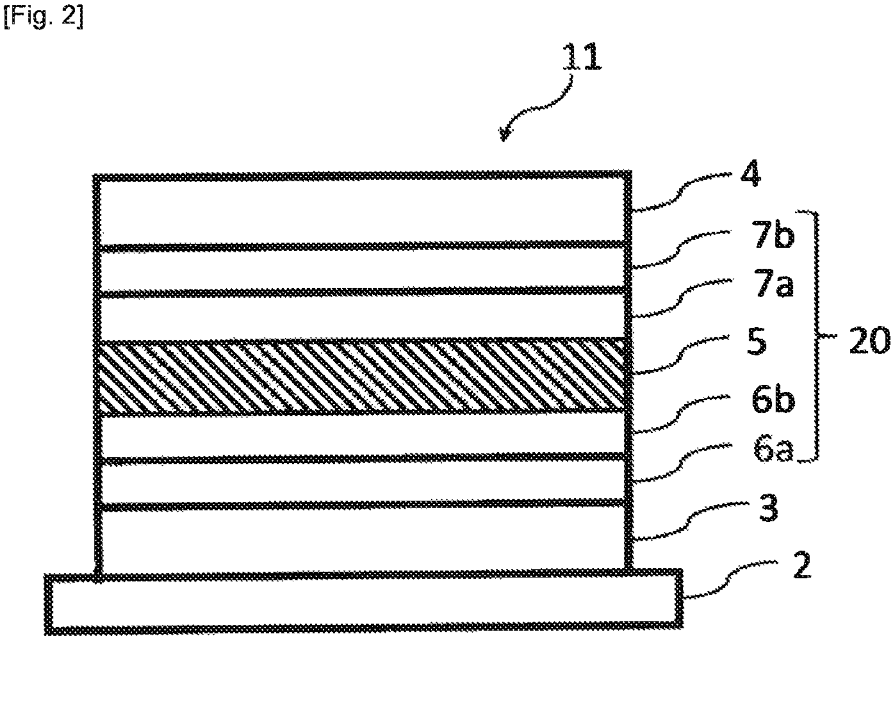

COMPOUND AND ORGANIC ELECTROLUMINESCENCE DEVICE

TECHNICAL FIELD

Embodiments described herein generally relate to a novel compound and an organic electroluminescence device using the same.

BACKGROUND ART

When a voltage is applied to an organic electroluminescence device (hereinafter, the organic electroluminescence device may be called "organic EL device"), holes from an anode and electrons from a cathode are injected to a light-emitting layer. The injected holes and electrons recombine in the light-emitting layer and form excitons.

An organic EL device comprises a light-emitting layer between an anode and a cathode. An organic EL device may also have a stacked structure comprising an organic layer such as a hole injection layer, a hole transport layer, an electron injection layer, or an electron transport layer.

Patent Literature 1 discloses a compound used as a material for an organic electroluminescence device.

PRIOR ART DOCUMENTS

Patent Literature

Patent Literature 1: WO 2015/102118

SUMMARY OF THE INVENTION

The object of the present invention is to provide a novel compound useful as a material for an organic electroluminescence device having high light-emitting efficiency, and an organic electroluminescence device having high light-emitting efficiency using said compound.

According to one aspect of the present invention, a compound represented by the following formula (1) is provided.

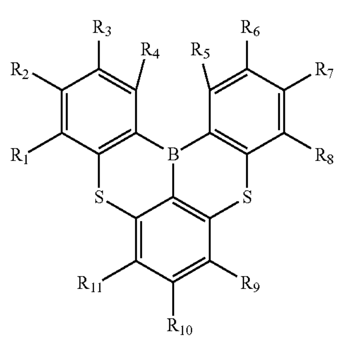

(1)

(In the formula (1), one or more sets of two or more adjacent groups among $R_1$ to $R_{11}$ form a substituted or unsubstituted heterocyclic ring or a ring represented by the formula (2) below, or do not form a substituted or unsubstituted heterocyclic ring or a ring represented by the formula (2) below.

$R_1$ to $R_{11}$ which do not form the substituted or unsubstituted heterocyclic ring or the ring represented by the formula (2) are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 carbon atoms that form a ring (hereinafter referred to as "ring carbon atoms"), a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arytthio group having 6 to 50 ring carbon atoms, a substituted or unsubstituted aralkyl group having 7 to 50 carbon atoms, $—S(R_{31})(R_{32})(R_{33})$, $—C(═O)R_{34}$, $—COOR_{35}$, $—N(R_{36})(R_{37})$, a halogen atom, a cyano group, a nitro group, a substituted or unsubstituted aryl group having 6 to 50 ring carbon atoms, a substituted or unsubstituted monovalent heterocyclic group having 5 to 50 atoms that form a ring (hereinafter referred to as "ring atoms"), or a group represented by the formula (3) below.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.

At least one set of two or more adjacent groups among $R_1$ to $R_{11}$ forms a substituted or unsubstituted heterocyclic ring, or forms a ring represented by the formula (2) below, or at least one of $R_1$ to $R_4$ is a group represented by the formula (3) below. When two or more substituted or unsubstituted heterocyclic rings are formed, the respective two or more substituted or unsubstituted heterocyclic rings may be the same or different. When two or more rings represented by the formula (2) are formed, the respective two or more rings represented by the formula (2) may be the same of different. When two or more groups represented by the formula (3) are formed, the respective two or more groups represented by the formula (3) may be the same or different.)

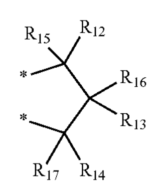

(2)

(In the formula (2), the two valence bonds * are bonded to two adjacent groups among $R_1$ to $R_{11}$ in the formula (1), respectively.

One or more sets selected from $R_{12}$ and $R_{13}$, $R_{13}$ and $R_{14}$, $R_{12}$ and $R_{15}$, $R_{13}$ and $R_{16}$, and $R_{14}$ and $R_{17}$ form a substituted or unsubstituted saturated or unsaturated ring, or do not form a substituted or unsubstituted saturated or unsaturated ring.

$R_{12}$ to $R_{14}$, $R_{15}$, $R_{16}$, and $R_{17}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are as defined in the formula (1).)

$$-L_{11}-Ar_{11} \quad (3)$$

(In the formula (3), $L_{11}$ is a single bond, a substituted or unsubstituted alkylene group having 1 to 30 carbon atoms, a substituted or unsubstituted arylene group having 6 to 30 ring carbon atoms, or a substituted or unsubstituted divalent heterocyclic group having 5 to 30 ring atoms.

$Ar_{11}$ is a substituted or unsubstituted aryl group having 6 to 50 ring carbon atoms, or a substituted or unsubstituted monovalent heterocyclic group having 5 to 50 ring atoms.)

According to one aspect of the present invention, a material for an organic electroluminescence device comprising a compound represented by the formula (1) above is provided.

According to one aspect of the present invention, an organic electroluminescence device having a cathode, an anode, and at least one organic layer provided between the cathode and the anode, wherein at least one layer of the at least one organic layer contains a compound represented by the formula (1) above is provided.

According to one aspect of the present invention, an electronic apparatus comprising the organic electroluminescence device is provided.

Effects of the Invention

The present invention provides a novel compound useful as a material for an organic electroluminescence device having high light-emitting efficiency, and an organic electroluminescence device having high light-emitting efficiency using said compound.

BRIEF DESCRIPTION OF THE DRAWINGS

FIG. 1 shows a schematic structure of one embodiment of the organic EL device of the present invention.

FIG. 2 shows a schematic structure of another embodiment of the organic EL device of the present invention.

EMBODIMENTS FOR CARRYING OUT THE INVENTION

In this specification, a hydrogen atom includes isotopes having different neutron numbers, i.e., light hydrogen (protium), heavy hydrogen (deuterium), and triple hydrogen (tritium).

In this specification, the number of ring carbon atoms means the number of carbons atoms included In the atoms which constitute the ring itself of a compound having a structure in which atoms are bonded in the form of a ring (for example, a monocyclic compound, a fused ring compound, a crosslinked compound, a carbocyclic compound, or a heterocyclic compound). When the ring is substituted with a substituent, the carbon atoms in the substituents are not included in the number of ring carbon atoms. The same applies to the "number of ring carbon atoms" described below unless otherwise mentioned. For example, a benzene ring has six ring carbon atoms, a naphthalene ring has ten ring carbon atoms, a pyridinyl group has five ring carbon atoms, and a furanyl group has four ring carbon atoms. Also, when a benzene ring or a naphthalene ring is substituted with an alkyl group, for example, the carbon atoms in the alkyl group are not included in the number of ring carbon atoms. When a fluorene ring, for example, is bonded to a fluorene ring as a substituent (including a spirofluorene ring), the carbon atoms in the fluorene ring bonded as a substituent are not included in the number of ring carbon atoms.

In this specification, the number of ring atoms means the number of the atoms which constitute the ring itself of a compound (for example, a monocyclic compound, a fused ring compound, a crosslinked compound, a carbocyclic compound, or a heterocyclic compound) having a structure (for example, a monocyclic ring, a fused ring, or a ring assembly) in which atoms are bonded in the form of a ring. Atoms which do not constitute the ring (for example, hydrogen atoms terminating the valence bond of the atoms forming the ring) and the atoms in the substituent, when the ring is substituted with a substituent, are not included in the number of ring atoms. The same applies to the "number of ring atoms" described below unless otherwise mentioned. For example, a pyridine ring has six ring atoms, a quinazoline ring has ten ring atoms, and a furan ring has five ring atoms. The hydrogen atoms bonded to each carbon atom in a pyridine ring or a quinazoline ring, and the atoms constituting a substituent are not included in the number of ring atoms. Also, when a fluorene ring, for example, is bonded to a fluorene ring as a substituent (including a spirofluorene ring), the atoms in the fluorene ring bonded as a substituent are not included in the number of ring atoms.

In this specification, the description "XX to YY carbon atoms" in the expression "substituted or unsubstituted ZZ group having XX to YY carbon atoms" means the number of carbon atoms in the case where the ZZ group is not substituted, and does not include the number of carbon atoms in the substituent when the ZZ group is substituted. Here, "YY" is greater than "XX" and each of "XX" and "YY" means an integer of one or more.

In this specification, the description "XX to YY atoms" in the expression "substituted or unsubstituted ZZ group having XX to YY atoms" means the number of atoms in the case where the ZZ group is not substituted, and does not include the number of atoms in the substituent when the ZZ groups is substituted. Here, "YY" is greater than "XX" and each of "XX" and "YY" means an integer of one or more.

In this specification, "substituted" in the case of "substituted or unsubstituted" means that the group is substituted with a substituent other than a hydrogen atom.

In this specification, "unsubstituted" in the case of "substituted or unsubstituted" means that the group is not substituted with the aforementioned substituent and that a hydrogen atom is bonded.

In this specification, the substituent (hereinafter, the substituent may be called "arbitrary substituent") in the case of "substituted or unsubstituted" is selected from the group consisting of an alkyl group having 1 to 50 carbon atoms, a haloalkyl group having 1 to 50 carbon atoms, an alkenyl group having 2 to 50 carbon atoms, an alkynyl group having 2 to 50 carbon atoms, a cycloalkyl group having 3 to 50 ring carbon atoms, an alkoxy group having 1 to 50 carbon atoms, an alkylthio group having 1 to 50 carbon atoms, an aryloxy group having 6 to 50 ring carbon atoms, an arylthio group having 6 to 50 ring carbon atoms, an aralkyl group having 7 to 50 carbon atoms, —Si($R_{41}$)($R_{42}$)($R_{43}$), —C(═O)$R_{44}$, —COO$R_{45}$, —S(═O)$_2R_{46}$, —P(═O)($R_{47}$)($R_{48}$), —Ge ($R_{49}$)($R_{50}$)($R_{51}$), —N($R_{52}$)($R_{53}$) (wherein, $R_{41}$ to $R_{53}$ are each independently a hydrogen atom, an alkyl group having 1 to 50 carbon atoms, an aryl group having 6 to 50 ring carbon atoms, or a heterocyclic group having 5 to 50 ring atoms; when the $R_{41}$ to $R_{53}$ are present in a number of two or more, the respective two or more $R_{41}$ to $R_{53}$ may be the same or different), a hydroxy group, a halogen atom, a cyano group, a nitro group, an aryl group having 6 to 50 ring carbon atoms, and a monovalent heterocyclic group having 5 to 50 ring atoms, for example.

In this specification, adjacent arbitrary substituents (or non-adjacent arbitrary substituents capable of forming a ring) form a substituted or unsubstituted saturated or unsaturated ring, or do not form a substituted or unsubstituted saturated or unsaturated ring. The explanation below regarding the wordings “substituted or unsubstituted” and “saturated or unsaturated ring” applies to the description “form a substituted or unsubstituted saturated or unsaturated ring”.

In this specification, an arbitrary substituent may further have a substituent. Substituents equivalent to the aforementioned arbitrary substituents can be mentioned as the further substituent bonded to the arbitrary substituent.

Specific examples of the groups and substituents in this specification include the following.

The unsubstituted alkyl group having 1 to 50 (preferably 1 to 30, more preferably 1 to 18, even more preferably 1 to 5) carbon atoms includes, for example, a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, and the like.

The substituted alkyl group having 1 to 50 (preferably 1 to 30, more preferably 1 to 18, even more preferably 1 to 5) carbon atoms includes, for example, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a 1-pyrrolylmethyl group, a 2-(1-pyrrolyl)ethyl group, a 1-hydroxy-2-phenylisopropyl group, a 1-chloro-2-phenylisopropyl group, and the like.

The substituted or unsubstituted haloalkyl group having 1 to 50 carbon atoms is a group in which one or more hydrogen atoms in the aforementioned alkyl group is substituted with a halogen atom. Examples of the substituted or unsubstituted haloalkyl group having 1 to 50 carbon atoms include those in which the aforementioned substituted or unsubstituted alkyl groups having 1 to 50 carbon atoms are substituted with one or more halogen atoms.

The unsubstituted alkenyl group having 2 to 50 (preferably 2 to 30, more preferably 2 to 18) carbon atoms includes a vinyl group, an allyl group, a 1-butenyl group, a 2-butenyl group, a 3-butenyl group, a 1,3-butanedienyl group, a 1-methylvinyl group, a 1-methylallyl group, a 1,1-dimethylallyl group, a 2-methylallyl group, a 1,2-dimethylallyl group, and the like.

The unsubstituted alkynyl group having 2 to 50 (preferably 2 to 30, more preferably 2 to 18) carbon atoms includes an ethynyl group and the like.

The unsubstituted cycloalkyl group having 3 to 50 (preferably 3 to 30, more preferably 3 to 18, even more preferably 3 to 6) ring carbon atoms includes a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, and the like.

The unsubstituted alkoxy group having 1 to 50 (preferably 1 to 30, more preferably 1 to 18) carbon atoms is represented by —OX, and the aforementioned alkyl groups having 1 to 50 carbon atoms, for example, can be mentioned as X.

The unsubstituted alkylthio group having 1 to 50 (preferably 1 to 30, more preferably 1 to 18) carbon atoms s represented by —SX, and the aforementioned alkyl groups having 1 to 50 carbon atoms, for example, can be mentioned as X.

The unsubstituted aryl group having 6 to 50 (preferably 6 to 30, more preferably 6 to 18) ring carbon atoms includes, for example, a phenyl group, a p-biphenylyl group, an m-biphenylyl group, an o-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-terphenyl-4-yl group, an o-terphenyl-3-yl group, an o-terphenyl-2-yl group, a 1-naphthyl group, a 2-naphthyl group, an anthryl group, a benzoanthryl group, a phenanthryl group, a benzophenanthryl group, a phenalenyl group, a pyrenyl group, a chrysenyl group, a benzochrysenyl group, a triphenylenyl group, a benzotriphenylenyl group, a tetracenyl group, a pentacenyl group, a fluorenyl group, a benzofluorenyl group, a dibenzofluorenyl group, a fluoranthenyl group, a benzofluoranthenyl group, and the like.

Among these examples, a phenyl group, a biphenylyl group, a terphenyl group, a naphthyl group, a phenanthryl group, and a fluorenyl group are preferable, and a phenyl group, a naphthyl group, and a biphenylyl group are more preferable.

The substituted aryl group having 6 to 50 (preferably 6 to 30, more preferably 6 to 18) ring carbon atoms includes, for example, an o-tolyl group, an m-tolyl group, a p-tolyl group, a para-xylyl group, a meta-xylyl group, an ortho-xylyl group, a para-isopropylphenyl group, a meta-isopropylphenyl group, an ortho-isopropylphenyl group, a para-t-butylphenyl group, a meta-t-butylphenyl group, an ortho-t-butylphenyl group, a 3,4,5-trimethylphenyl group, a 9,9-dimethylfluorenyl group, a 9,9-diphenylfluorenyl group, a 9,9'-spirobifluorenyl group, a 9,9-di(4-methylphenyl)fluorenyl group, a 9,9-di(4-isopropylphenyl)fluorenyl group, a 9,9-di(4-t-butylphenyl)fluorenyl group, a cyanophenyl group, a triphenylsilylphenyl group, a trimethylsilylphenyl group, and the like.

The substituted or unsubstituted arylene group having 6 to 30 (preferably 6 to 20, more preferably 6 to 18) ring carbon atoms includes, for example, divalent groups formed from the aromatic hydrocarbon rings which constitute the above-listed unsubstituted aryl groups having 6 to 50 ring carbon atoms or substituted aryl groups having 6 to 50 ring carbon atoms.

The substituted or unsubstituted arylene group having 6 to 30 ring carbon atoms is selected from the group consisting of the substituted or unsubstituted phenylene groups represented by the formulae (L1-1a) to (L1-1c) below, the substituted or unsubstituted biphenylyl groups represented by the formulae (L1-2a) to (L1-2g) below, the substituted or unsubstituted dialkylfluorenylene groups represented by the formulae (L1-3a) to (L1-3k) below, and the substituted or unsubstituted naphthylene groups represented by the formulae (L1-4a) to (L1-4j) below, for example.

(L1-1a)

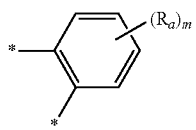

(L1-1b)

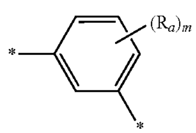

(L1-1c)

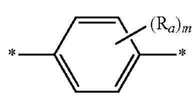

(L1-2a)

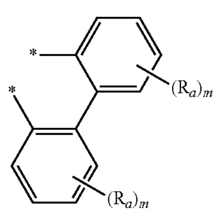

(L1-2b)

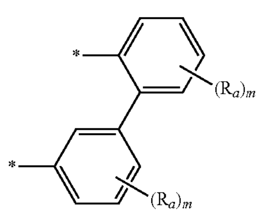

(L1-2c)

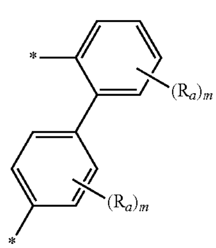

-continued (L1-2d)

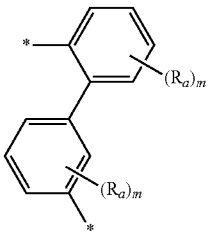

(L1-2e)

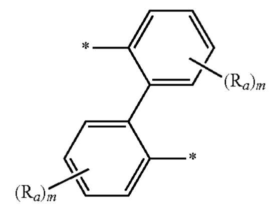

(L1-2f)

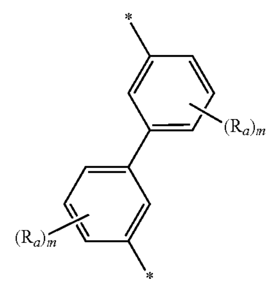

(L1-2g)

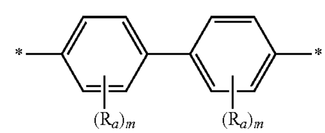

(L1-3a)

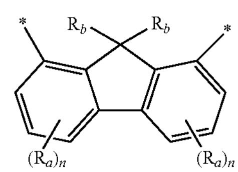

(L1-3b)

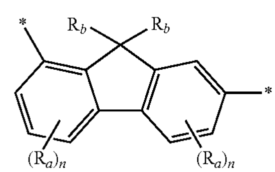

(L1-3c)

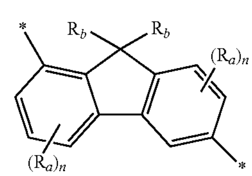

(L1-3d)

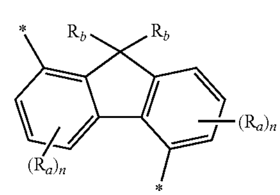

-continued (L1-3e)

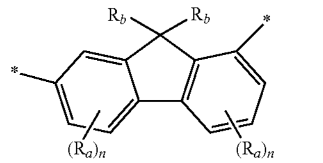

(L1-3f)

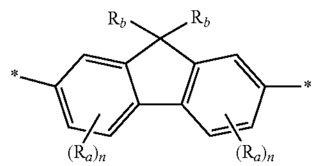

(L1-3g)

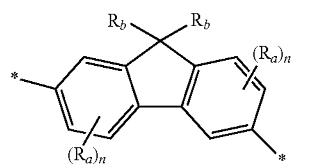

(L1-3h)

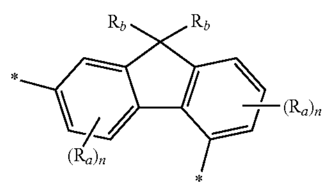

(L1-3i)

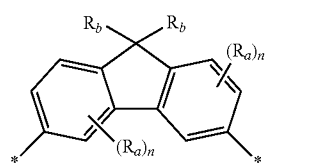

(L1-3j)

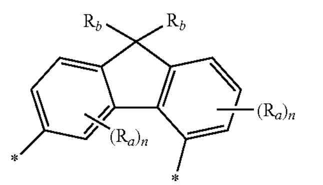

(L1-3k)

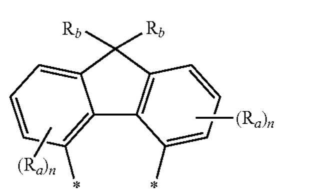

(L1-4a)

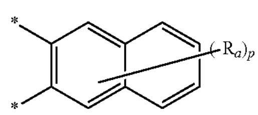

(L1-4b)

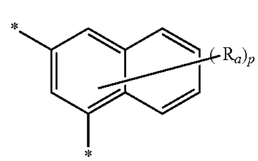

-continued (L1-4c)

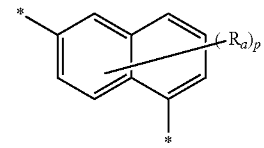

(L1-4d)

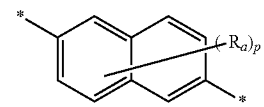

(L1-4e)

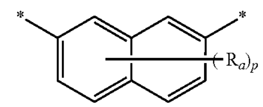

(L1-4f)

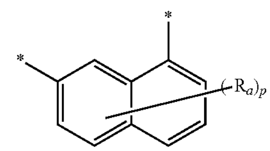

(L1-4g)

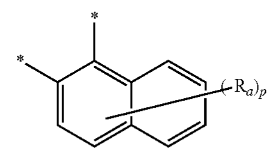

(L1-4h)

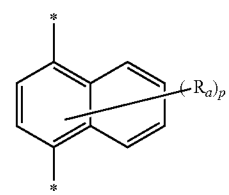

(L1-4i)

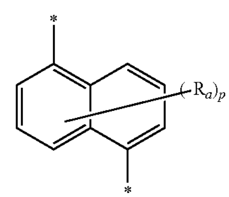

(L1-4j)

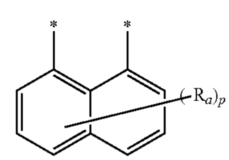

(In the formulae (L1-4a) to (L1-4j), $(R_a)_p$ is bonded to an arbitrary carbon atom.)

In the formulae (L1-1a) to (L1-1c), formulae (L1-2a) to (L1-2g), formulae (L1-3a) to (L1-3k), and formulae (L1-4a) to (L1-4j), each $R_a$ is independently an arbitrary substituent.

Each $R_b$ is independently a substituted or unsubstituted alkyl group having 1 to 50 (preferably 1 to 30, more preferably 1 to 18, even more preferably 1 to 5) carbon atoms.

Each m is independently an integer from 0 to 4, each n is independently an integer from 0 to 3, and each p is independently an integer from 0 to 6.

When two or more m are present, the two or more $R_a$ may be the same or different. When two or more n are present, the two or more $R_a$ may be the same or different. When two or more p are present, the two or more $R_a$ may be the same or different. When two or more m are present, the two or more $R_a$ are not bonded to one another. When two or more n are present, the two or more $R_a$ are not bonded to one another. When two or more p are present, the two or more $R_a$ are not bonded to one another.

m is preferably 0, n is preferably 0, and p is preferably 0.

The two * (asterisk) in each formula are valence bonds.

The unsubstituted aryloxy group having 6 to 50 (preferably 6 to 30, more preferably 6 to 18) ring carbon atoms is represented by —OY, and the aforementioned aryl groups having 6 to 50 ring carbon atoms, for example, can be mentioned as Y.

The unsubstituted arytthio group having 6 to 50 (preferably 6 to 30, more preferably 6 to 18) ring carbon atoms is represented by —SY, and the aforementioned aryl groups having 6 to 50 ring carbon atoms, for example, can be mentioned as Y.

The unsubstituted aralkyl group having 7 to 50 (preferably 7 to 30, more preferably 7 to 18) carbon atoms includes, for example, a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

The substituted aralkyl group having 7 to 50 (preferably 7 to 30, more preferably 7 to 18) carbon atoms includes, for example, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-nitrobenzyl group, an m-nitrobenzyl group, an o-nitrobenzyl group, a p-cyanobenzyl group, an m-cyanobenzyl group, an o-cyanobenzyl group, and the like.

The unsubstituted monovalent heterocyclic group having 5 to 50 (preferably 5 to 30, more preferably 5 to 18) ring atoms includes, for example, heterocyclic groups containing a nitrogen element such as a pyrrolyl group, an imidazolyl group, a pyrazolyl group, a triazolyl group, a tetrazolyl group, an oxazolyl group, an isoxazolyl group, an oxadiazolyl group, a thiazolyl group, an isothiazolyl group, a thiadiazolyl group, a pyridyl group, a pyridadinyl group, a pyrimidinyl group, a pyradinyl group, a triazinyl group, an indolyl group, an isoindolyl group, an indolydinyl group, a quinolidinyl group, a quinolyl group, an isoquinolyl group, a cynnolyl group, a phthalazinyl group, a quinazolinyl group, a quinoxalinyl group, a benzimidazolyl group, an indazolyl group, a phenanthrolinyl group, a phenanthridinyl group, an acridinyl group, a phenazinyl group, a carbazolyl group, a benzocarbazolyl group, a morpholino group, a phenoxazinyl group, a phenothiazinyl group, an azacarbazolyl group, and a diazacarbazolyl group;

unsubstituted heterocyclic groups containing an oxygen element such as a furyl group, an oxazolyl group, an isoxazolyl group, an oxadiazolyl group, a xanthenyl group, a benzofuranyl group, an isobenzofuranyl group, a dibenzofuranyl group, a naphthobenzofuranyl group, a benzoxazolyl group, a benzisoxazolyl group, a phenoxazinyl group, a morpholino group, a dinaphthofuranyl group, an azadibenzofuranyl group, a diazadibenzofuranyl group, an azanaphthobenzofuranyl group, and a diazanaphthobenzofuranyl group; and unsubstituted heterocyclic groups containing a sulfur element such as a thienyl group, a thiazolyl group, an isothiazolyl group, a thiadiazolyl group, a benzothiophenyl group, an isobenzothiophenyl group, a dibenzothiophenyl group, a naphthobenzothiophenyl group, a benzothiazolyl group, a benzoisothiazolyl group, a phenothiazinyl group, a dinaphthothiophenyl group, an azadibenzothiophenyl group, a diazadibenzothiophenyl group, an azanaphthobenzothiophenyl group, and a diazanaphthobenzothiophenyl group.

As the hetero atom that constitutes the heterocyclic group, hetero atoms such as Si, Ge and Se can also be mentioned in addition to the hetero atoms such as S, O, and N.

The "heterocyclic group" In this specification may be a monocyclic group or a fused ring group. Also, the "heterocyclic group" in this specification may be an aromatic heterocyclic group or an aliphatic heterocyclic group.

The substituted monovalent heterocyclic group having 5 to 50 (preferably 5 to 30, more preferably 5 to 18) ring atoms includes, for example, substituted heterocyclic groups containing a nitrogen element such as a (9-phenyl) carbazolyl group, a (9-biphenyl) carbazolyl group, a (9-phenyl)phenylcarbazolyl group, a (9-naphthyl)carbazolyl group, a diphenylcarbazol-9-yl group, a phenylcarbazol-9-yl group, a methylbenzimidazolyl group, an ethylbenzimidazolyl group, a phenyltriazinyl group, a biphenyltriazinyl group, a diphenyltriazinyl group, a phenylquinazolinyl group, and a biphenylquinazolinyl group;

substituted heterocyclic groups containing an oxygen element such as a phenyldibenzofuranyl group, a methyldibenzofuranyl group, a t-butyldibenzofuranyl group, and a monovalent group formed from a spiro[9H-xanthene-9,9'-(9-H)fluorene]; and substituted heterocyclic groups containing a sulfur element such as a phenyldibenzothiophenyl group, a methyldibenzothlophenyl group, a t-butyldibenzothiophenyl group, and a monovalent group formed from a spiro[9H-thioxanthene-9,9'-[9H]fluorene].

The substituted or unsubstituted divalent heterocyclic group having 5 to 30 (preferably 5 to 20, more preferably 5 to 18) ring atoms includes, for example, divalent groups formed from the heterocyclic rings that constitute the above-listed unsubstituted monovalent heterocyclic groups having 5 to 50 ring atoms or substituted monovalent heterocyclic groups having 5 to 50 ring atoms.

The substituted or unsubstituted monovalent heterocyclic group having 5 to 50 ring atoms includes the groups below. Also, the divalent heterocyclic group having 5 to 30 ring atoms includes divalent groups formed from the groups below.

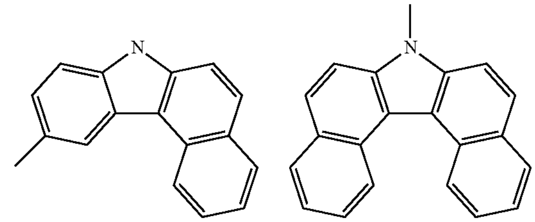

-continued
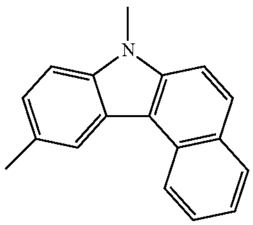
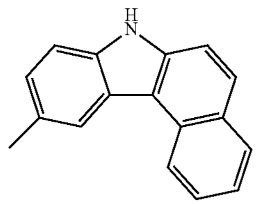
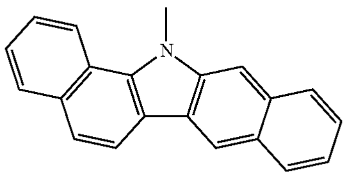
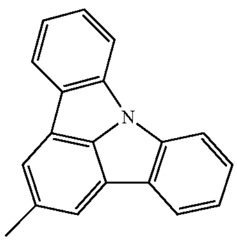
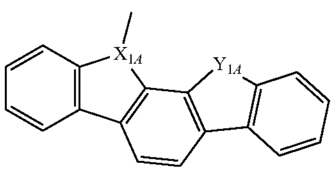
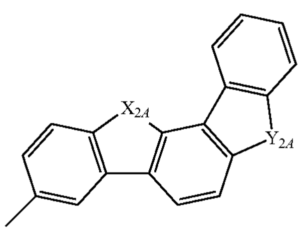
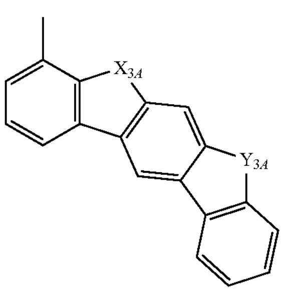
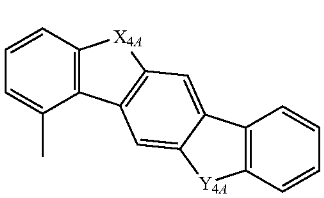
-continued
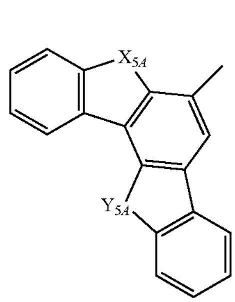
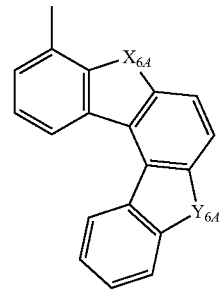
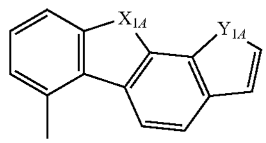
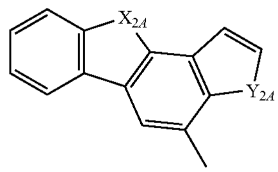
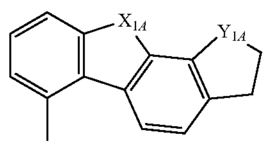
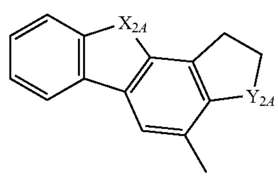
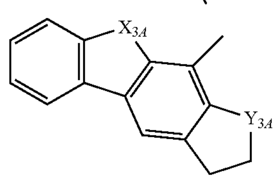
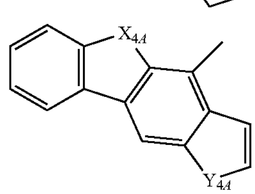
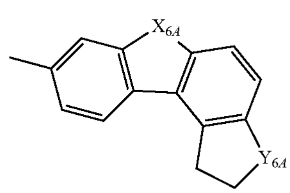
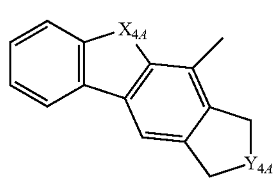
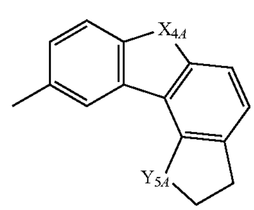

-continued

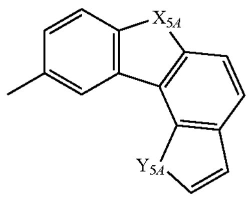

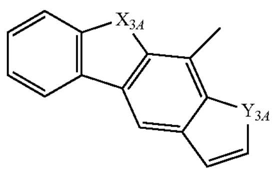

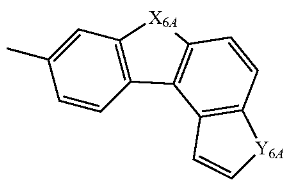

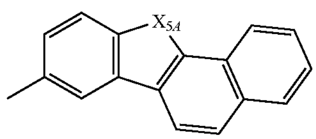

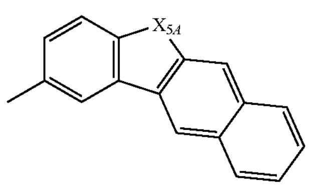

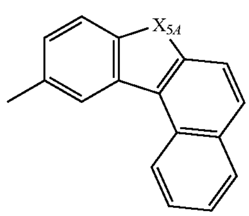

(In the formulae, $X_{1A}$ to $X_{6A}$, and $Y_{1A}$ to $Y_{6A}$ are each independently an oxygen atom, a sulfur atom, a —NZ— group, or a —NH— group. Z is a substituted or unsubstituted aryl group having 6 to 50 ring carbon atoms, a substituted or unsubstituted monovalent heterocyclic group having 5 to 50 ring atoms, or a substituted or unsubstituted alkyl group having 1 to 50 carbon atoms. When two or more Z are present, the two or more Z may be the same or different.)

As the halogen atom, a fluorine atom, a chlorine atom, a bromine atom, an iodine atom, and the like can be mentioned.

<Compound>

The novel compound according to one aspect of the present invention is represented by the following formula (1).

(1)

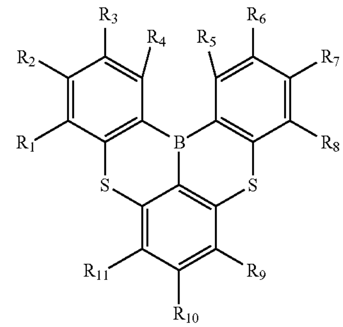

(In the formula (1), one or more sets of two or more adjacent groups among $R_1$ to $R_{11}$ form a substituted or unsubstituted heterocyclic ring or a ring represented by the formula (2) below, or do not form a substituted or unsubstituted heterocyclic ring or a ring represented by the formula (2) below.

$R_1$ to $R_{11}$ which do not form the substituted or unsubstituted heterocyclic ring or the ring represented by the formula (2) are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, $—Si(R_{31})(R_{32})(R_{33})$, $—C(=O)R_{34}$, $—COOR_{35}$, $—N(R_{36})(R_{37})$, a halogen atom, a cyano group, a nitro group, a substituted or unsubstituted aryl group having 6 to 50 ring carbon atoms, a substituted or unsubstituted monovalent heterocyclic group having 5 to 50 ring atoms, or a group represented by the formula (3) below.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.

At least one set of two or more adjacent groups among $R_1$ to $R_{11}$ forms a substituted or unsubstituted heterocyclic ring, or forms a ring represented by the formula (2) below, or at least one of $R_1$ to $R_4$ is a group represented by the formula (3) below. When two or more substituted or unsubstituted heterocyclic rings are formed, the respective two or more substituted or unsubstituted heterocyclic rings may be the same or different. When two or more rings represented by the formula (2) are formed, the respective two or more rings represented by the formula (2) may be the same of different. When two or more groups represented by the formula (3) are formed, the respective two or more groups represented by the formula (3) may be the same or different.)

(2)

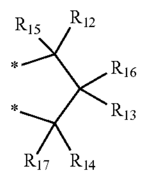

(In the formula (2), the two valence bonds * are bonded to two adjacent groups among $R_1$ to $R_{11}$ in the formula (1), respectively.

One or more sets selected from $R_{12}$ and $R_{13}$, $R_{13}$ and $R_{14}$, $R_{12}$ and $R_{13}$, $R_{13}$ and $R_{14}$, and $R_{16}$ and $R_{17}$ form a substituted or unsubstituted saturated or unsaturated ring, or do not form a substituted or unsubstituted saturated or unsaturated ring.

$R_{12}$ to $R_{14}$, $R_{15}$, $R_{16}$, and $R_{17}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are as defined in the formula (1).)

$$-L_{11}-Ar_{11} \quad (3)$$

(In the formula (3), $L_{11}$ is a single bond, a substituted or unsubstituted alkylene group having 1 to 30 carbon atoms, a substituted or unsubstituted arylene group having 6 to 30 ring carbon atoms, or a substituted or unsubstituted divalent heterocyclic group having 5 to 30 ring atoms.

$Ar_{11}$ is a substituted or unsubstituted aryl group having 6 to 50 ring carbon atoms, or a substituted or unsubstituted monovalent heterocyclic group having 5 to 50 ring atoms.)

The description "one or more sets of two or more adjacent groups among $R_1$ to $R_{11}$ form a substituted or unsubstituted heterocyclic ring or a ring represented by the formula (2) below" is explained as follows.

"One set of two or more adjacent groups among $R_1$ to $R_{11}$" means a set of groups such as $R_1$ and $R_2$, $R_2$ and $R_3$, $R_3$ and $R_4$, $R_5$ and $R_6$, $R_6$ and $R_7$, or $R_1$, $R_2$ and $R_3$.

The expression "one or more sets of two or more adjacent groups among X to Y" hereinafter can be understood by replacing the aforementioned $R_1$ with X and replacing the aforementioned $R_{11}$ with Y.

The substituents when the "substituted or unsubstituted" heterocyclic ring or ring represented by the formula (2) is "substituted" are the same as the aforementioned arbitrary substituents.

The "saturated or unsaturated ring" in the description "$R_{12}$ and $R_{13}$ or $R_{13}$ and $R_{14}$ form a substituted or unsubstituted saturated or unsaturated ring, or do not form a substituted or unsubstituted saturated or unsaturated ring" means, in the case where $R_{12}$ and $R_{13}$ form a ring, for example, a ring formed by a carbon atom to which $R_{12}$ is bonded and a carbon atom to which $R_{13}$ is bonded and one or more arbitrary elements. Specifically, when $R_{12}$ and $R_{13}$ form a ring, a benzene ring is formed by $R_{12}$ and $R_{13}$ when an unsaturated ring is formed by a carbon atom to which $R_{12}$ is bonded, a carbon atom to which $R_{13}$ is bonded, and four carbon atoms.

The substituents when the aforementioned "substituted or unsubstituted" saturated or unsaturated ring is "substituted" are the same as the aforementioned arbitrary substituents.

The "arbitrary element" is preferably a C element, an N element, an O element, or an S element. In the arbitrary element (in the case of a C element or an N element, for example), a valence bond which does not form a ring may be terminated with a hydrogen atom or the like.

The "one or more arbitrary elements" are preferably 2 or more and 15 or less, more preferably 3 or more and 12 or less, even more preferably 3 or more and 5 or less arbitrary elements.

In one embodiment, at least one set of two or more adjacent groups among $R_1$ to $R_{11}$ in the formula (1) forms a substituted or unsubstituted heterocyclic ring or a ring represented by the formula (2).

In one embodiment, at least one set of two or more adjacent groups among $R_1$ to $R_{11}$ in the formula (1) forms a substituted or unsubstituted heterocyclic ring or a ring represented by the formula (2), where the substituted or unsubstituted heterocyclic ring is a substituted or unsubstituted oxygen-containing heterocyclic ring or a substituted or unsubstituted nitrogen-containing heterocyclic ring.

In one embodiment, one or more sets selected from $R_1$ and $R_2$, and $R_7$ and $R_8$ in the formula (1) form a substituted or unsubstituted heterocyclic ring or a ring represented by the formula (2).

In one embodiment, the compound represented by the formula (1) is a compound represented by the following formula (4-1) or (4-2).

(4-1)

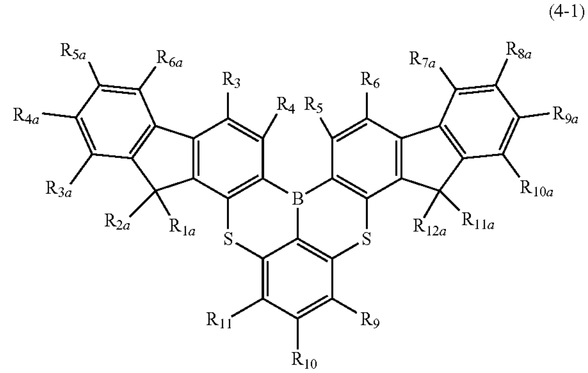

-continued (4-2)

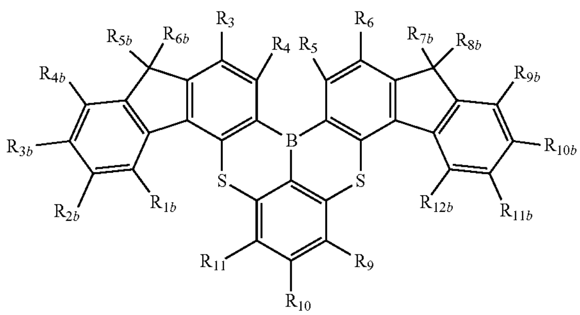

(In the formula (4-1), $R_3$ to $R_5$ and $R_9$ to $R_{11}$ are as defined in the formula (1).

One or more sets selected from $R_{1a}$ and $R_{2a}$, and $R_{11a}$ and $R_{12a}$, and one or more sets of two or more adjacent groups among $R_{1a}$ to $R_{12a}$ form a substituted or unsubstituted saturated or unsaturated ring, or do not form a substituted or unsubstituted saturated or unsaturated ring.

$R_{1a}$ to $R_{12a}$ which do not form the substituted or unsubstituted saturated or unsaturated ring are each Independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.

In the formula (4-2), $R_3$ to $R_6$ and $R_9$ to $R_{11}$ are as defined in the formula (1).

One or more sets selected from $R_{5b}$ and $R_{6b}$, and $R_{7b}$ and $R_{8b}$, and one or more sets of two or more adjacent groups among $R_{1b}$ to $R_{12b}$ form a substituted or unsubstituted saturated or unsaturated ring, or do not form a substituted or unsubstituted saturated or unsaturated ring.

$R_{1b}$ to $R_{12a}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arytthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.)

In one embodiment, the compound represented by the formula (1) is a compound represented by the following formula (5-1) or (5-2).

(5-1)

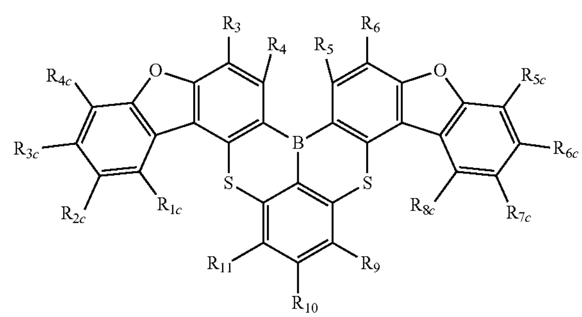

(5-2)

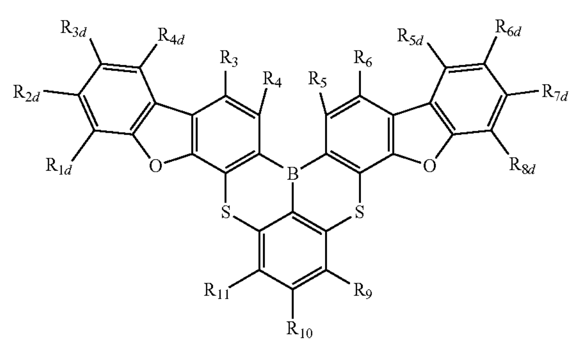

(In the formula (5-1), $R_3$ to $R_6$ and $R_9$ to $R_{11}$ are as defined in the formula (1).

One or more sets of two or more adjacent group having $R_{1c}$ to $R_{8c}$ form a substituted or unsubstituted saturated or unsaturated ring, or do not form a substituted or unsubstituted saturated or unsaturated ring.

$R_{1c}$ to $R_{8c}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arytthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COOR$_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.

In the formula (5-2), $R_3$ to $R_6$ and $R_9$ to $R_{11}$ are as defined in the formula (1).

One or more sets of two or more adjacent groups among $R_{1d}$ to $R_{8d}$ form a substituted or unsubstituted saturated or unsaturated ring, or do not form a substituted or unsubstituted saturated or unsaturated ring.

$R_{1d}$ to $R_{8d}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COOR$_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{13}$ to $R_{37}$ present may be the same or different.)

In one embodiment, the compound represented by the formula (1) is a compound represented by the following formula (6-1) or (6-2).

(6-1)

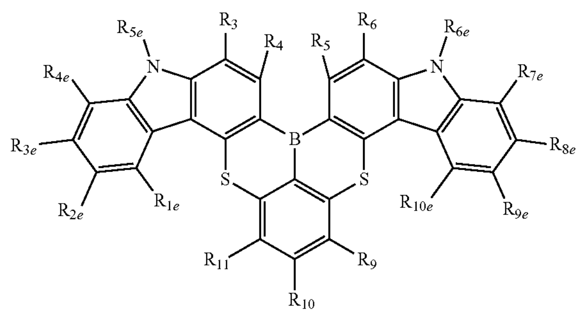

(6-2)

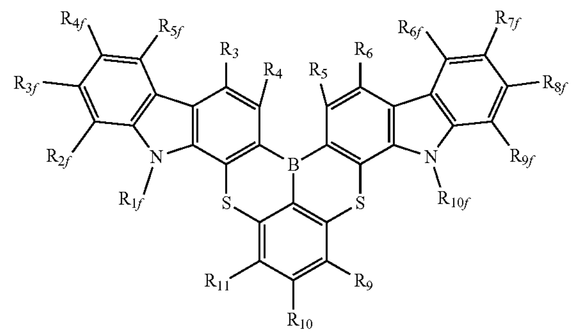

(In the formula (6-1), $R_3$ to $R_6$ and $R_9$ to $R_{11}$ are as defined in the formula (1).

One or more sets of two or more adjacent groups among $R_{1e}$ to $R_{10e}$ form a substituted or unsubstituted saturated or unsaturated ring, or do not form a substituted or unsubstituted saturated or unsaturated ring.

$R_{1a}$ to $R_{10e}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COOR$_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.

In the formula (6-2), $R_3$ to $R_6$ and $R_9$ to $R_{11}$ are as defined in the formula (1).

One or more sets of two or more adjacent groups among $R_{1f}$ to $R_{10f}$ form a substituted or unsubstituted saturated or unsaturated ring, or do not form a substituted or unsubstituted saturated or unsaturated ring.

$R_{1f}$ to $R_{10f}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or, unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms.

When the respective $R_{31}$ to $R_{37}$ are present in a number of two or more, the respective two or more $R_{31}$ to $R_{37}$ present may be the same or different.)

In one embodiment, one or more sets of two or more adjacent groups among $R_1$ to $R_{11}$ in the formula (1) do not form a substituted or unsubstituted heterocyclic ring or a ring represented by the formula (2), and at least two of $R_1$ to $R_8$ are groups represented by the formula (3).

In one embodiment, one or more sets of two or more adjacent groups among $R_1$ to $R_{11}$ in the formula (1) do not form a substituted or unsubstituted heterocyclic ring or a ring represented by the formula (2), and at least one of $R_1$ to $R_4$ and at least one of $R_5$ to $R_8$ are groups represented by the formula (3), respectively.

In one embodiment, one or more sets of two or more adjacent groups among $R_1$ to $R_{11}$ in the formula (1) do not form a substituted or unsubstituted heterocyclic ring or a ring represented by the formula (2), and $R_2$ is a group represented by the formula (3).

In one embodiment, $L_{11}$ in the formula (3) is a single bond, and $Ar_{11}$ in the formula (3) is a substituted or unsubstituted carbazolyl group or a substituted or unsubstituted dibenzofuranyl group.

In one embodiment, the compound represented by the formula (1) is a compound represented by the following formula (7).

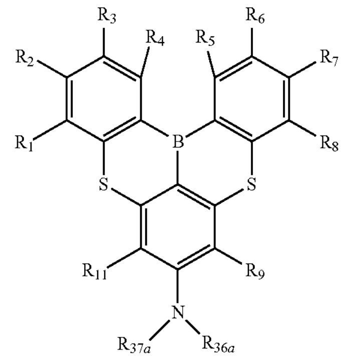

(7)

(In the formula (7), $R_1$ to $R_9$ and $R_{11}$ are as defined in the formula (1).

$R_{36a}$ and $R_{37a}$ are each independently a substituted or unsubstituted aryl group having 6 to 50 ring carbon atoms.)

In one embodiment, the substituent (hereinafter, the substituent may be called "arbitrary substituent") in the compound represented by the formula (1) in the case of "substituted or unsubstituted" is selected from the group consisting of an alkyl group having 1 to 50 carbon atoms, a haloalkyl group having 1 to 50 carbon atoms, an alkenyl group having 2 to 50 carbon atoms, an alkynyl group having 2 to 50 carbon atoms, a cycloalkyl group having 3 to 50 ring carbon atoms, an alkoxy group having 1 to 50 carbon atoms, an alkylthio group having 1 to 50 carbon atoms, an aryloxy group having 6 to 50 ring carbon atoms, an arylthio group having 6 to 50 ring carbon atoms, an aralkyl group having 7 to 50 carbon atoms, —Si($R_{41}$)($R_{42}$)($R_{43}$), —C(═O)$R_{44}$, —COO$R_{45}$, —S(═O)$_2R_{46}$, —P(═O)($R_{47}$)($R_{48}$), —Ge($R_{49}$)($R_{50}$)($R_{51}$), —N($R_{52}$)($R_{53}$) (wherein, $R_{41}$ to $R_{53}$ are each independently a hydrogen atom, an alkyl group having 1 to 50 carbon atoms, an aryl group having 6 to 50 ring carbon atoms, or a monovalent heterocyclic group having 5 to 50 ring atoms. When the $R_{41}$ to $R_{53}$ are present in a number of two or more, the respective two or more $R_{41}$ to $R_{53}$ may be the same or different), a hydroxy group, a halogen atom, a cyano group, a nitro group, an aryl group having 6 to 50 ring carbon atoms, and a monovalent heterocyclic group having 5 to 50 ring atoms.

In one embodiment, the substituent in the compound represented by the formula (1) in the case of "substituted or unsubstituted" is selected from the group consisting of an alkyl group having 1 to 50 carbon atoms, an aryl group having 6 to 50 ring carbon atoms, and a monovalent heterocyclic group having 5 to 50 ring atoms.

In one embodiment, the substituent in the compound represented by the formula (1) in the case of "substituted or unsubstituted" is selected from the group consisting of an alkyl group having 1 to 18 carbon atoms, an aryl group having 6 to 18 ring carbon atoms, and a monovalent heterocyclic group having 5 to 18 ring atoms.

Specific examples of the substituents, arbitrary substituents, and halogen atoms in the compound represented by the formula (1) are the same as those described above.

Specific examples of the compound represented by the formula (1) include the following compounds.

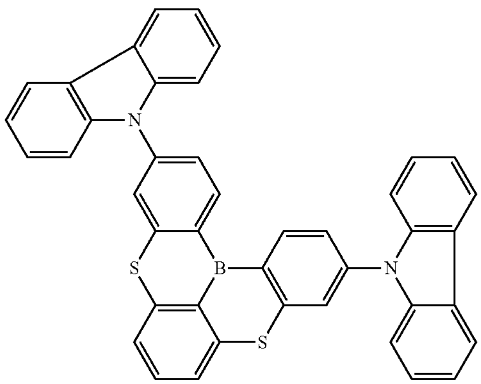
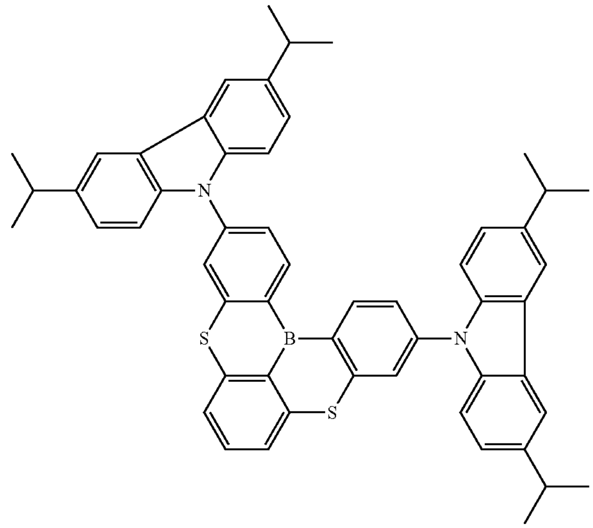
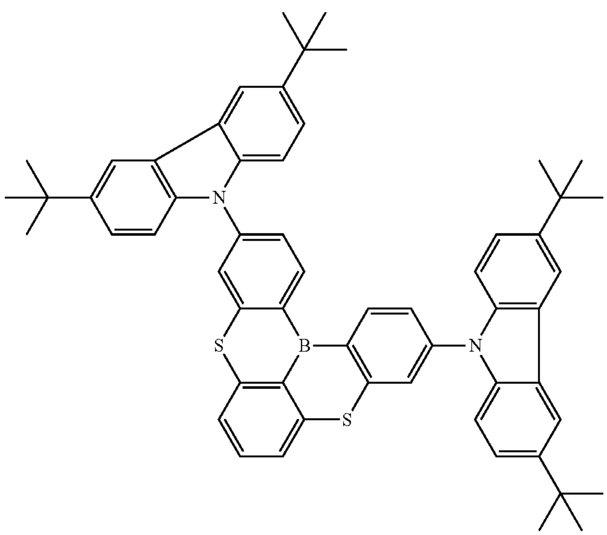
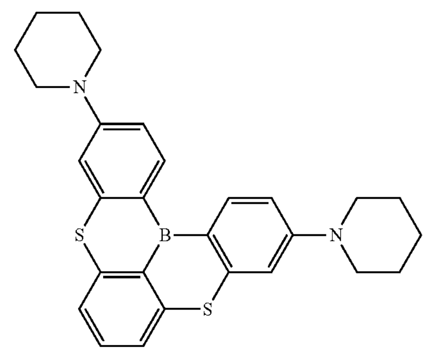
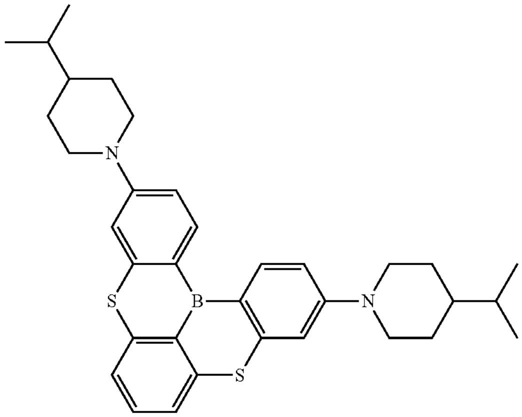
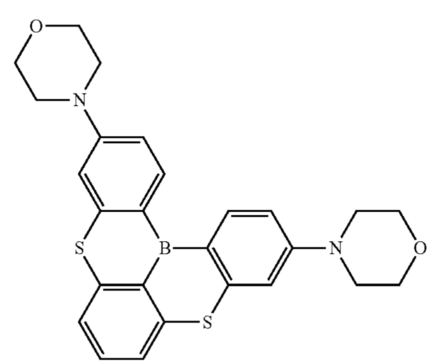
O
N
S
B
N
O
S

-continued
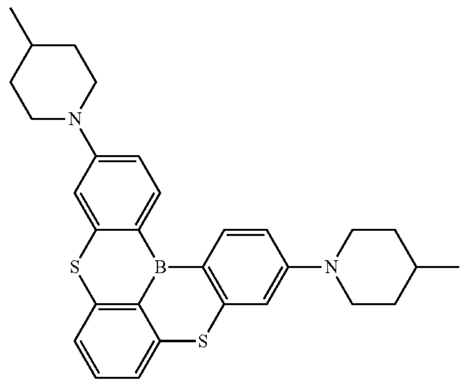
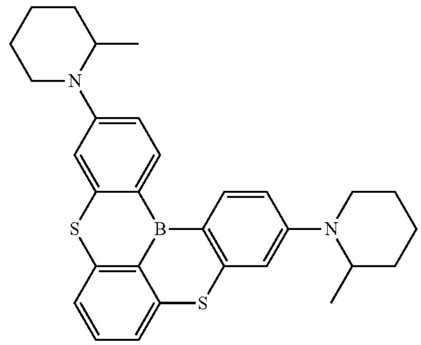
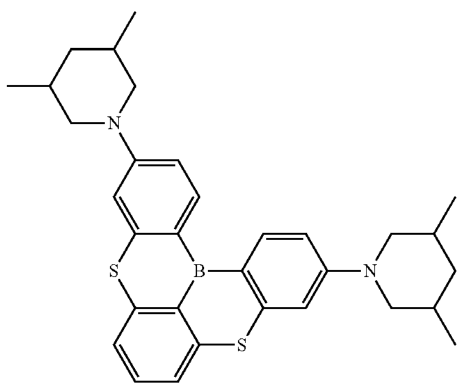
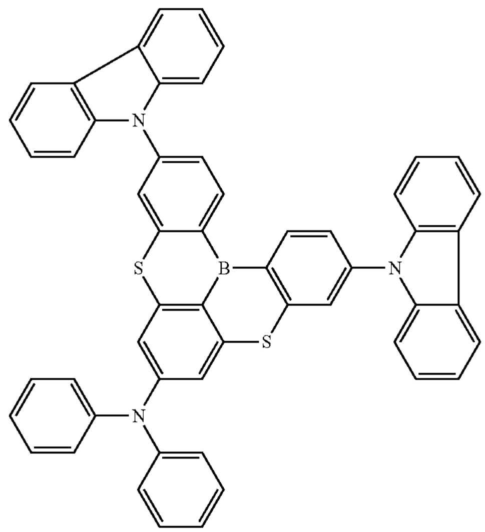
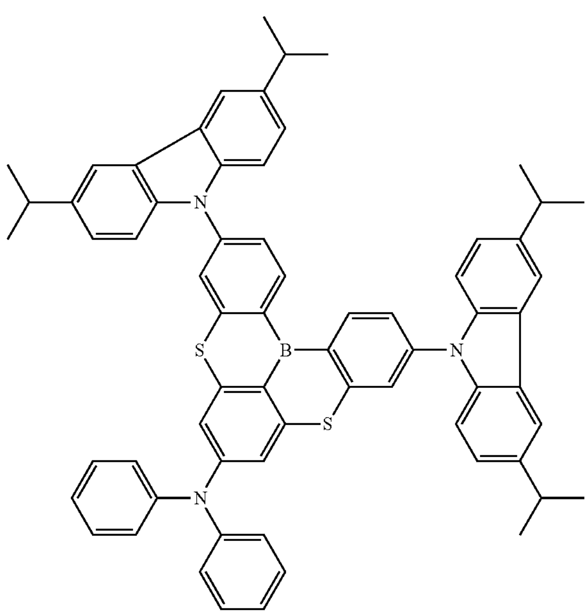

-continued
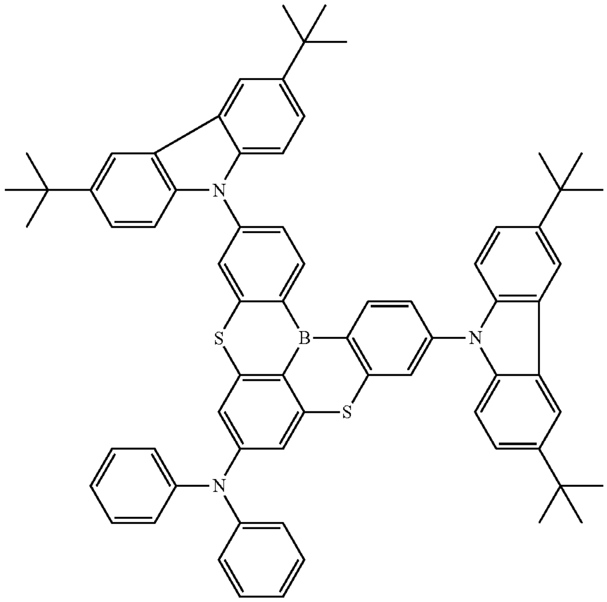
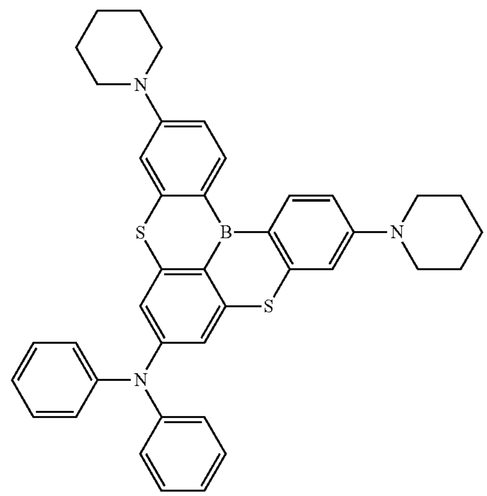
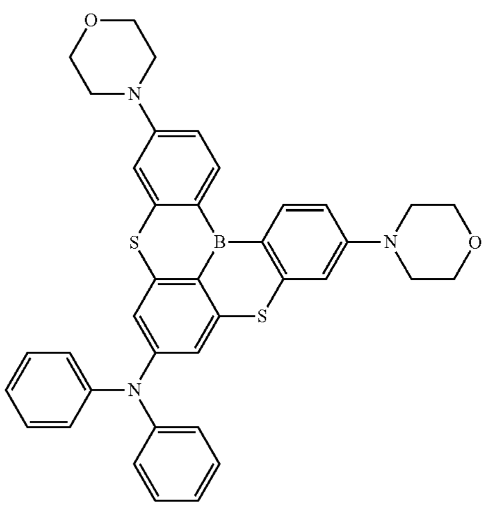
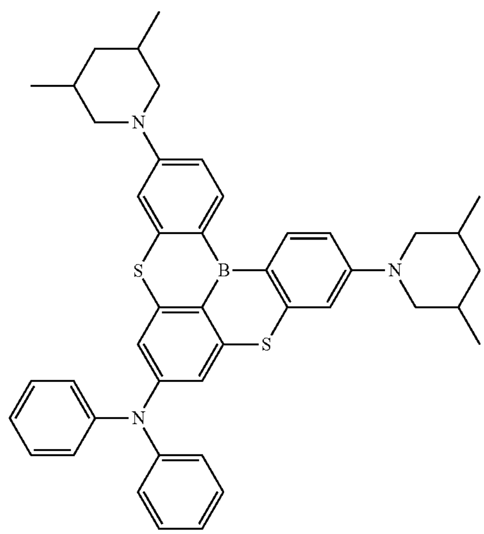
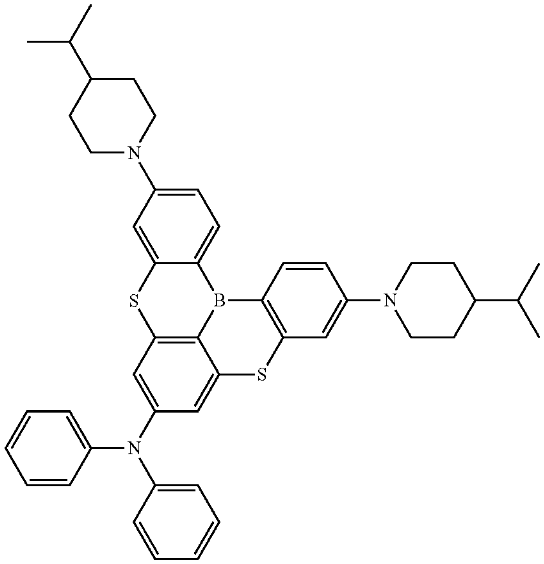
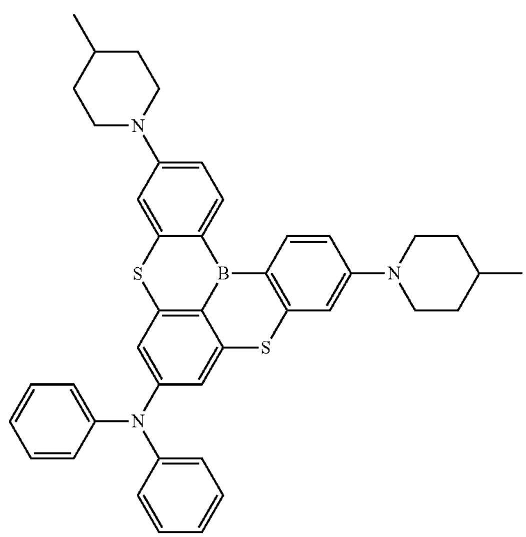

-continued
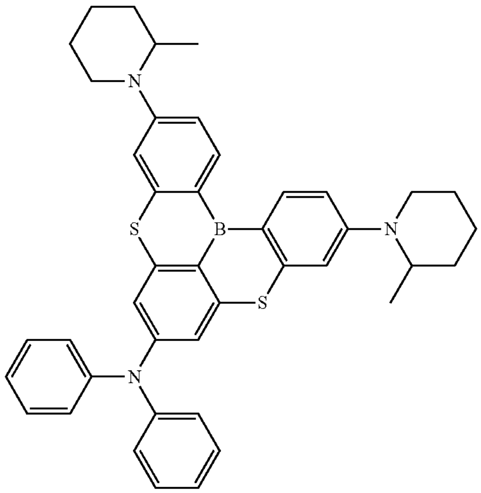
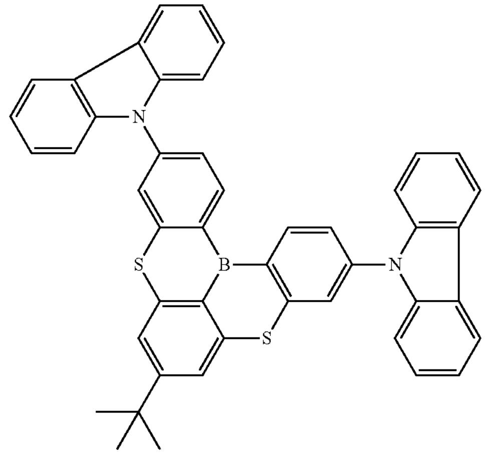
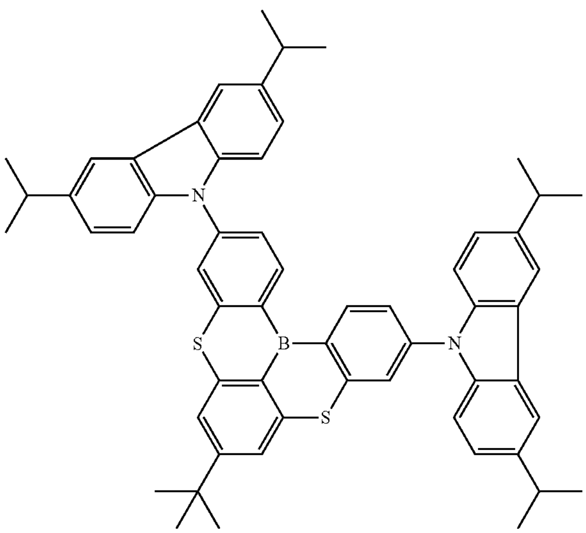
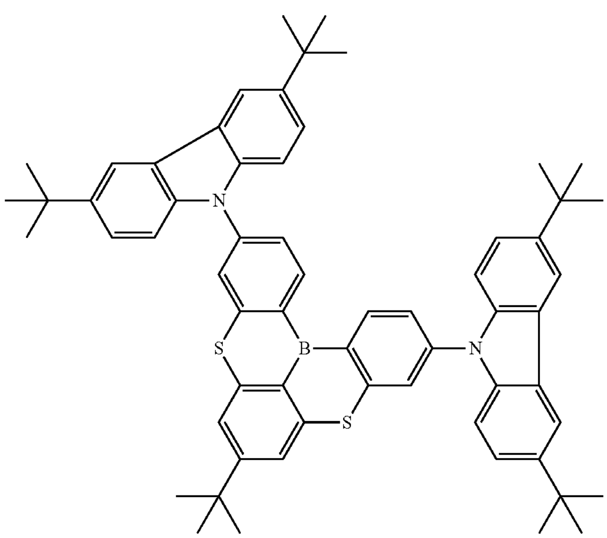
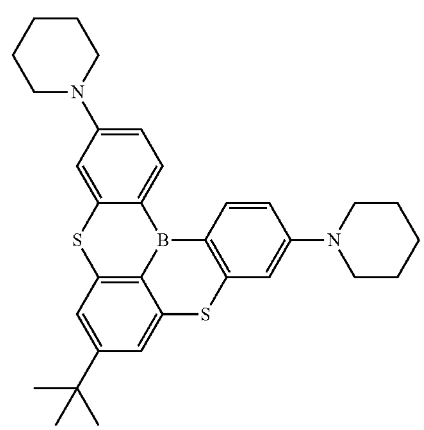

-continued
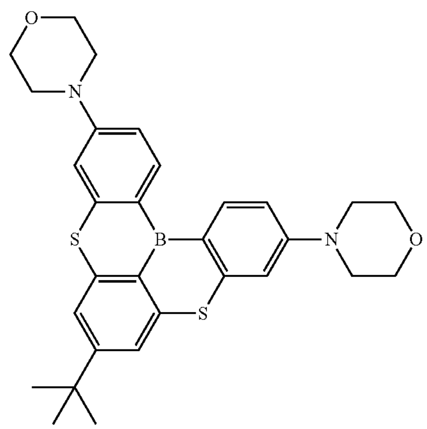
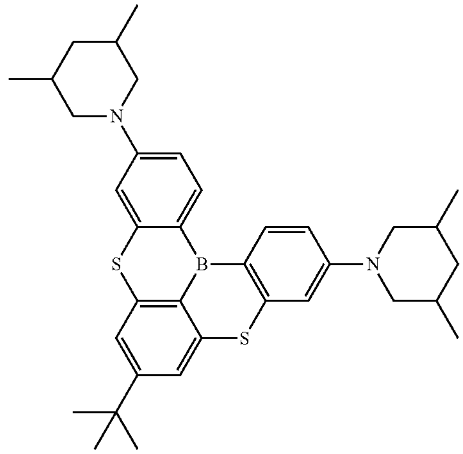
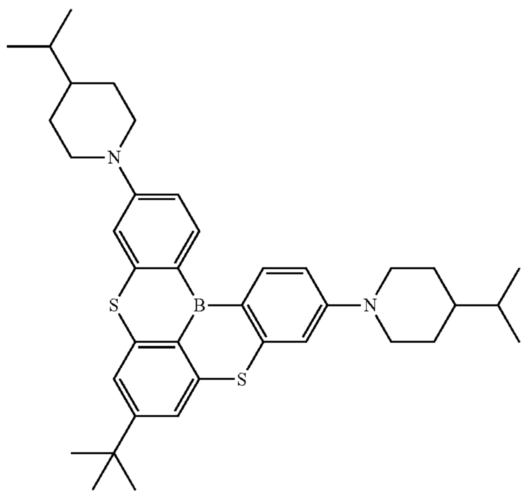
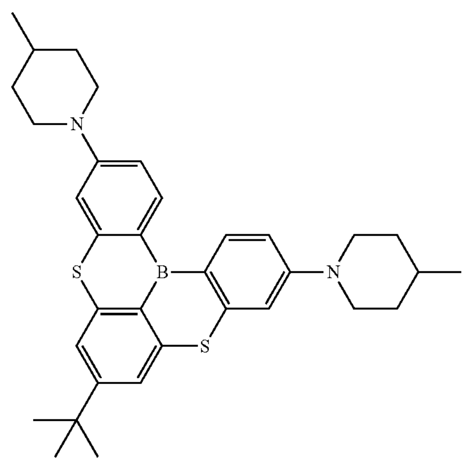
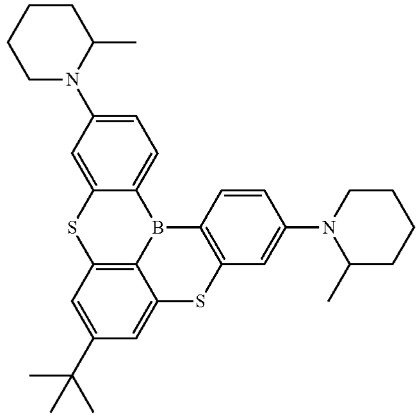
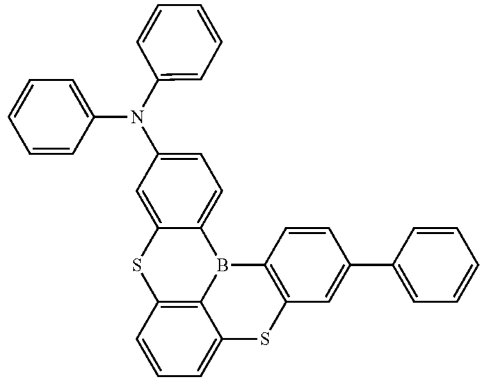

-continued
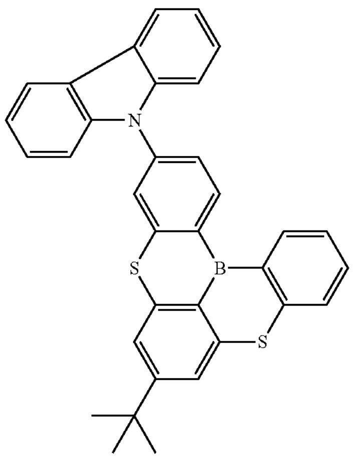
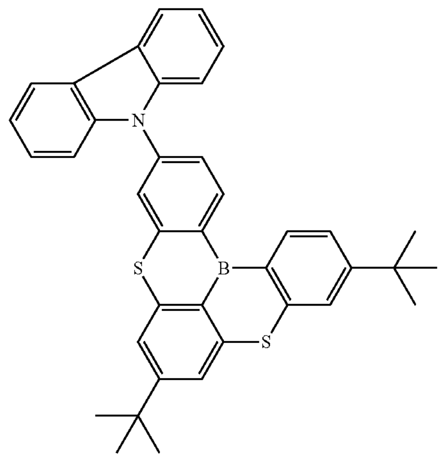
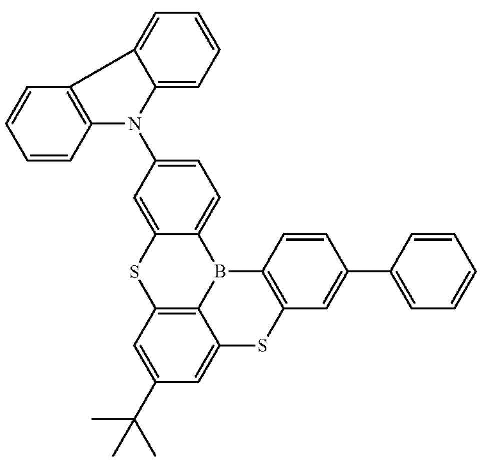
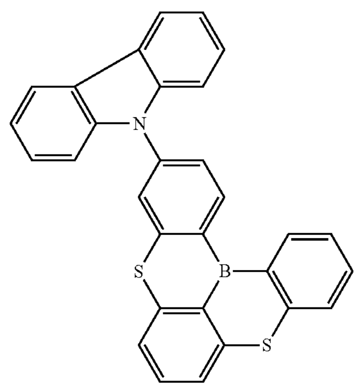
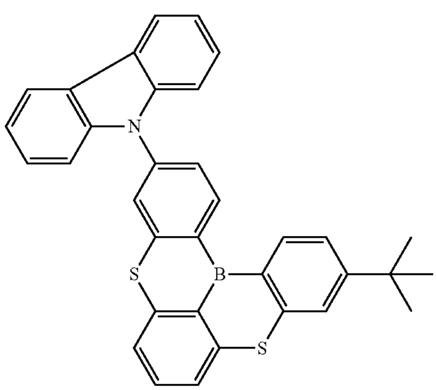
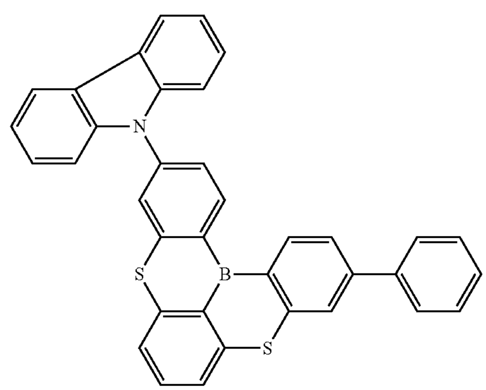
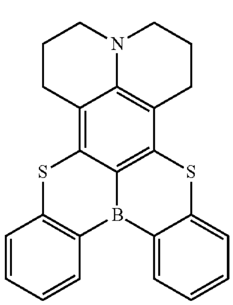
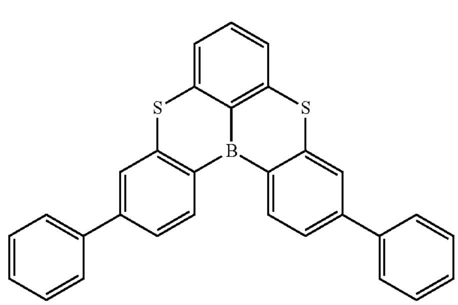
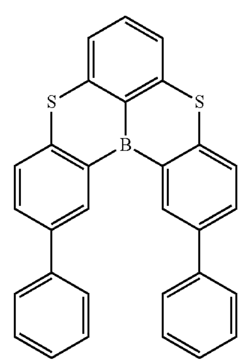

-continued
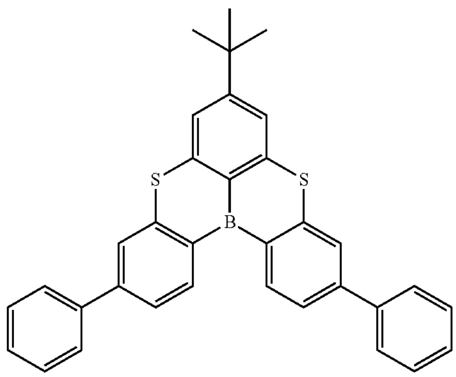
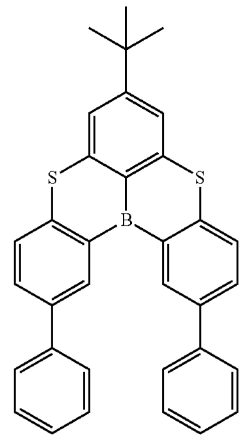
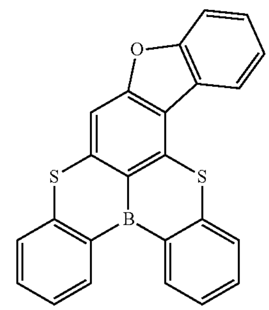
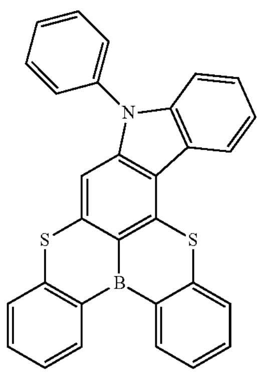
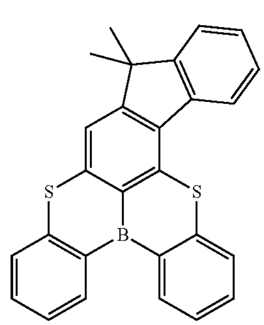
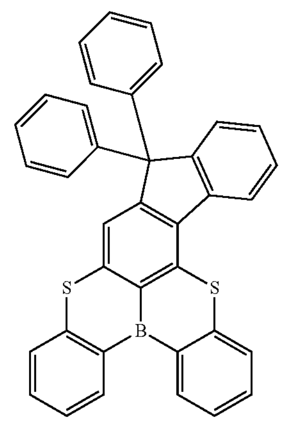
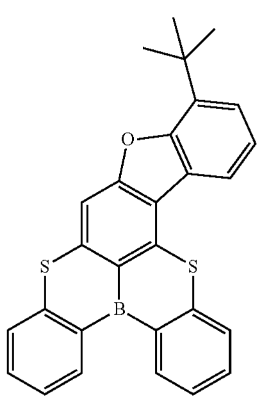
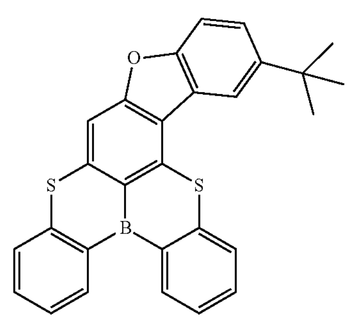
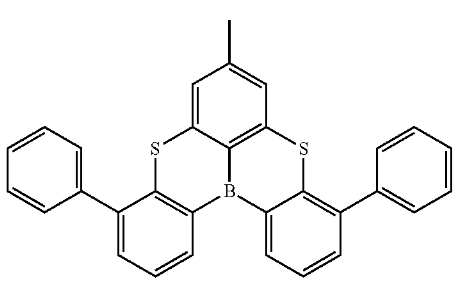
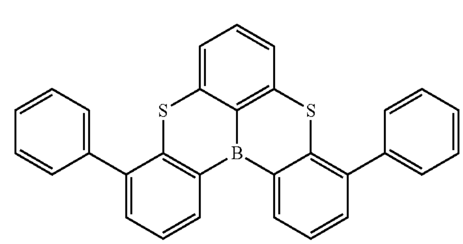

-continued
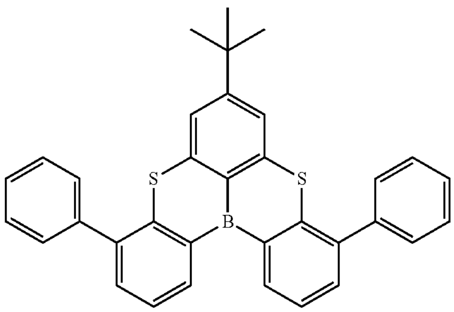
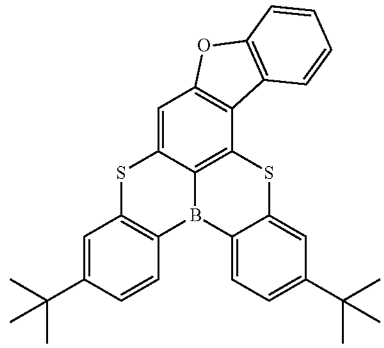
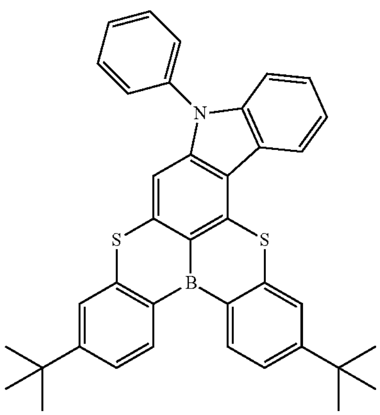
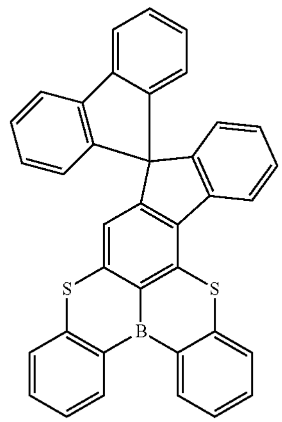
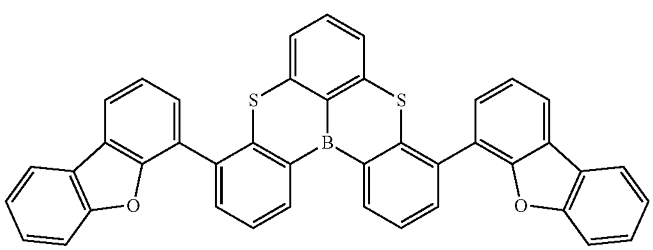
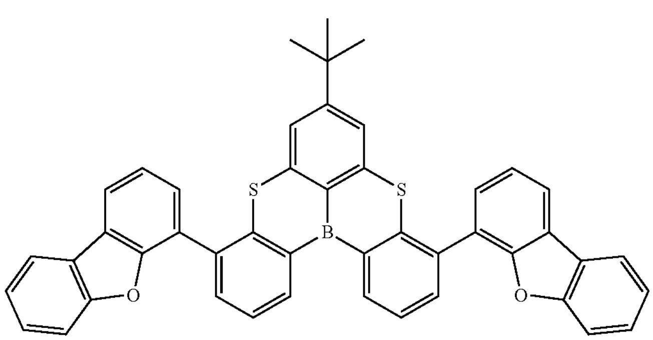

-continued
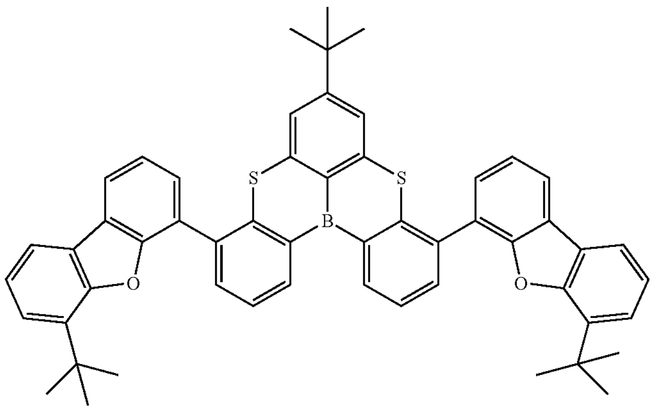
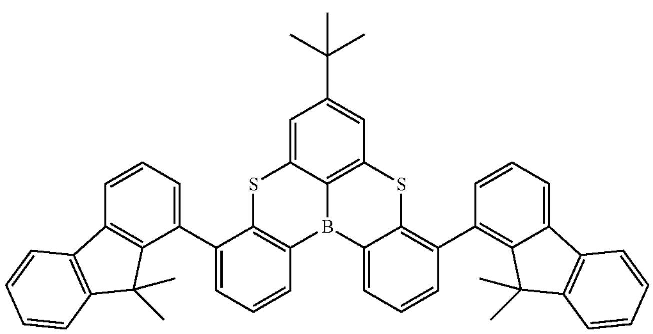
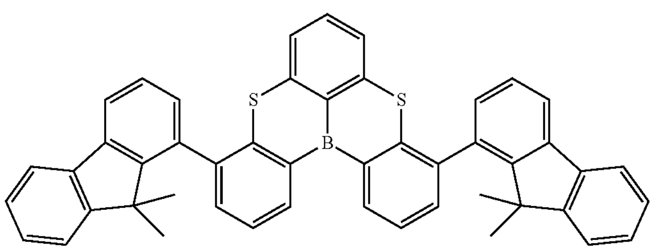
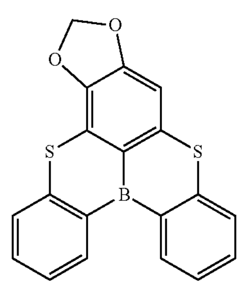
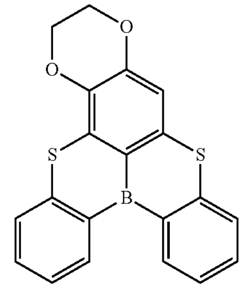
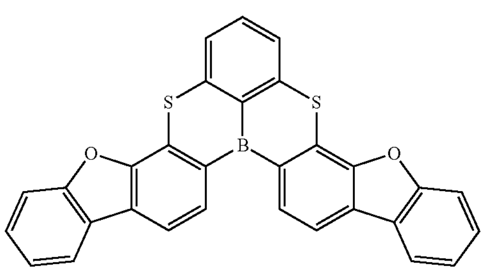
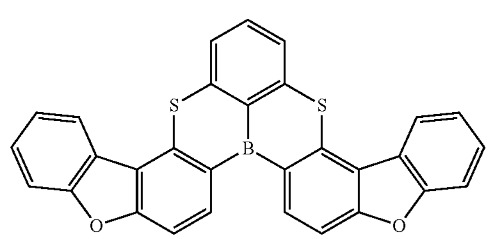
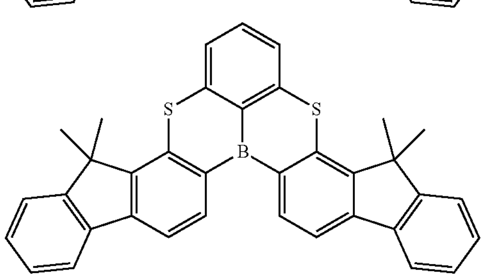
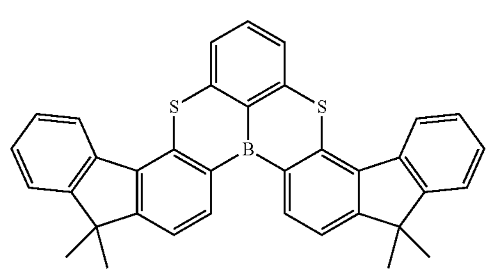

-continued
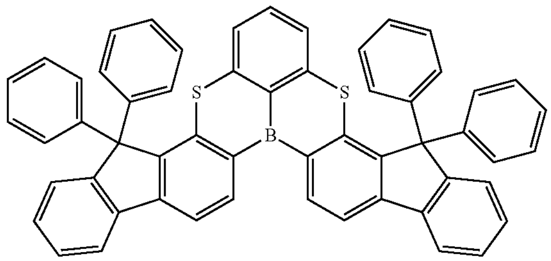
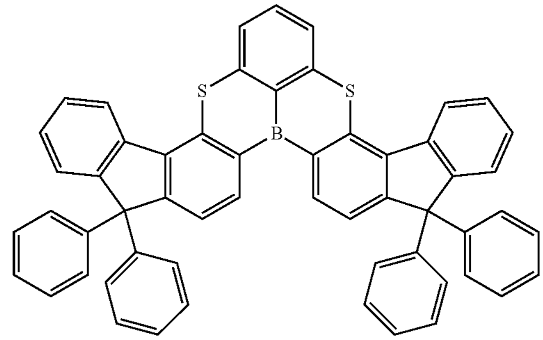
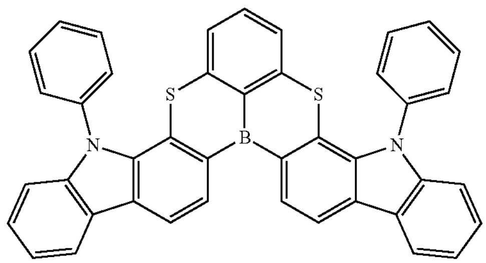
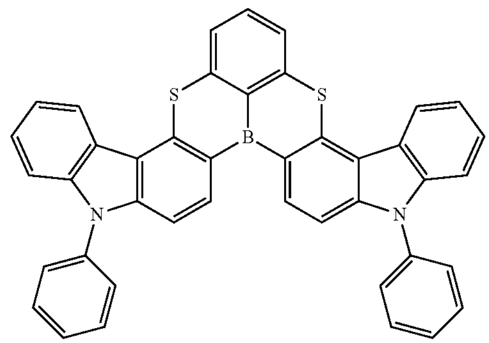
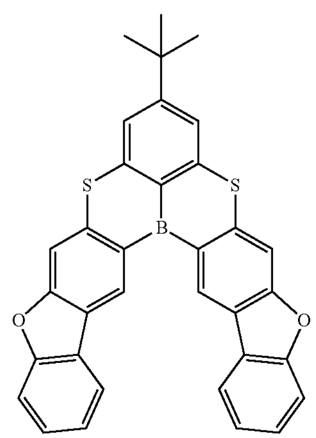
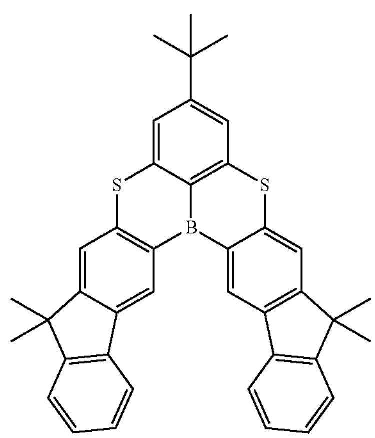
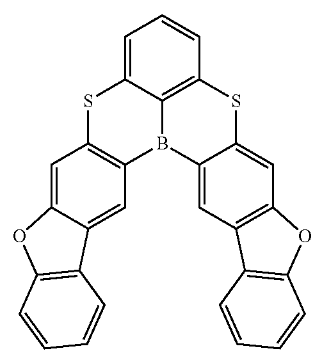
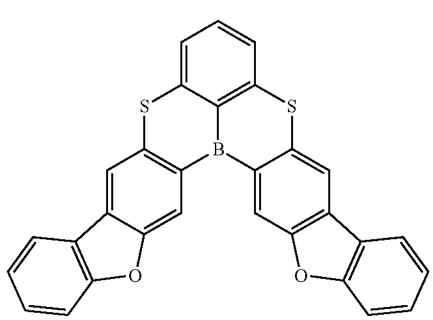
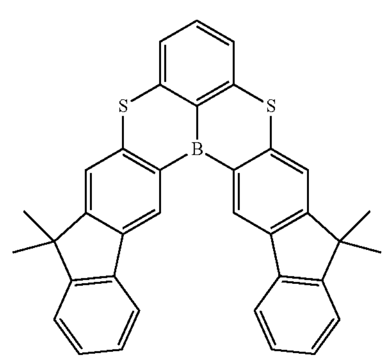

-continued
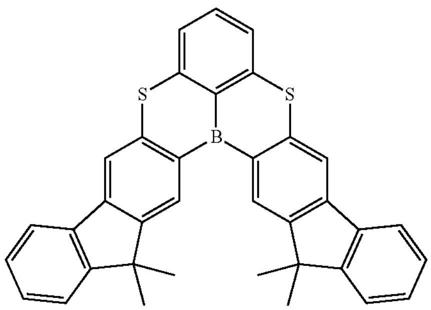
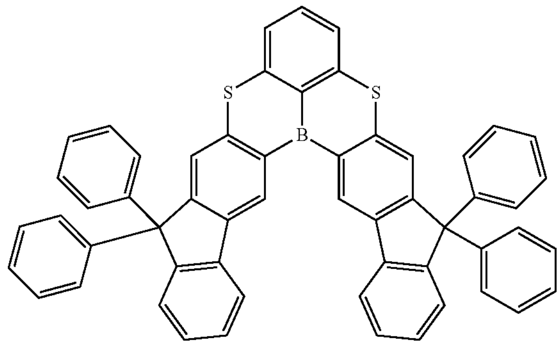
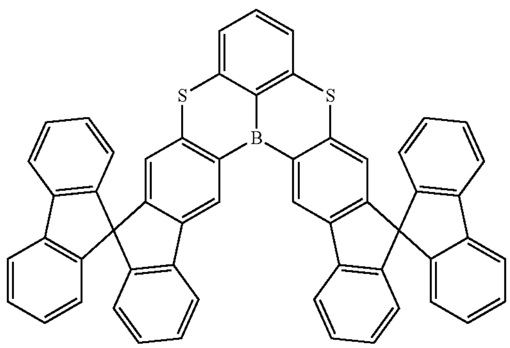
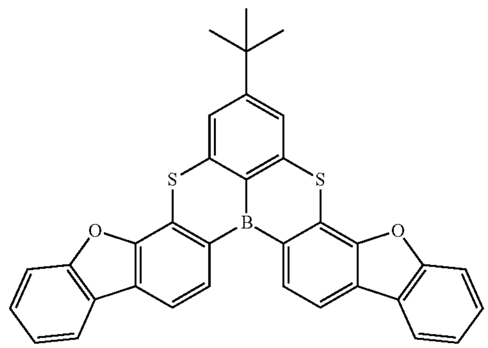
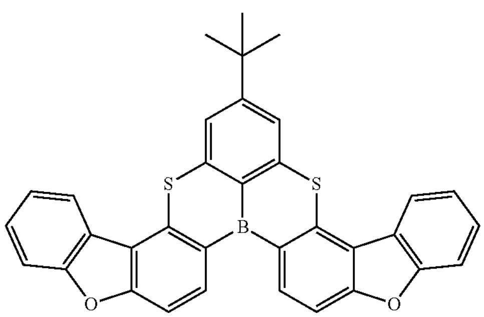
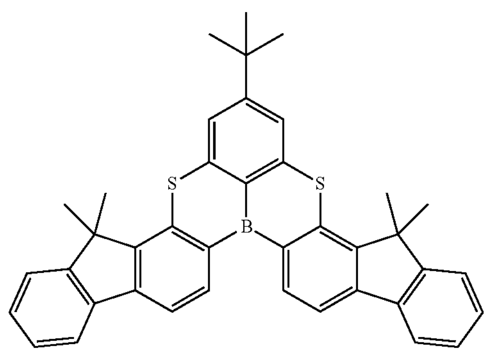
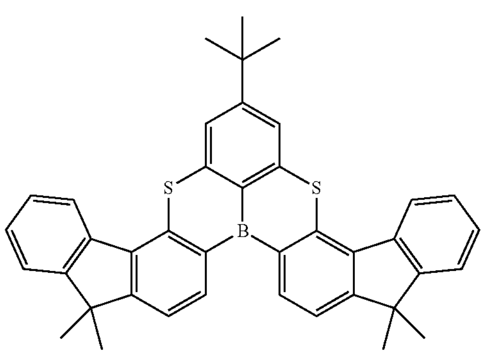
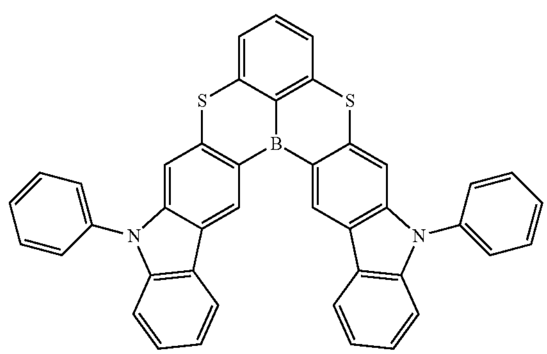

-continued
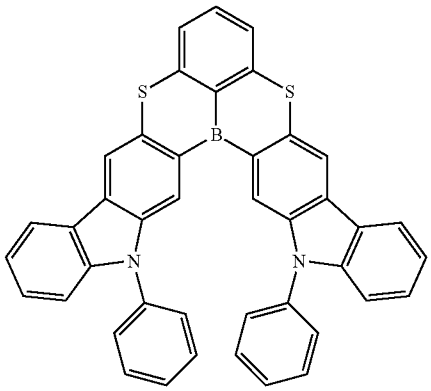
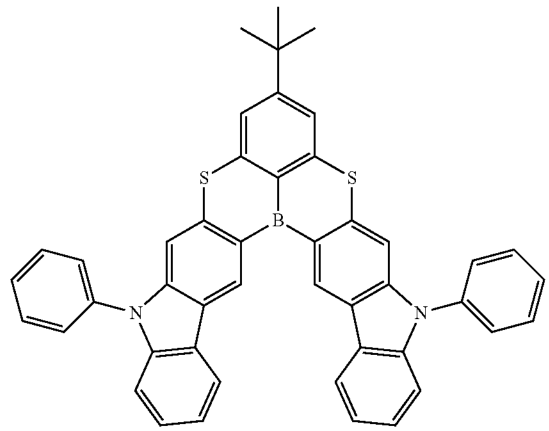
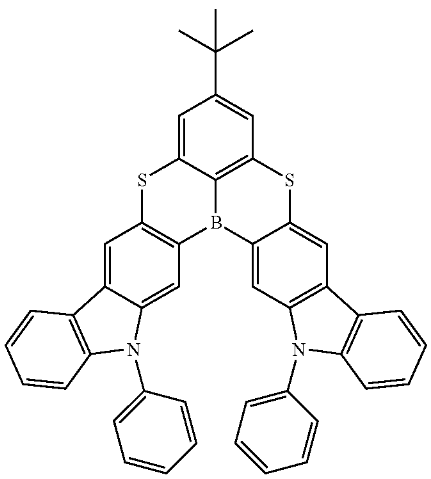
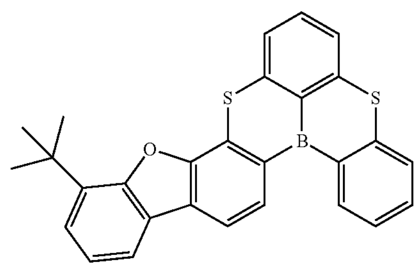
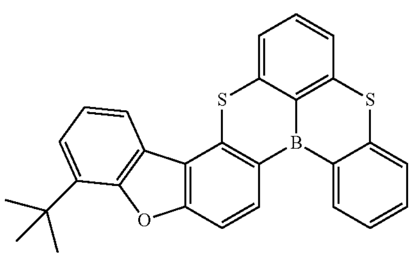
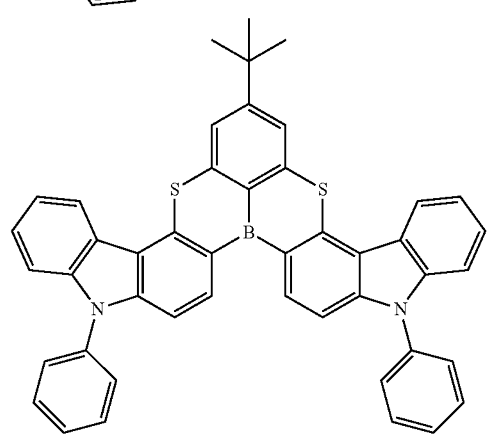
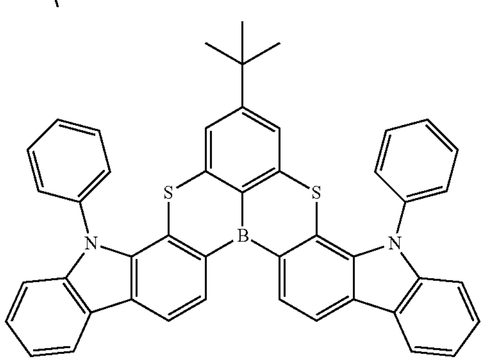
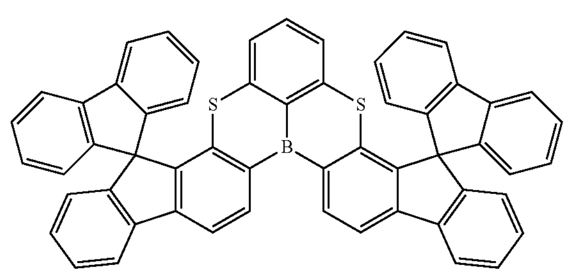

-continued
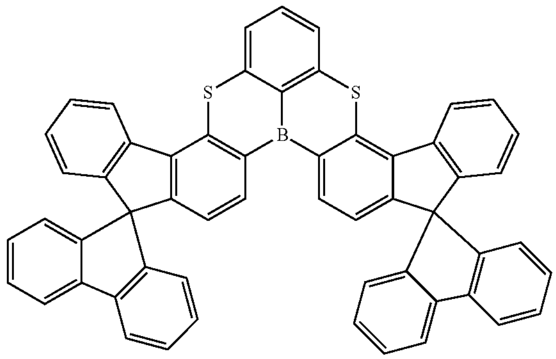
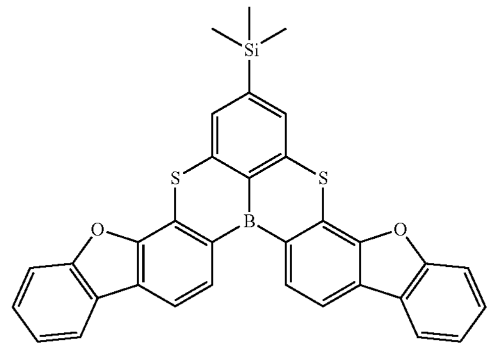
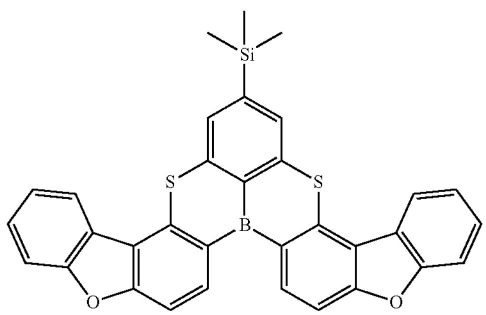
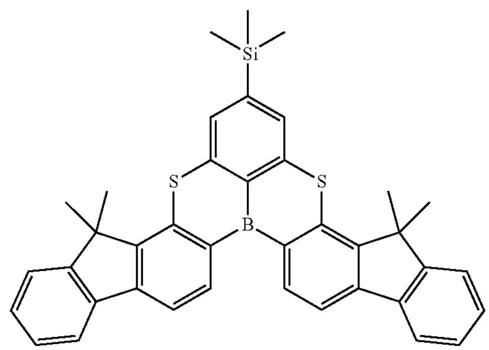
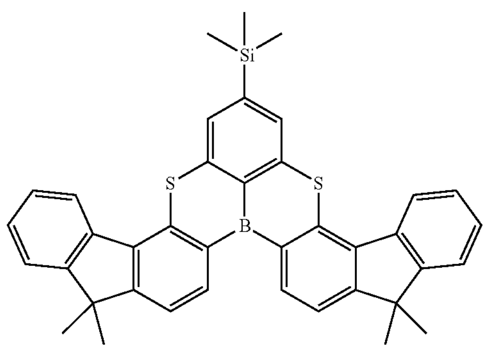
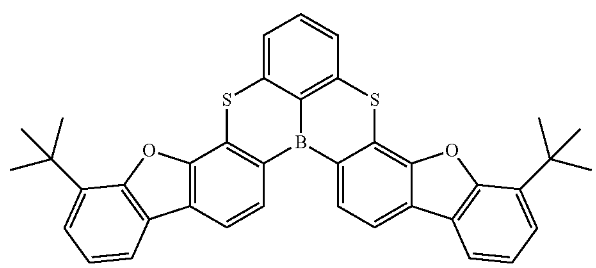
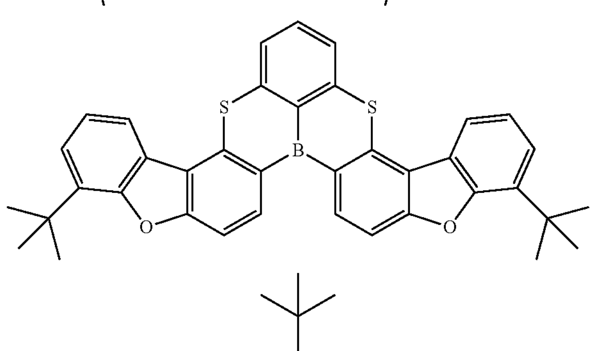
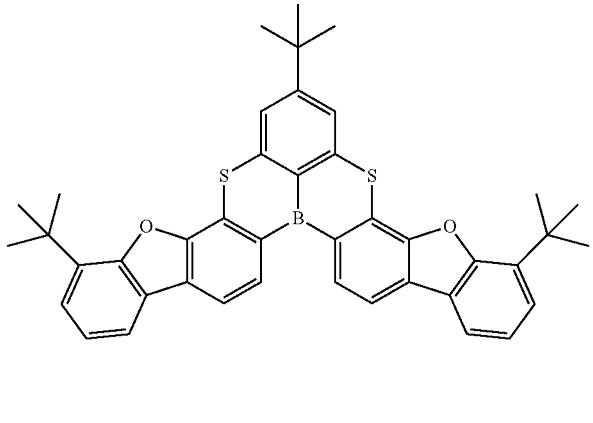

-continued
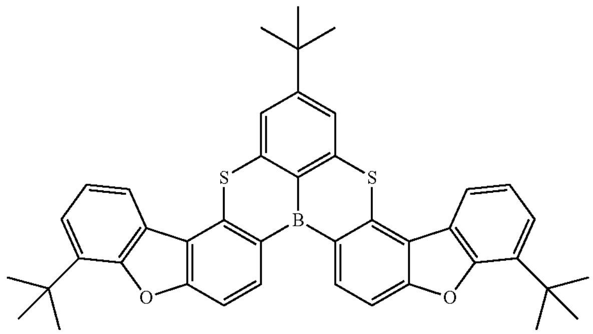
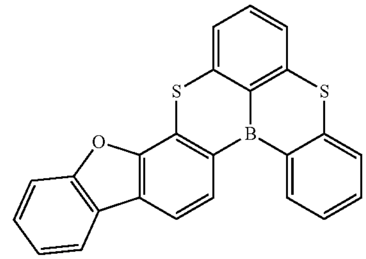
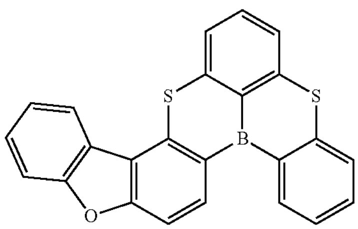
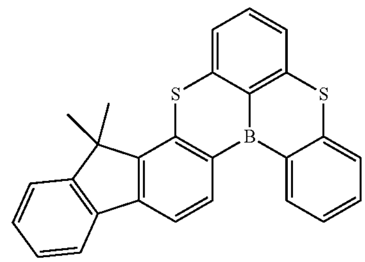
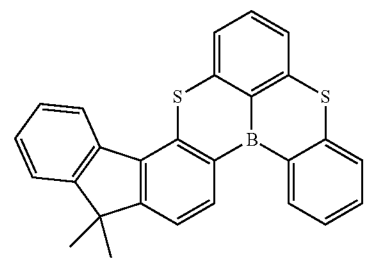
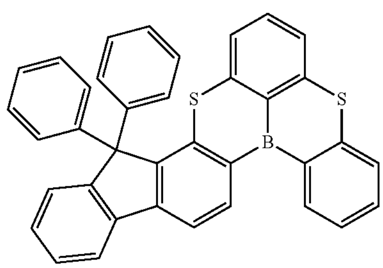
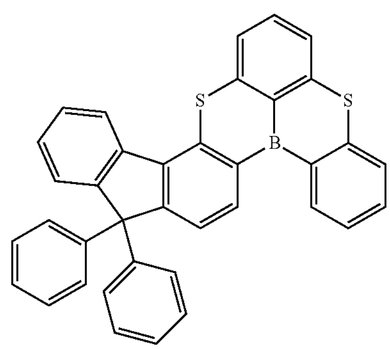
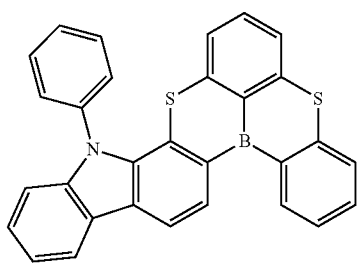
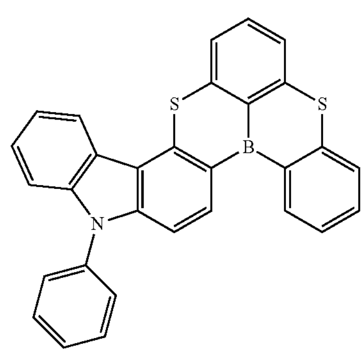
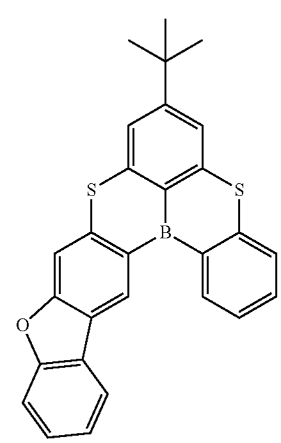

-continued
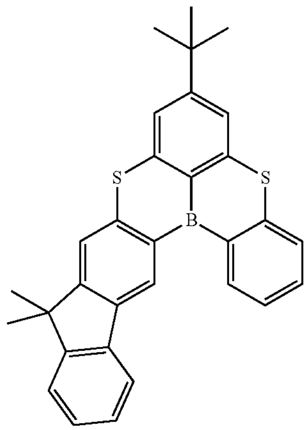
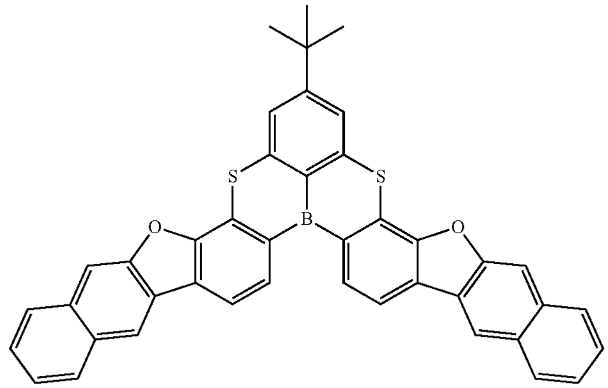
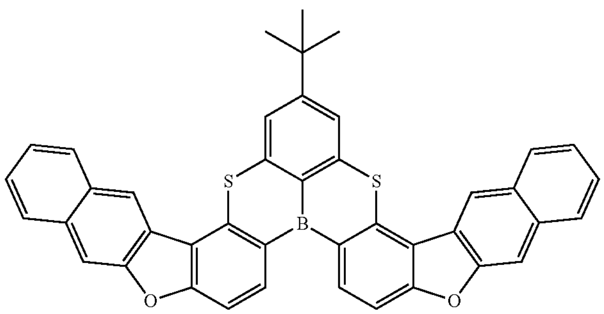
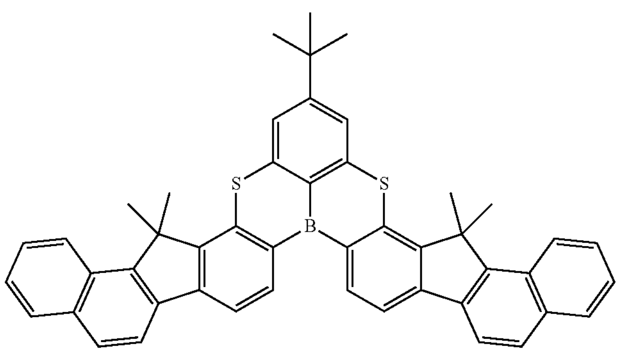
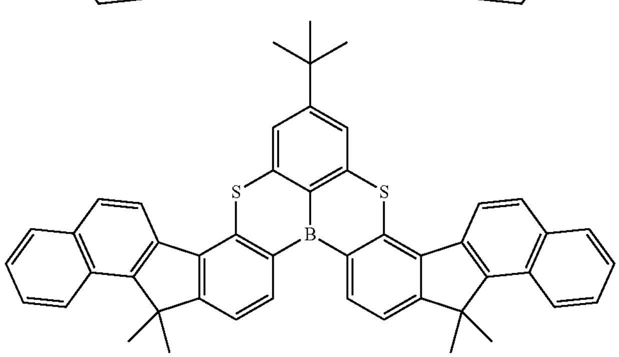
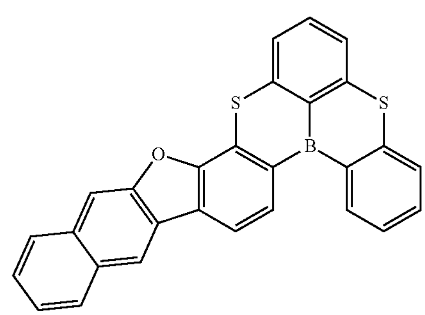
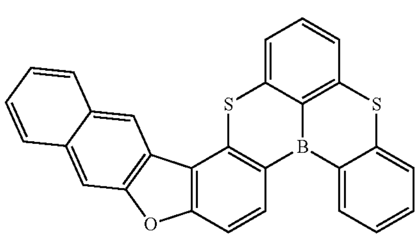
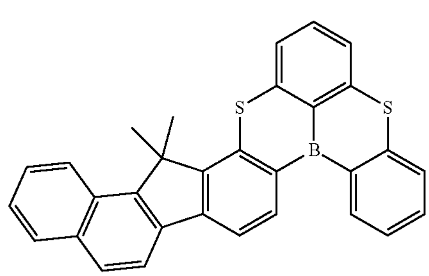

-continued
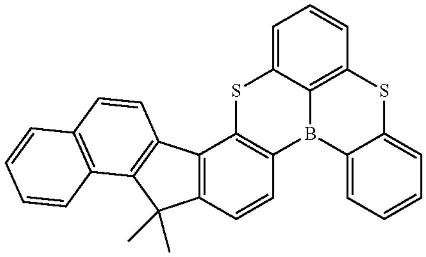
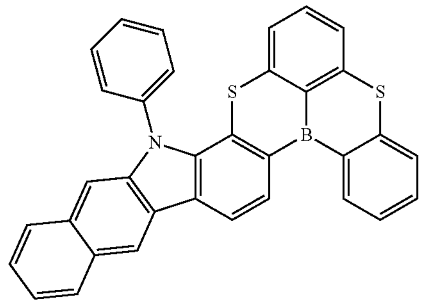
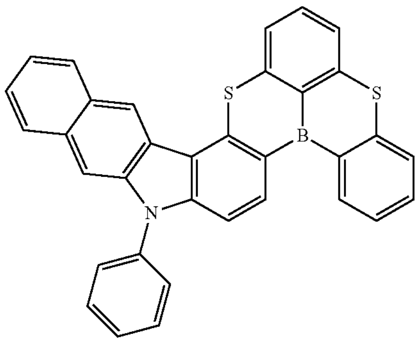
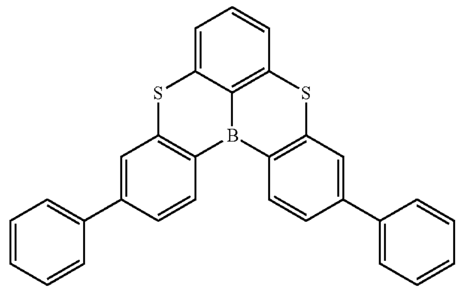
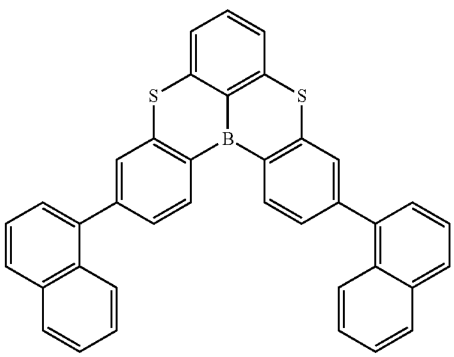
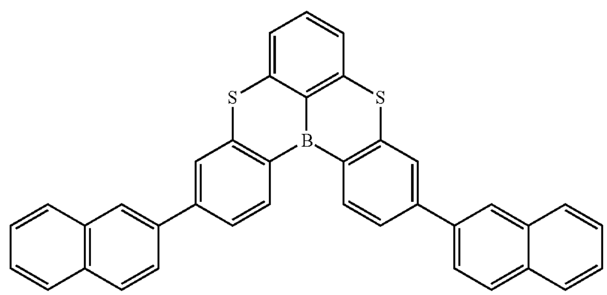
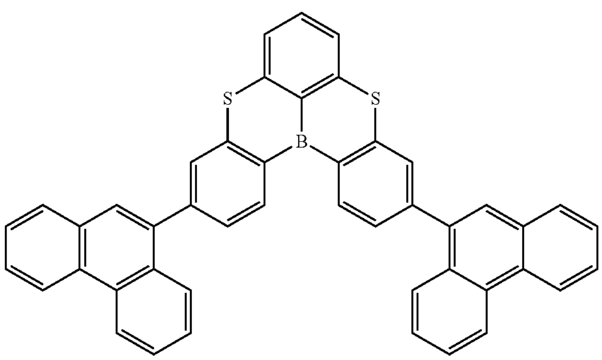
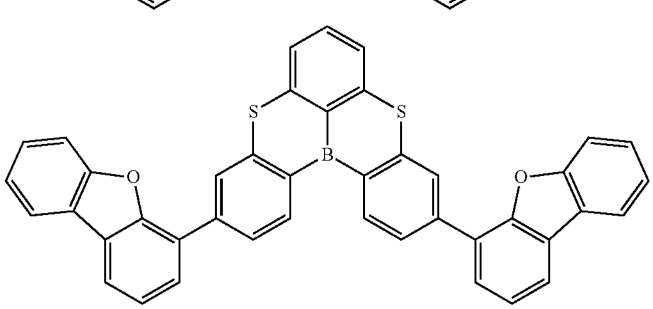

-continued
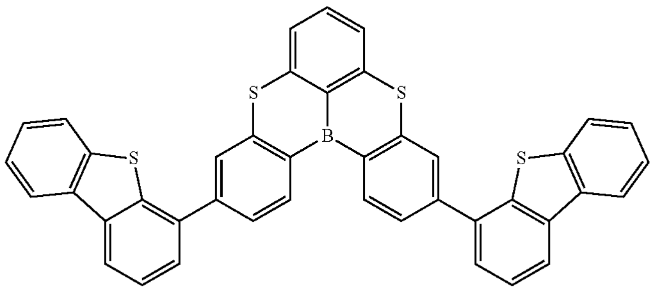
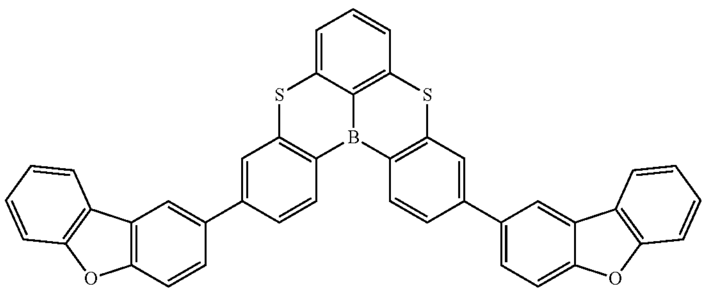
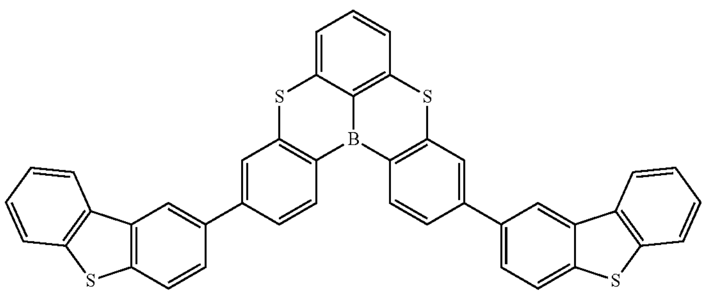
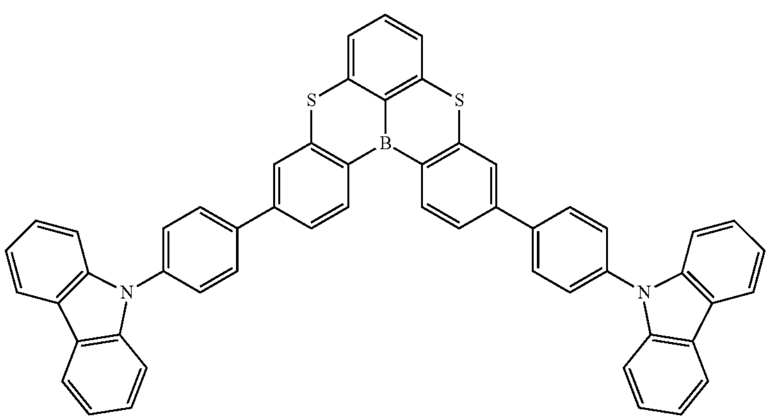
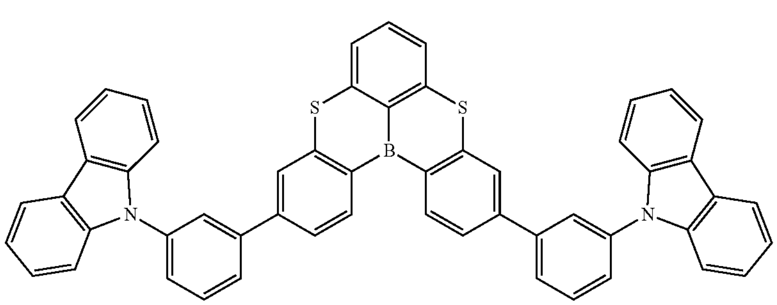

-continued
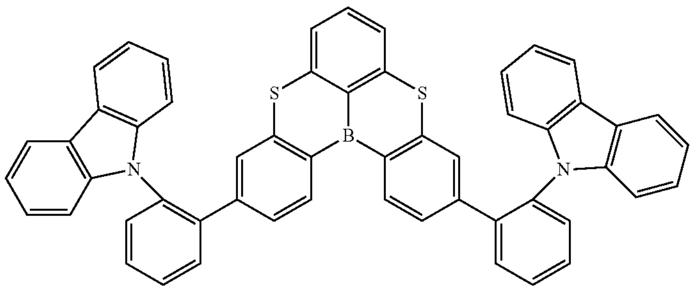
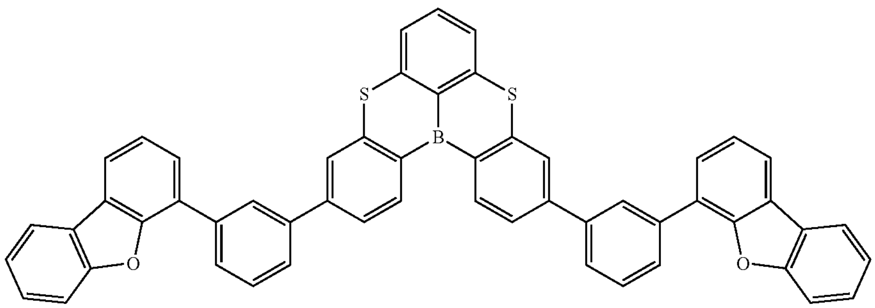
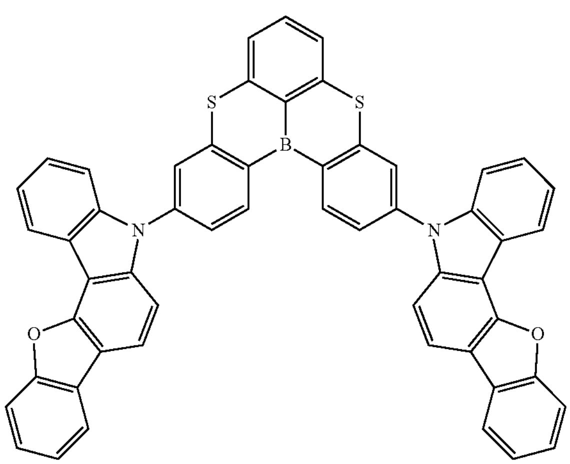
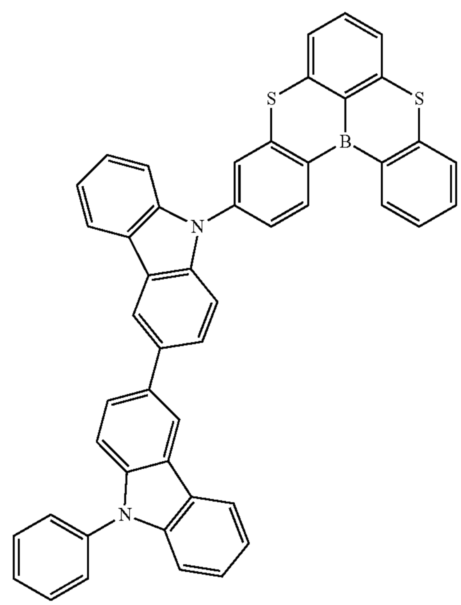
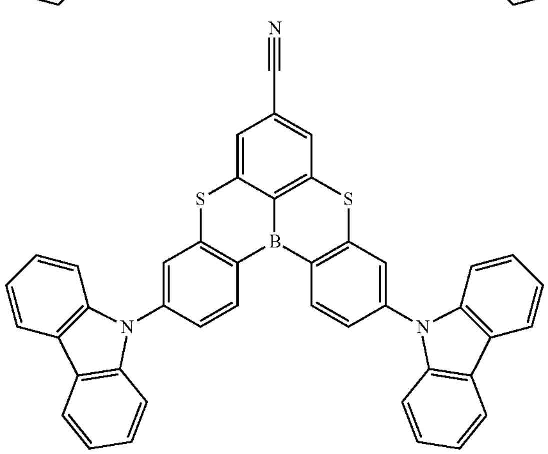

-continued
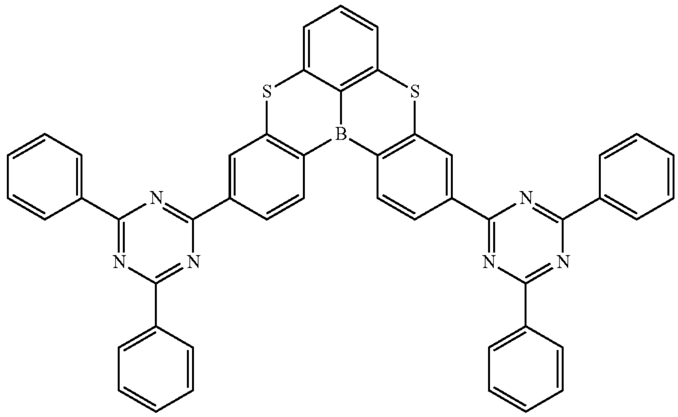
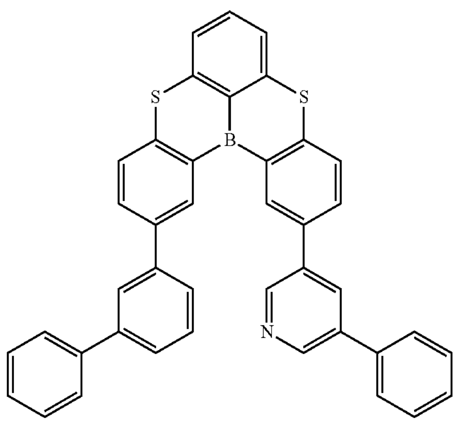
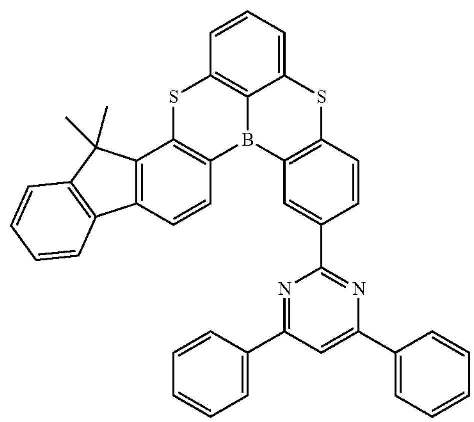
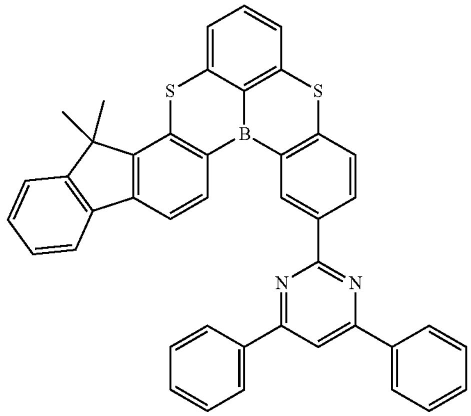
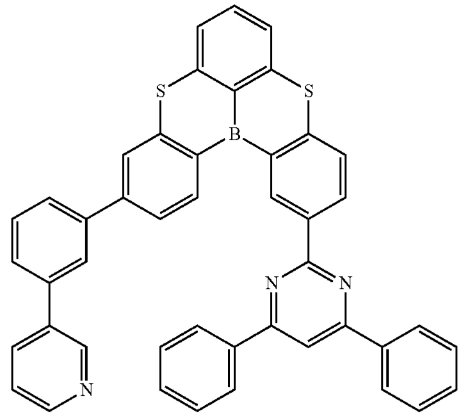

-continued

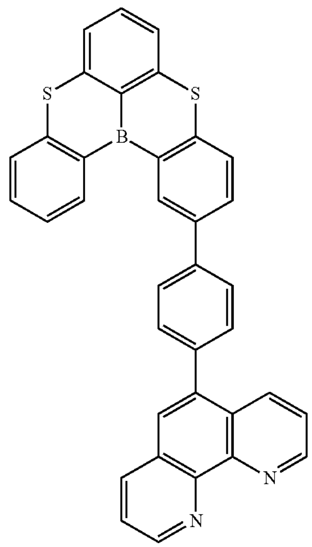

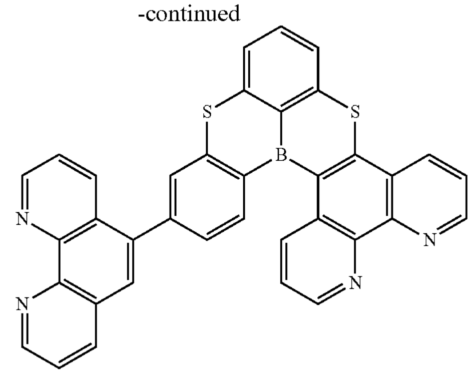

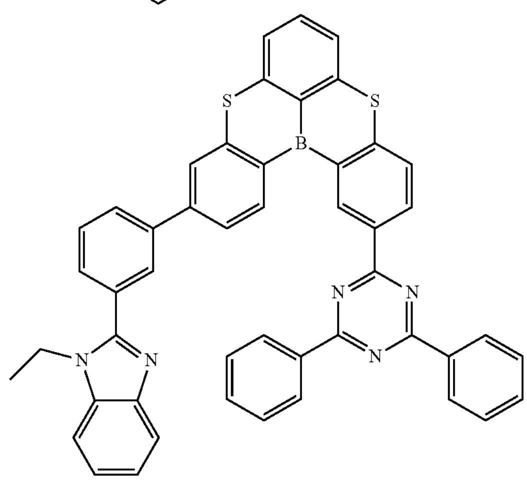

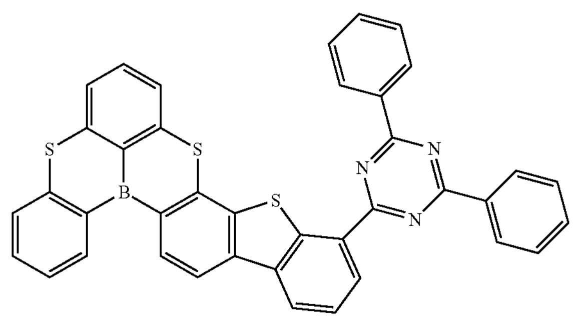

The compound represented by the formula (1) can be synthesized, for example, in the same manner as the reactions of the examples described later by using known alternative reactions and starting materials in accordance with the target compound.

The compound represented by the formula (1) is useful as a material for an organic EL device.

The use of the compound represented by the formula (1) as a material for a light-emitting layer of an organic EL device improves the light-emitting efficiency of the obtained organic EL device.

The compound represented by the formula (1) is also preferably used as a material for an electron transport layer of an organic EL device.

The material for an organic EL device according to one aspect of the present invention comprises the compound represented by the formula (1).

<Organic Electroluminescence Device>

The organic EL device according to one aspect of the present invention has a cathode, an anode, and at least one organic layer provided between the cathode and the anode, where at least one layer of the at least one organic layer contains the compound represented by the formula (1).

The use of the compound represented by the formula (1) in a prescribed organic layer, for example in a light-emitting layer, improves the light-emitting efficiency of the organic EL device.

In one embodiment, at least one layer of the at least one organic layer is a light-emitting layer.

The organic EL device according to one aspect of the present invention has a cathode, an anode, and at least one organic layer provided between the cathode and the anode, where at least one layer of the at least one organic layer contains a dopant material and the dopant material comprises the compound represented by the formula (1).

In this specification, the "at least one organic layer provided between a cathode and an anode" means, the single layer when a single organic layer is present between a cathode and an anode, and at least one of the organic layers when two or more organic layers are present.

Also, the description "at least one layer of the at least one organic layer is a light-emitting layer" means that the single layer is a light-emitting layer when a single organic layer is present between a cathode and an anode, and that at least one of the layers is a light-emitting layer when two or more organic layers are present.

In one embodiment, the organic EL device has a hole transport layer between the anode and the light-emitting layer.

In one embodiment, the organic EL device has an electron transport layer between the cathode and the light-emitting layer.

In this specification, the "at least one layer between a light-emitting layer and an anode" means the single layer when a single layer is present between a light-emitting layer and an anode, and at least one layer when two or more organic layers are present. For example, when two or more organic layers are present between a light-emitting layer and an anode, the organic layer on the side closer to the light-emitting layer is called a "hole transport layer" and the organic layer on the side closer to the anode is called a "hole injection layer". The number of the respective "hole transport layer" and the "hole injection layer" may be one, or two or more, and it is also possible that the number of one of the layers is one and the number of the other layer is two or more.

Similarly, the "at least one layer between a light-emitting layer and a cathode" means the single layer when a single layer is present between a light-emitting layer and a cathode, and at least one of the layers when two or more organic layers are present. For example, when two or more organic layers are present between a light-emitting layer and a cathode, the organic layer on the side closer to the light-emitting layer is called an "electron transport layer" and the organic layer on the side closer to the cathode is called an "electron injection layer". The number of the respective "electron transport layer" and the "electron injection layer" may be one, or two or more, and it is also possible that the number of one of the layers is one and the number of the other layer is two or more.

In one embodiment, the light-emitting layer further contains a compound represented by the following formula (10).

In one embodiment, the light-emitting layer further contains a compound represented by the following formula (10) (hereinafter, the compound represented by the formula (10) may be called "compound (10)").

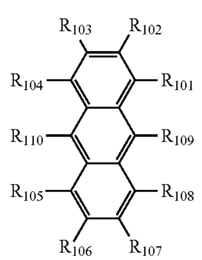

(10)

[In the formula (10), one or more sets of two or more adjacent groups among $R_{101}$ to $R_{110}$ form a substituted or unsubstituted saturated or unsaturated ring, or do not form a substituted or unsubstituted saturated or unsaturated ring.

$R_{101}$ to $R_{110}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{121})(R_{122})(R_{123})$, —$C(=O)R_{124}$, —$COOR_{125}$, —$N(R_{126})(R_{127})$, a halogen atom, a cyano group, a nitro group, a substituted or unsubstituted aryl group having 6 to 50 ring carbon atoms, a substituted or unsubstituted monovalent heterocyclic group having 5 to 50 ring atoms, or a group represented by the formula (31) below.

$R_{121}$ to $R_{127}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms. When the $R_{121}$ to $R_{127}$ are present in a number of two or more, the respective two or more $R_{121}$ to $R_{127}$ may be the same or different.

At least one of $R_{101}$ to $R_{110}$ which do not form the substituted or unsubstituted saturated or unsaturated ring is a group represented by the formula (31) below. When two or more groups represented by the formula (31) are present, the respective two or more groups represented by the formula (31) may be the same or different.

$$-L_{101}-Ar_{101} \quad (31)$$

(In the formula (31), $L_{101}$ is a single bond, a substituted or unsubstituted arylene group having 6 to 30 ring carbon atoms, or a substituted or unsubstituted divalent heterocyclic group having 5 to 30 ring atoms.

$Ar_{101}$ is a substituted or unsubstituted aryl group having 6 to 50 ring carbon atoms, or a substituted or unsubstituted monovalent heterocyclic group having 5 to 50 ring atoms.)]

Specific examples of the substituents, arbitrary substituents, and halogen atoms in the compound (10) are the same as those described above.

The description "one or more sets of two or more adjacent groups among $R_{101}$ to $R_{110}$ form a substituted or unsubstituted saturated or unsaturated ring" is explained below.

"One set of two or more adjacent groups among $R_{101}$ to $R_{110}$" means the set of $R_{101}$ and $R_{102}$, $R_{102}$ and $R_{103}$, $R_{103}$ and $R_{104}$, $R_{105}$ and $R_{106}$, $R_{106}$ and $R_{107}$, $R_{107}$ and $R_{108}$, $R_{108}$ and $R_{109}$, $R_{101}$ and $R_{102}$ and $R_{103}$, or the like, for example.

The substituents when the "substituted or unsubstituted" saturated or unsaturated ring is "substituted" are the same as the aforementioned arbitrary substituents in the formula (10).

A "saturated or unsaturated ring" means, in the case where $R_{101}$ and $R_{102}$ form a ring, for example, a ring formed by a carbon atom to which $R_{101}$ is bonded and a carbon atom to which $R_{102}$ is bonded and one or more arbitrary elements. Specifically, when $R_{101}$ and $R_{102}$ form a ring, a benzene ring is formed by $R_{101}$ and $R_{102}$ when an unsaturated ring is formed by a carbon atom to which $R_{101}$ is bonded, a carbon atom to which $R_{102}$ is bonded, and four carbon atoms.

The "arbitrary element" is preferably a C element, an N element, an O element, or an S element. In the arbitrary element (in the case of a C element or an N element, for example), a valence bond which does not form a ring may be terminated with a hydrogen atom or the like.

The "one or more arbitrary elements" are preferably 2 or more and 15 or less, more preferably 3 or more and 12 or less, even more preferably 3 or more and 5 or less arbitrary elements.

For example, the set of $R_{1001}$ and $R_{102}$ and the set of $R_{105}$ and $R_{106}$ may form rings, respectively, at the same time. In this case, the compound represented by the formula (10) is a compound represented by the following formula (10A), for example.

(10A)

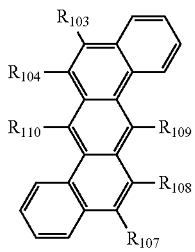

In one embodiment, $R_{101}$ to $R_{110}$ are each independently a hydrogen atom, a substituted or unsubstituted alkyl group having 1 to 50 carbon atoms, a substituted or unsubstituted aryl group having 6 to 50 ring carbon atoms, a substituted or unsubstituted heterocyclic group having 5 to 50 ring atoms, or a group represented by the formula (31).

In one embodiment, $R_{101}$ to $R_{110}$ are each independently a hydrogen atom, a substituted or unsubstituted aryl group having 6 to 50 ring carbon atoms, a substituted or unsubstituted heterocyclic group having 5 to 50 ring atoms, or a group represented by the formula (31).

In one embodiment, $R_{101}$ to $R_{110}$ are each independently a hydrogen atom, a substituted or unsubstituted aryl group having 6 to 18 ring carbon atoms, a substituted or unsubstituted heterocyclic ring having 5 to 18 ring atoms, or a group represented by the formula (31).

In one embodiment, at least one of $R_{109}$ and $R_{110}$ is a group represented by the formula (31).

In one embodiment, $R_{109}$ and $R_{110}$ are each independently a group represented by the formula (31).

In one embodiment, the compound (10) is a compound represented by the following formula (10-1).

(10-1)

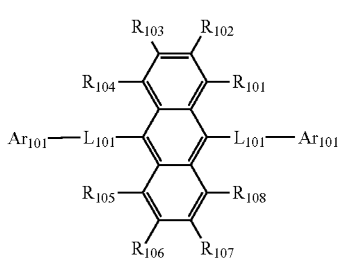

In the formula (10-1), $R_{101}$ to $R_{108}$, $L_{101}$, and $Ar_{101}$ are as defined in the formula (10).

In one embodiment, the compound (10) is a compound represented by the following formula (0-2).

(10-2)

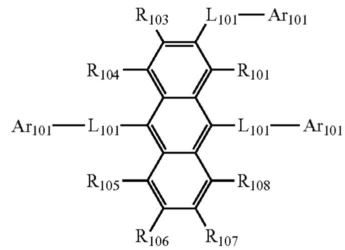

In the formula (10-2), $R_{101}$, $R_{103}$ to $R_{108}$, $L_{101}$, and $Ar_{101}$ are as defined in the formula (10).

In one embodiment, the compound (10) is a compound represented by the following formula (10-3).

(10-3)

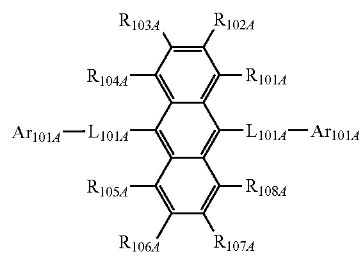

In the formula (10-3), $R_{101A}$ to $R_{106A}$ are each independently a hydrogen atom, or a substituted or unsubstituted aryl group having 6 to 50 ring carbon atoms.

$L_{101A}$ is a single bond, or a substituted or unsubstituted arylene group having 6 to 30 ring carbon atoms. The two $L_{101A}$ may be the same or different.

$Ar_{101A}$ is a substituted or unsubstituted aryl group having 6 to 50 ring carbon atoms. The two $Ar_{101A}$ may be the same or different.

In one embodiment, the compound (10) is a compound represented by the following formula (10-4).

(10-4)

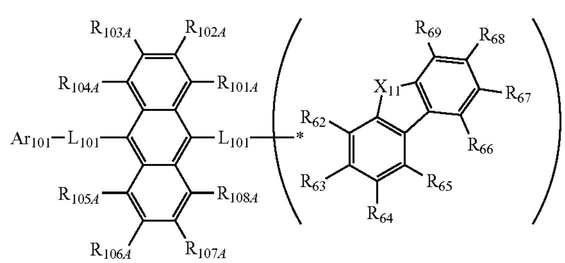

In the formula (10-4), $L_{101}$ and $Ar_{101}$ are as defined in the formula (10).

$R_{101A}$ to $R_{108A}$ are each independently a hydrogen atom, or a substituted or unsubstituted aryl group having 6 to 50 ring carbon atoms.

$X_{11}$ is O, S, or $N(R_{51})$.

$R_{61}$ is a hydrogen atom, a substituted or unsubstituted alkyl group having 1 to 50 carbon atoms, or a substituted or unsubstituted aryl group having 6 to 50 ring carbon atoms.

One of $R_{62}$ to $R_{69}$ is a valence bond bonded to $L_{101}$.

One or more sets of adjacent groups among $R_{62}$ to $R_{69}$ that are not bonded to $L_{101}$ form a substituted or unsubstituted saturated or unsaturated ring, or do not form a substituted or unsubstituted saturated or unsaturated ring.

$R_{62}$ to $R_{69}$ which are not bonded to $L_{101}$ and do not form the substituted or unsubstituted saturated or unsaturated ring are each independently a hydrogen atom, a substituted or unsubstituted alkyl group having 1 to 50 carbon atoms, or a substituted or unsubstituted aryl group having 6 to 50 ring carbon atoms.

In one embodiment, the compound (10) is a compound represented by the following formula 10-4A).

(10-4A)

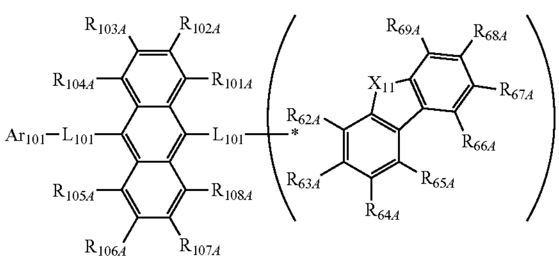

In the formula (10-4A), $L_{101}$ and $Ar_{101}$ are as defined In the formula (10).

$R_{101A}$ to $R_{106A}$ are each independently a hydrogen atom, or a substituted or unsubstituted aryl group having 6 to 50 ring carbon atoms.

$X_{11}$ is O, S, or $N(R_{61})$.

$R_{61}$ is a hydrogen atom, a substituted or unsubstituted alkyl group having 1 to 50 carbon atoms, or a substituted or unsubstituted aryl group having 6 to 50 ring carbon atoms.

One or more sets of two or more adjacent groups among $R_{62A}$ to $R_{69A}$ form a substituted or unsubstituted saturated or unsaturated ring, or do not form a substituted or unsubstituted saturated or unsaturated ring, with the proviso that two adjacent groups among $R_{62A}$ to $R_{69A}$ form a ring represented by the formula (10-4A-1) below.

$R_{62A}$ to $R_{69A}$ which do not form a substituted or unsubstituted saturated or unsaturated ring are each independently a hydrogen atom, a substituted or unsubstituted alkyl group having 1 to 50 carbon atoms, or a substituted or unsubstituted aryl group having 6 to 50 ring carbon atoms.

(10-4A-1)

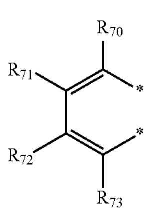

(In the formula (10-4A-1),

The two valence bonds * are bonded to two adjacent groups among $R_{62A}$ to $R_{69A}$, respectively.

One of $R_{70}$ to $R_{73}$ is a valence bond bonded to $L_{101}$.

$R_{70}$ to $R_{73}$ not bonded to $L_{101}$ are each independently a hydrogen atom, a substituted or unsubstituted alkyl group having 1 to 50 carbon atoms, or a substituted or unsubstituted aryl group having 6 to 50 ring carbon atoms.)

In one embodiment, the compound (10) is a compound represented by the following formula (10-6).

(10-6)

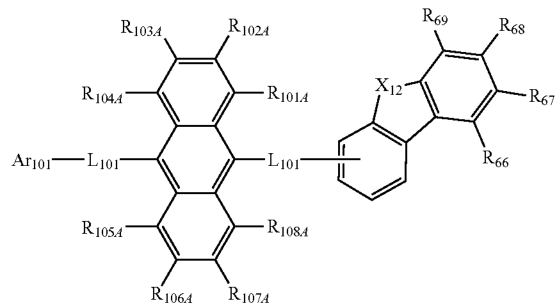

In the formula (10-6), $L_{101}$ and $Ar_{101}$ are as defined in the formula (10).

$R_{101A}$ to $R_{106A}$ are as defined in the formula (10-4).

$R_{66}$ to $R_{69}$ are as defined in the formula (10-4).

$X_{12}$ is O or S.

In one embodiment, the compound represented by the formula (10-6) is a compound selected from the following formulae (10-6-1) to (10-4).

(10-6-1)

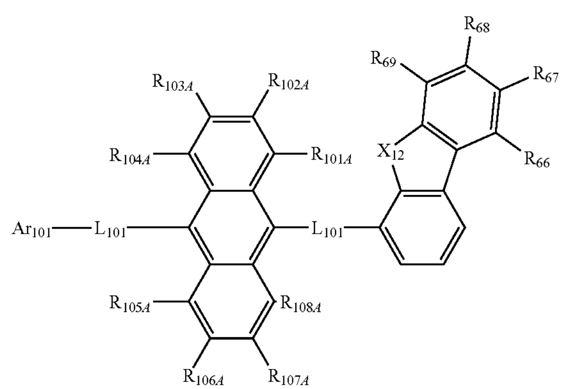

(10-6-2)

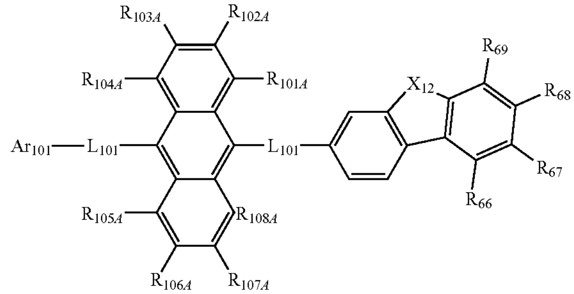

-continued (10-6-3)

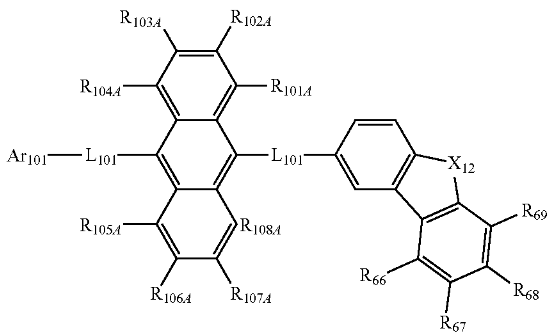

(10-6-4)

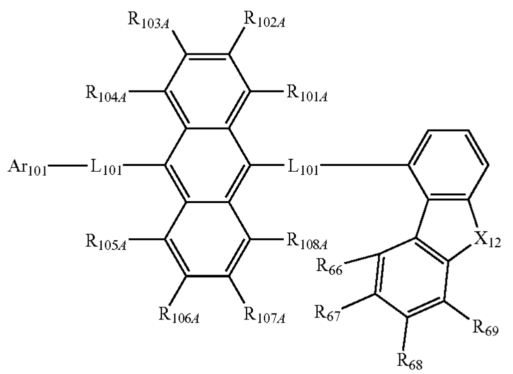

In the formula (10-6-1) to (10-6-4), $L_{101}$ and $Ar_{101}$ are as defined in the formula (10).

$R_{101A}$ and $R_{108A}$ are as defined in the formula (10-4).

$R_{66}$ and $R_{69}$ are as defined in the formula (10-4).

$X_{12}$ is O or S.

In one embodiment, the compound represented by the formula (10-6) is a compound represented by the following formula (10-6H).

(10-6H)

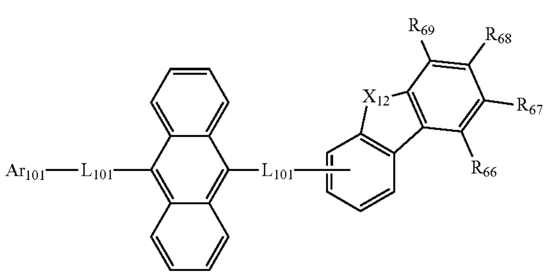

In the formula (10-6H), $L_{101}$ and $Ar_{101}$ are as defined in the formula (10).

$R_{66}$ and $R_{69}$ are as defined in the formula (10-4).

$X_{12}$ is O or S.

In one embodiment, the compound represented by the formula (10-6) or (10-6H) is a compounds represented by the following formula (10-6Ha).

(10-6Ha)

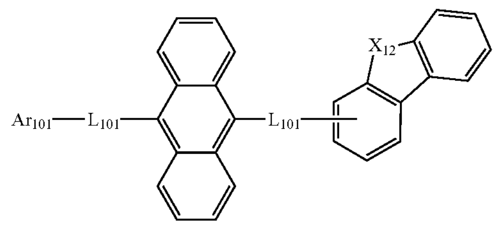

In the formula (10-6Ha), $L_{101}$ and $Ar_{101}$ are as defined in the formula (10).

$X_{12}$ is O or S.

In one embodiment, the compound represented by the formula (10-6), (10-6H), or (10-6Ha) is a compound represented by the following formula (10-6Ha-1) or (10-6Ha-2).

(10-6Ha-1)

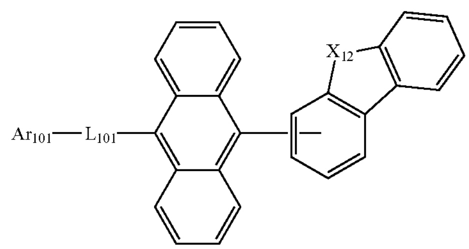

(10-6Ha-2)

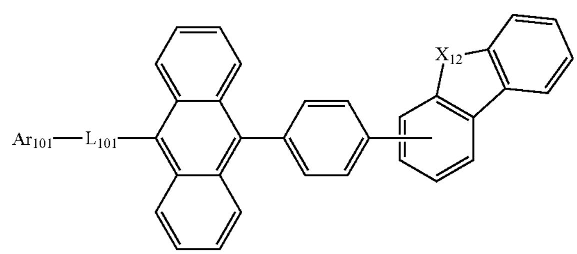

In the formulae (10-6Ha-1) and (10-6Ha-2), $L_{101}$ and $Ar_{101}$ are as defined in the formula (10).

$X_{12}$ is O or S.

In one embodiment, the compound (10) is a compound represented by the following formula (10-7), (10-7)

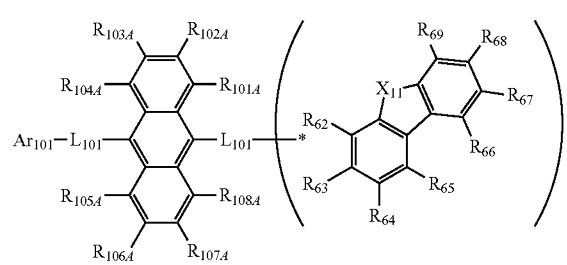

In the formula (10-7), $L_{101}$ and $Ar_{101}$ are as defined in the formula (10).

$R_{101A}$ to $R_{108A}$ are as defined in the formula (10-4).

$X_{11}$ is as defined in the formula (10-4).

$R_{62}$ to $R_{69}$ are as defined in the formula (10-4), with the proviso that the groups of any one set selected from $R_{86}$ and $R_{87}$, $R_{67}$ and $R_{68}$, and $R_{68}$ and $R_{69}$ are bonded to one another and form a substituted or unsubstituted saturated or unsaturated ring.

In one embodiment, the compound (10) is a compound represented by the following formula (10-7H).

(10-7H)

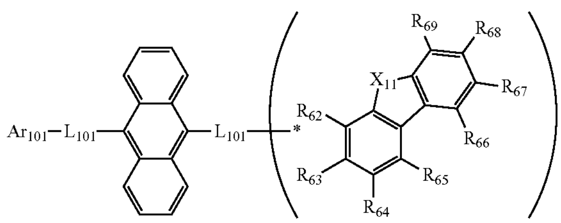

In the formula (10-7H), $L_{101}$ and $Ar_{101}$ are as defined in the formula (10).

$X_{11}$ is as defined in the formula (10-4).

$R_{62}$ to $R_{69}$ are as defined in the formula (10-4), with the proviso that the groups of any one set selected from $R_{66}$ and $R_{67}$, $R_{67}$ and $R_{68}$, and $R_{68}$ and $R_{69}$ are bonded to one another and form a substituted or unsubstituted saturated or unsaturated ring.

In one embodiment, the compound (10) is a compound represented by the following formula (10-8).

(10-8)

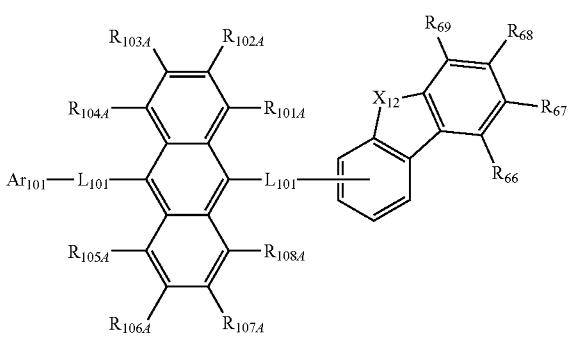

In the formula (10-8), $L_{101}$ and $Ar_{101}$ are as defined in the formula (10).

$R_{101A}$ to $R_{108A}$ are as defined in the formula (10-4).

$X_{12}$ is O or S.

$R_{66}$ to $R_{69}$ are as defined in the formula (10-4), with the proviso that the groups of any one set selected from $R_{66}$ and $R_{67}$, $R_{67}$ and $R_{68}$, and $R_{68}$ and $R_{69}$ are bonded to one another and form a substituted or unsubstituted saturated or unsaturated ring.

In one embodiment, the compound represented by the formula (10-8) is a compound represented by the following formula (10-8H).

(10-8H)

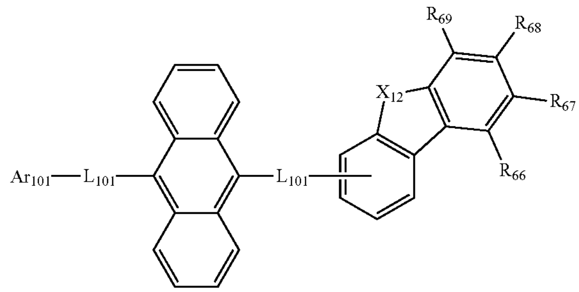

In the formula (10-8H), $L_{101}$ and $Ar_{101}$ are as defined in the formula (10).

$R_{66}$ to $R_{69}$ are as defined in the formula (10-4), with the proviso that the groups of any one set selected from $R_{66}$ and $R_{67}$, $R_{67}$ and $R_{68}$, and $R_{68}$ and $R_{69}$ are bonded to one another and form a substituted or unsubstituted saturated or unsaturated ring. The groups of any one set selected from $R_{66}$ and $R_{67}$, $R_{67}$ and $R_{68}$, and $R_{68}$ and $R_{69}$ are preferably bonded to one another and form an unsubstituted benzene ring.

$X_{12}$ is O or S.

In one embodiment, in the compound represented by the formula (10-7), (10-7H), (10-8) or (10-8H), the groups of any one set selected from $R_{66}$ and $R_{67}$, $R_{67}$ and $R_{68}$, and $R_{68}$ and $R_{69}$ are bonded to one another and form a ring represented by the following formula (10-8-1) or (10-8-2), and $R_{66}$ to $R_{69}$ which do not form the ring represented by the following formula (10-8-1) or (10-8-2) do not form a substituted or unsubstituted saturated or unsaturated ring.

(10-8-1)

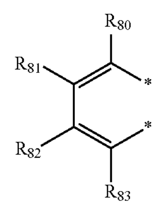

(10-8-2)

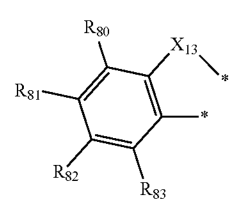

(In the formulae (10-8-1) and (10-8-2), the two valence bonds * are bonded to the groups of any one set selected from $R_{66}$ and $R_{67}$, $R_{67}$ and $R_{68}$, and $R_{68}$ and $R_{69}$, respectively.

$R_{80}$ to $R_{83}$ are each independently a hydrogen atom, a substituted or unsubstituted alkyl group having 1 to 50 carbon atoms, or a substituted or unsubstituted aryl group having 6 to 50 ring carbon atoms.

$X_{13}$ is O or S.)

In one embodiment, the compound (10) is a compound represented by the following formula (10-9).

(10-9)

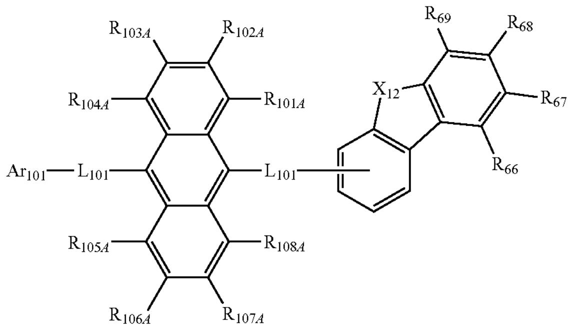

In the formula (10-9), $L_{101}$ and $Ar_{101}$ are as defined in the formula (10).

$R_{101A}$ to $R_{108A}$ are as defined in the formula (10-4).

$R_{66}$ to $R_{69}$ are as defined in the formula (10-4), with the proviso that none of $R_{66}$ and $R_{67}$, $R_{67}$ and $R_{68}$, and $R_{68}$ and $R_{69}$ are bonded to one another or form a substituted or unsubstituted saturated or unsaturated ring.

$X_{12}$ is O or S.

In one embodiment, the compound (10) is selected from the group consisting of compounds represented by the following formulae (10-10-1) to (10-10-4).

(10-10-1)

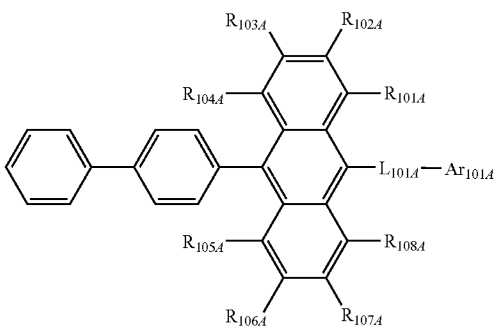

(10-10-2)

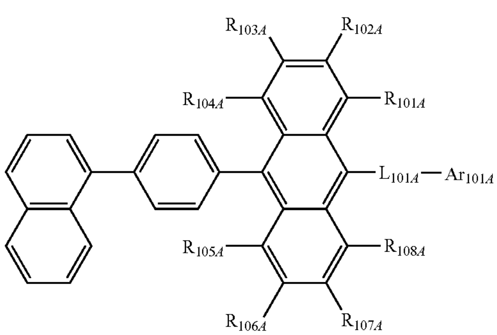

-continued (10-10-3)

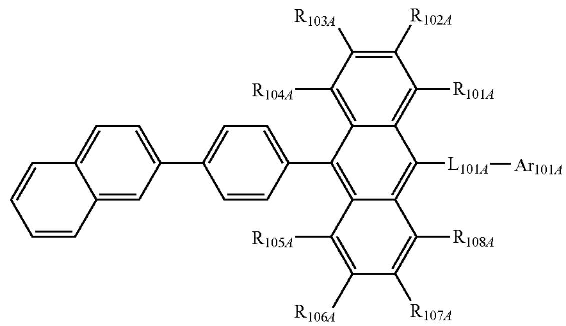

(10-10-4)

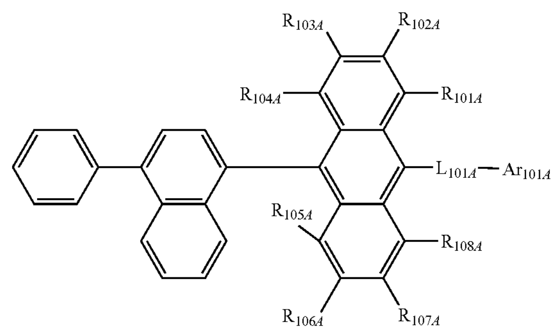

In the formulae (10-10-1) to (10-10-4), $L_{101A}$, $Ar_{101A}$ and $R_{101A}$ to $R_{108A}$ are as defined in the formula (10-3).

In one embodiment, the compounds represented by the formulae (10-10-1) to (10-10-4) are the compounds represented by the following formulae (10-10-1H) to (10-10-4H).

(10-10-1H)

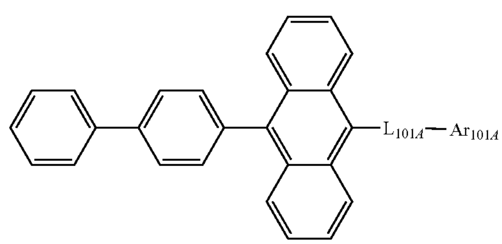

(10-10-2H)

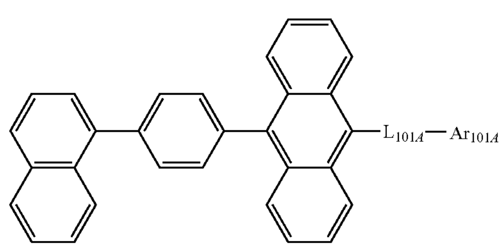

-continued
(10-10-3H)
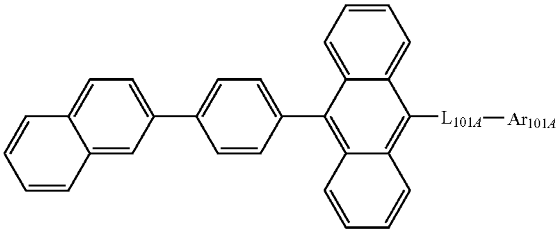
(10-10-4H)
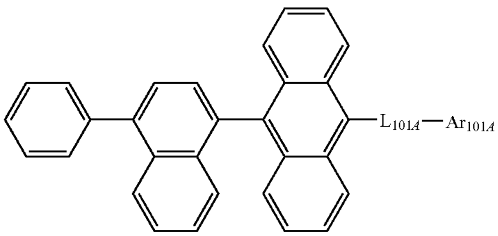
In the formulae (10-10-1H) to (10-10-4H), $L_{101A}$ and $Ar_{101A}$ are as defined in the formula (10-3).
Specific examples of the compound represented by the formula (10) include the following compounds.
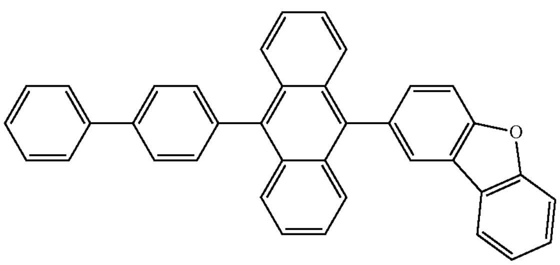
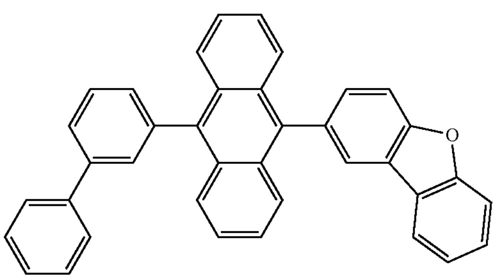
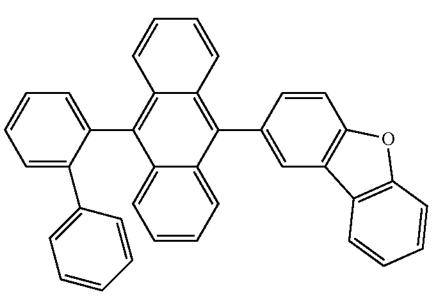
-continued
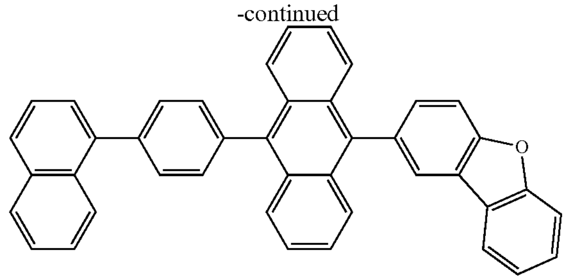
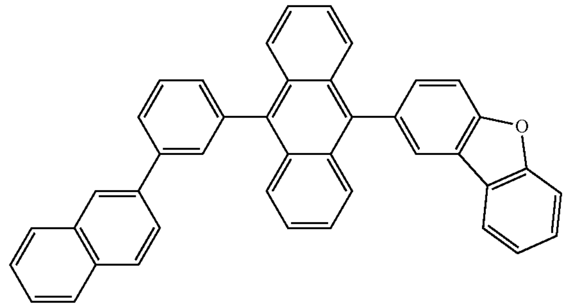
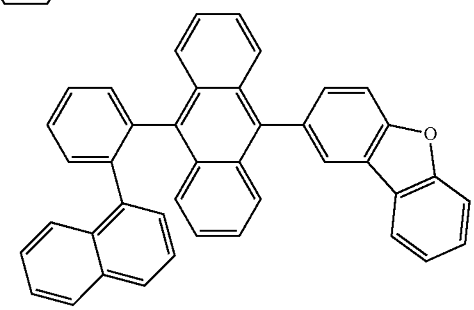
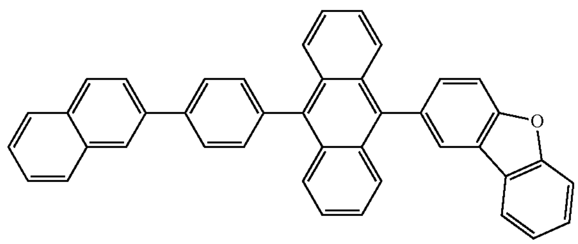
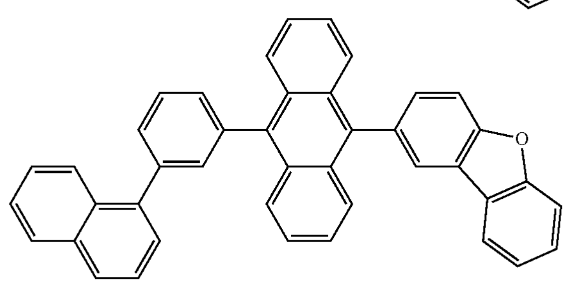
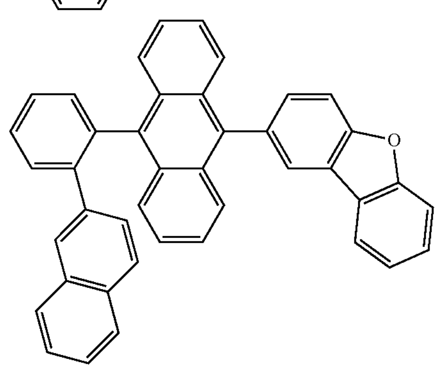

-continued
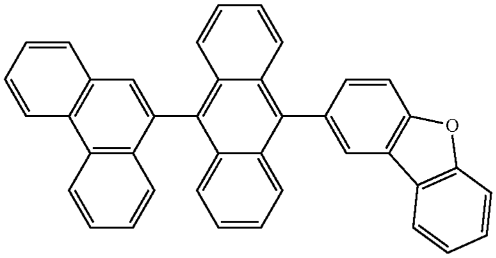
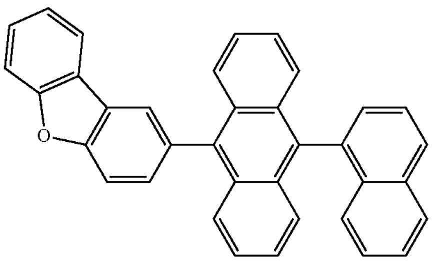
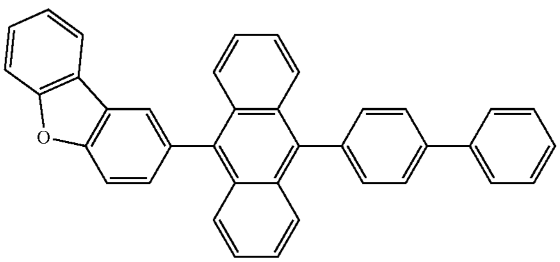
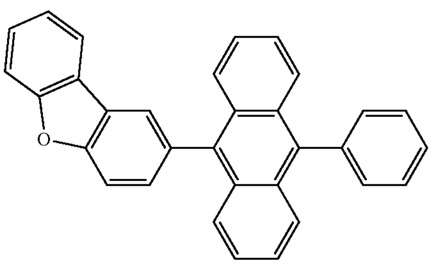
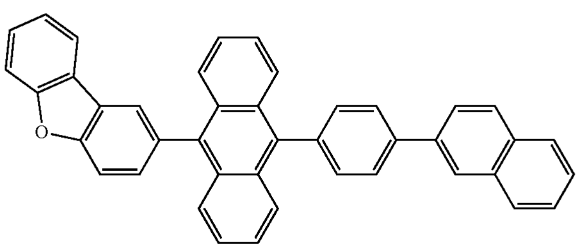
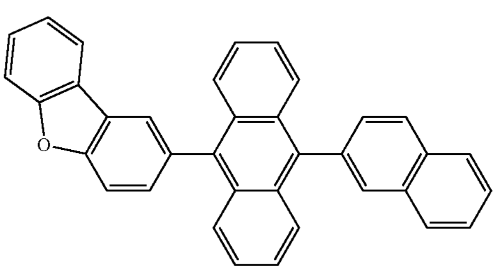
-continued
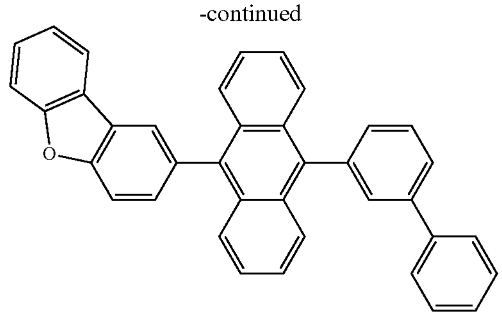
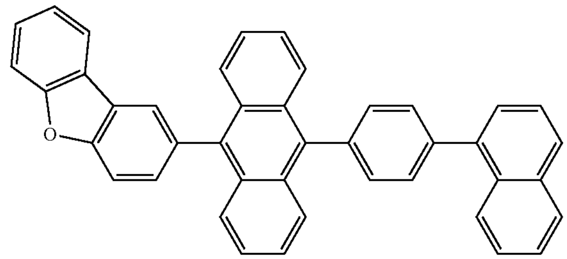
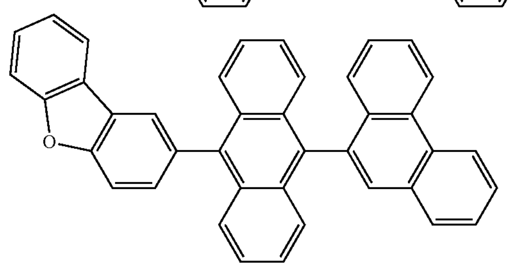
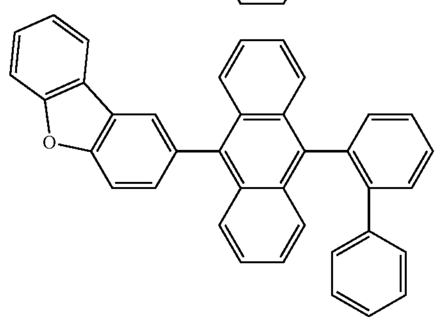
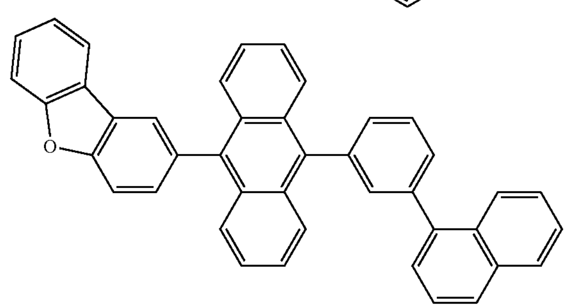
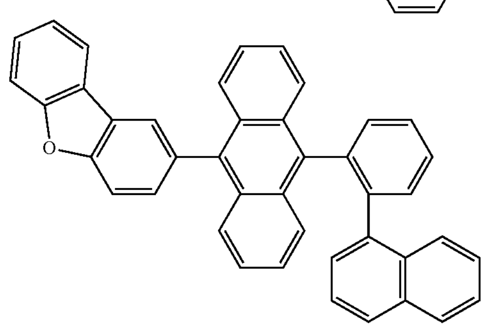

-continued
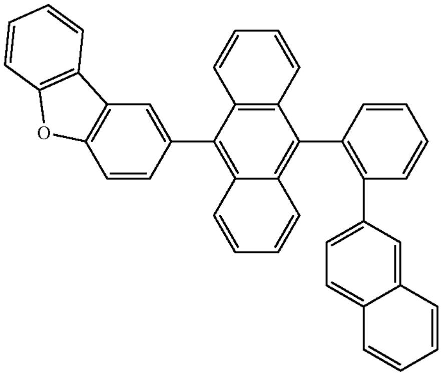
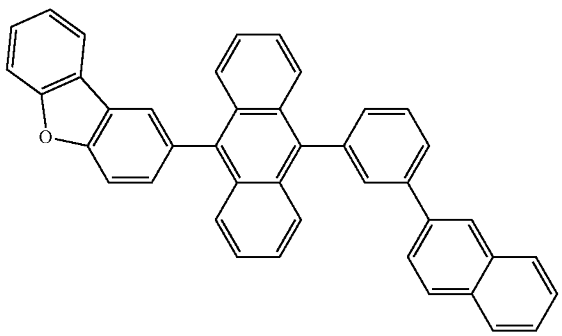
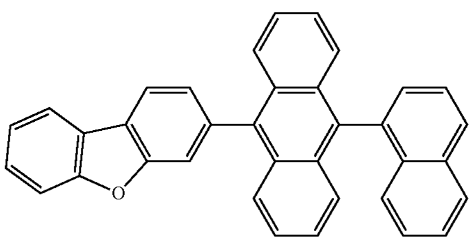
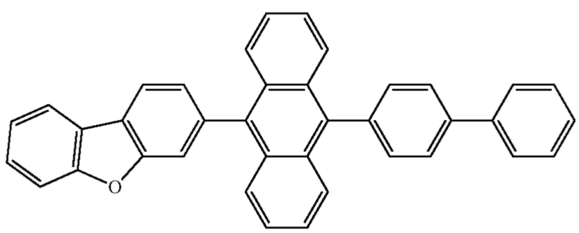
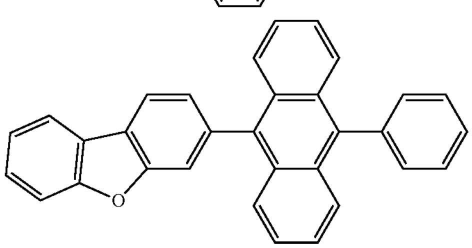
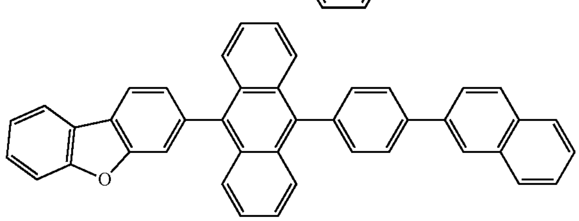
-continued
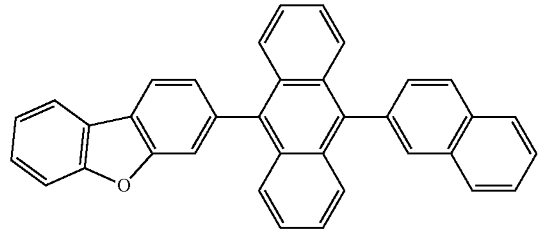
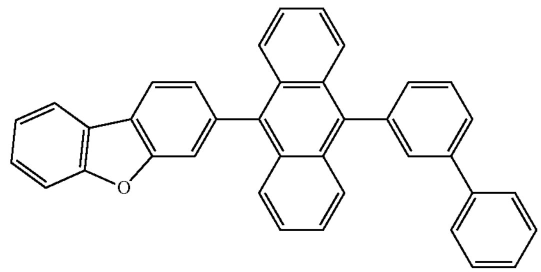
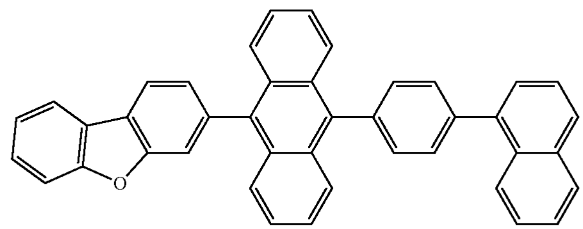
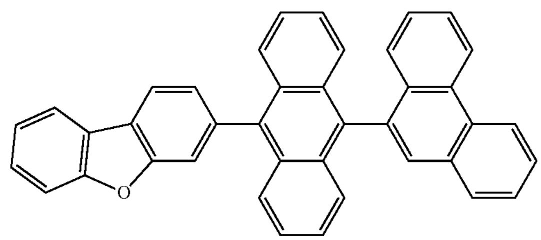
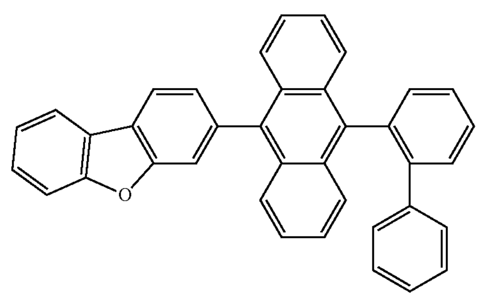
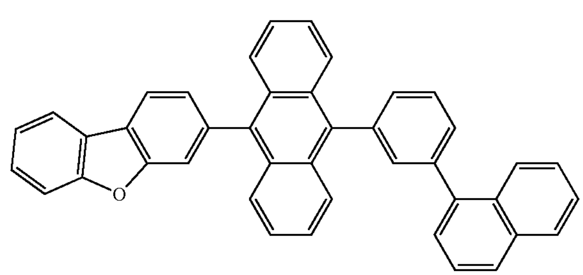

-continued
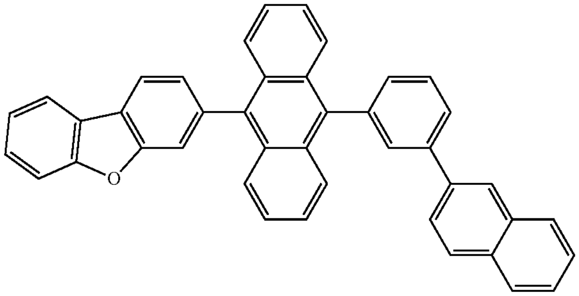
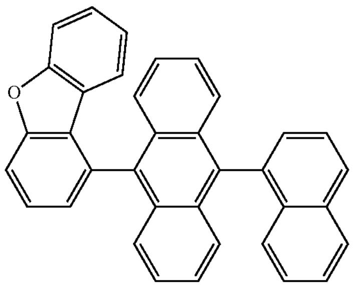
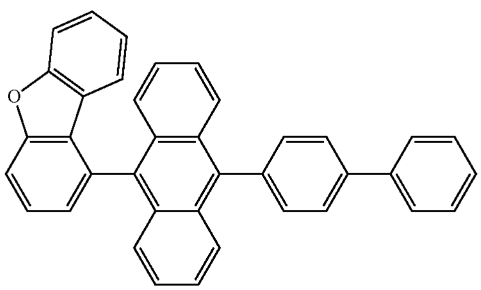
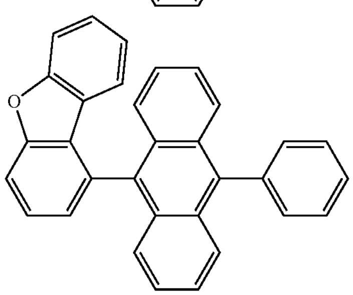
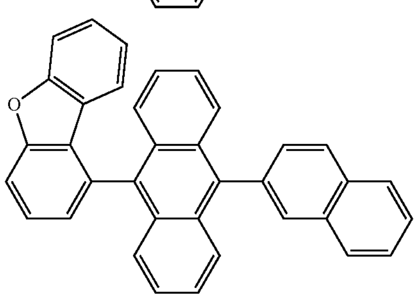
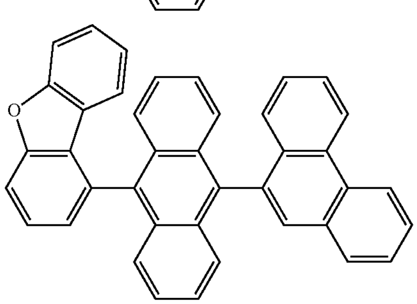
-continued
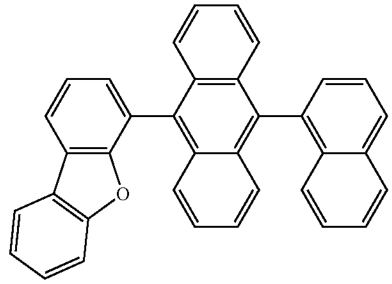
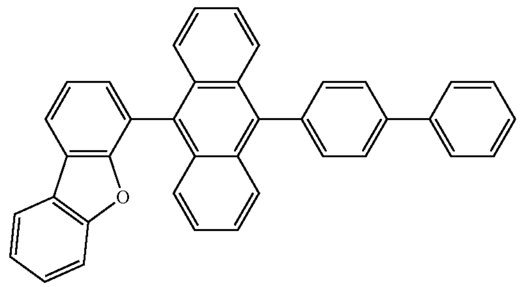
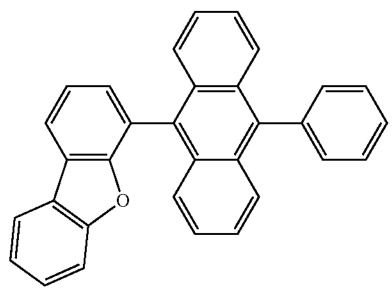
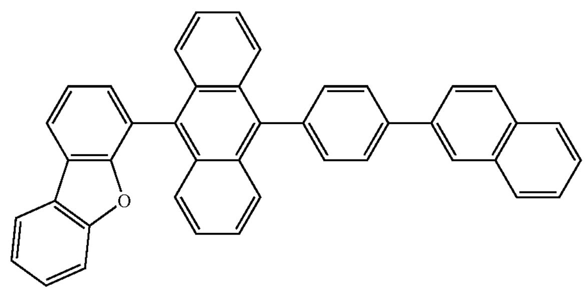
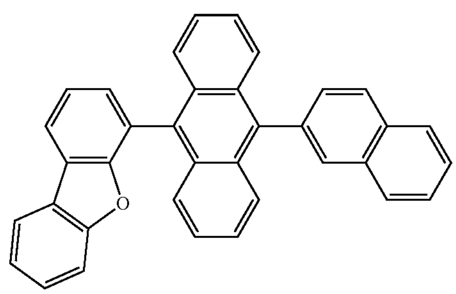
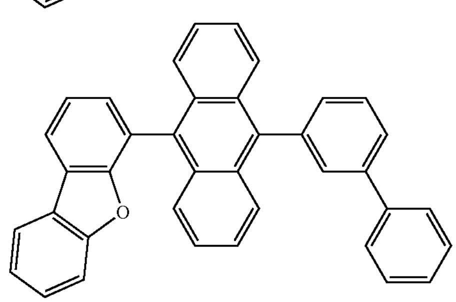

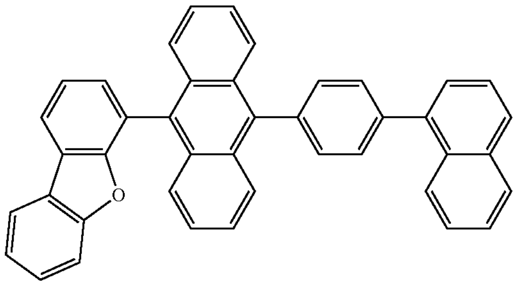
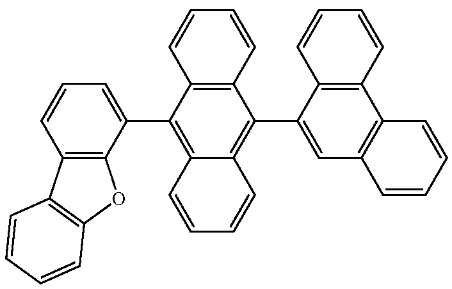
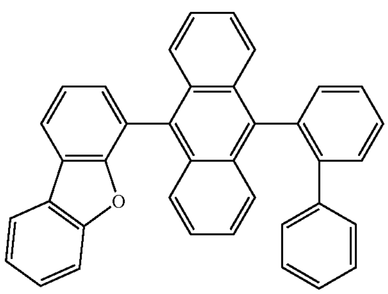
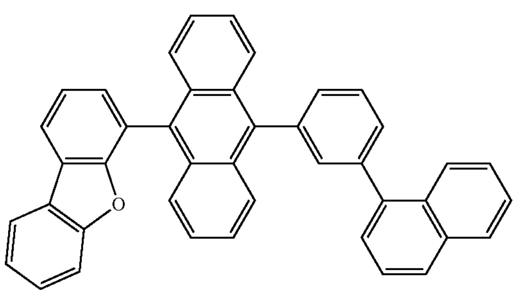
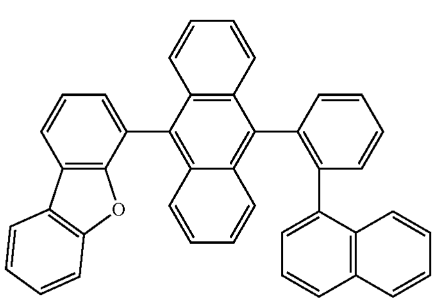
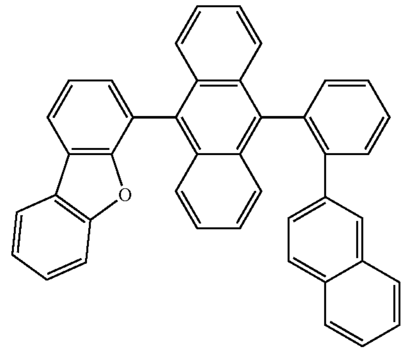
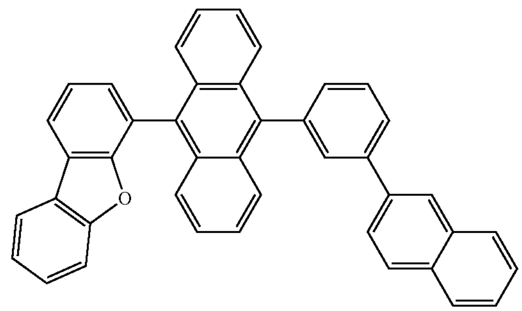
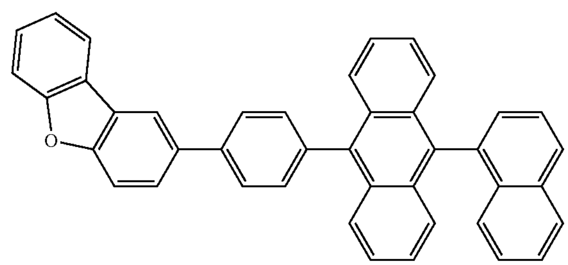
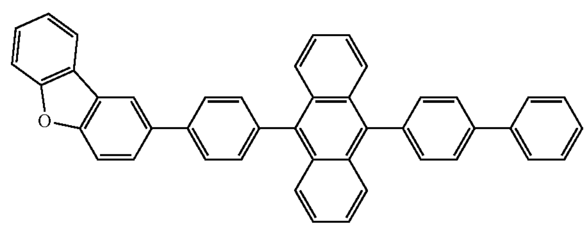
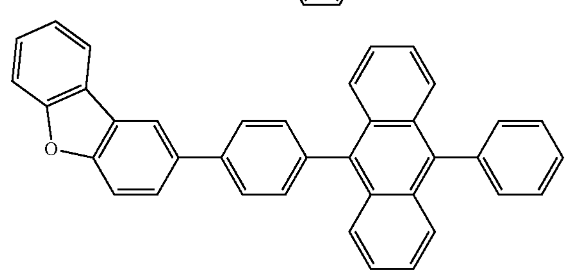
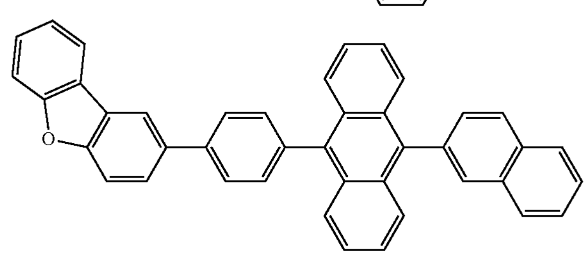

-continued
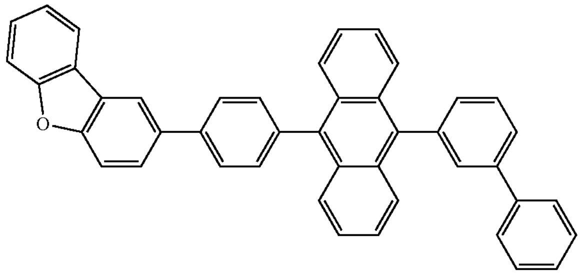
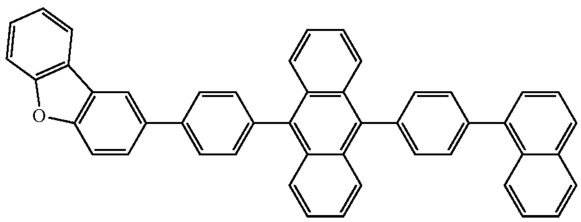
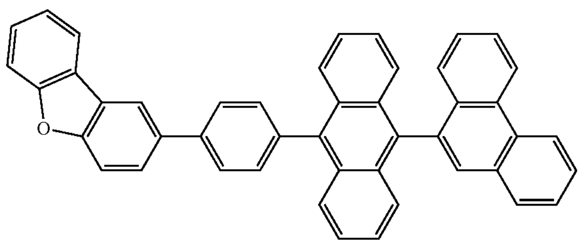
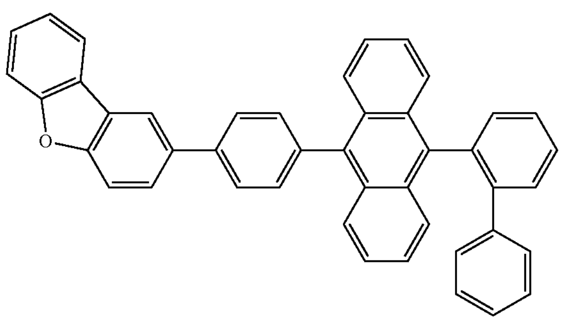
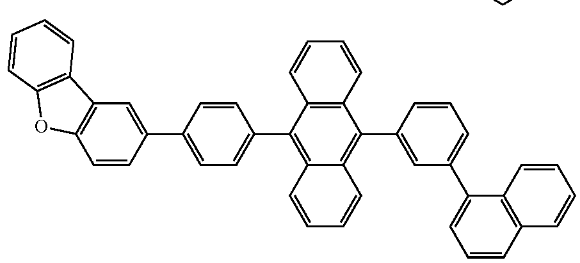
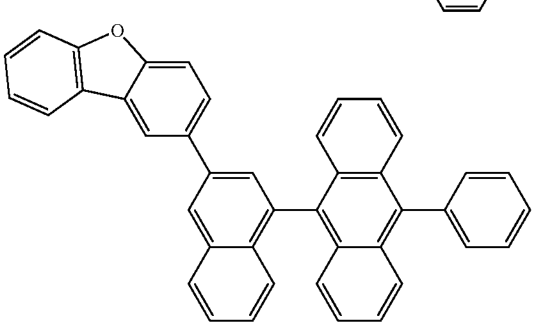
-continued
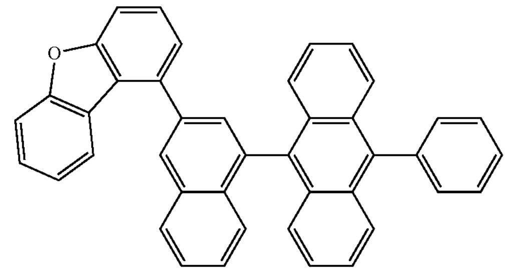
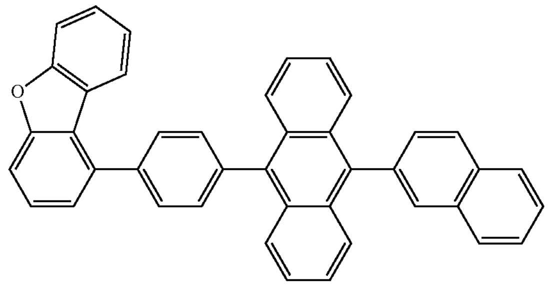
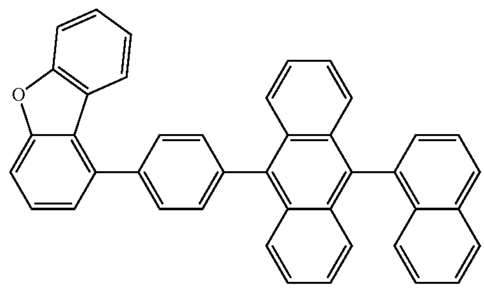
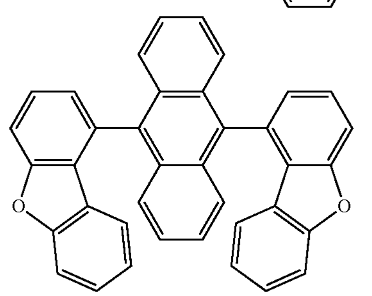
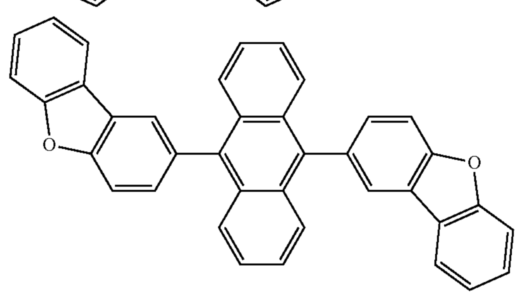
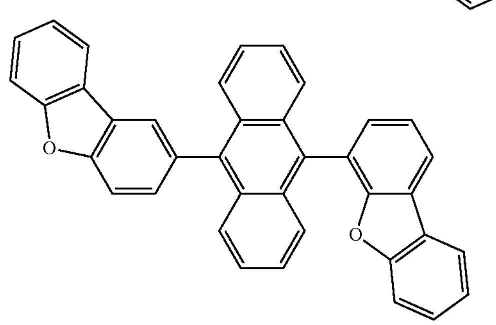

-continued
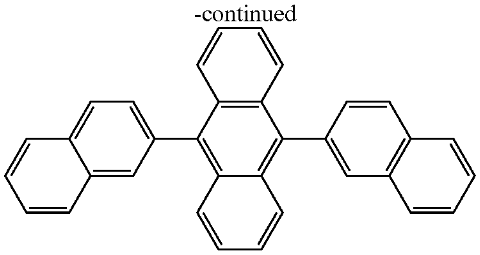
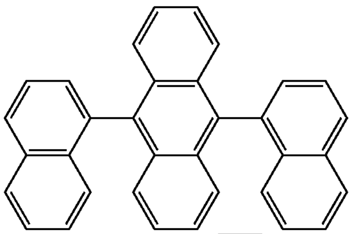
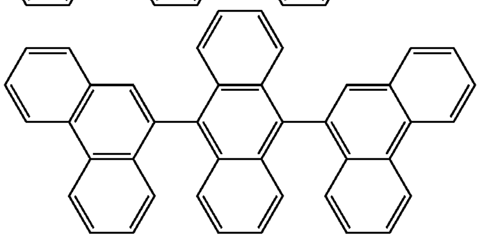
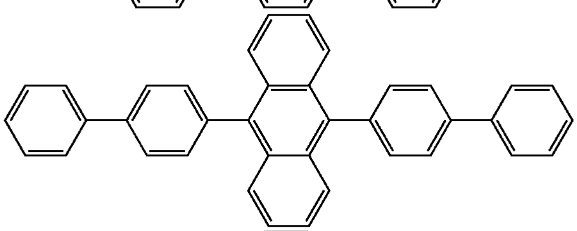
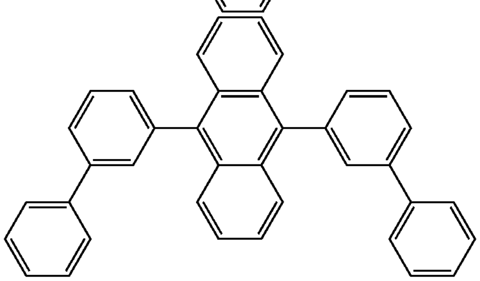
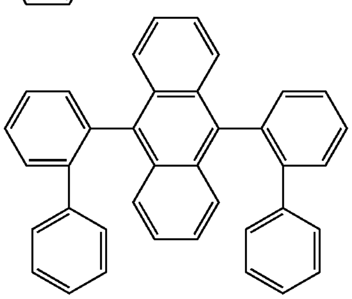
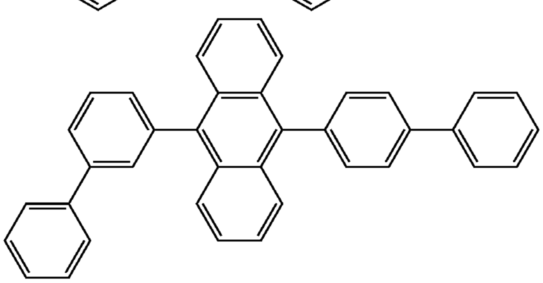
-continued
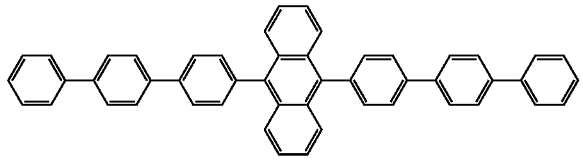
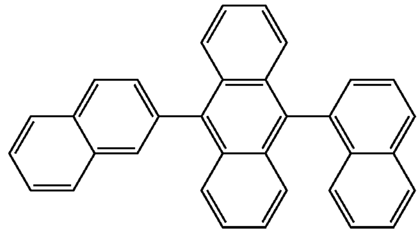
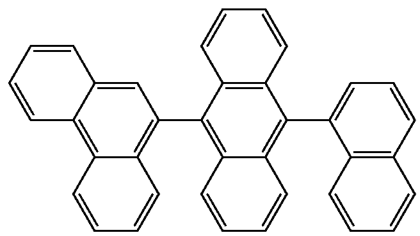
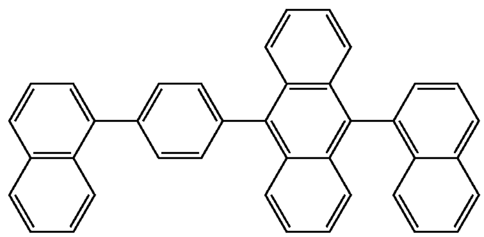
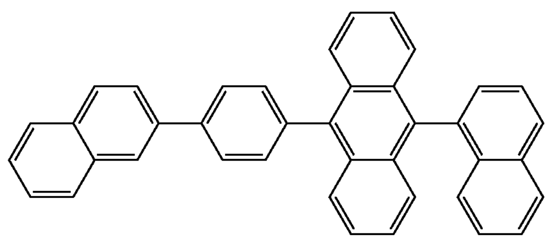
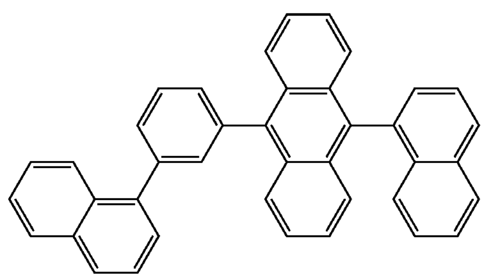
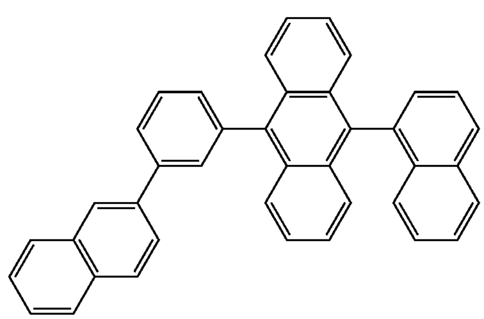

-continued
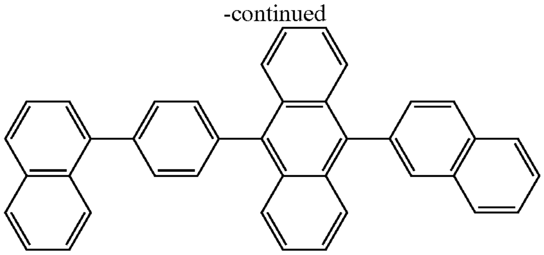
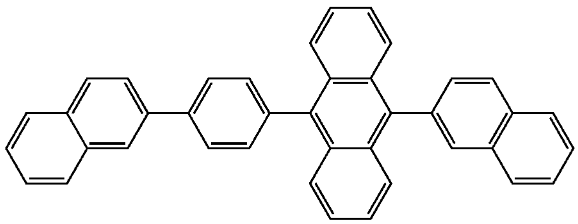
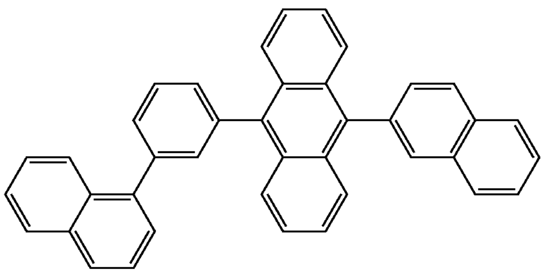
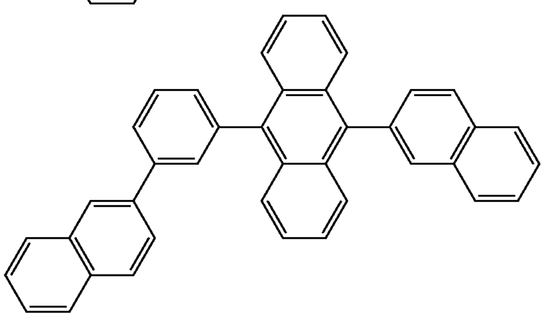
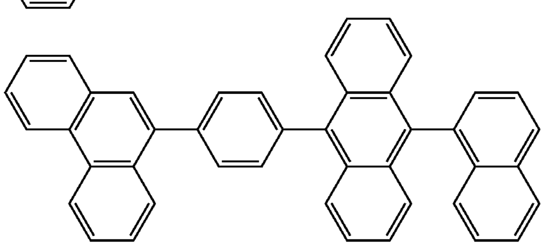
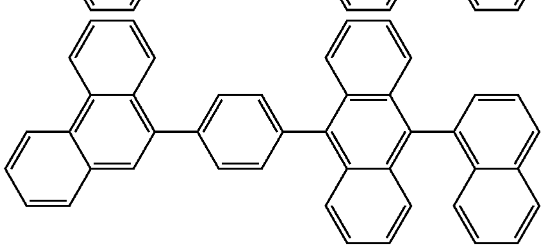
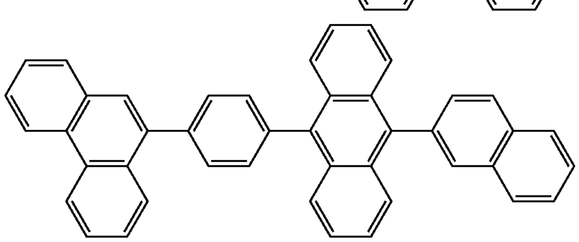
-continued
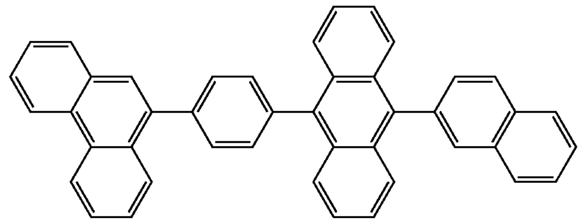
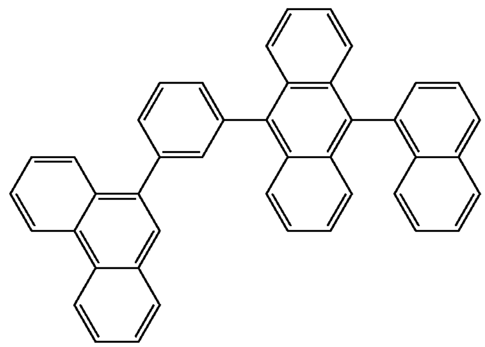
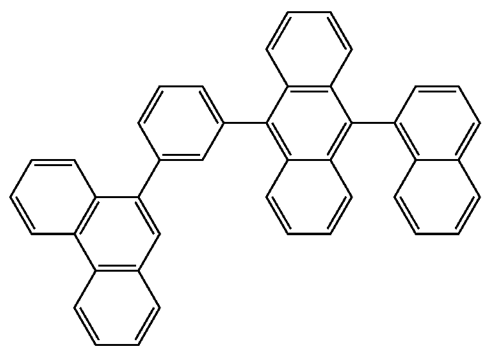
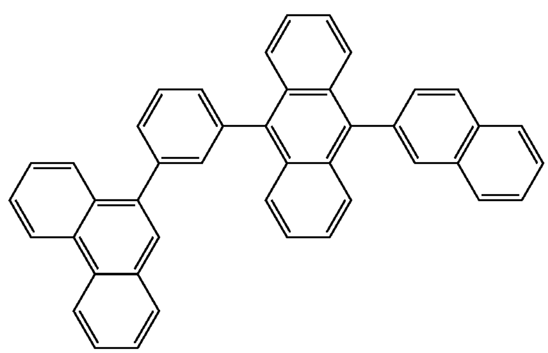
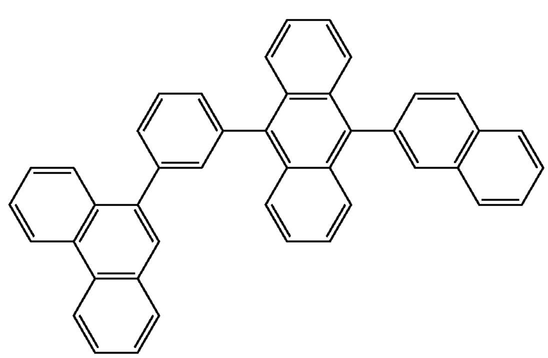

-continued
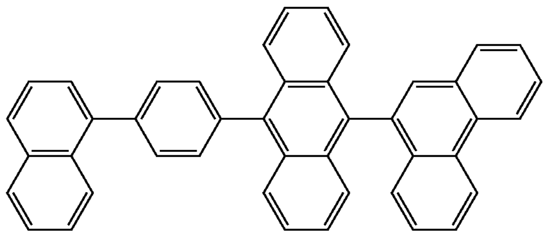
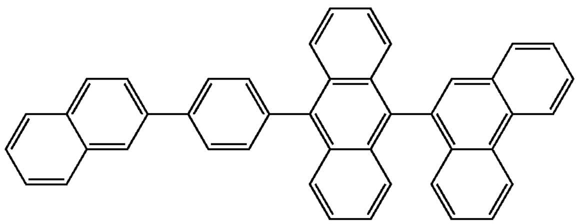
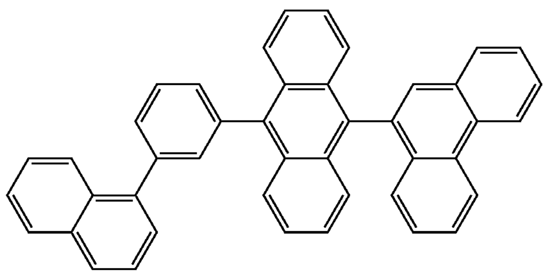
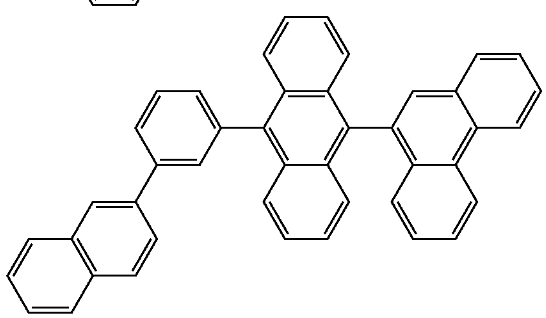
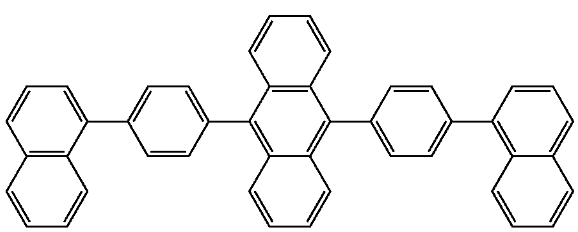
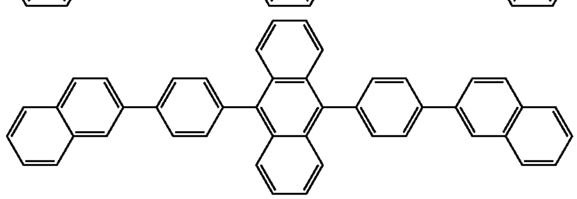
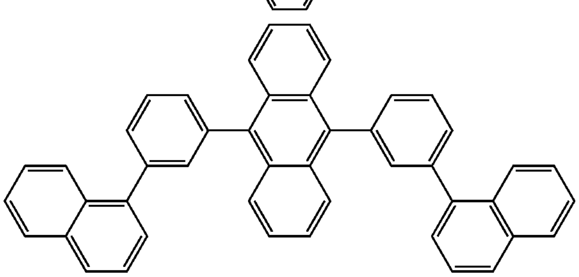
-continued
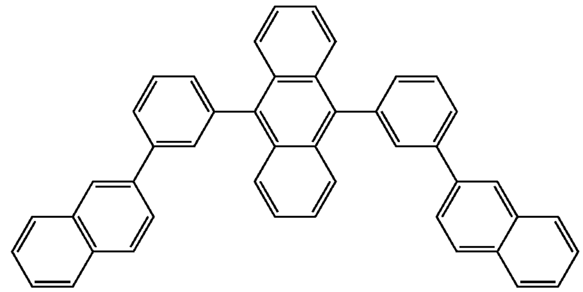
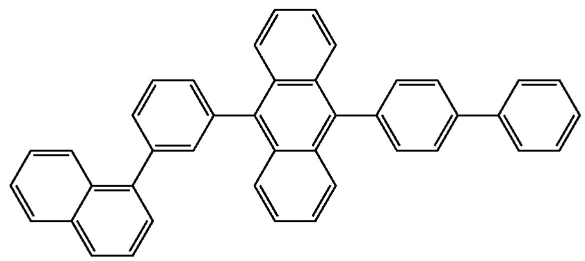
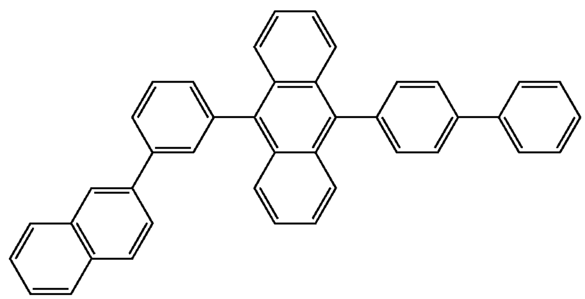
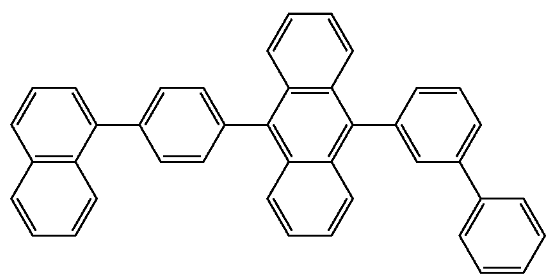
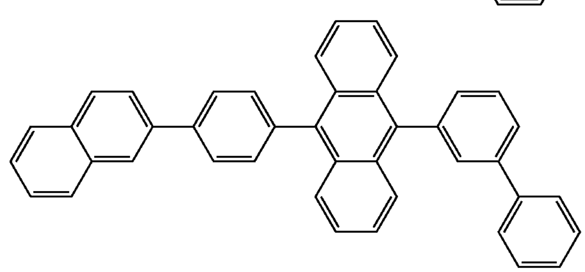
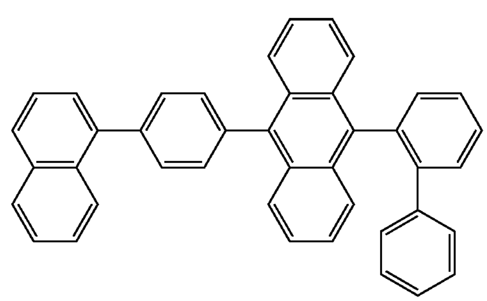

-continued
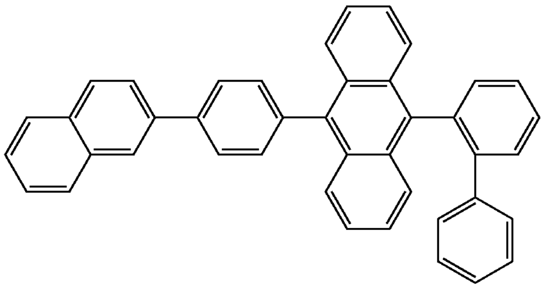
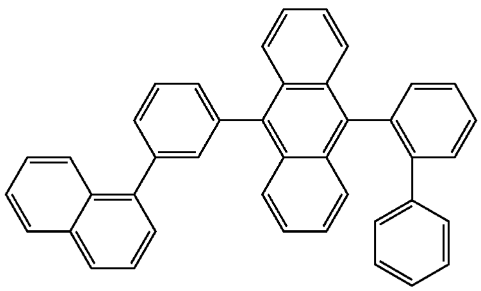
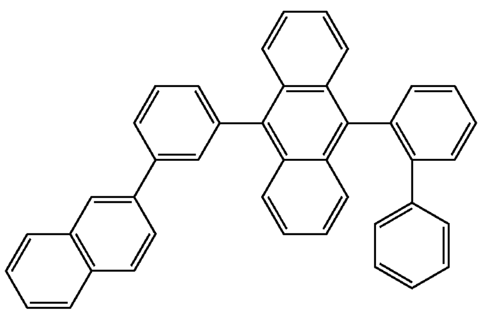
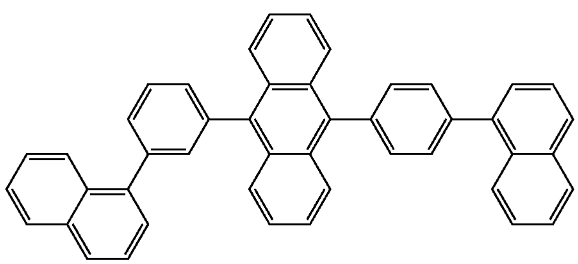
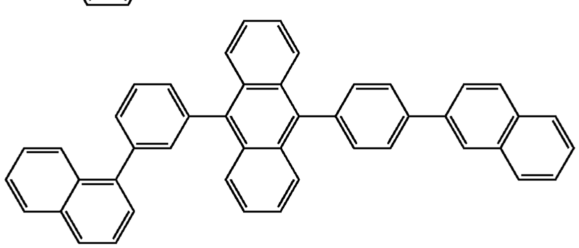
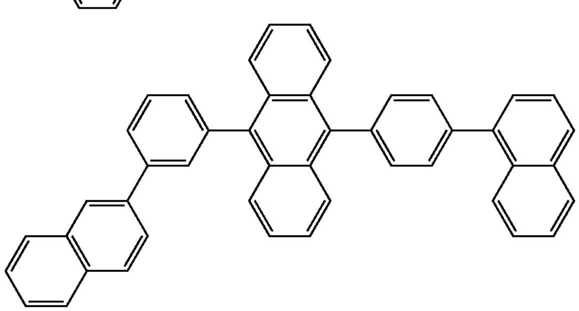
-continued
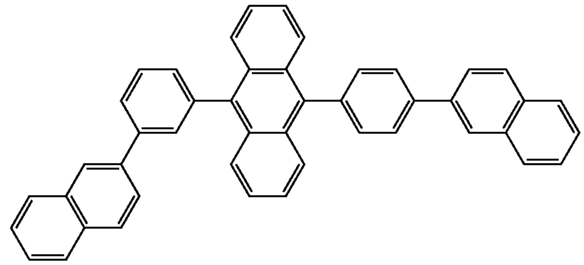
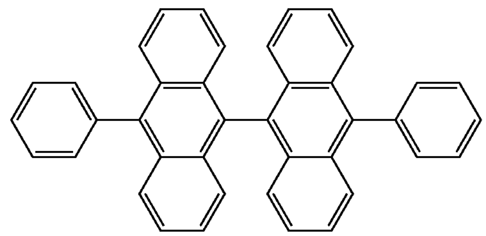
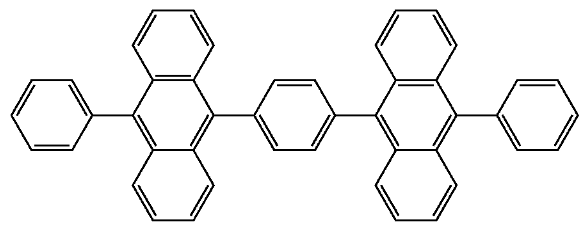
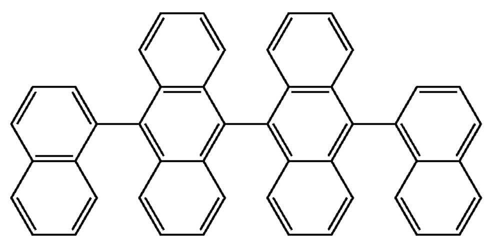
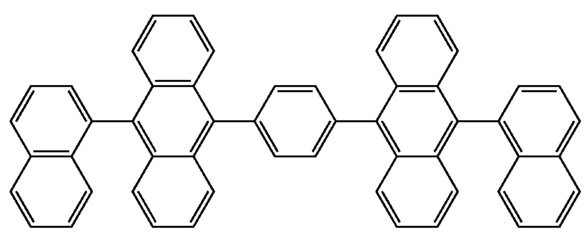
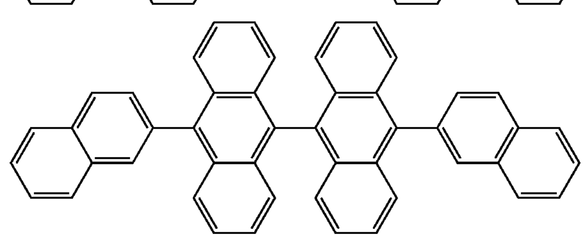
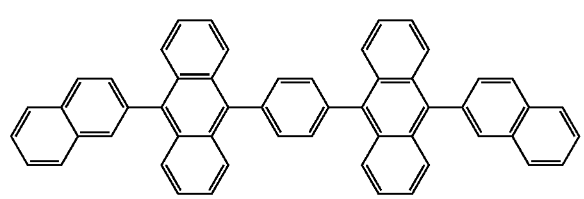

-continued
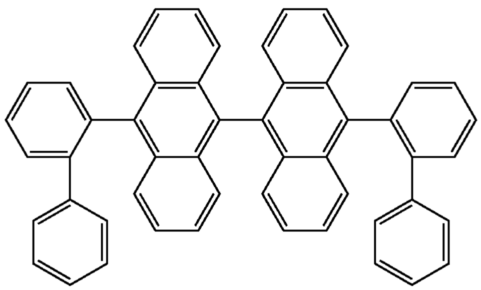
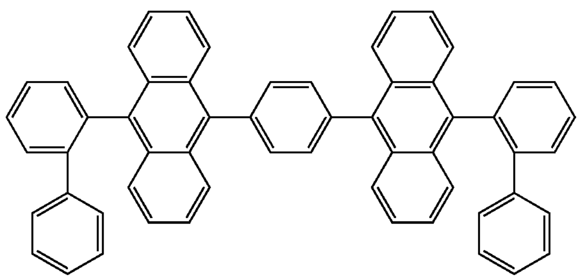
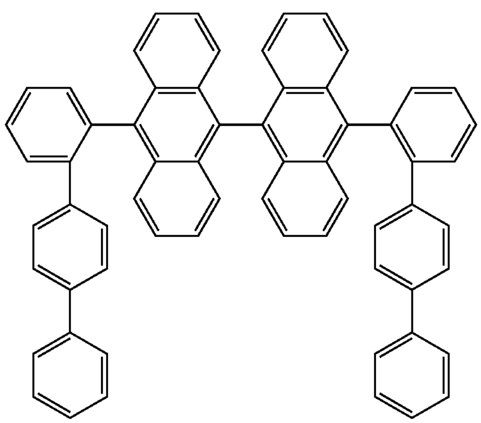
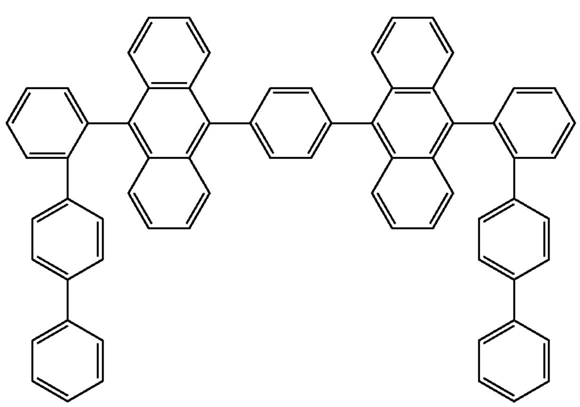
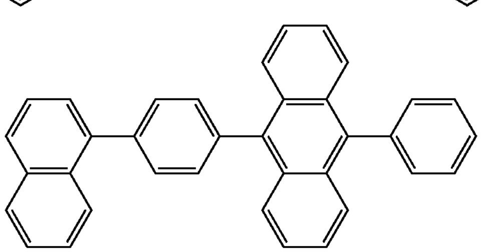
-continued
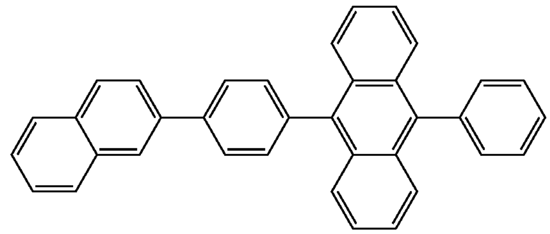
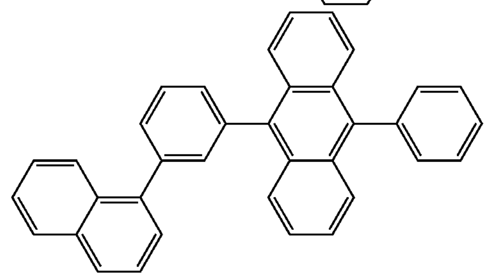
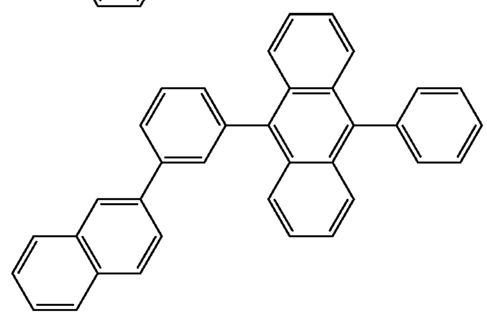
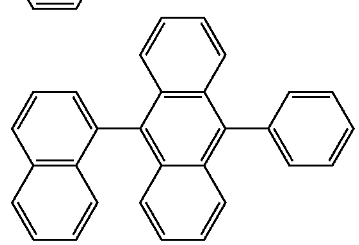
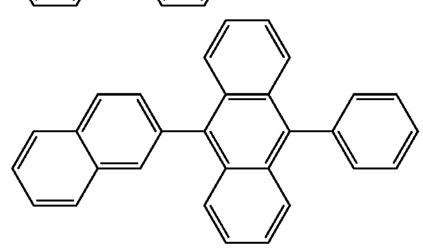
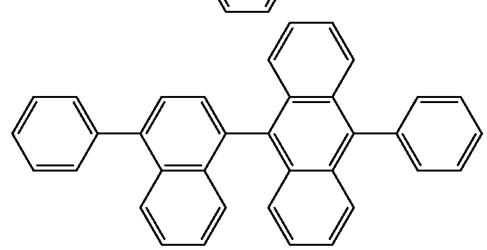
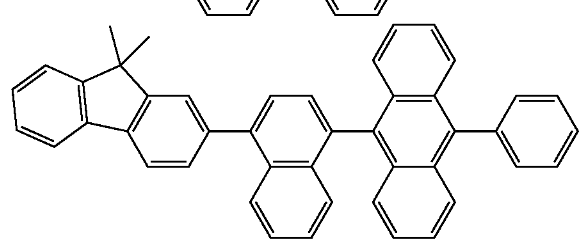

-continued
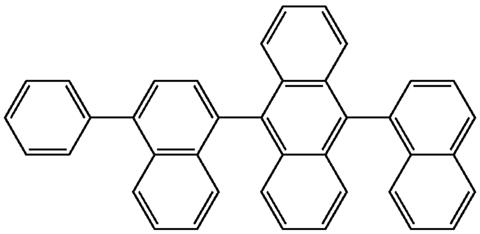
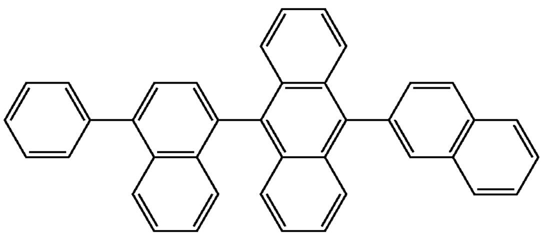
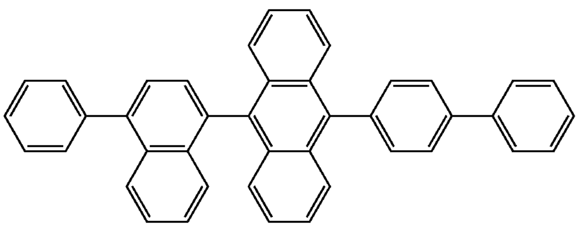
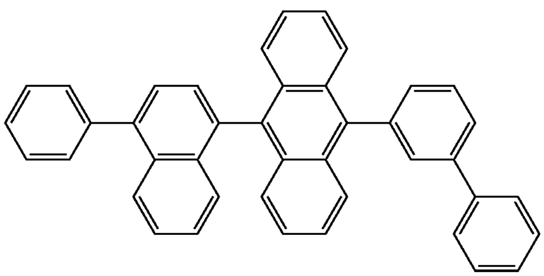
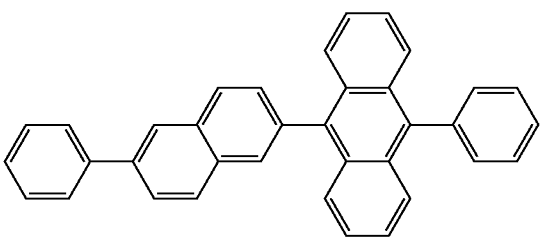
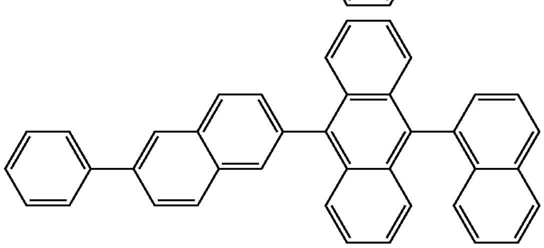
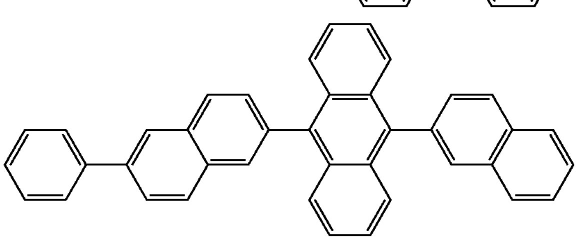
-continued
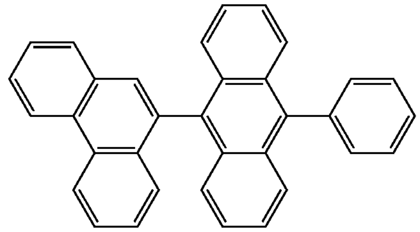
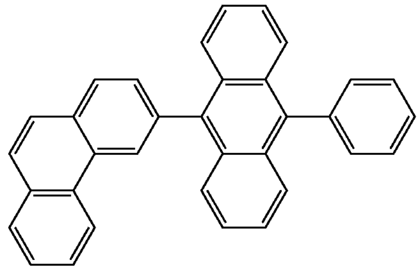
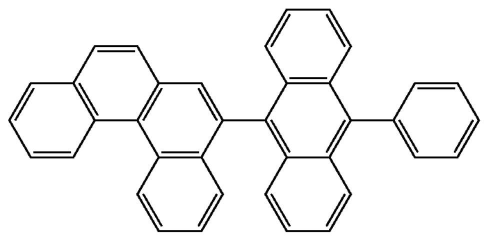
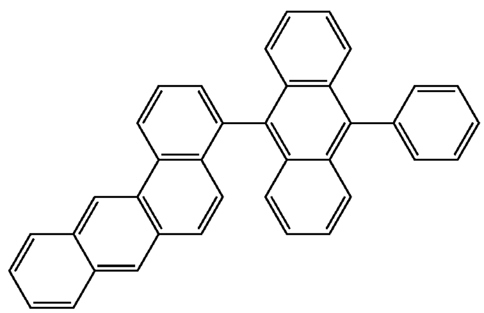
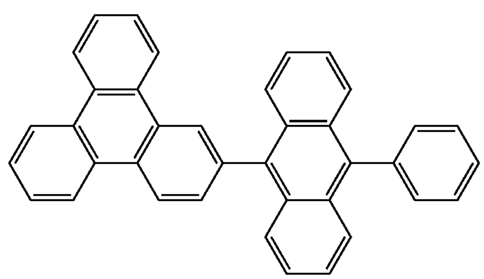
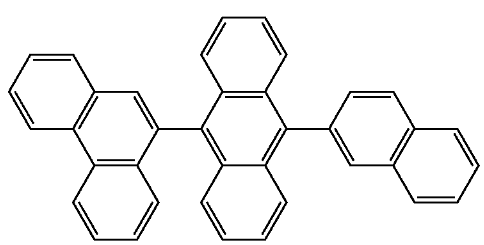

-continued
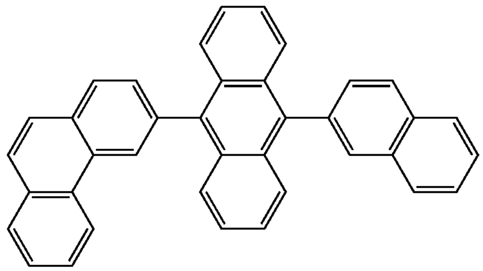
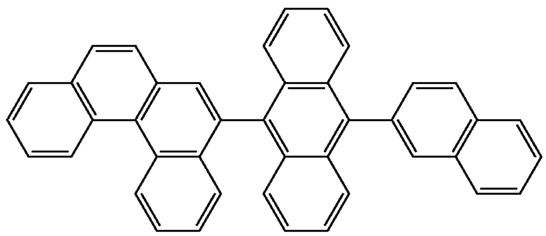
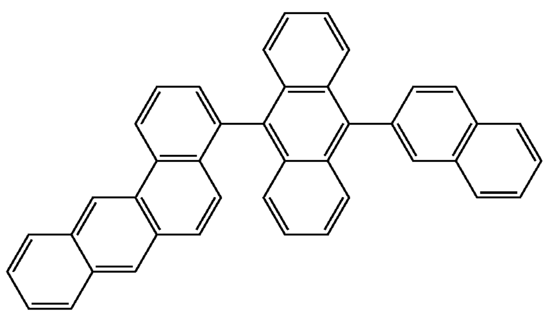
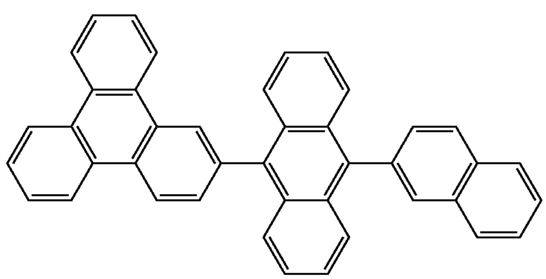
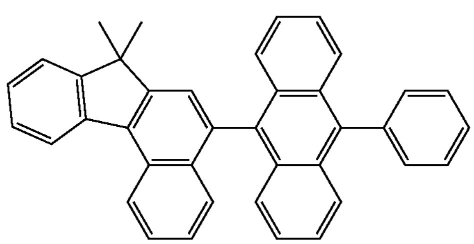
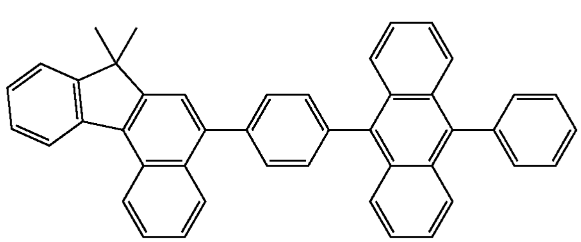
-continued
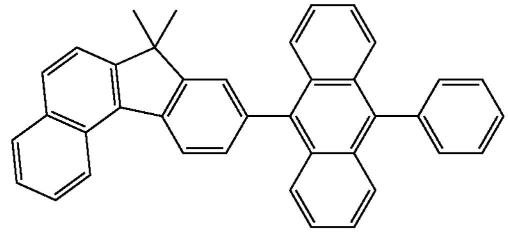
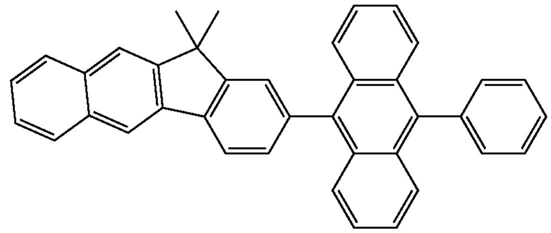
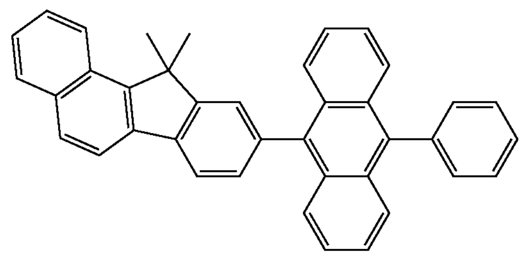
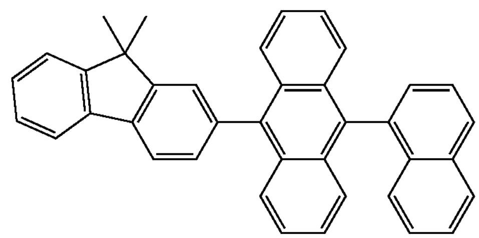
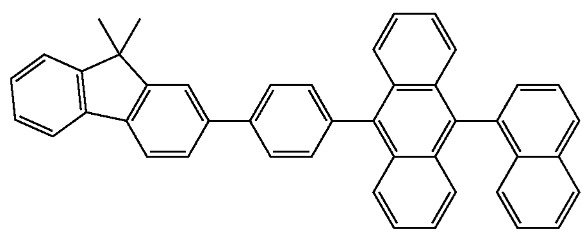
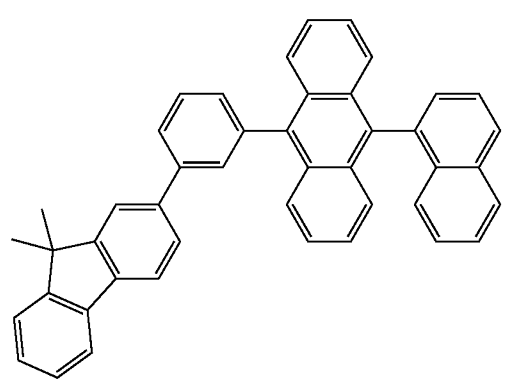

-continued
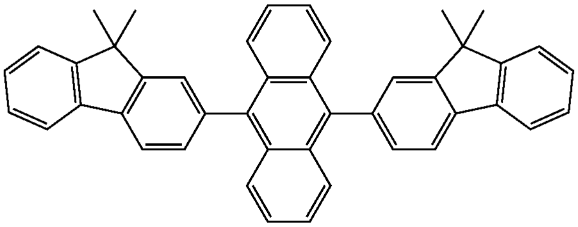
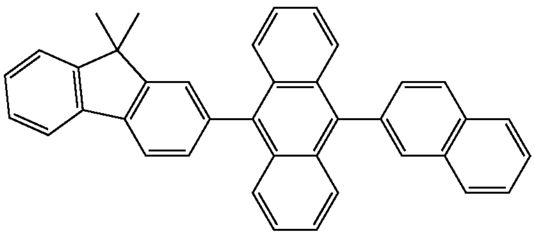
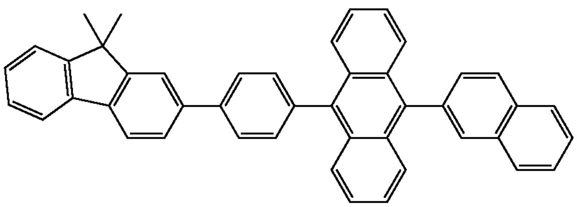
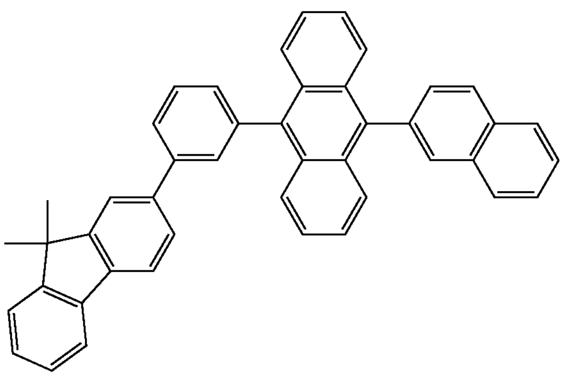
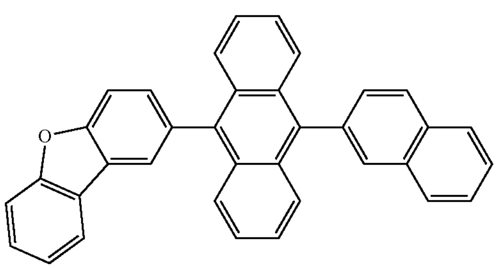
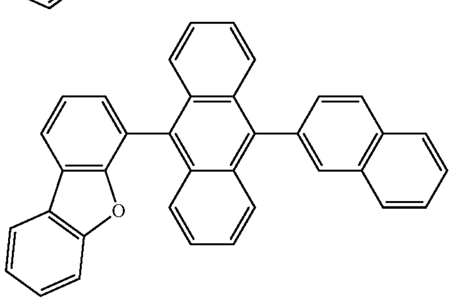
-continued
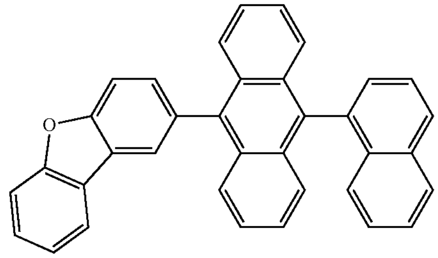
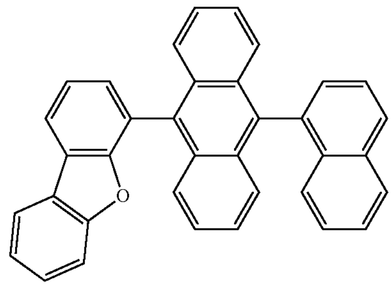
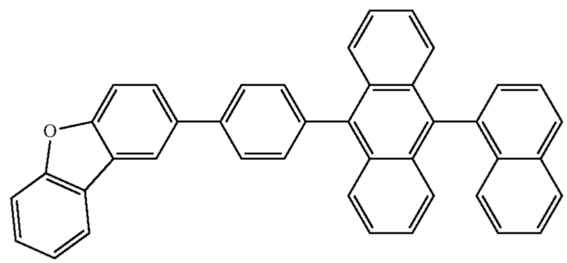
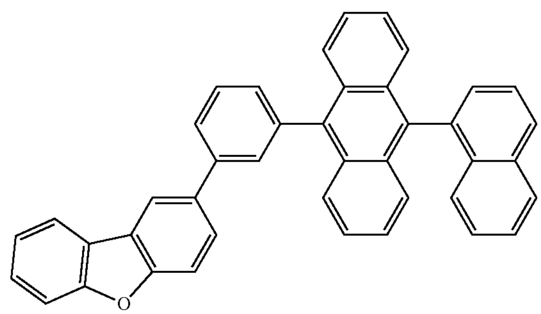
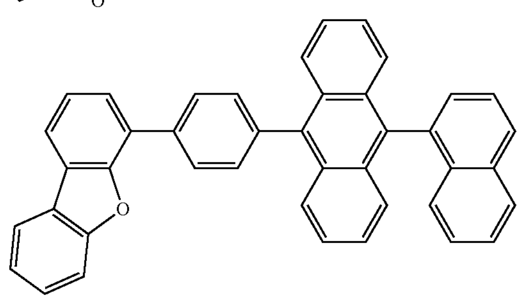
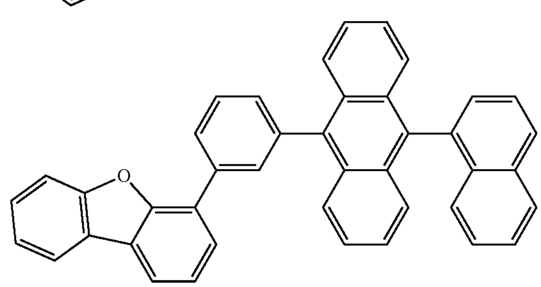

-continued
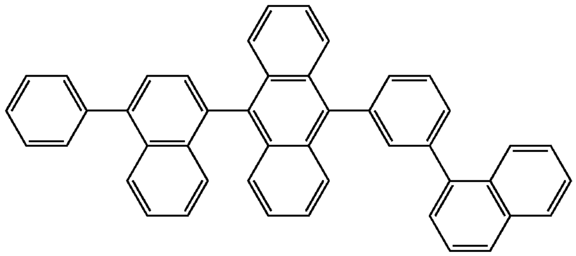
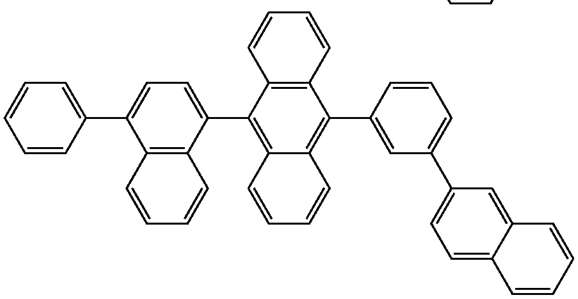
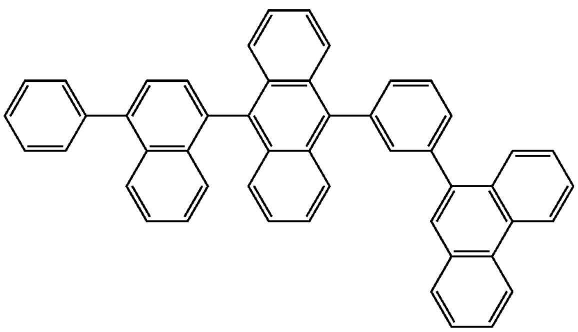
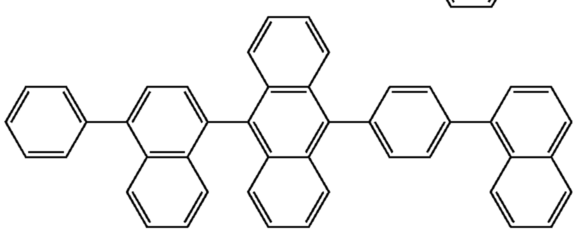
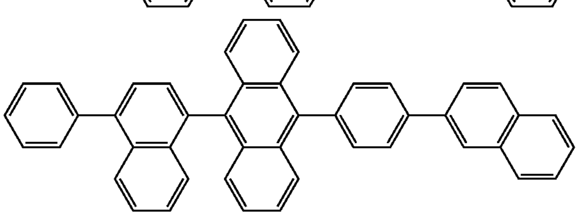
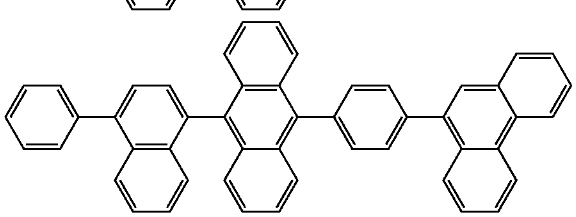
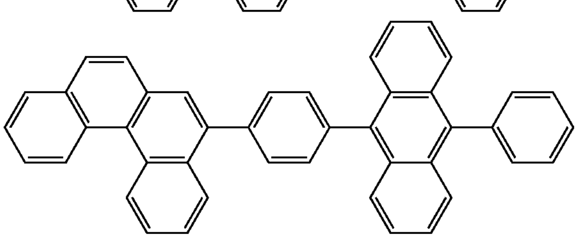
-continued
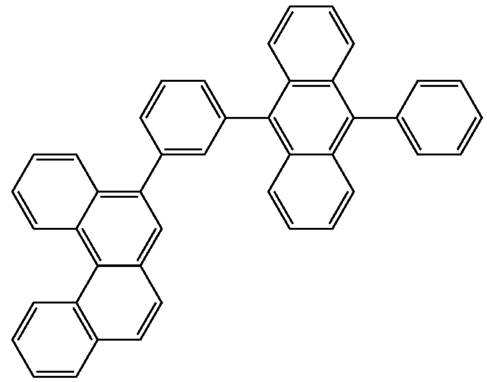
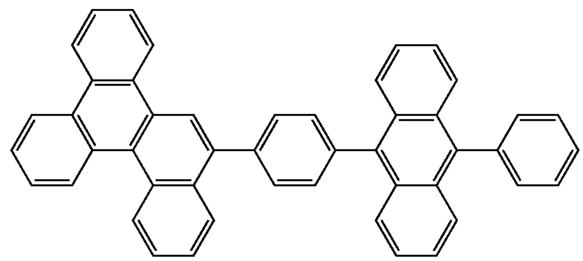
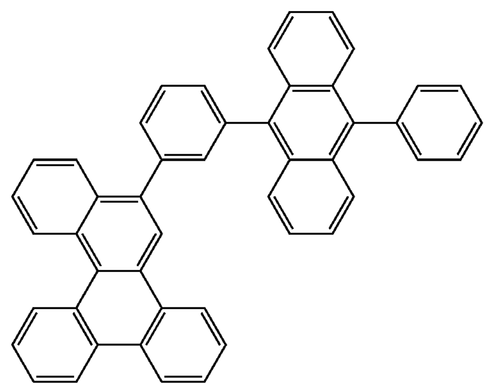
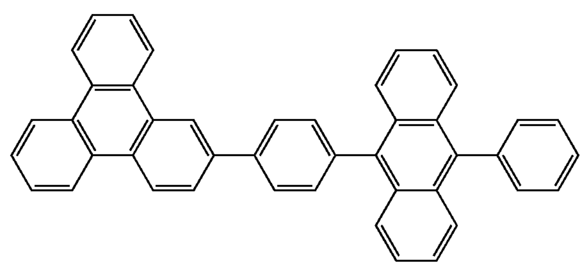
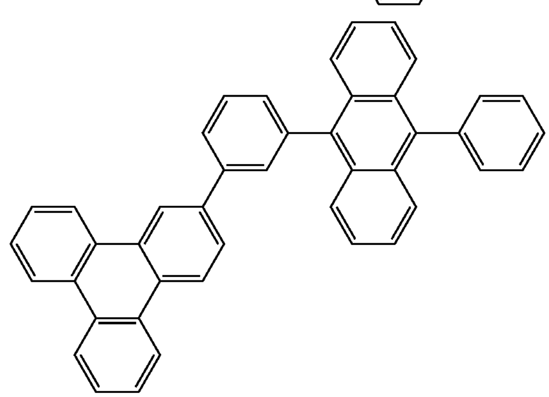

-continued
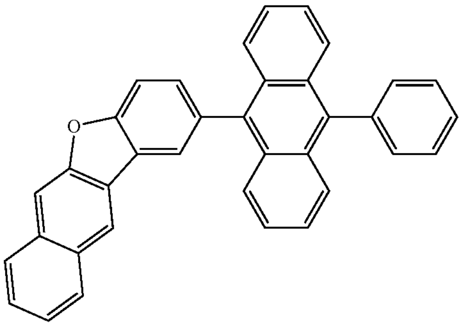
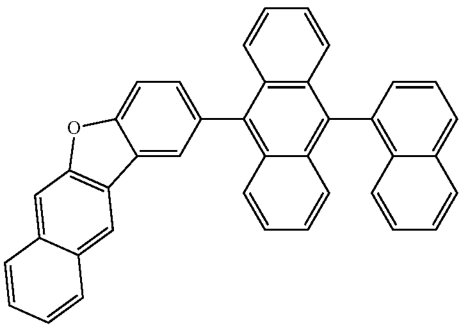
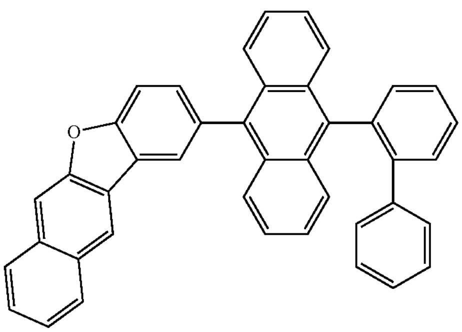
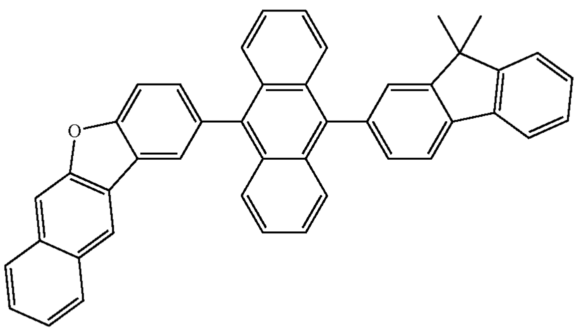
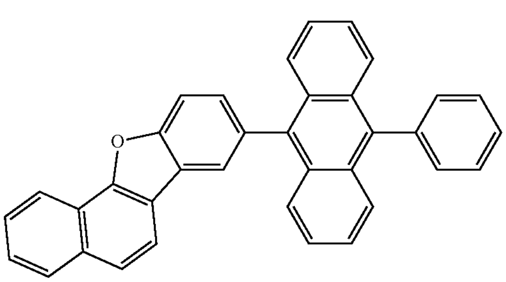
-continued
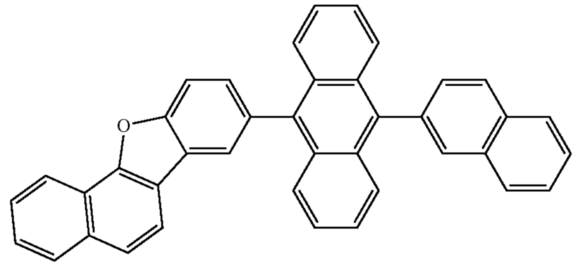
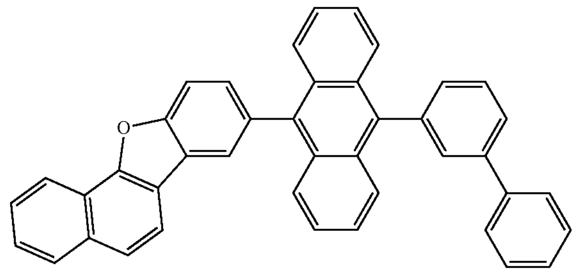
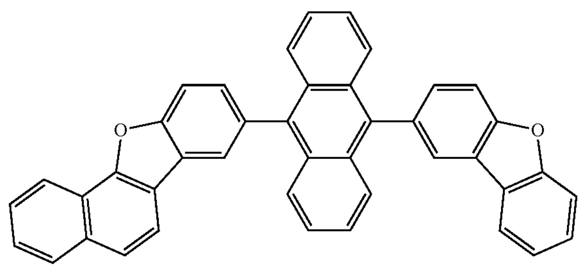
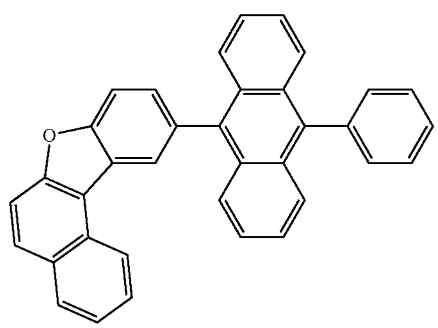
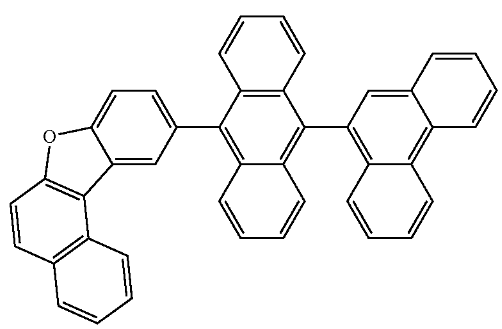

-continued
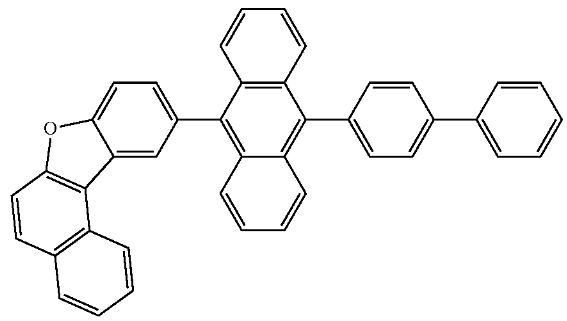
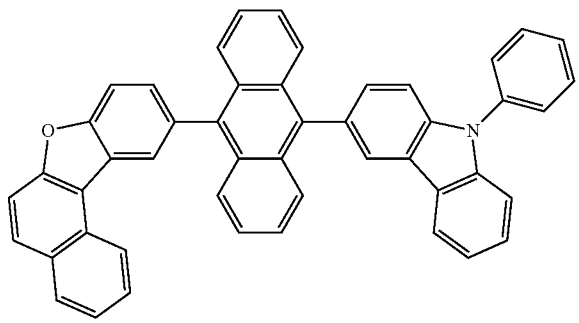
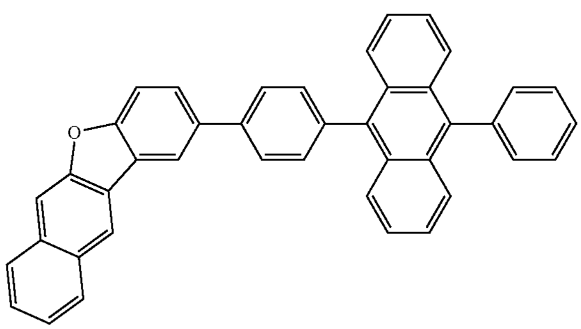
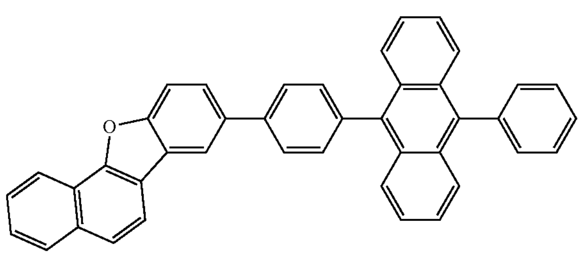
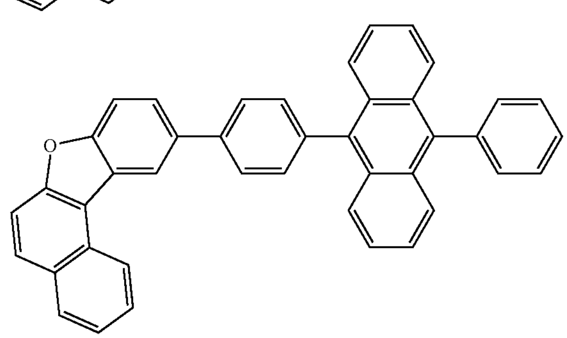
-continued
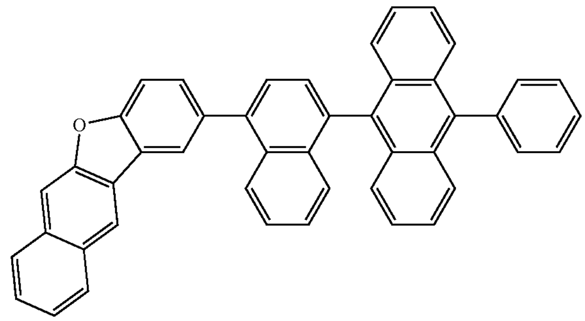
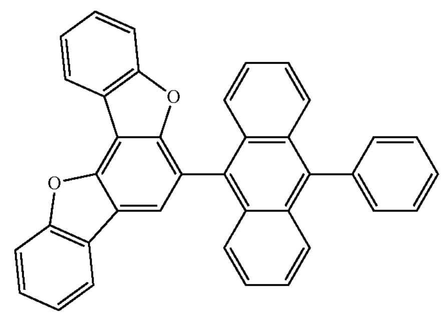
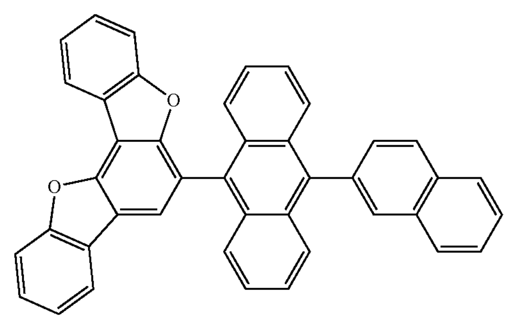
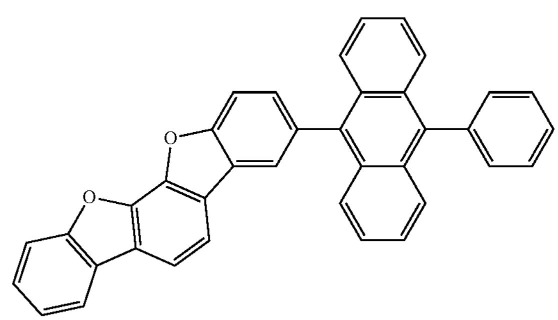
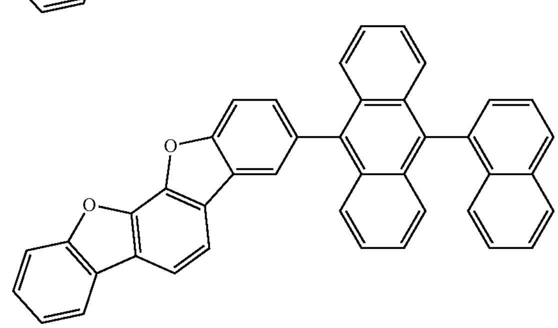

-continued
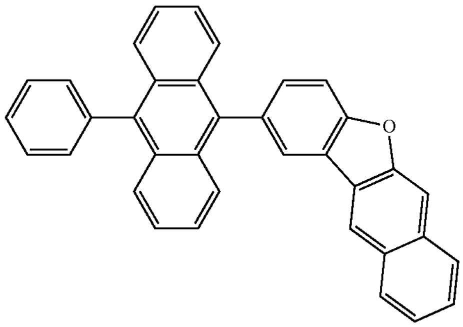
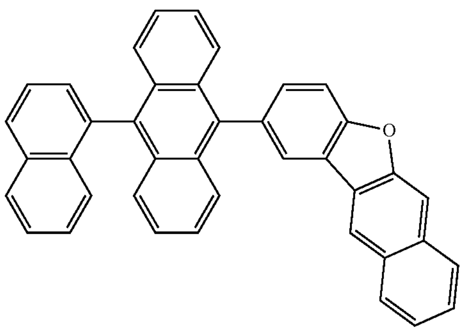
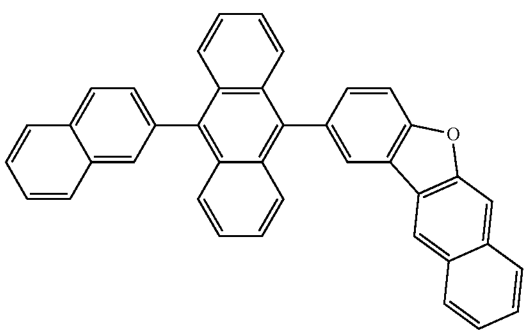
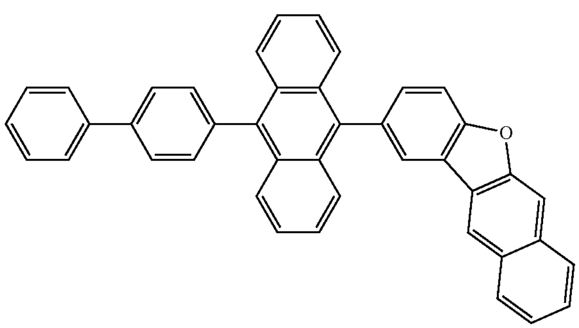
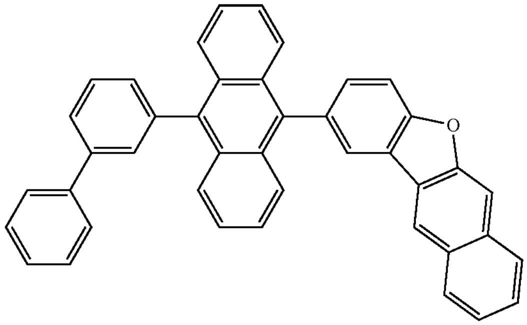
-continued
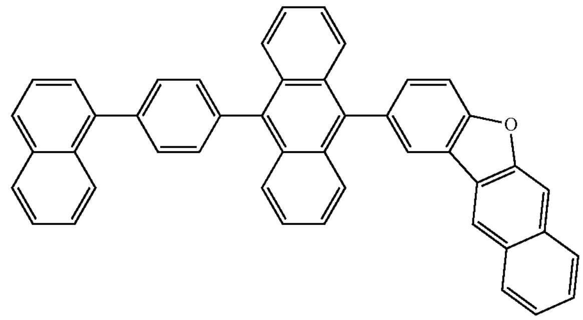
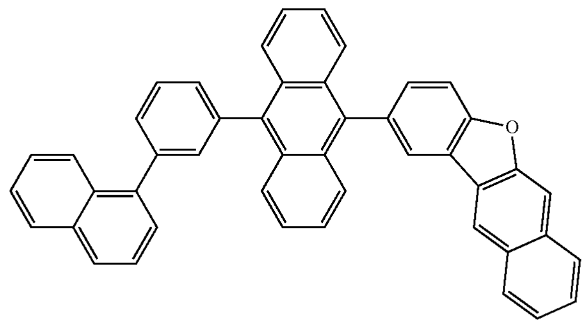
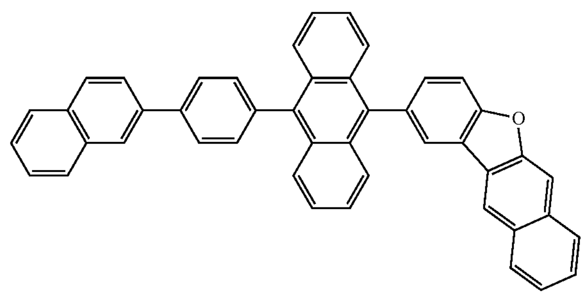
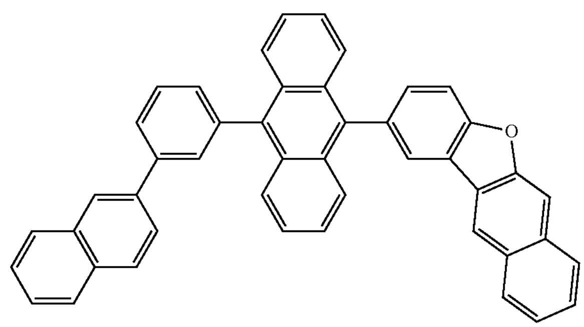
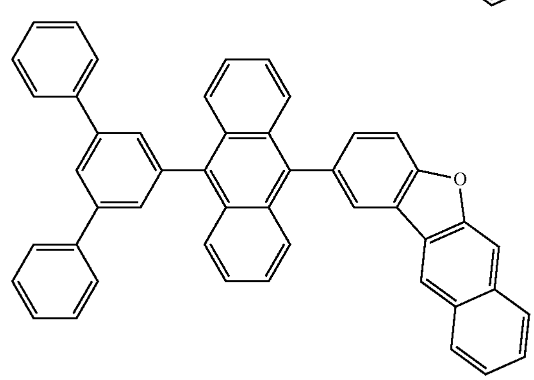

-continued
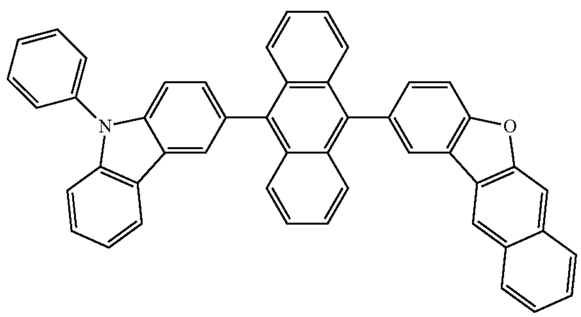
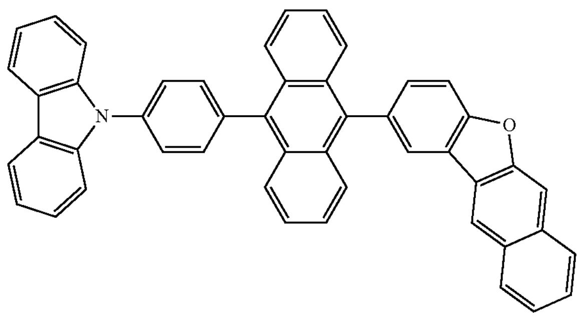
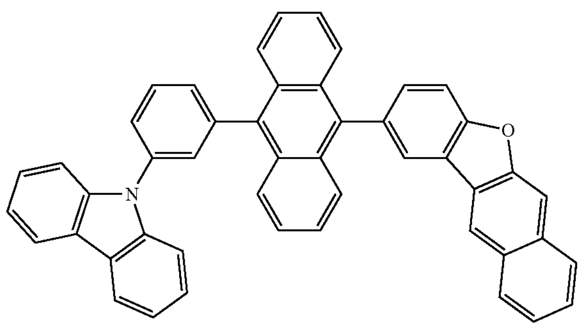
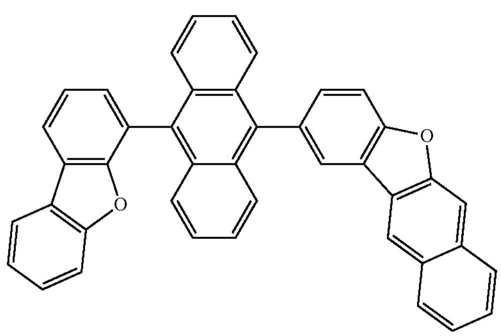
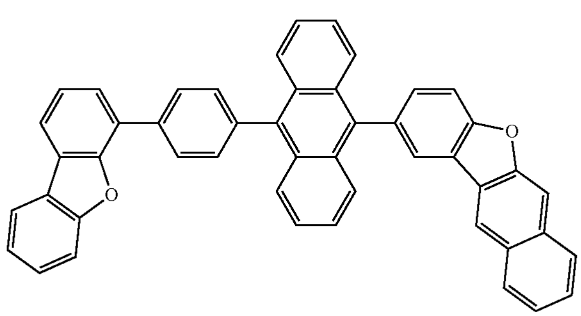
-continued
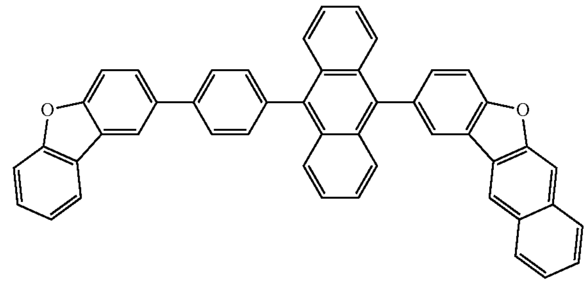
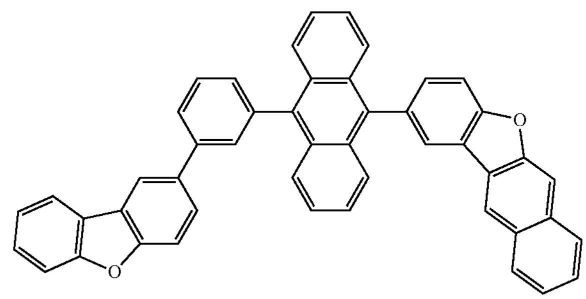
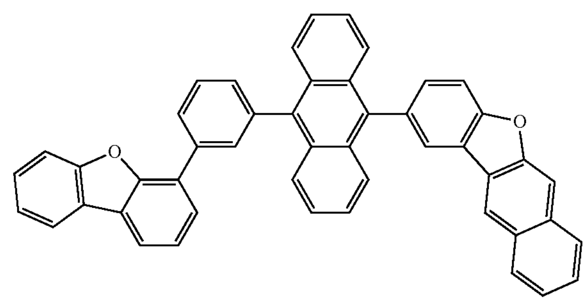
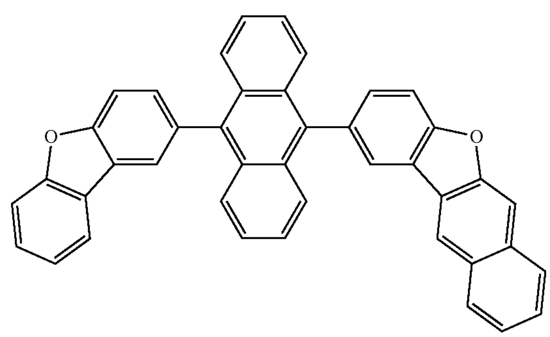
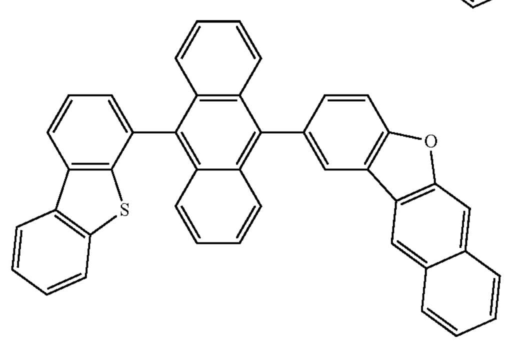

-continued
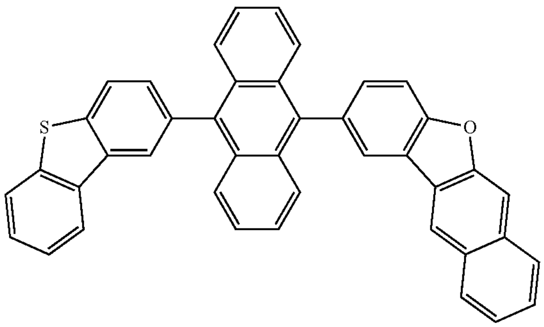
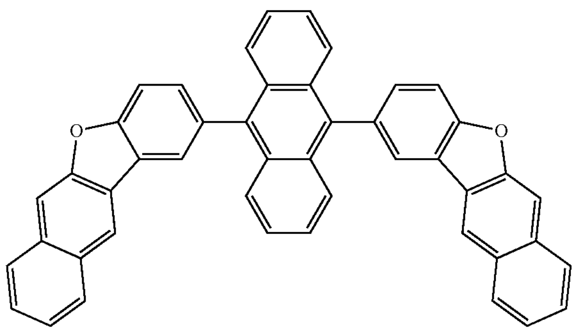
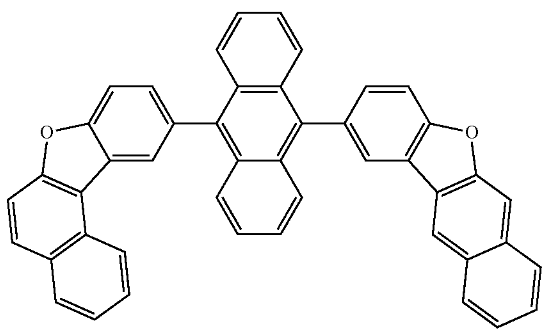
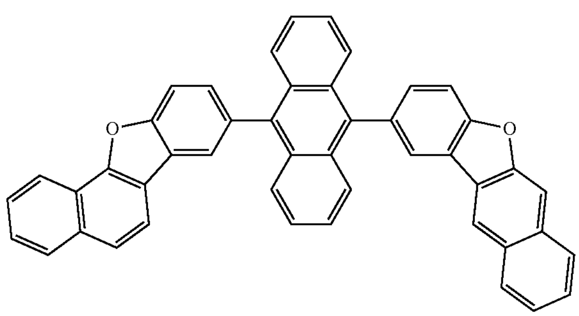
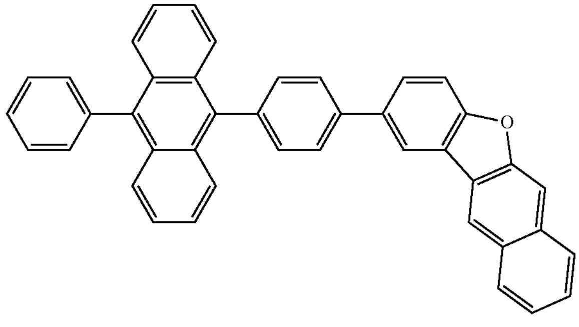
-continued
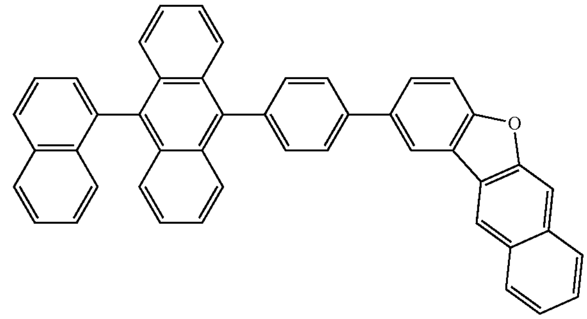
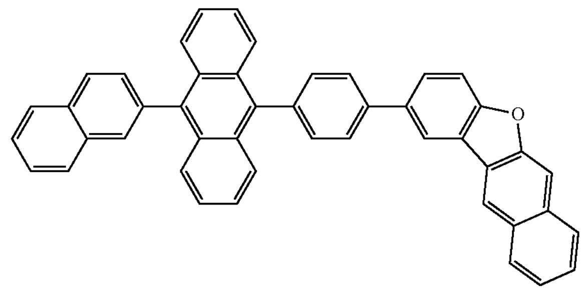
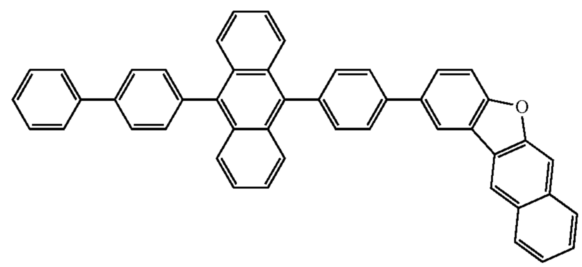
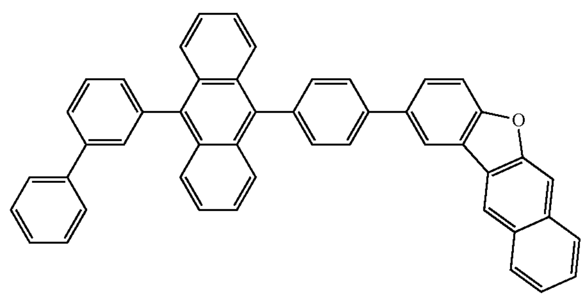
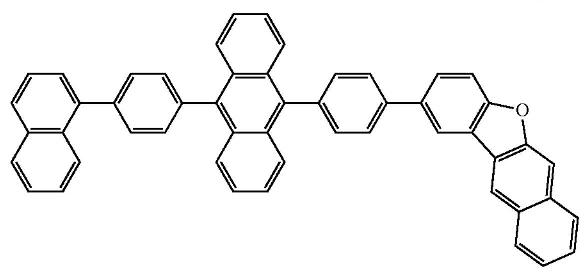
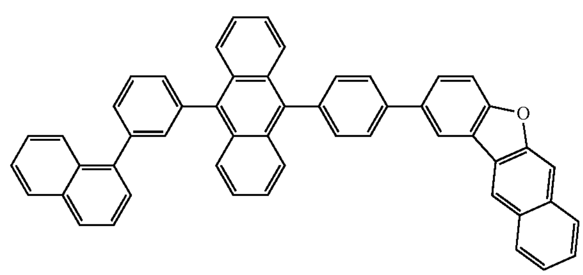

-continued
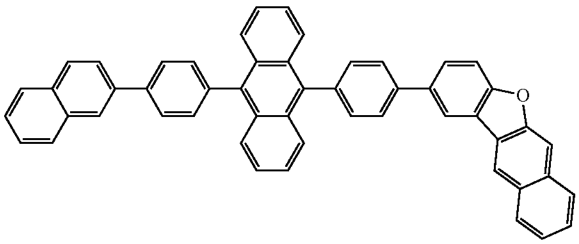
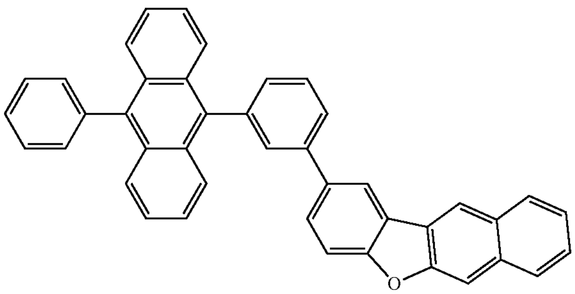
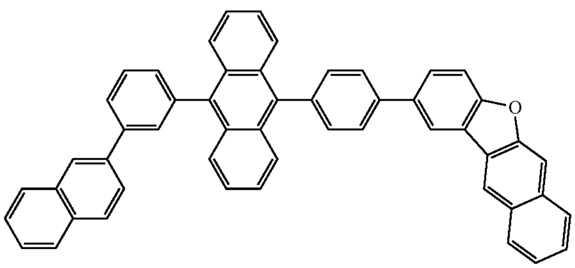
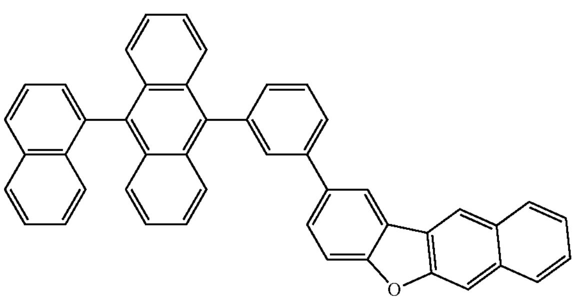
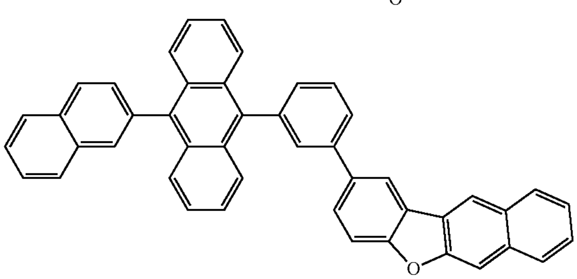
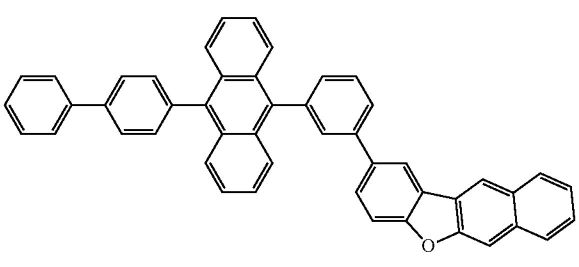
-continued
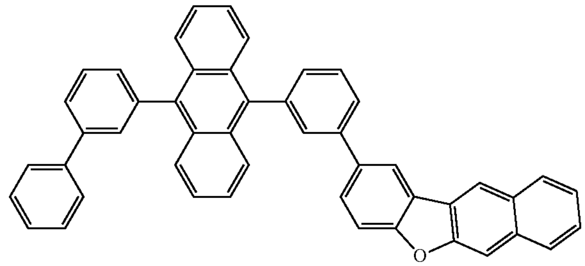
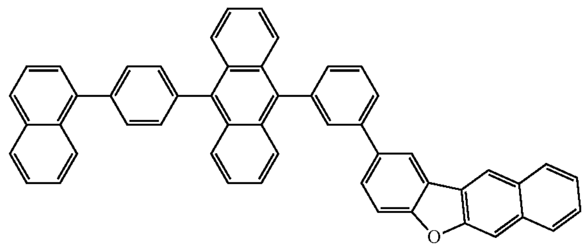
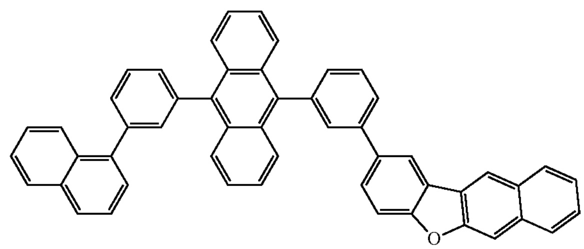
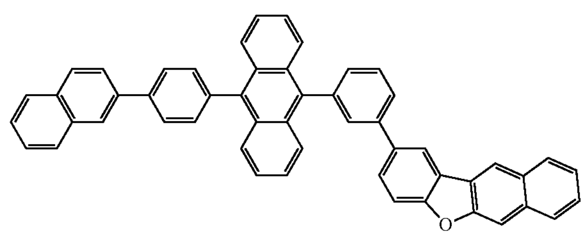
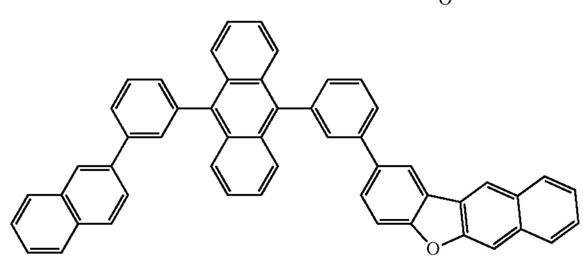
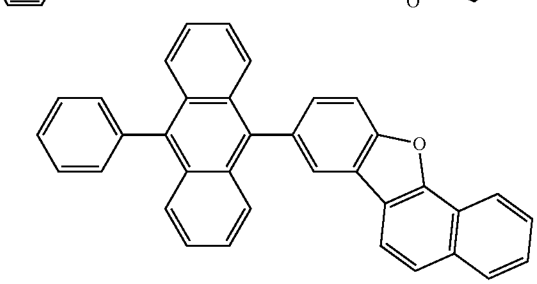

-continued
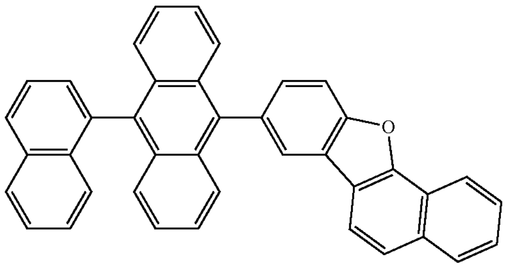
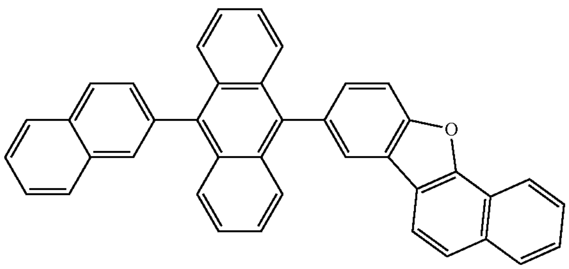
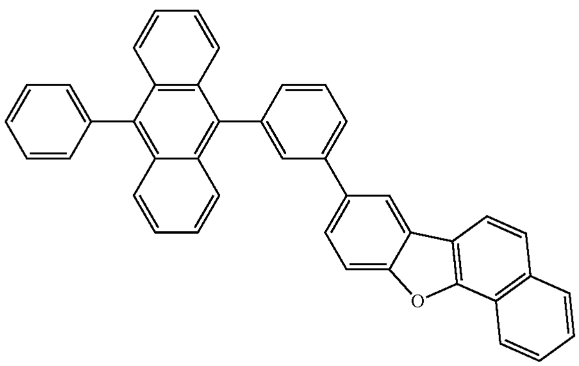
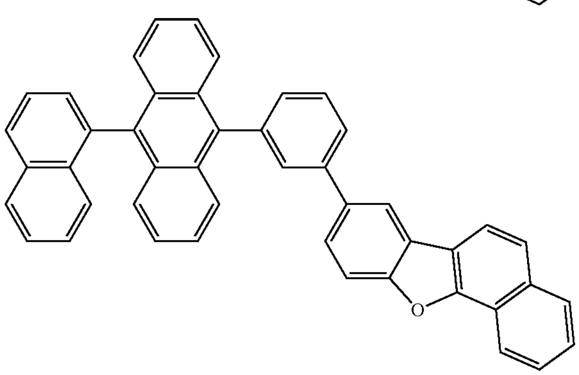
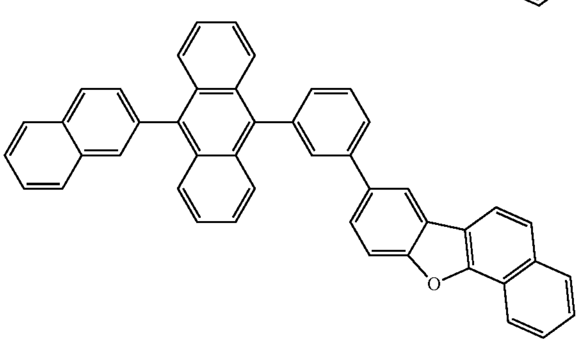
-continued
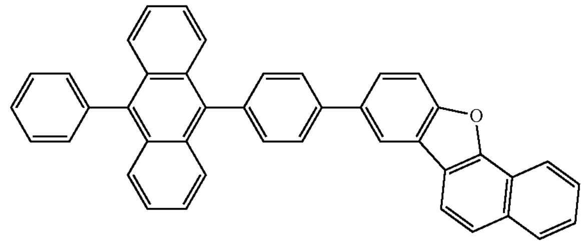
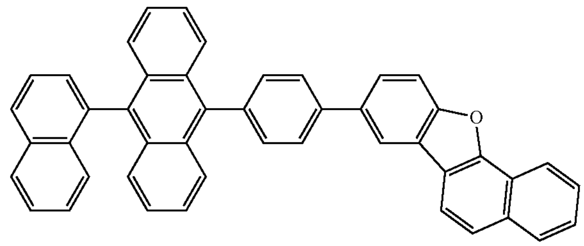
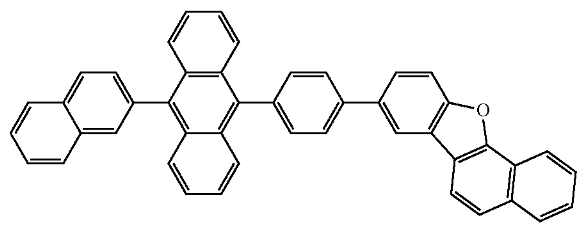
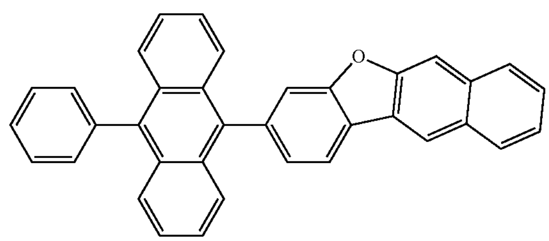
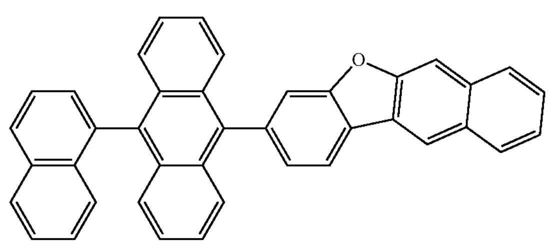
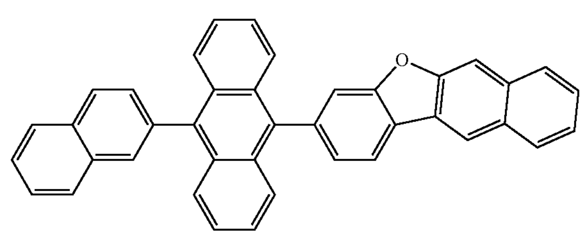

-continued
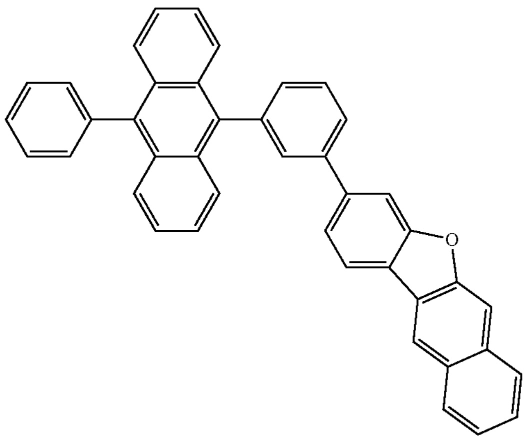
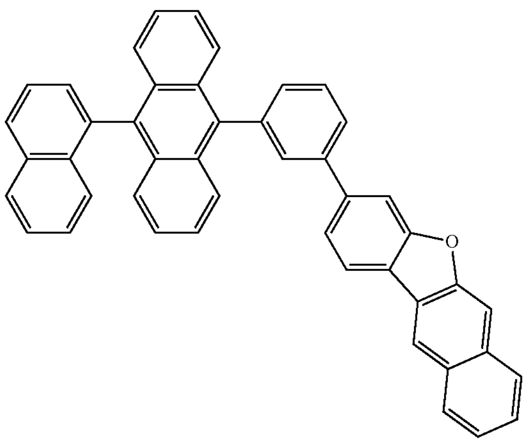
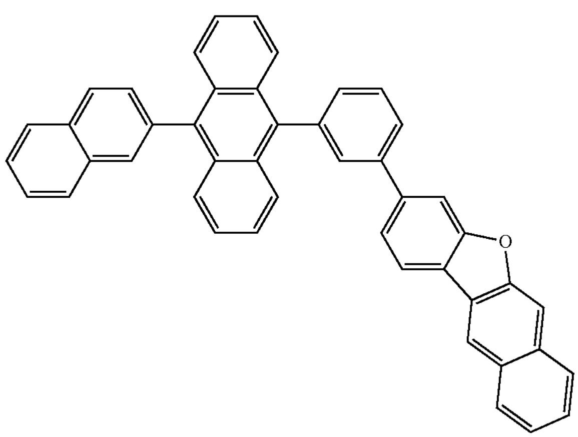
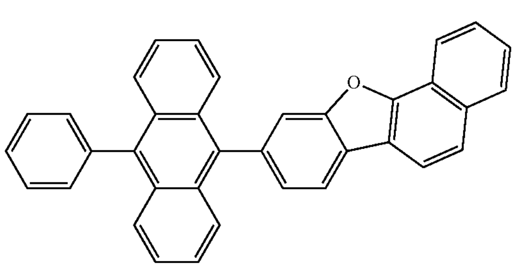
-continued
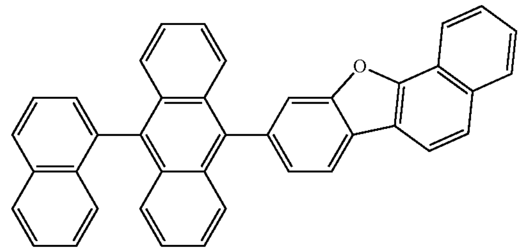
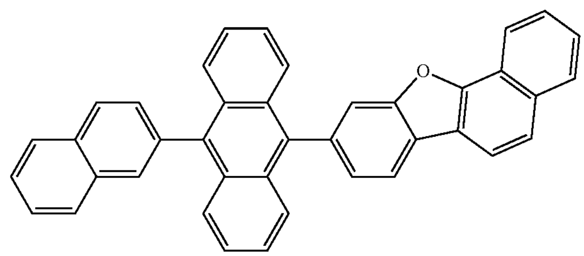
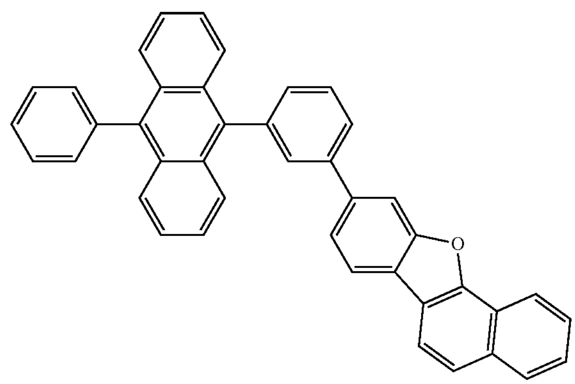
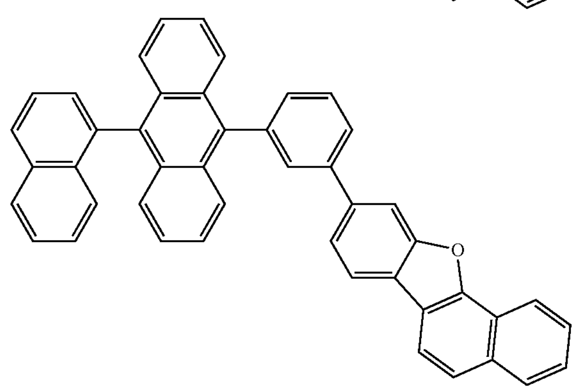
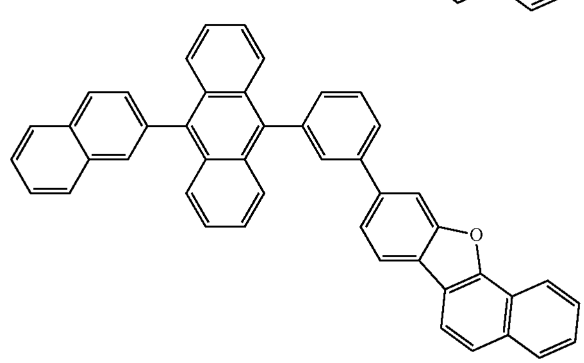

-continued
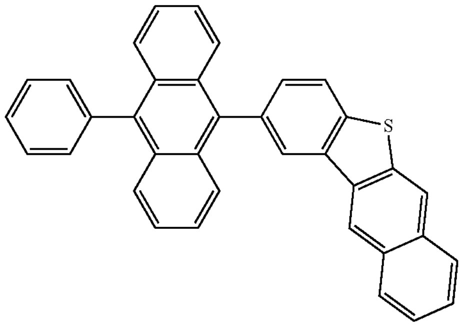
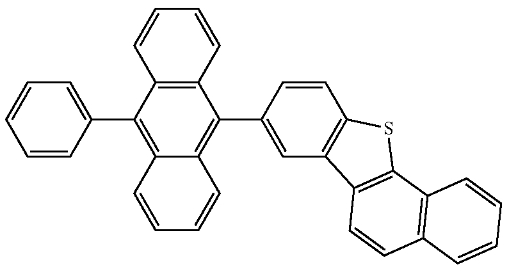
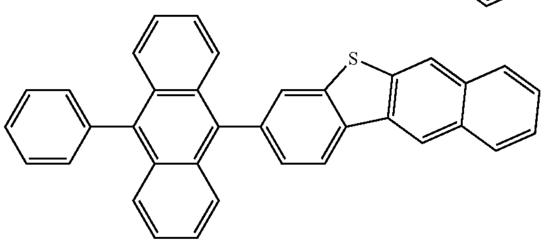
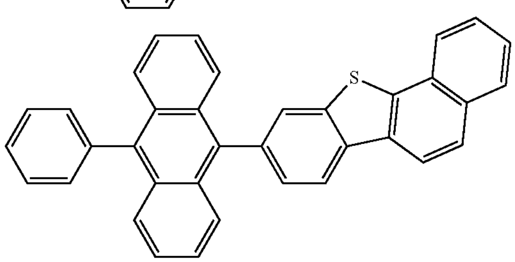
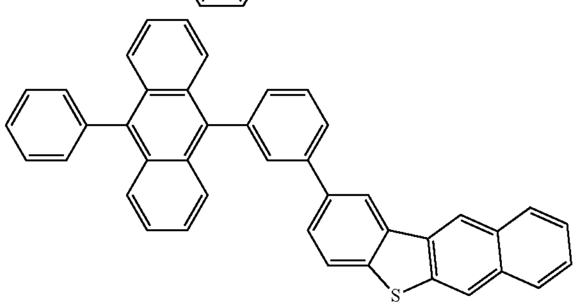
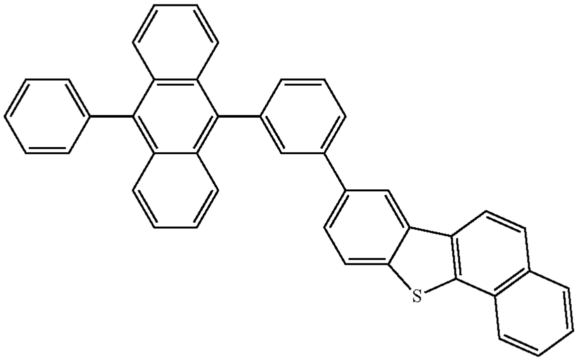
-continued
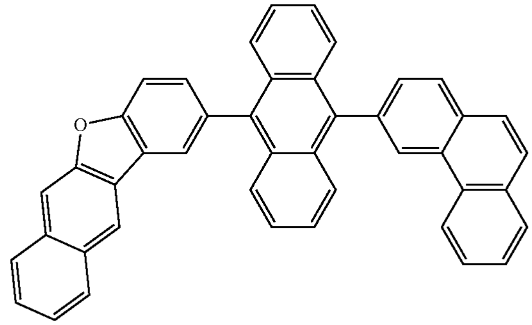
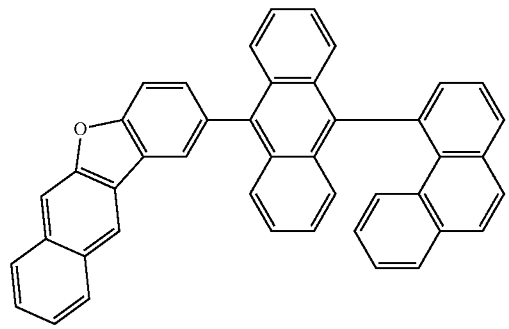
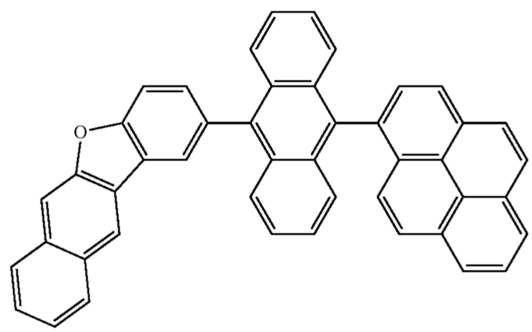
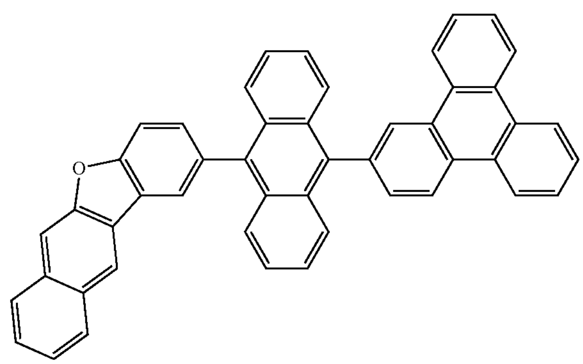
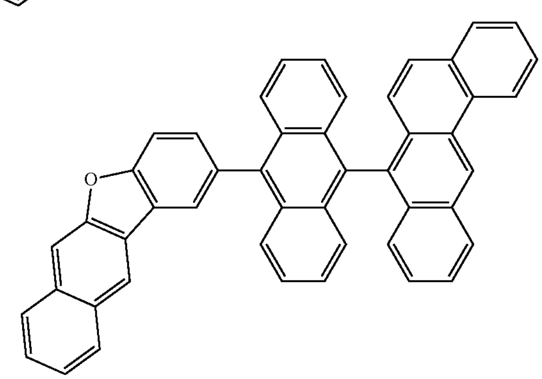

-continued
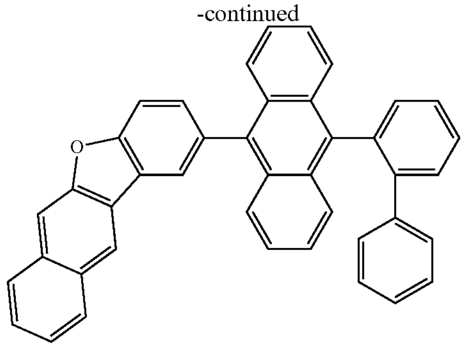
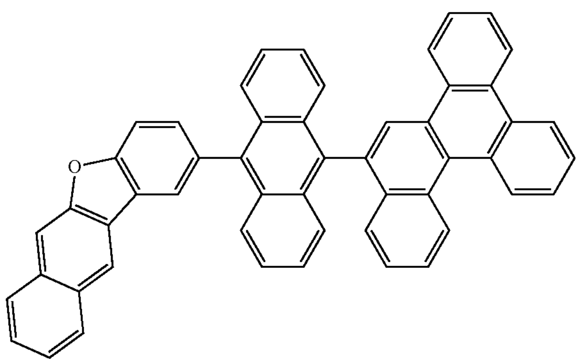
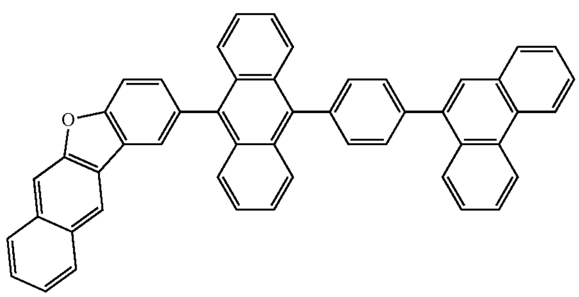
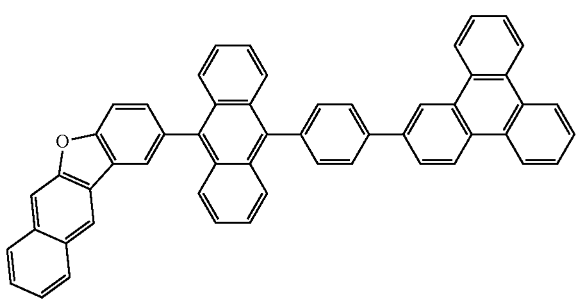
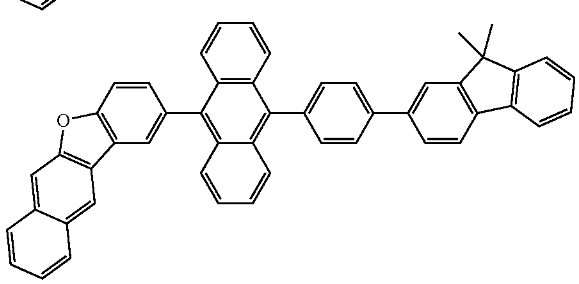
-continued
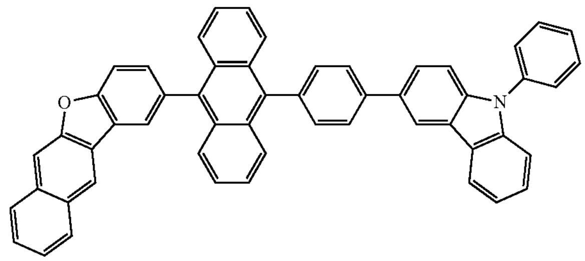
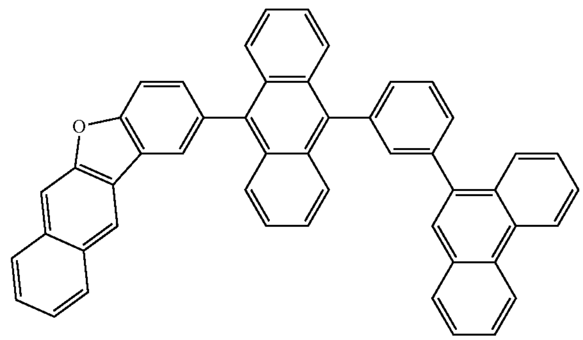
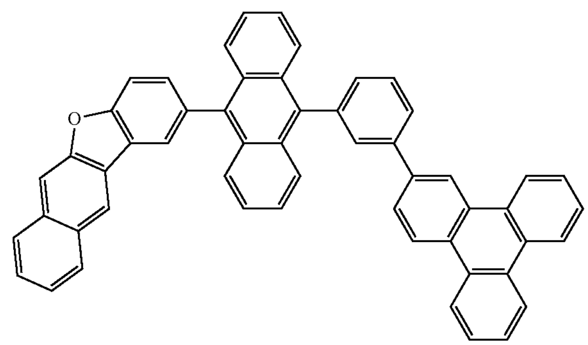
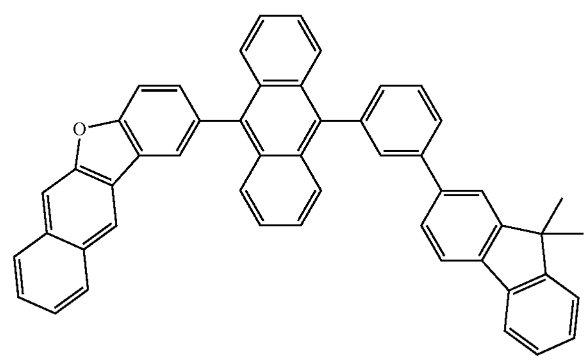
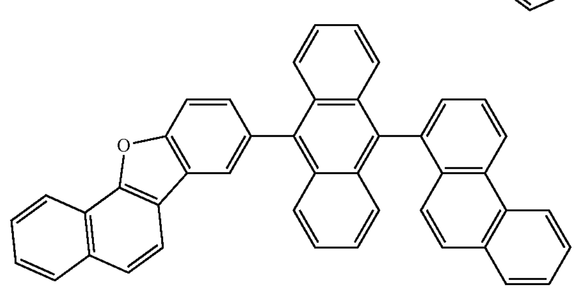

-continued
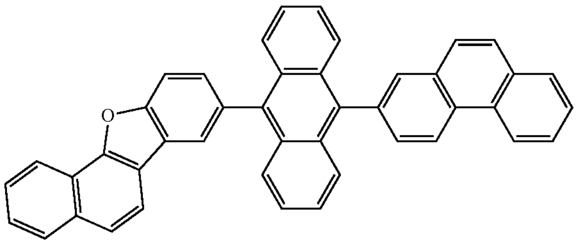
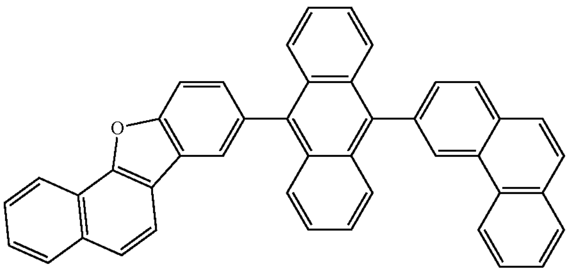
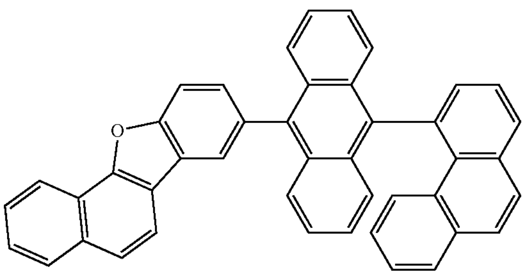
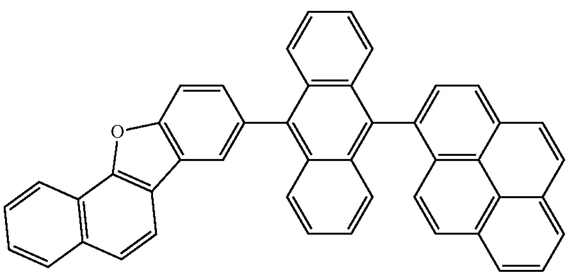
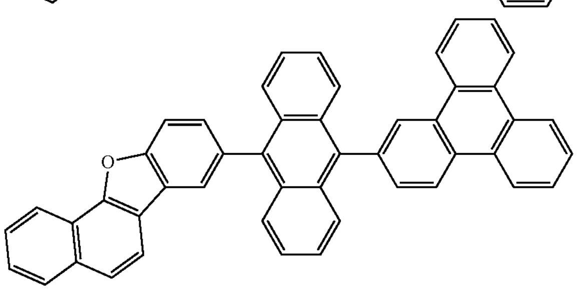
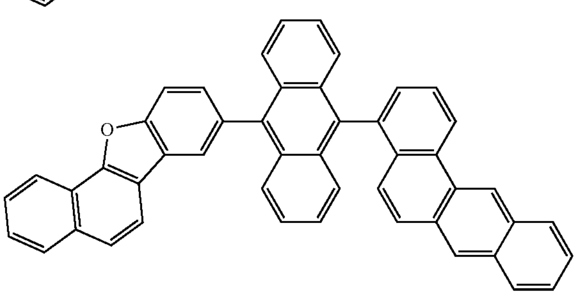
-continued
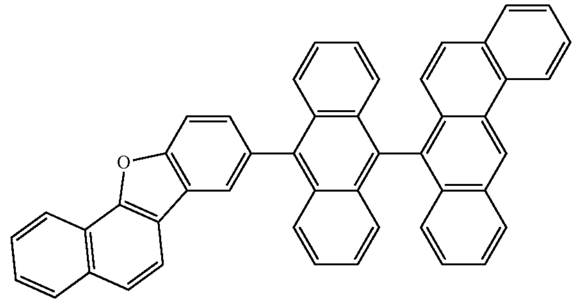
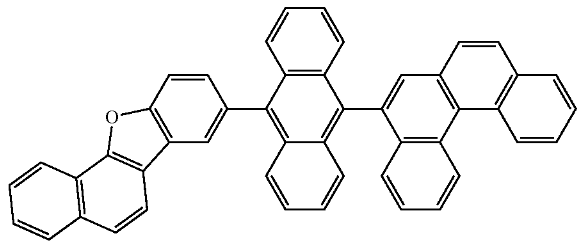
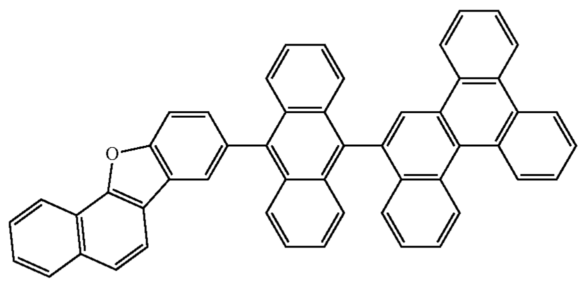
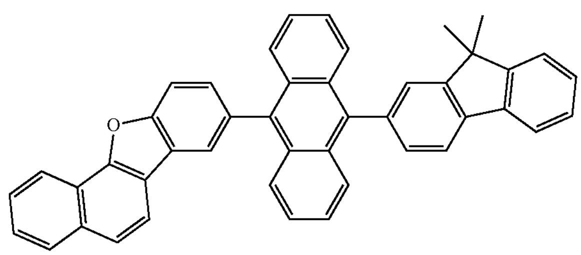
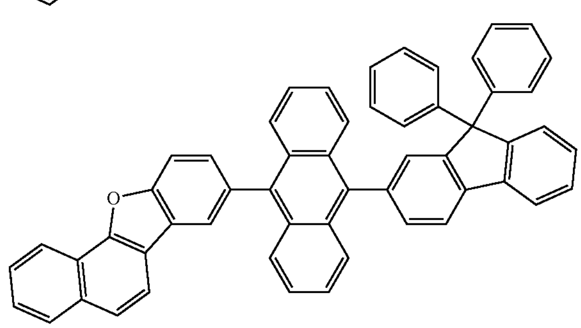

-continued
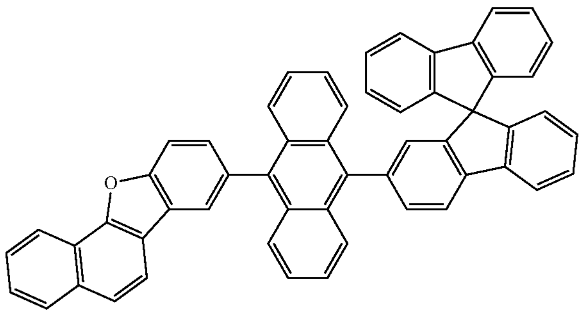
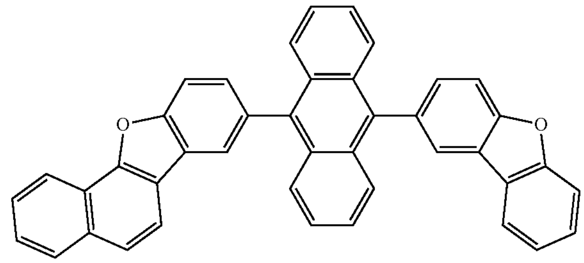
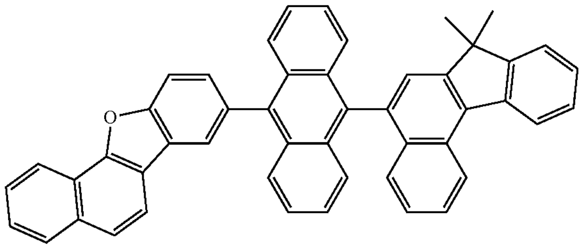
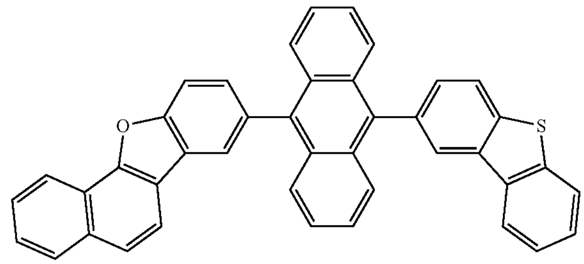
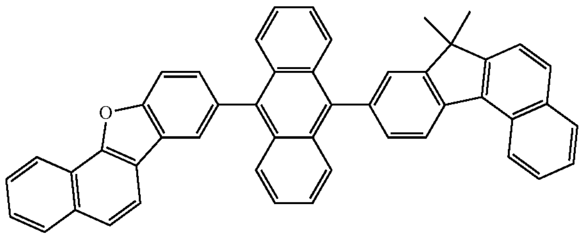
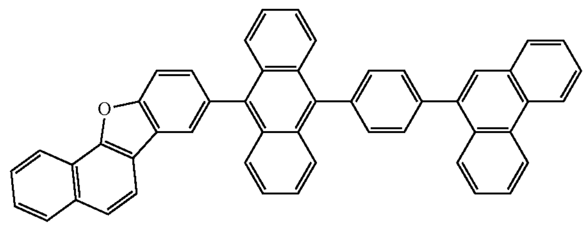
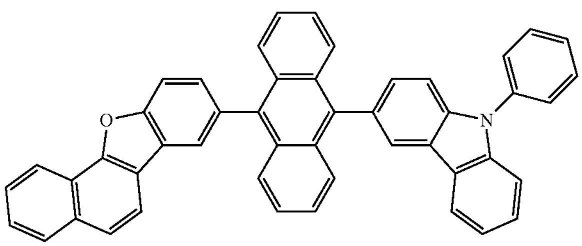
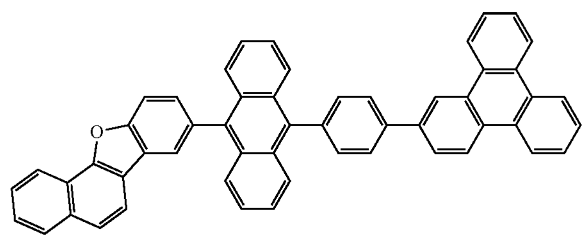
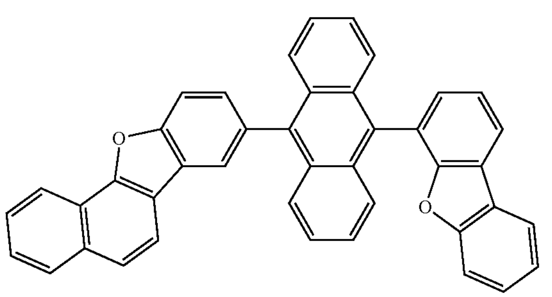
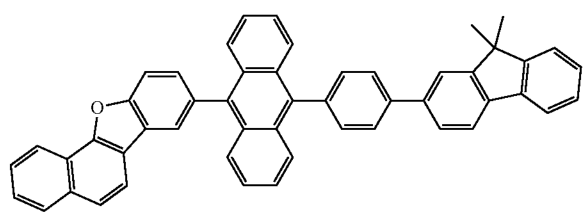
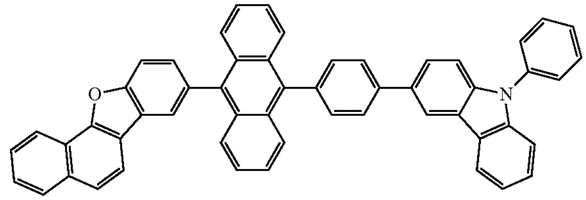
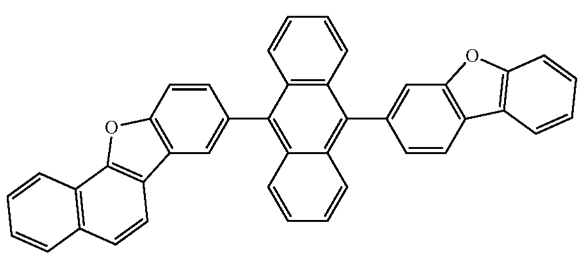
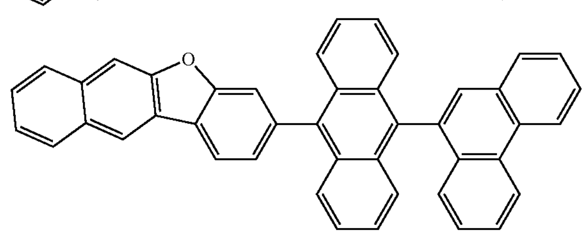

-continued
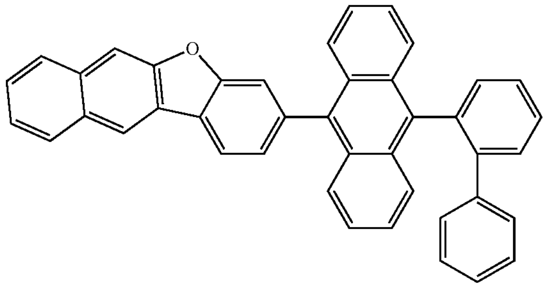
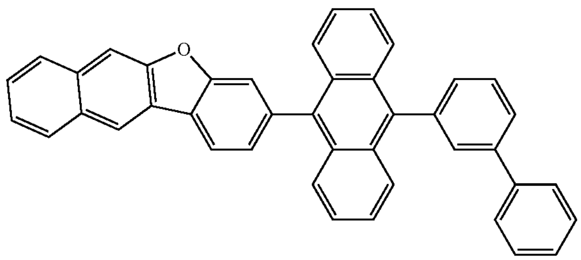
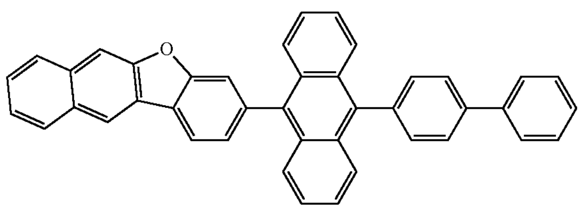
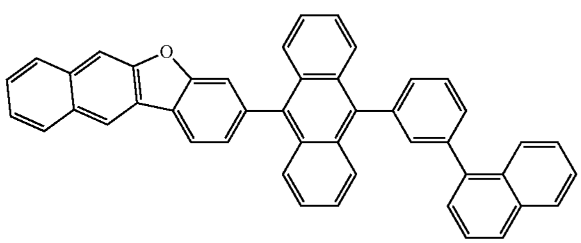
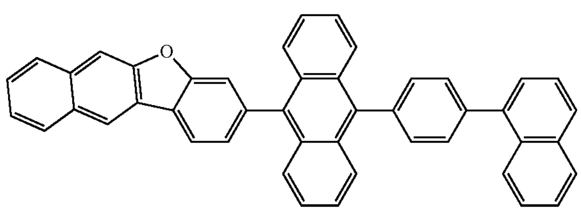
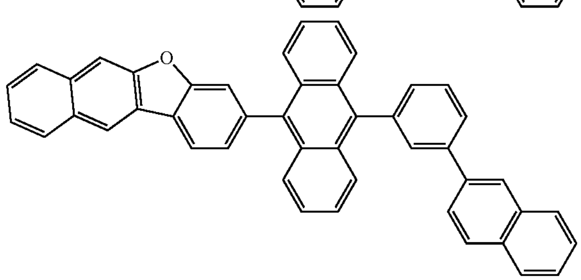
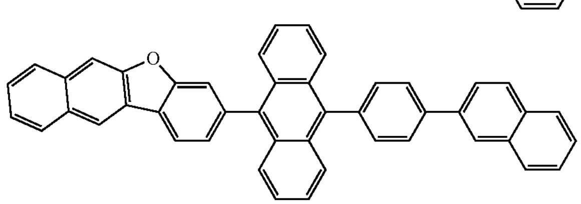
-continued
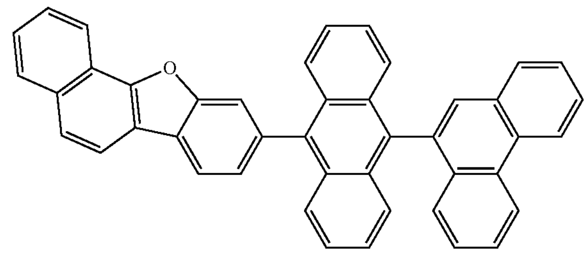
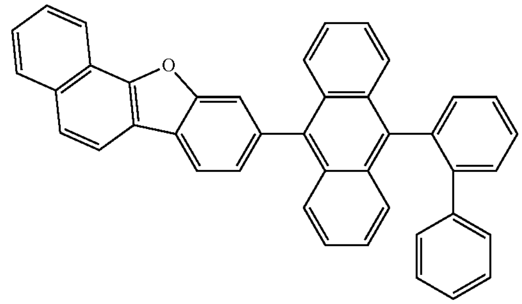
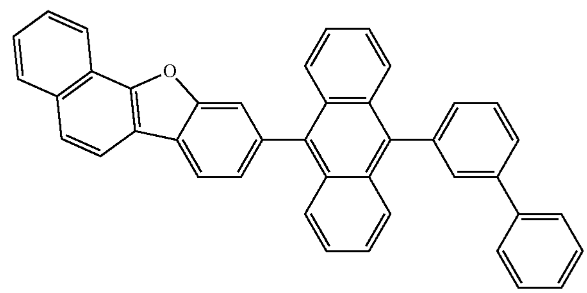
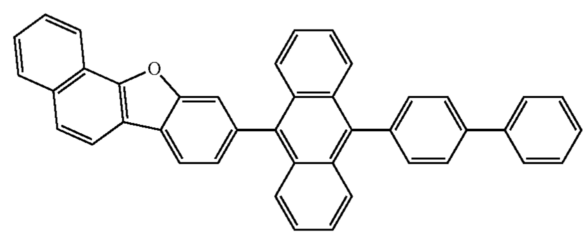
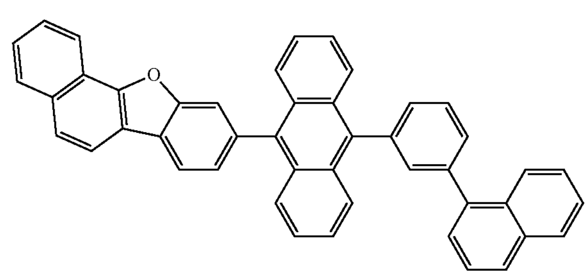
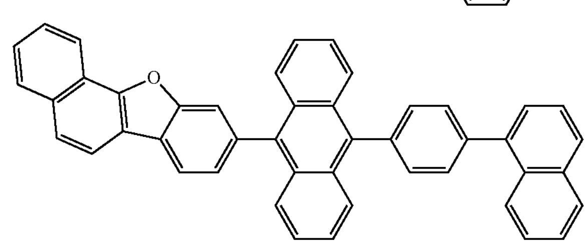

-continued
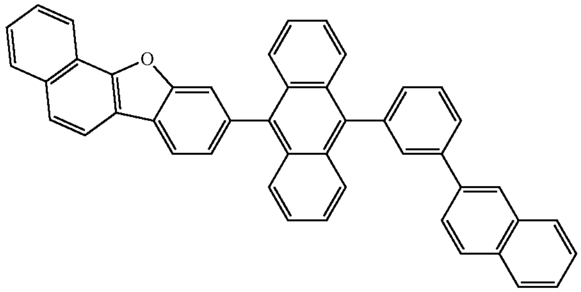
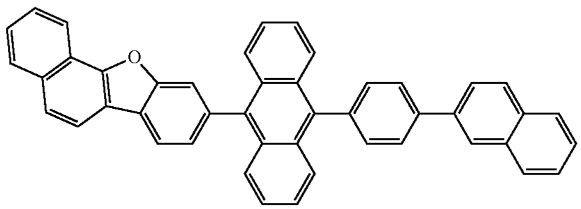
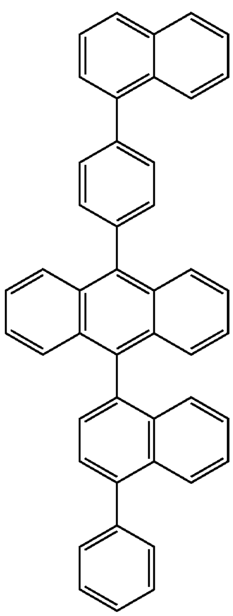
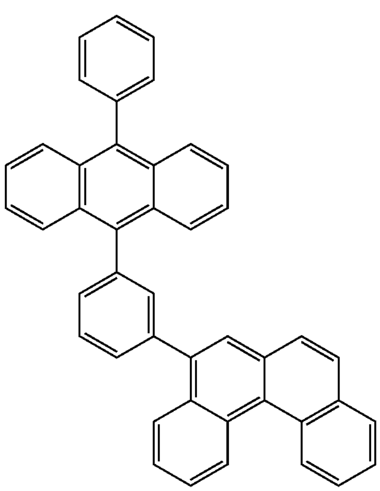
-continued
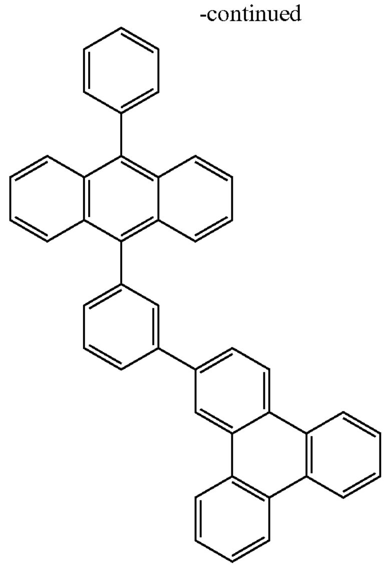
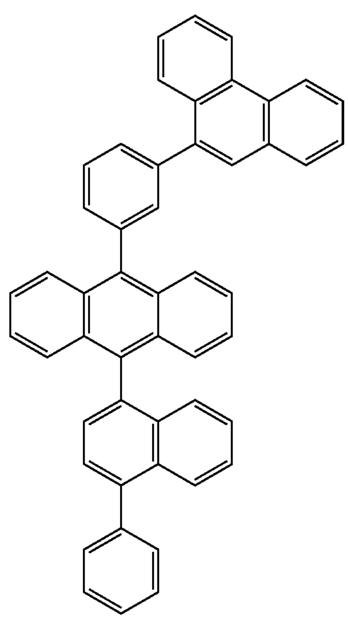

-continued
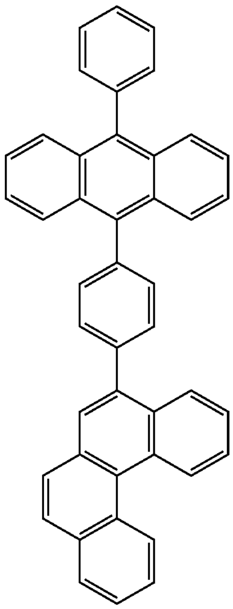
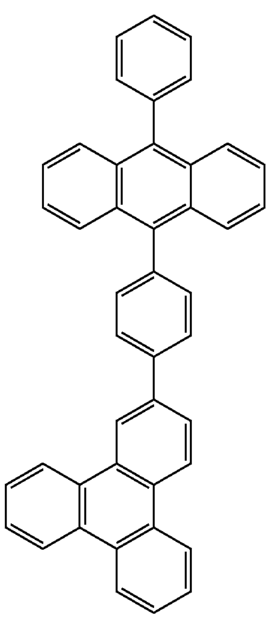
-continued
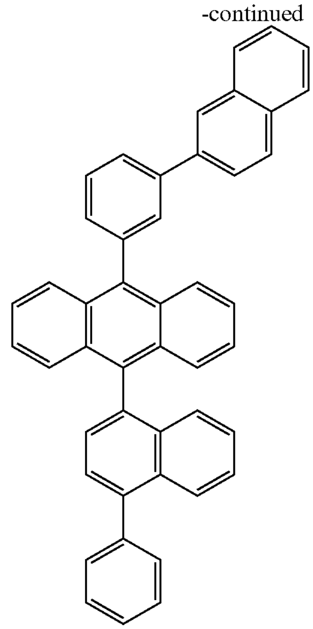
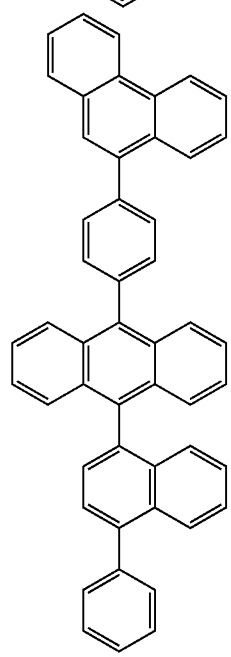
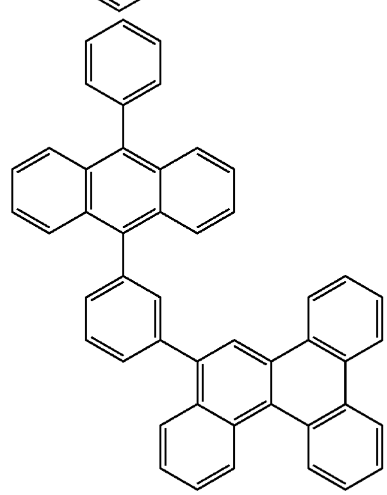

-continued
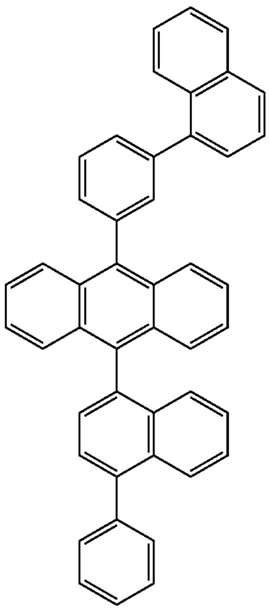
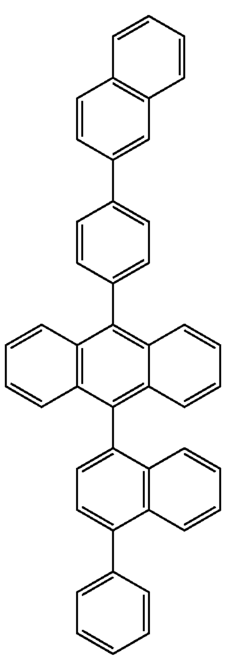
-continued
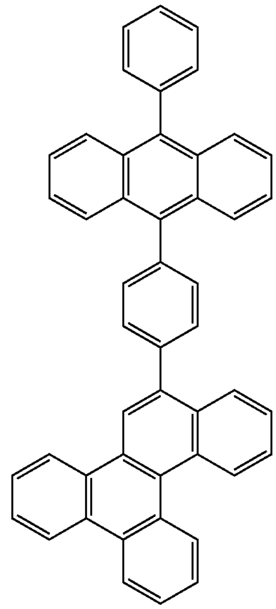
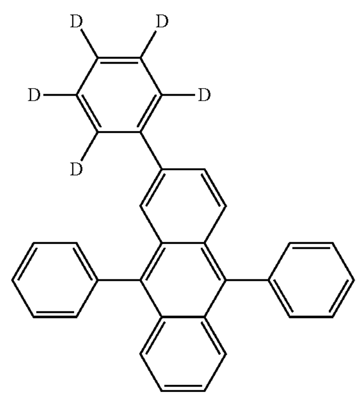
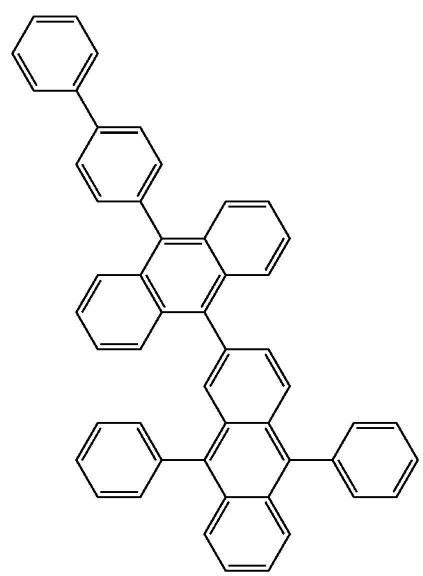

-continued
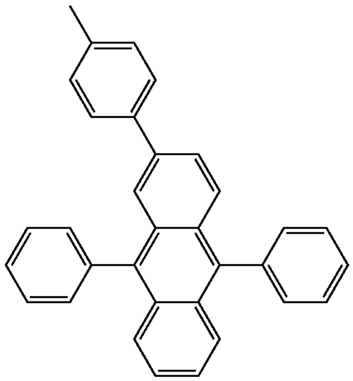
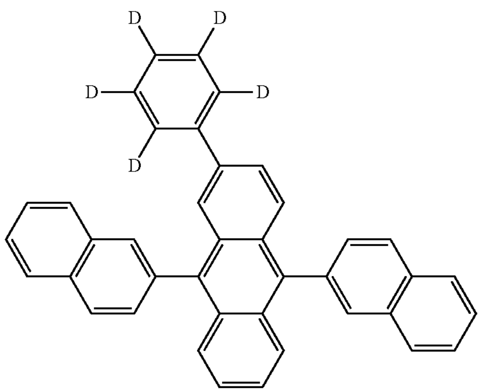
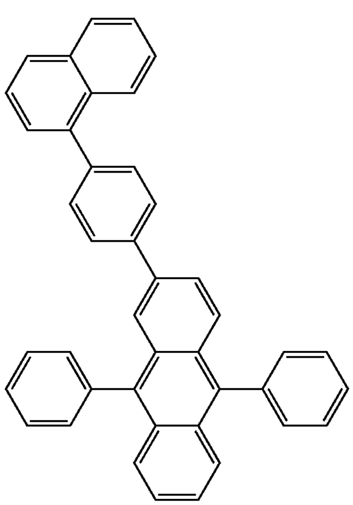
-continued
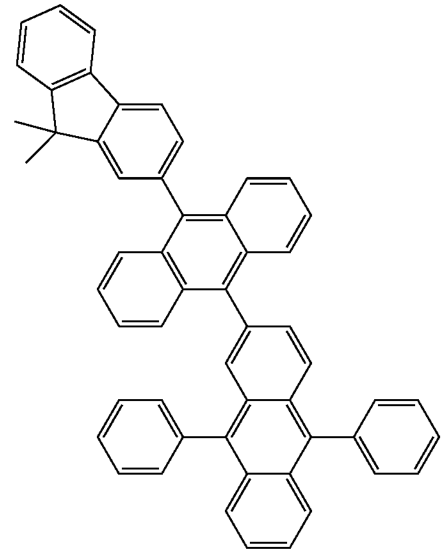
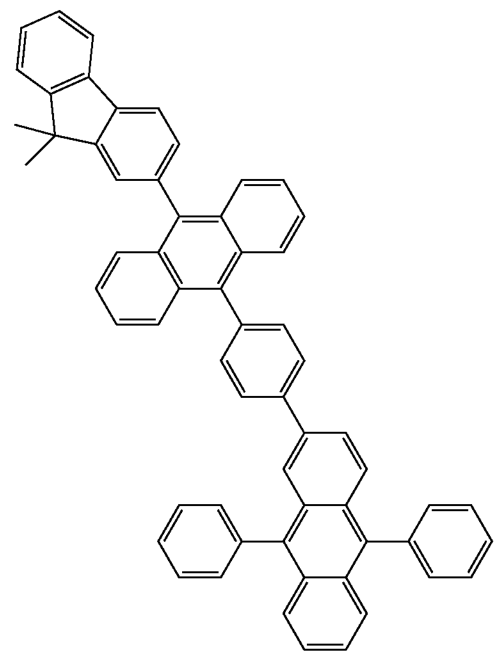
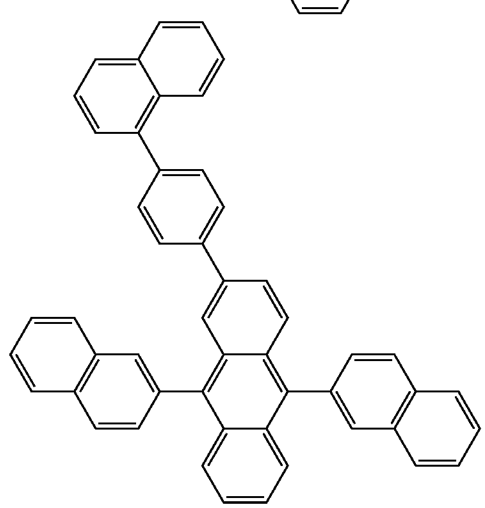

-continued
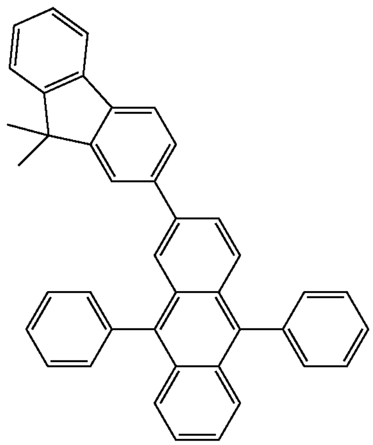
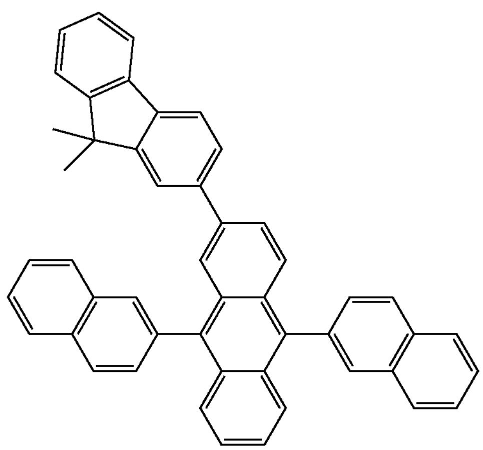
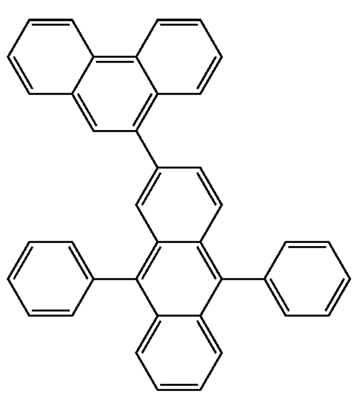
-continued
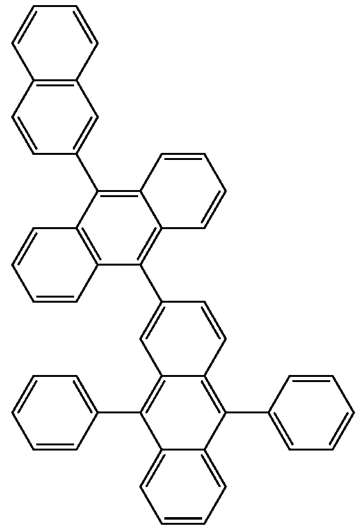
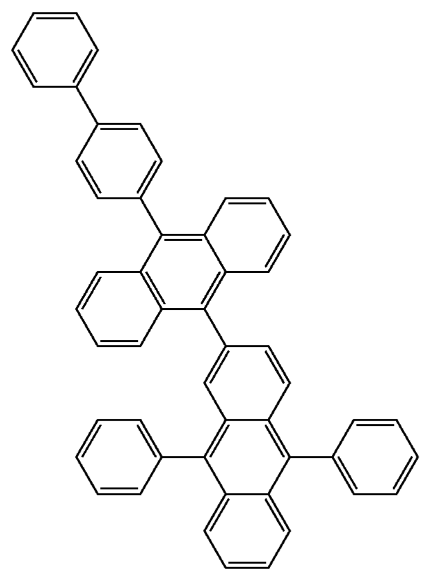
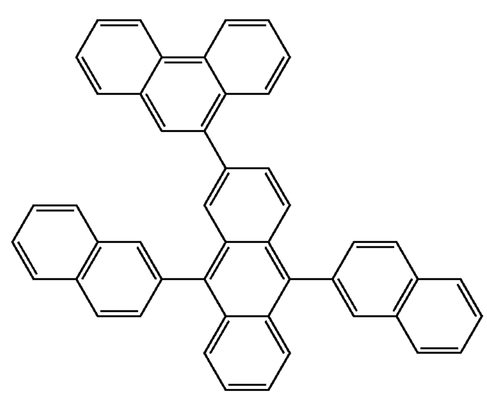

-continued
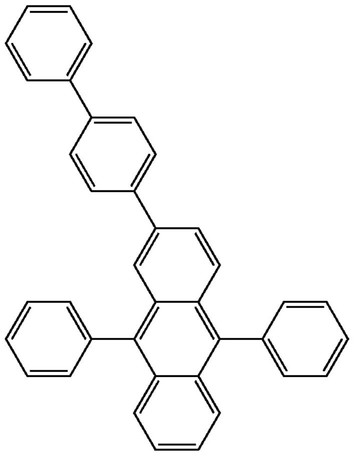
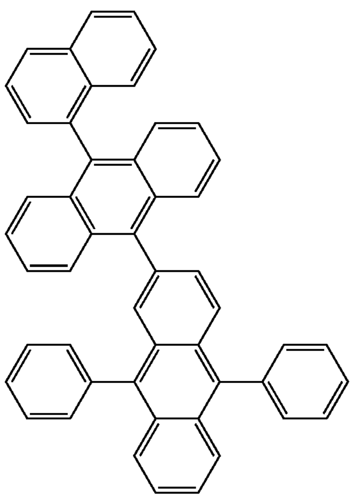
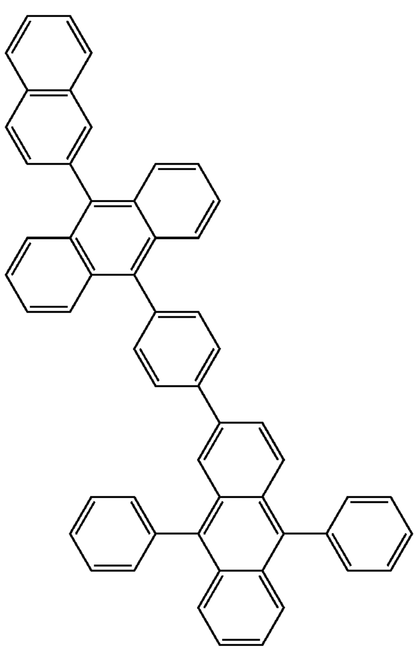
-continued
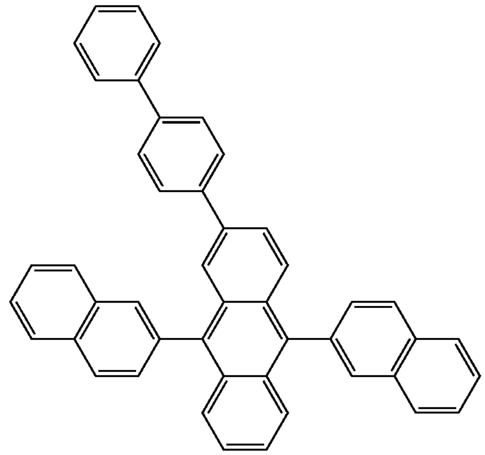
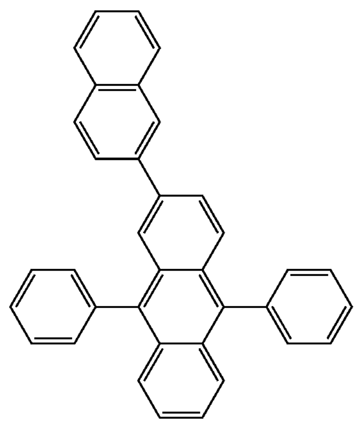
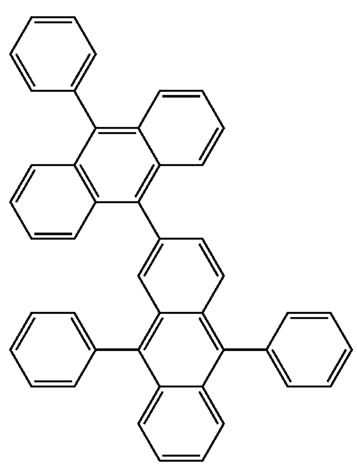

-continued
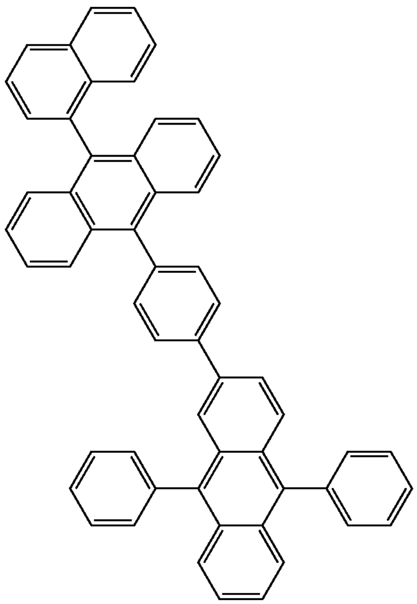
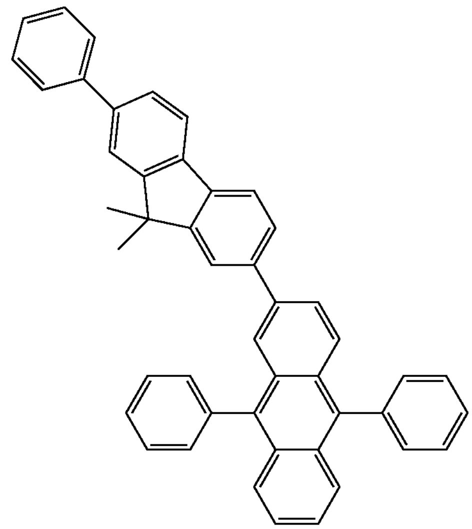
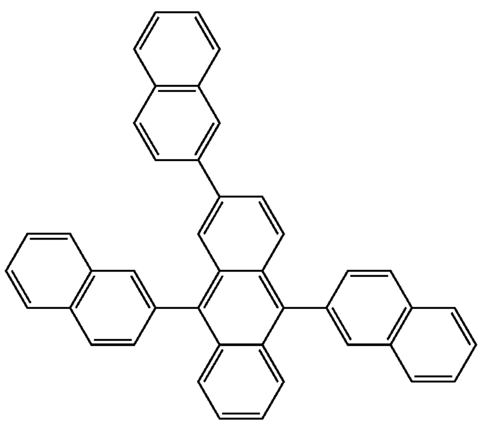
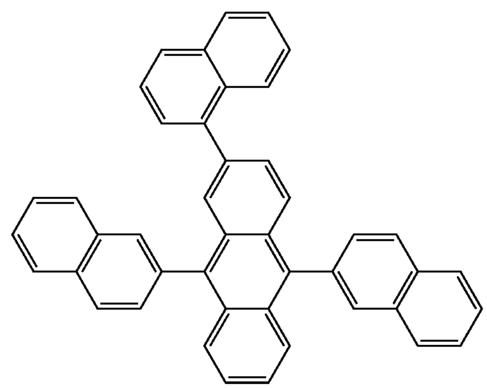
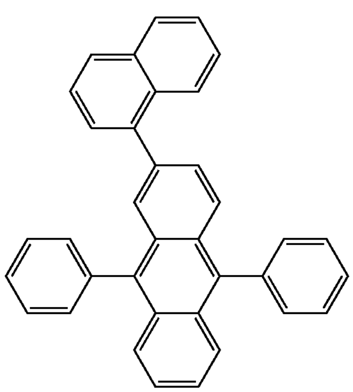
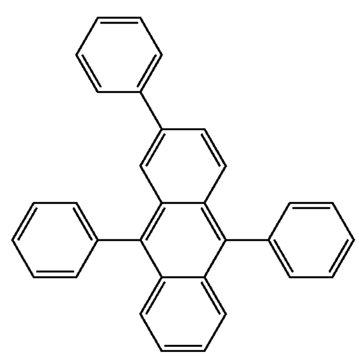

-continued
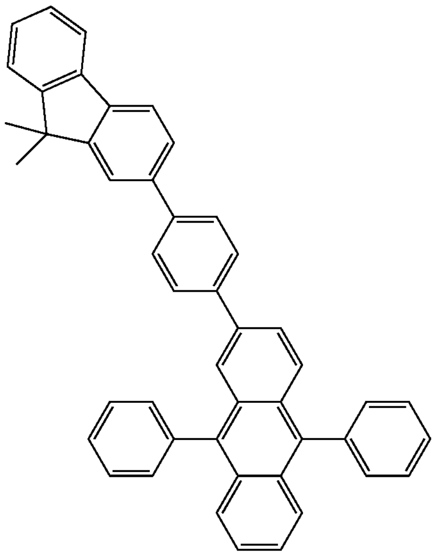
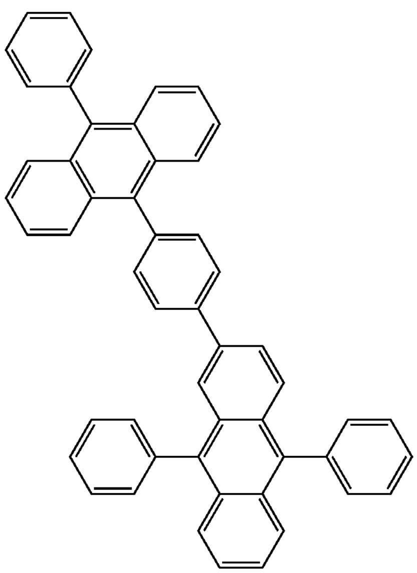
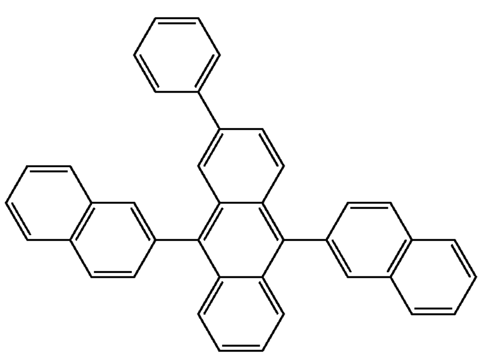
-continued
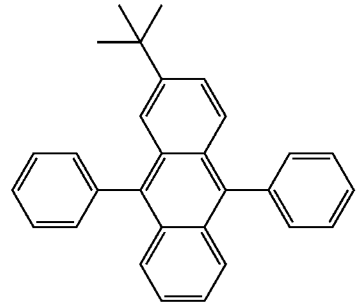
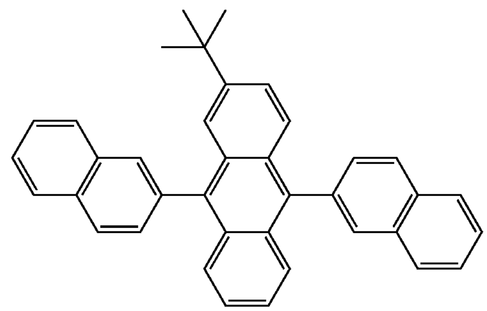
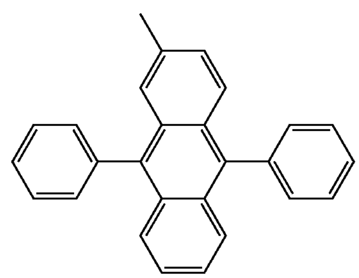
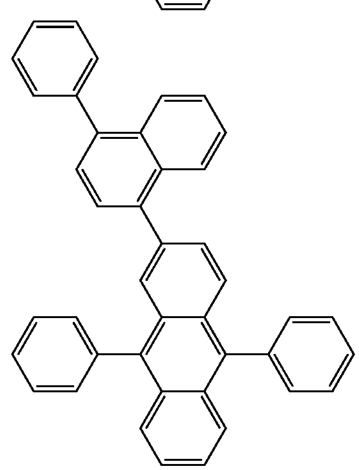

-continued
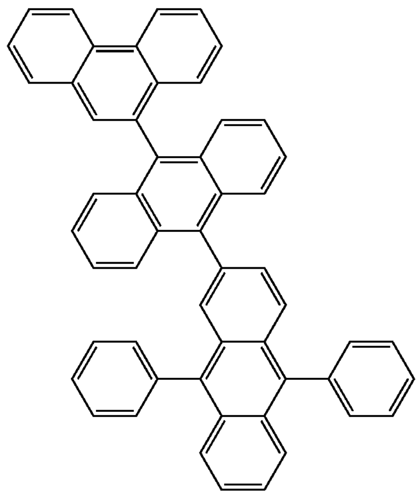
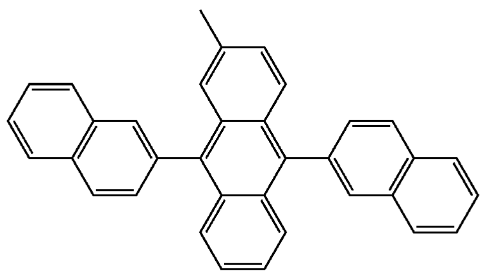
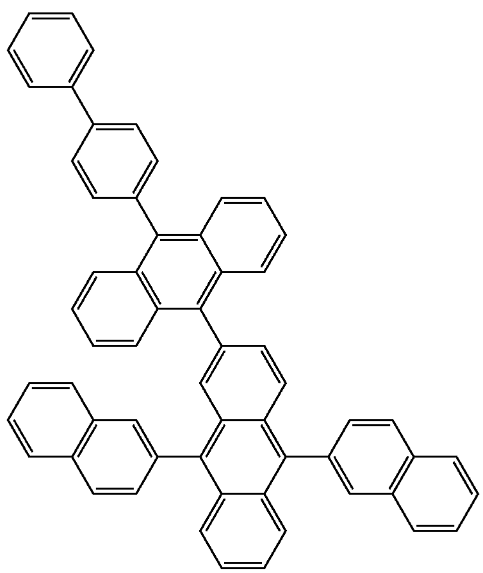
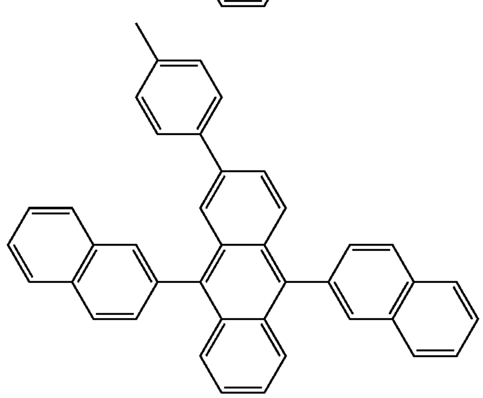
-continued
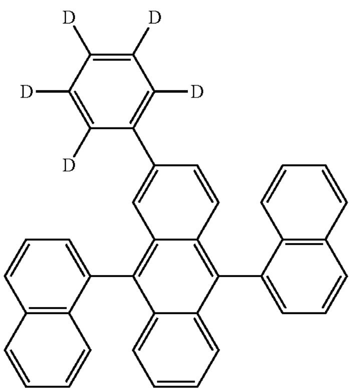
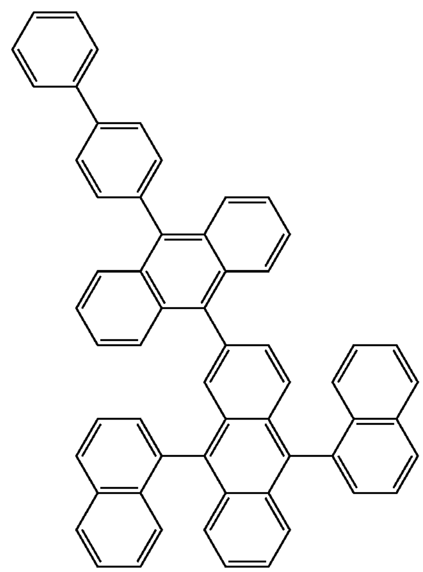
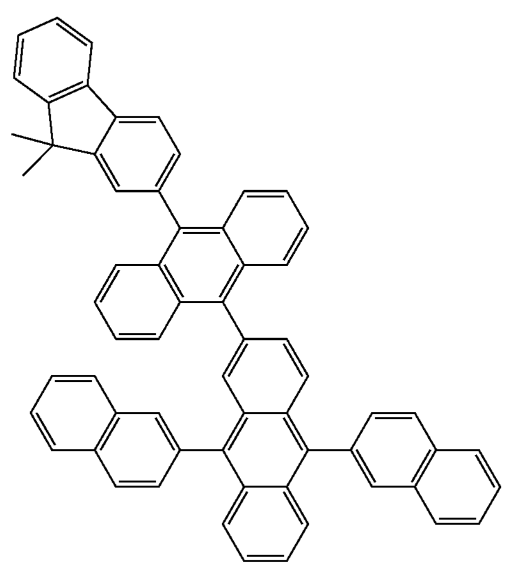

-continued
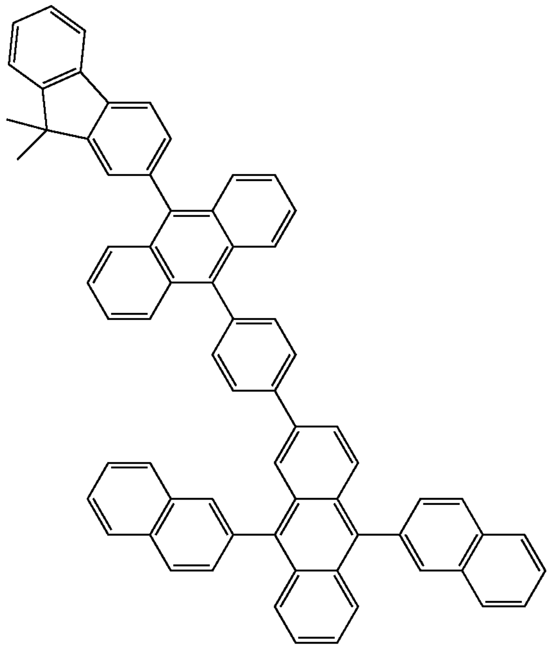
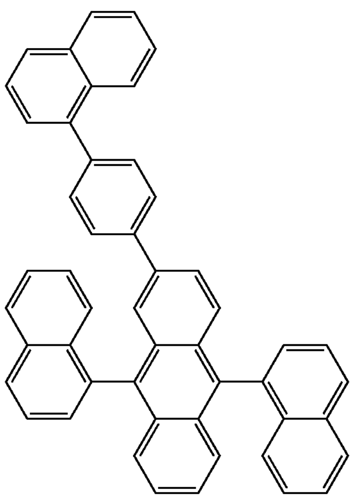
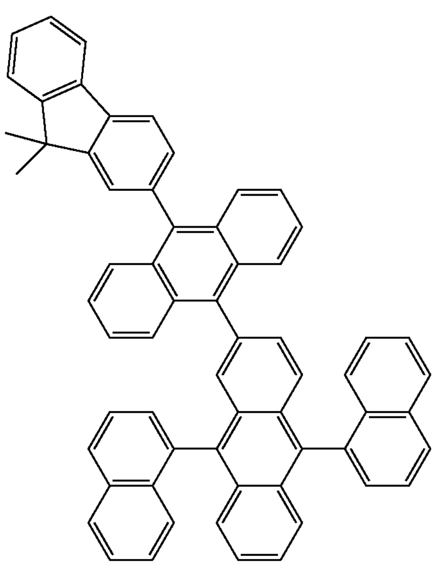
-continued
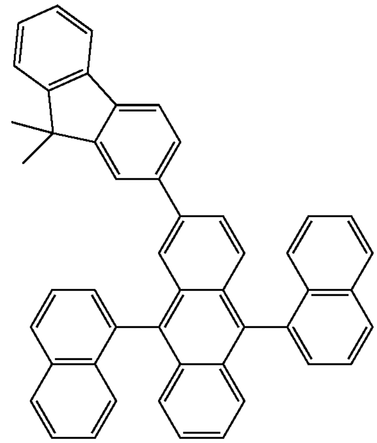
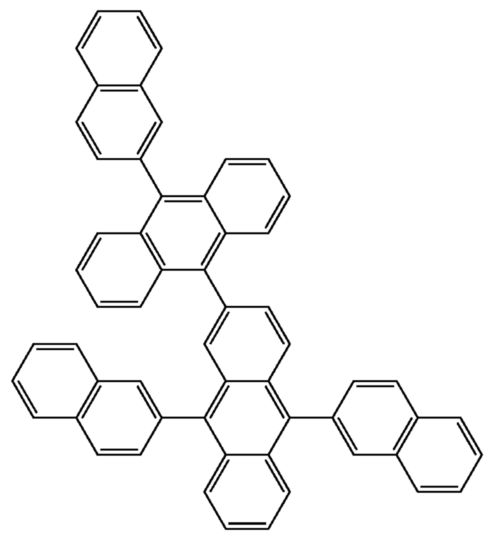
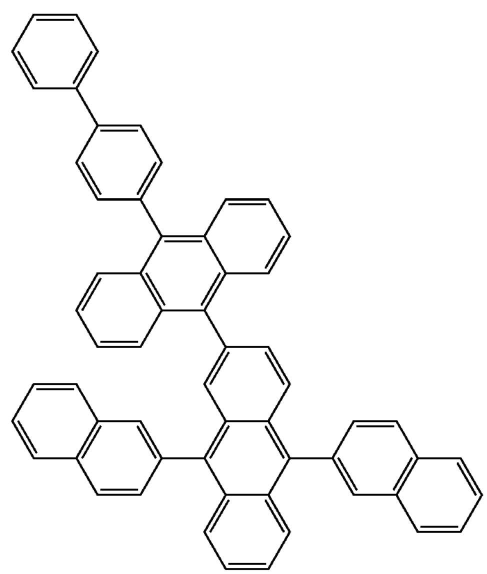

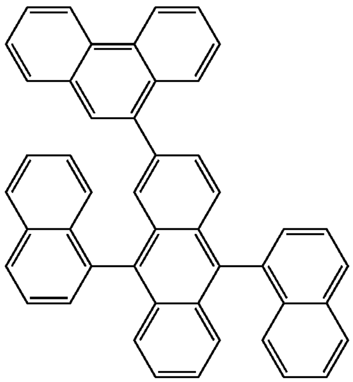
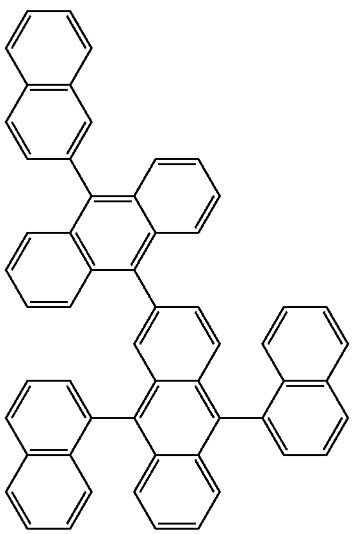
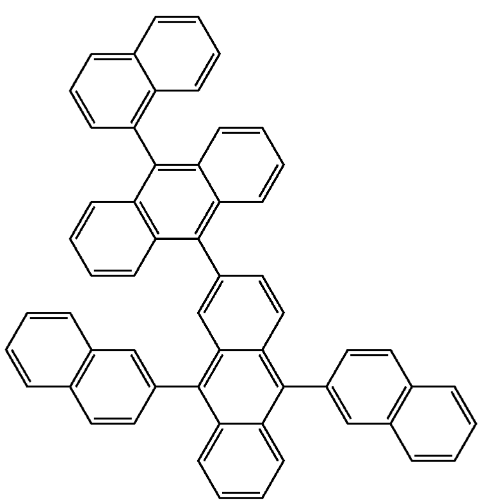
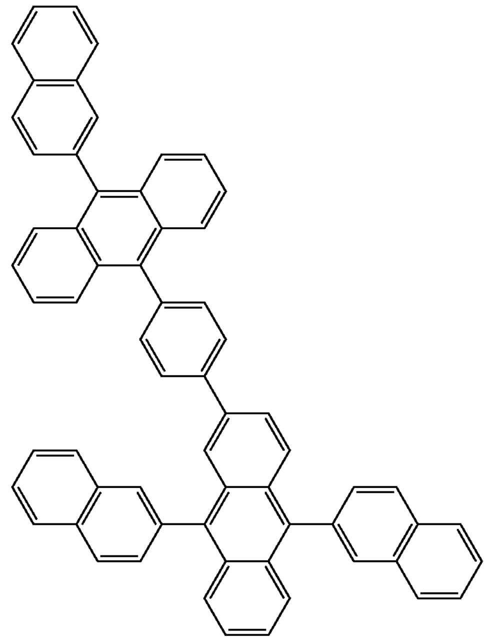
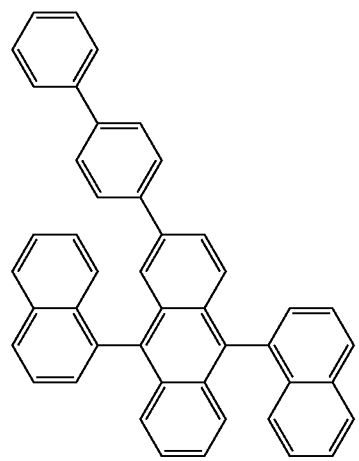
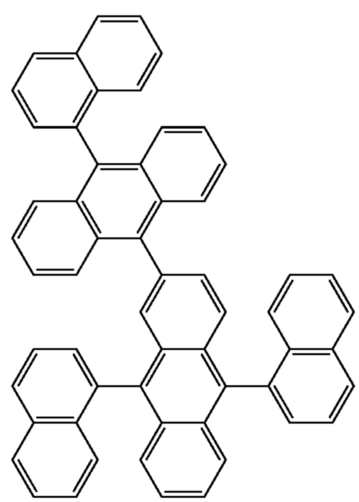

-continued
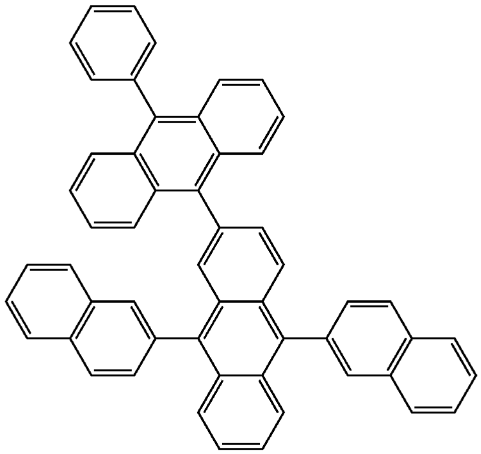
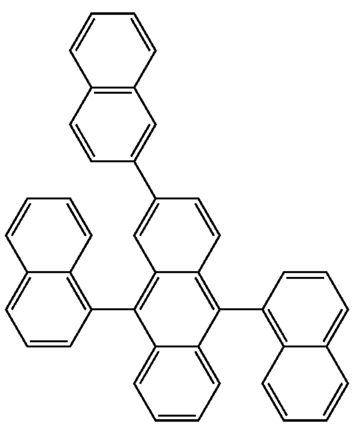
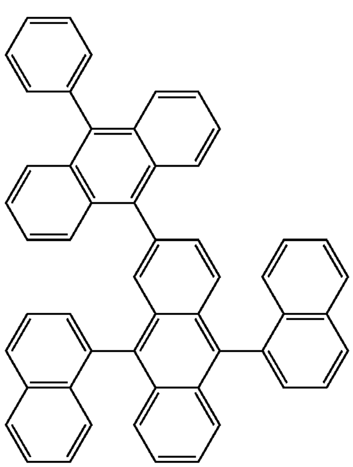
-continued
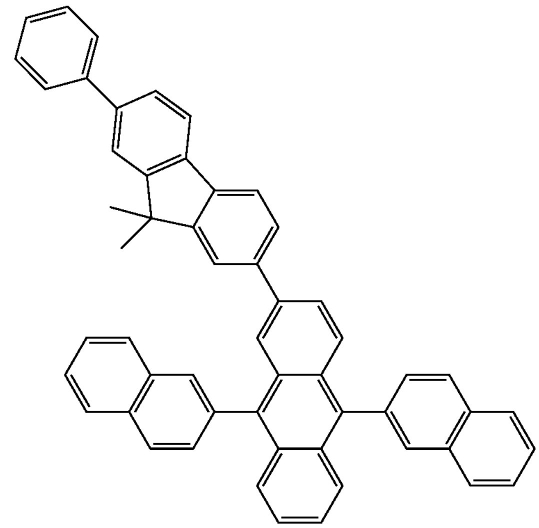
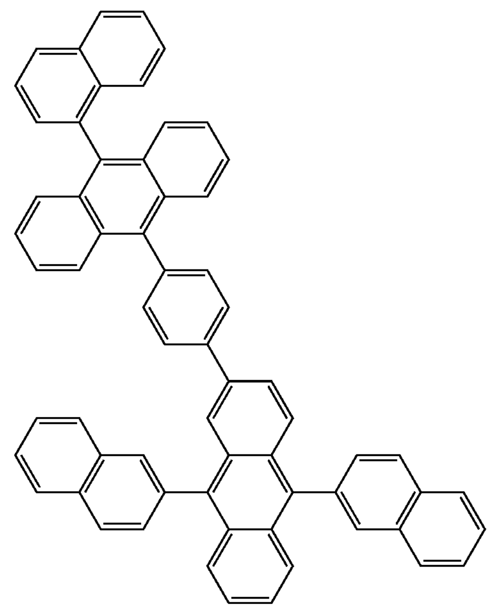
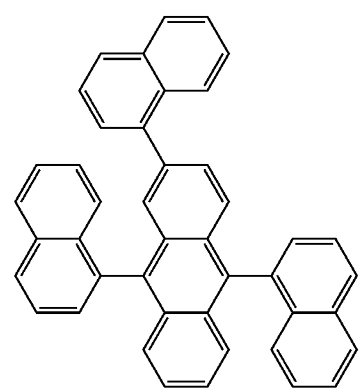

-continued
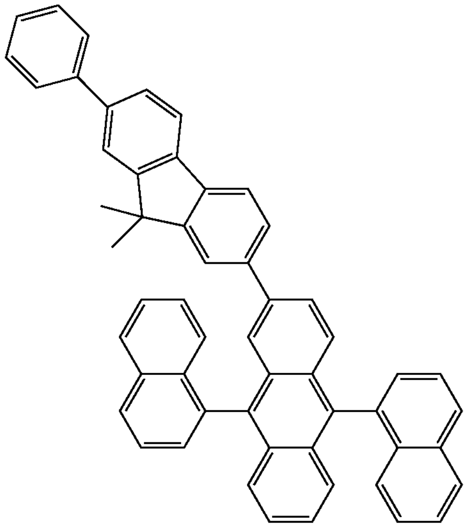
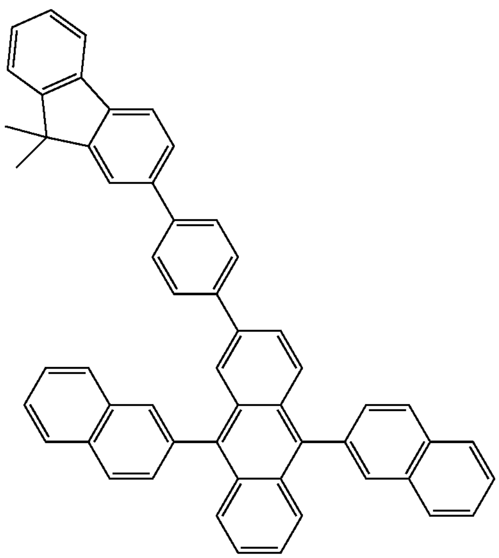
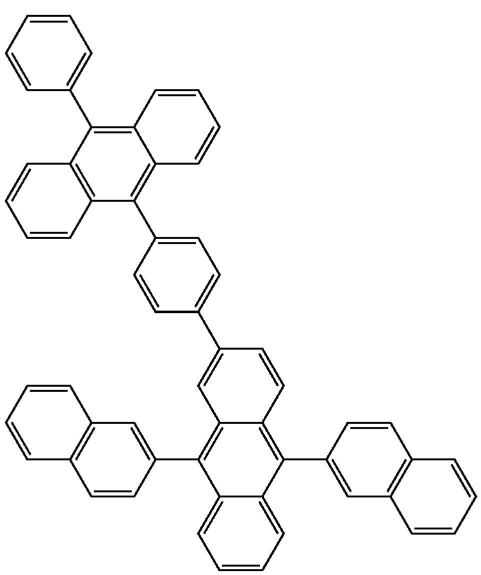
-continued
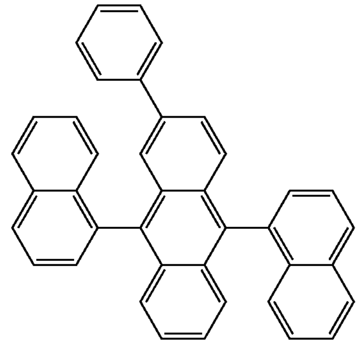
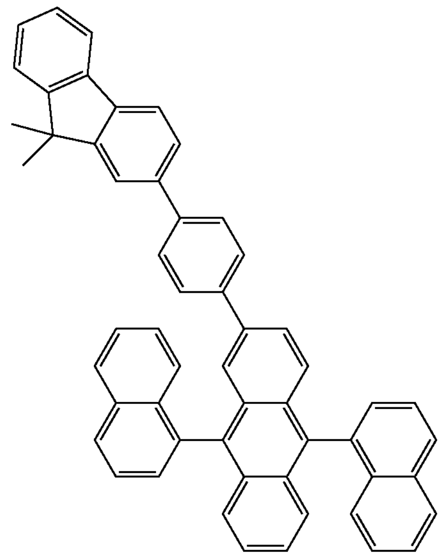
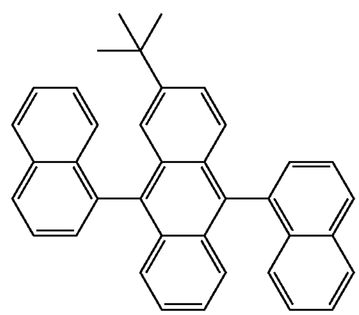
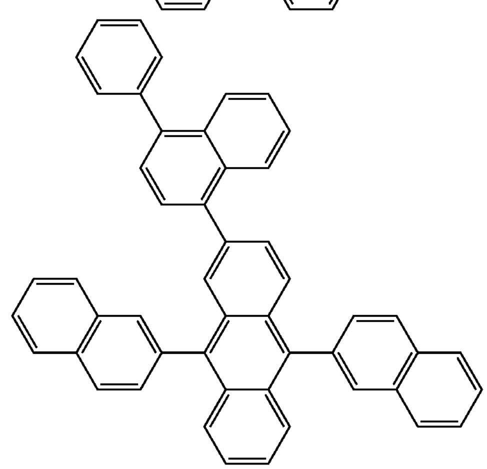

-continued
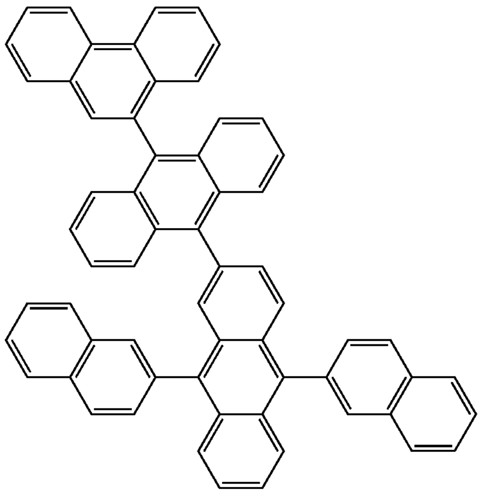
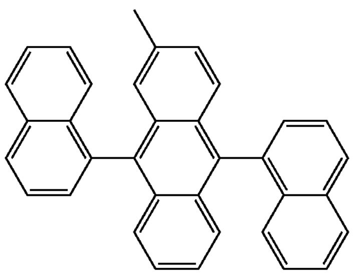
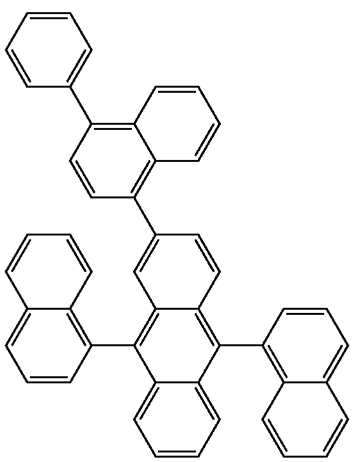
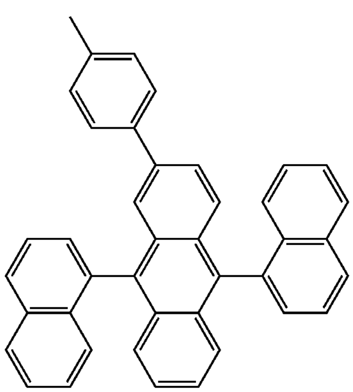
-continued
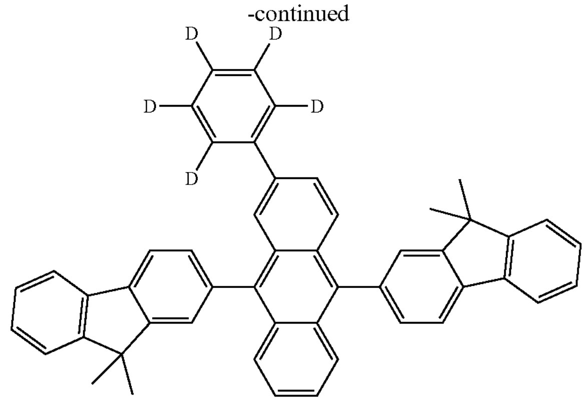
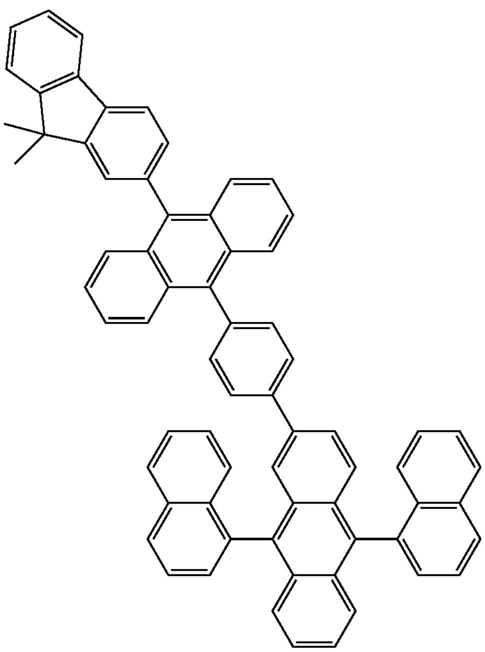
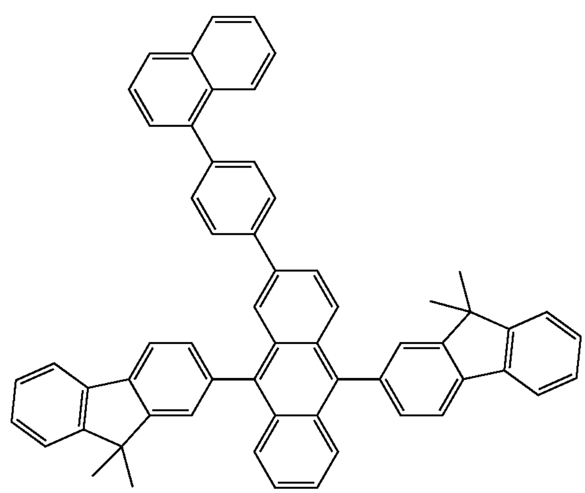

-continued
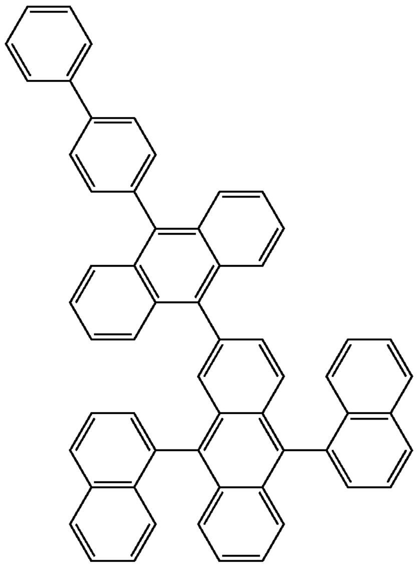
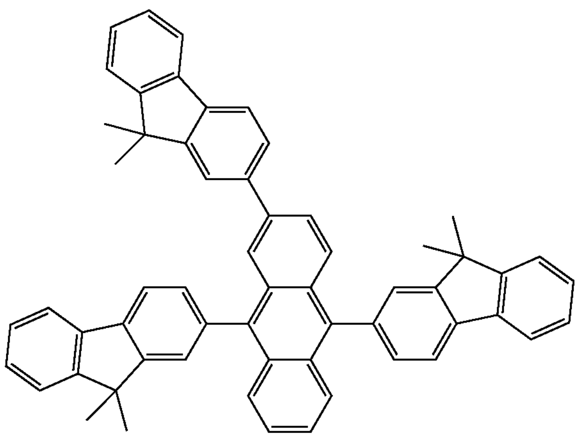
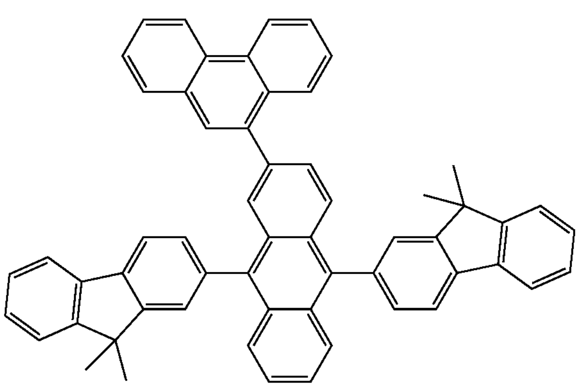
-continued
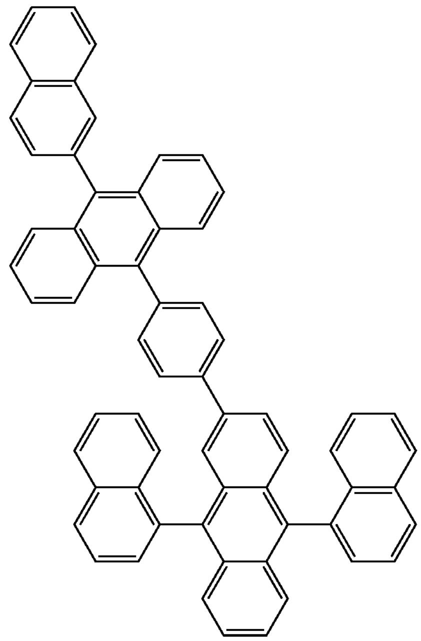
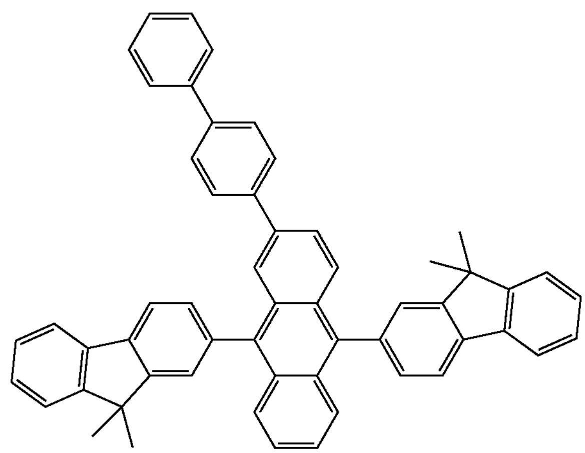
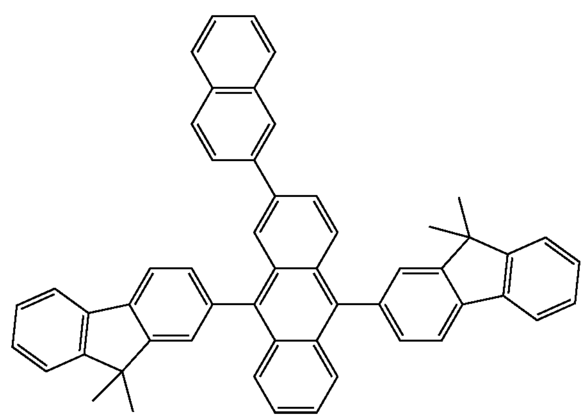

-continued
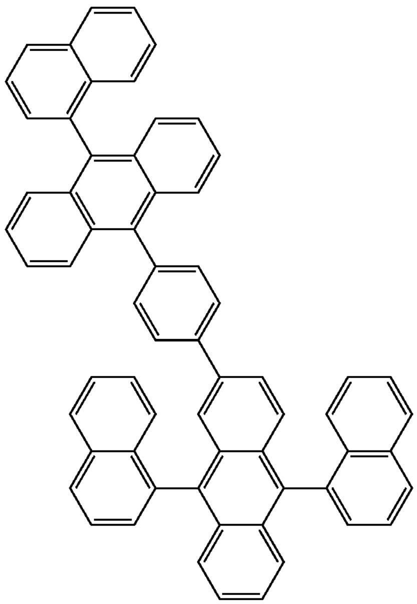
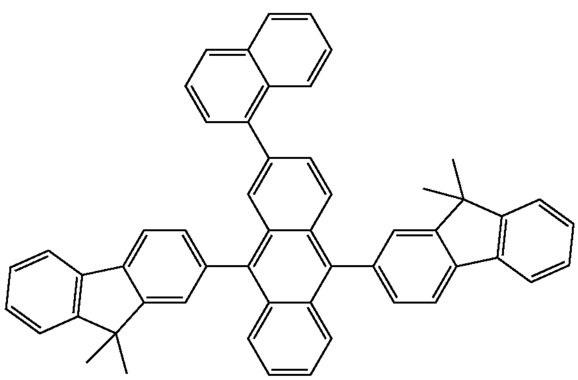
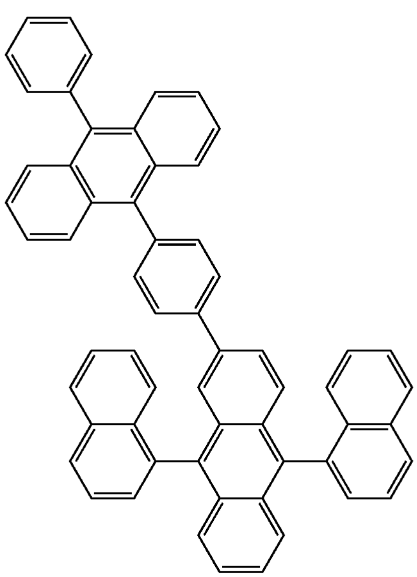
-continued
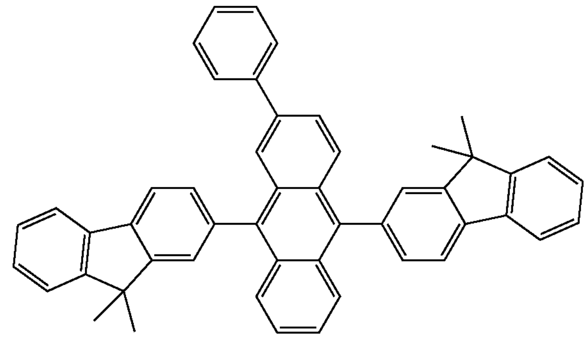
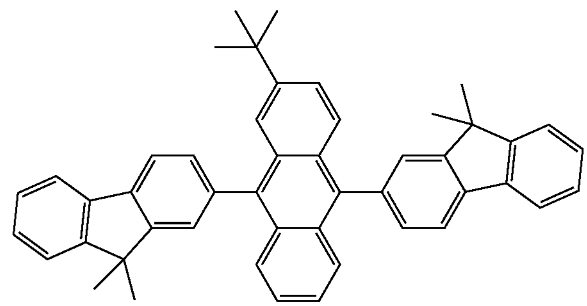
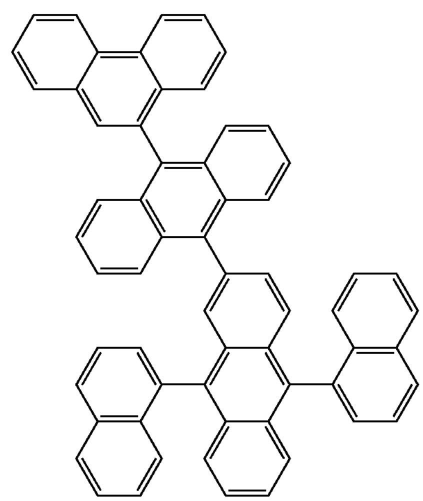
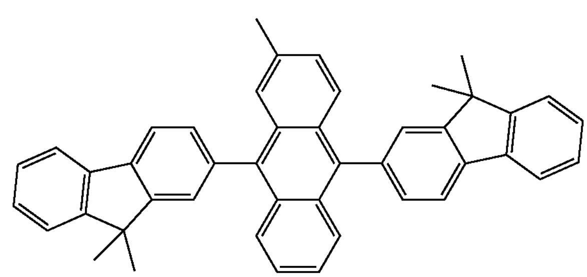

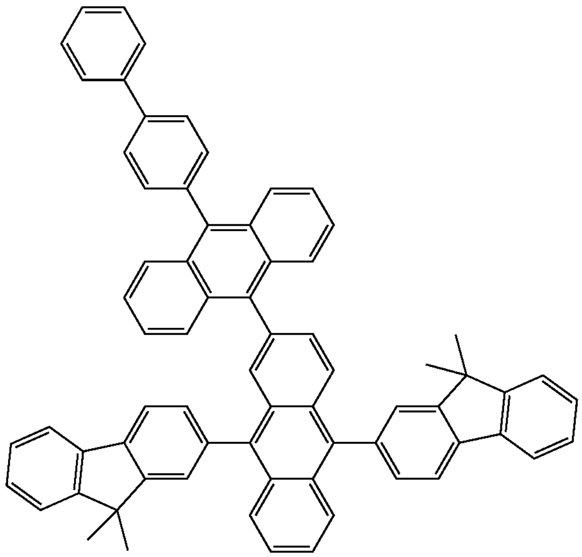
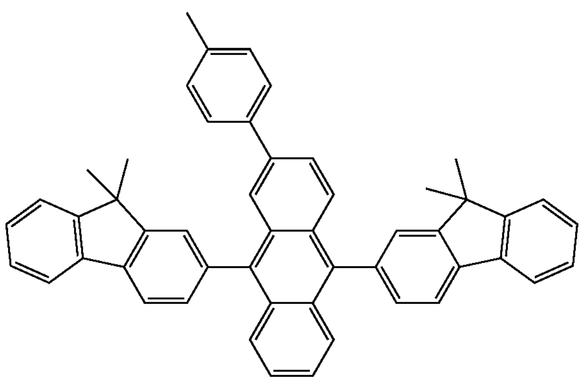
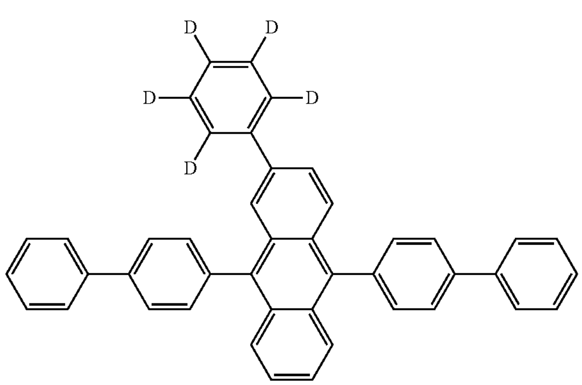
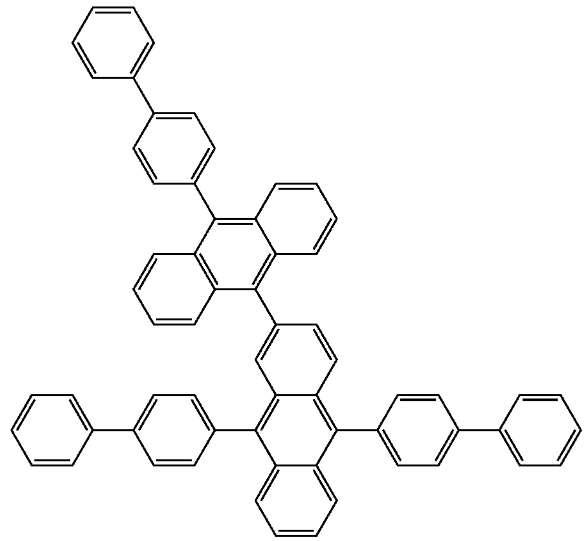
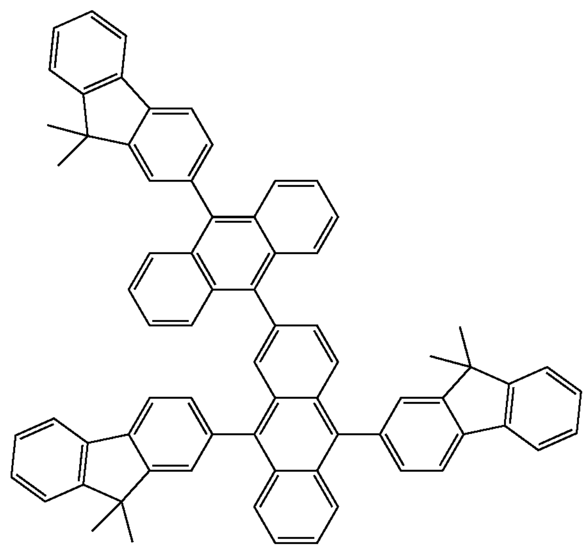
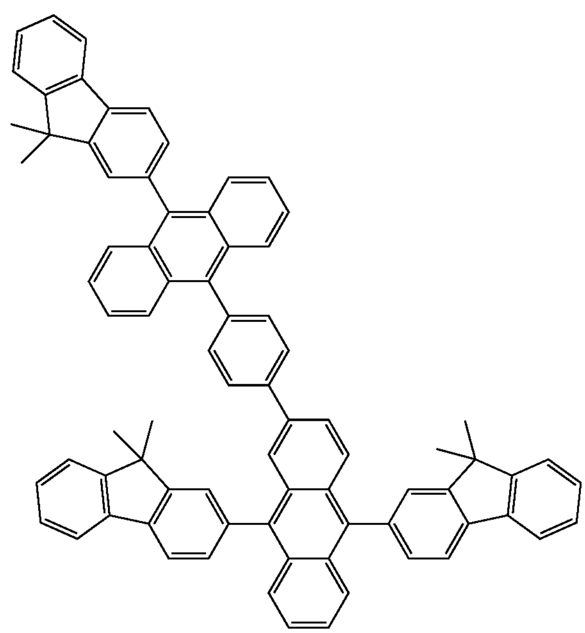

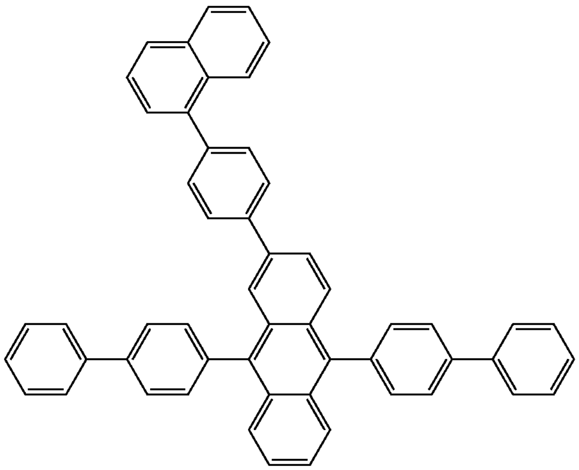
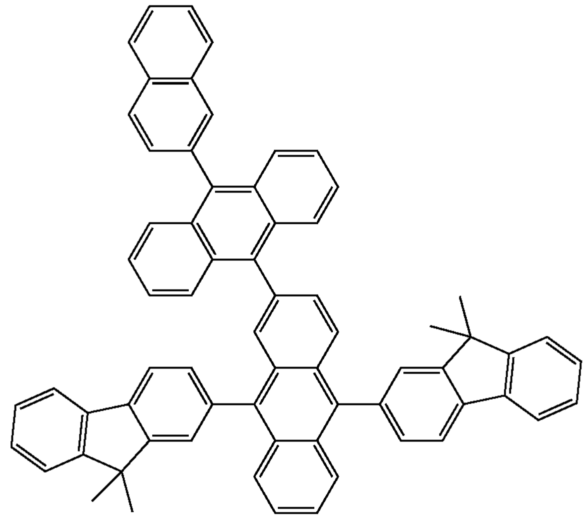
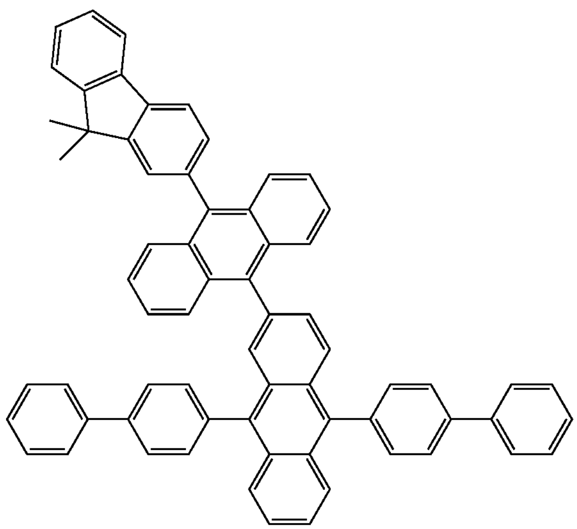
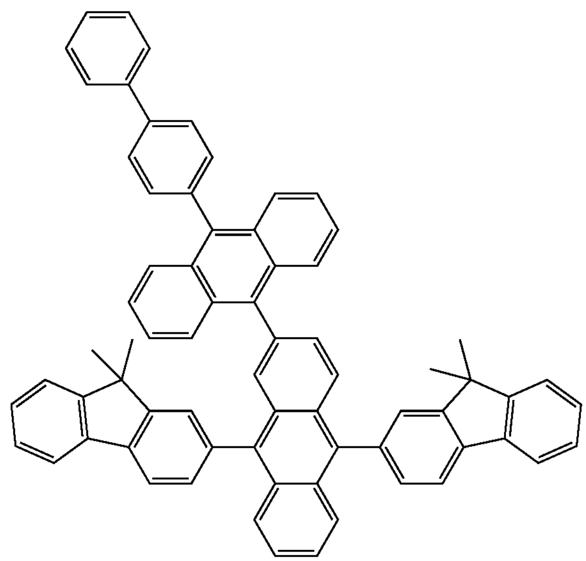
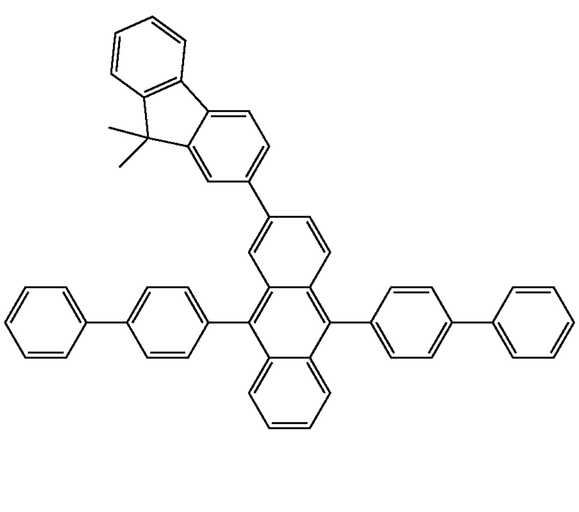
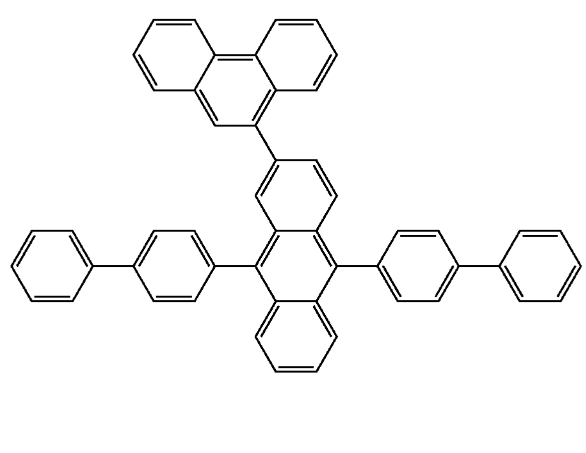

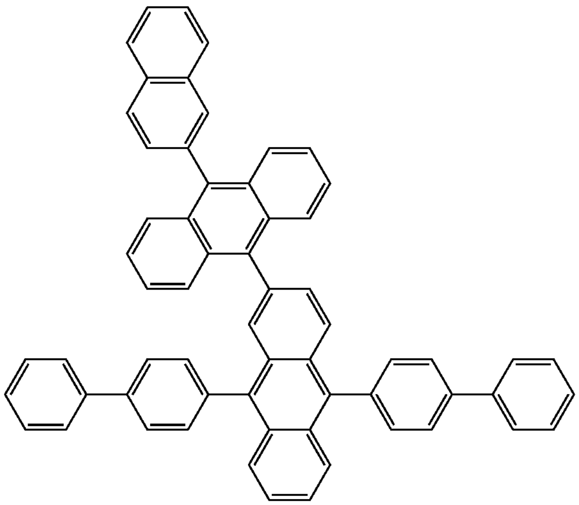
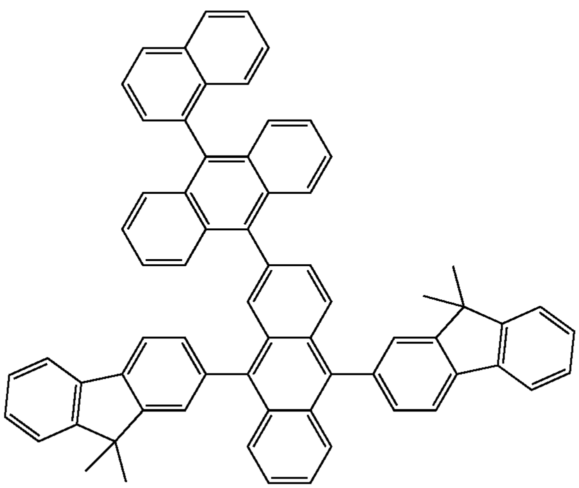
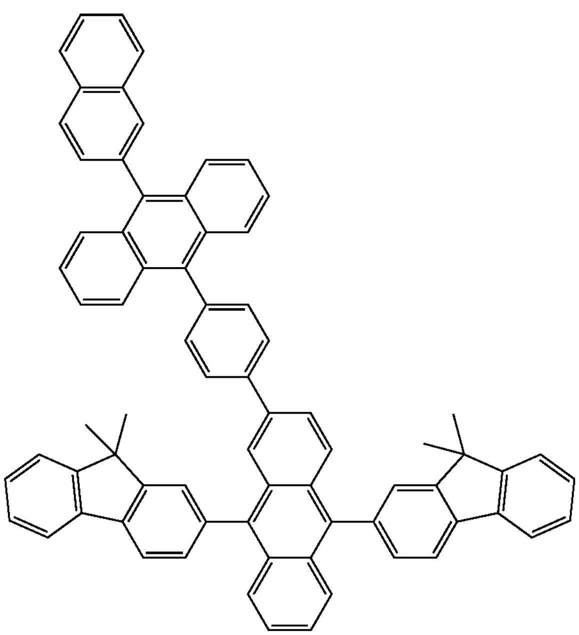
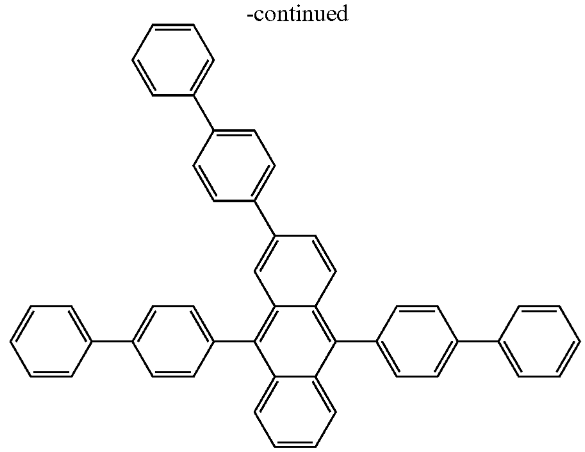
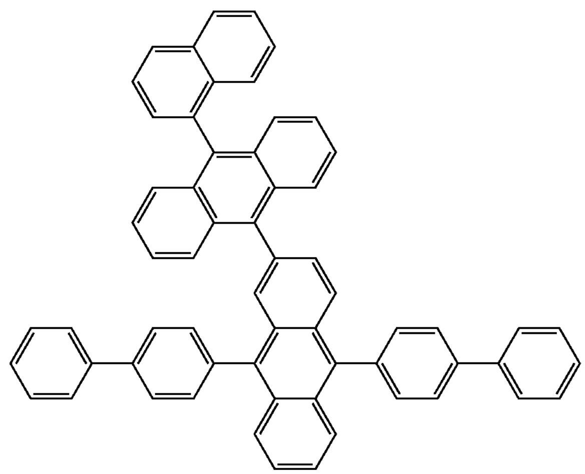
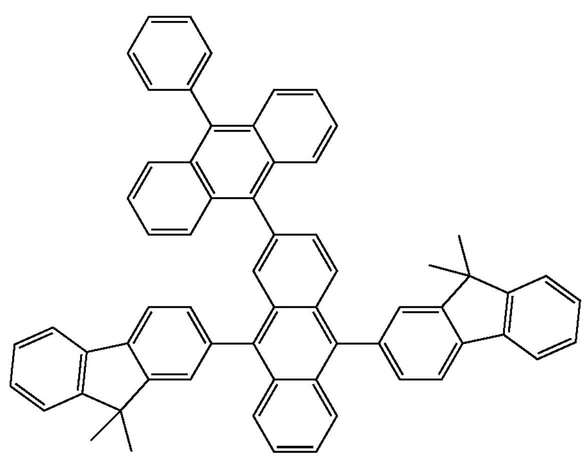

-continued
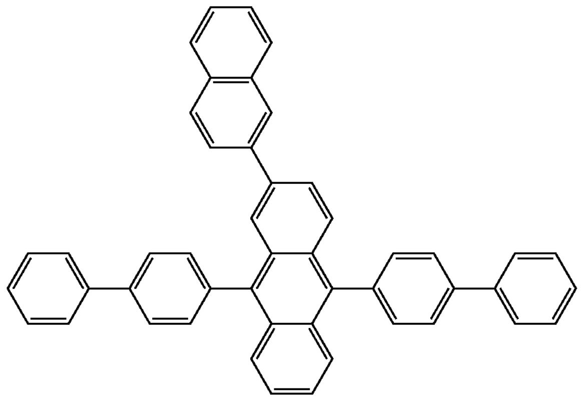
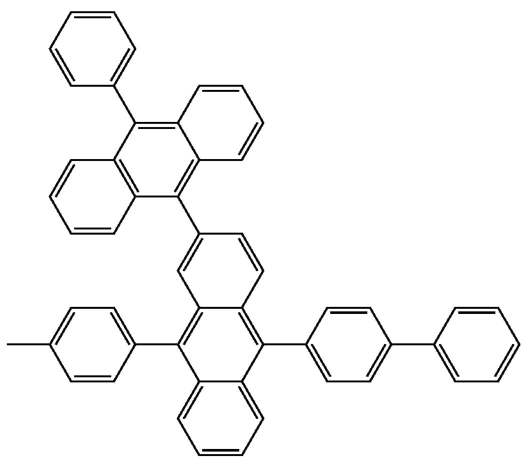
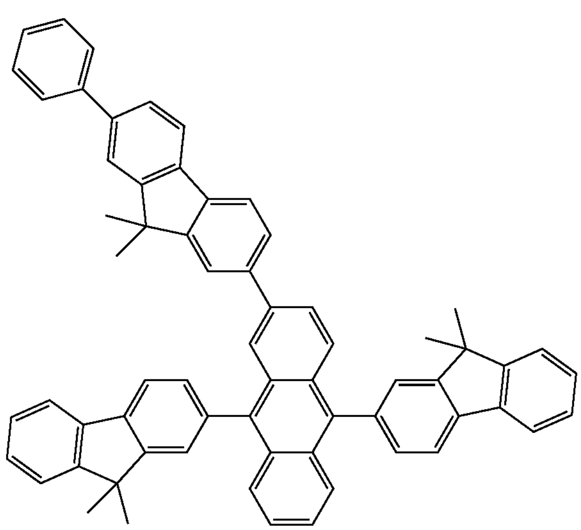
-continued
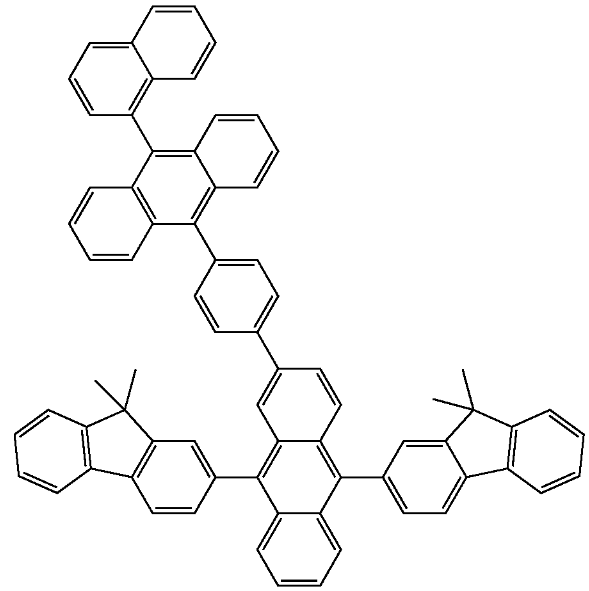
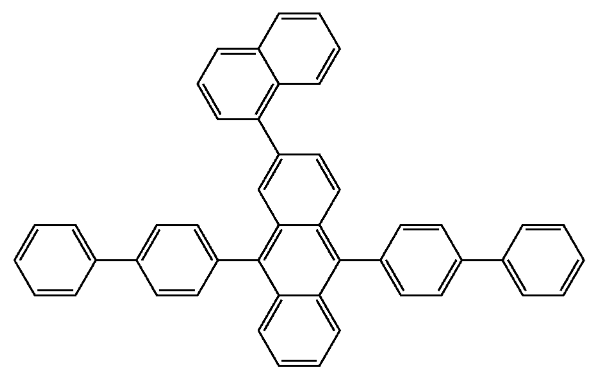
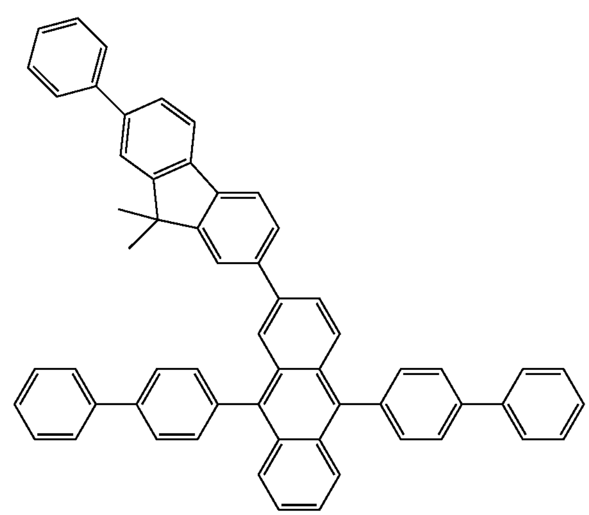

-continued
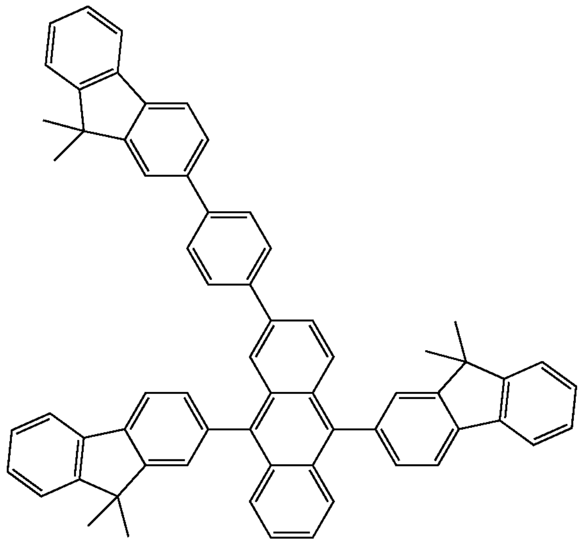
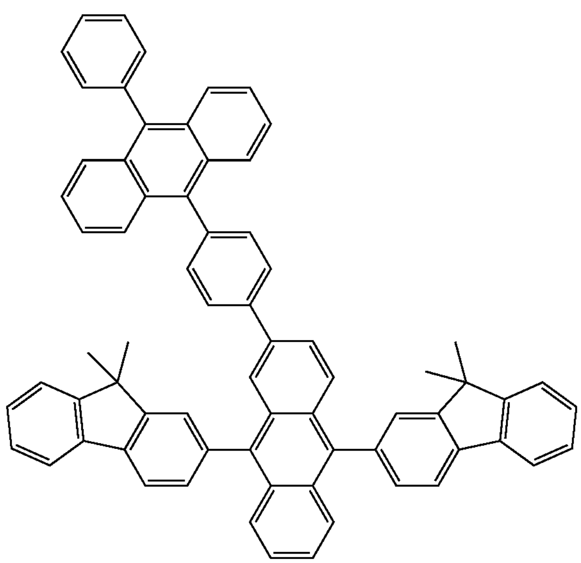
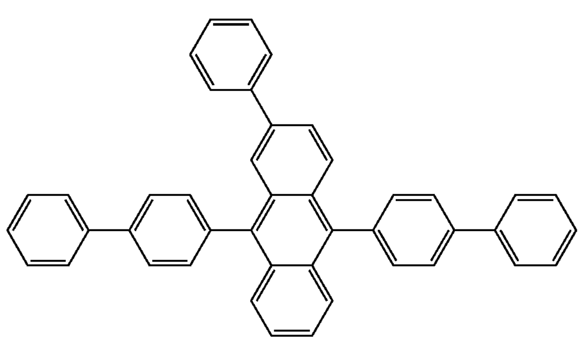
-continued
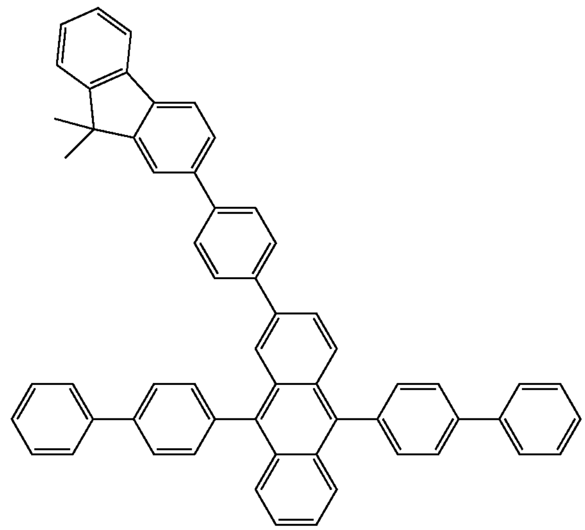
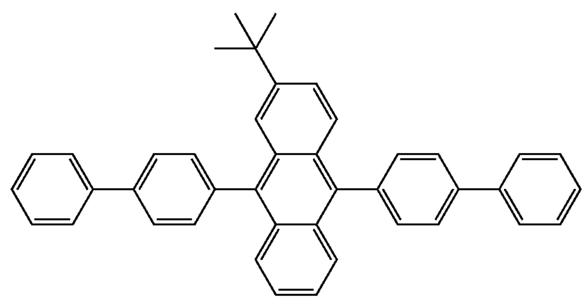
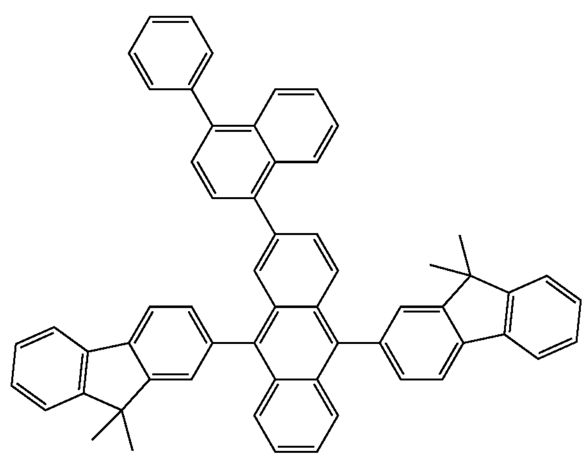

-continued
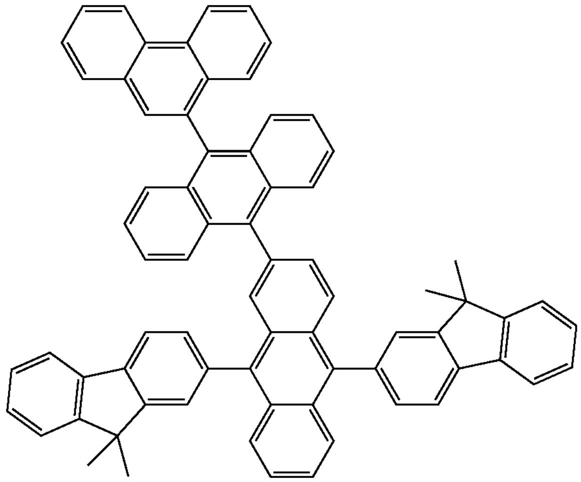
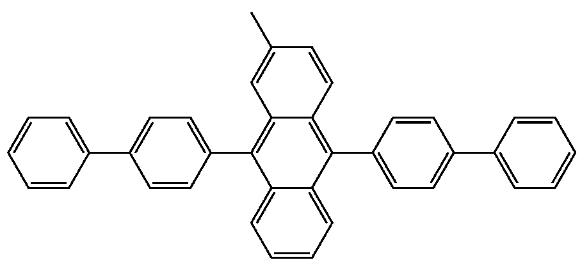
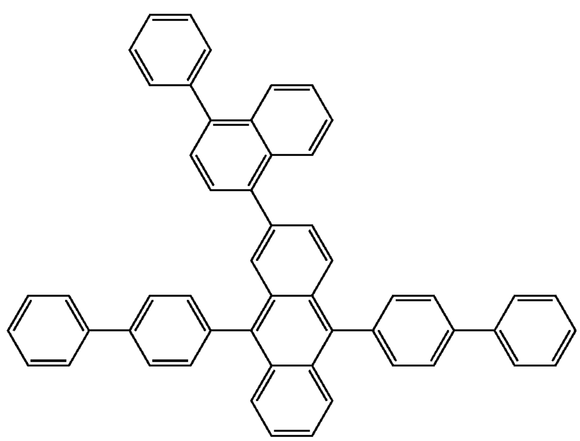
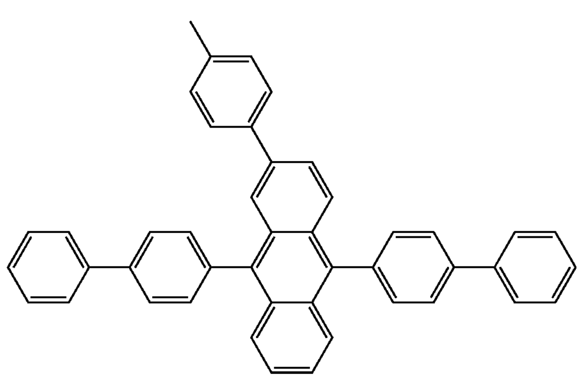
-continued
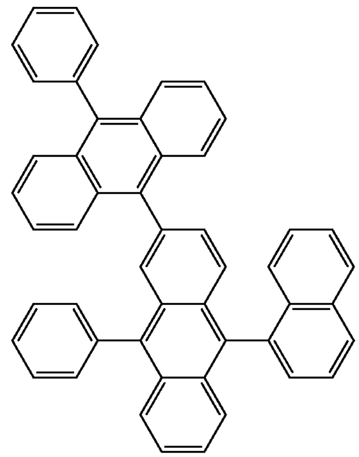
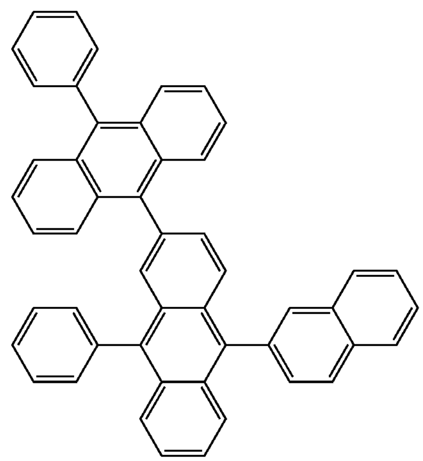
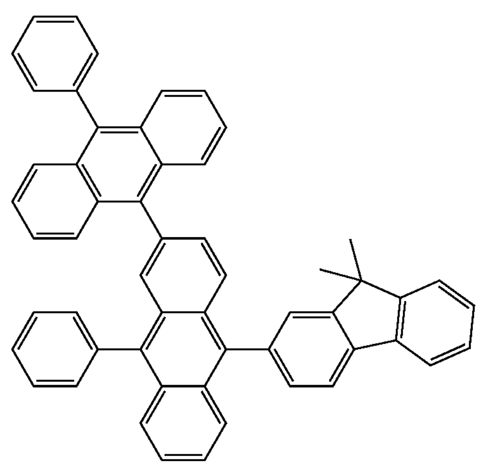

-continued
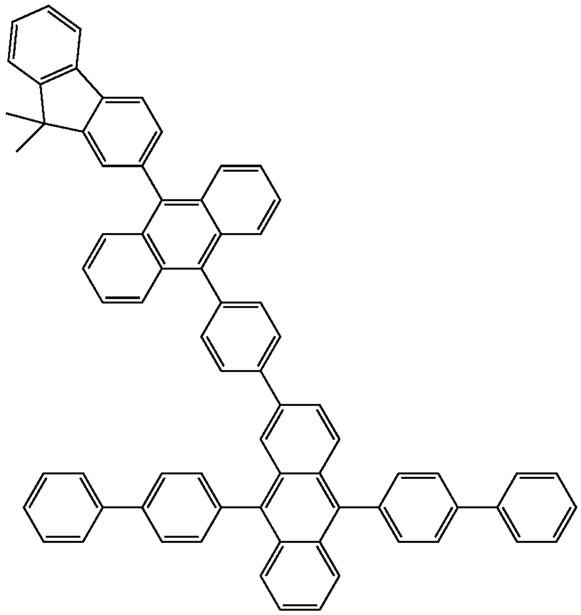
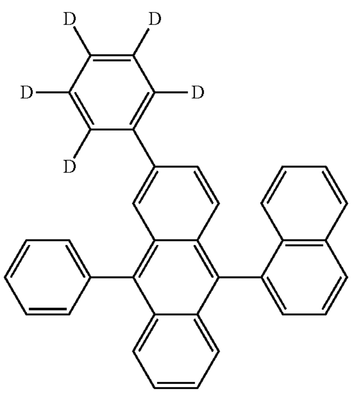
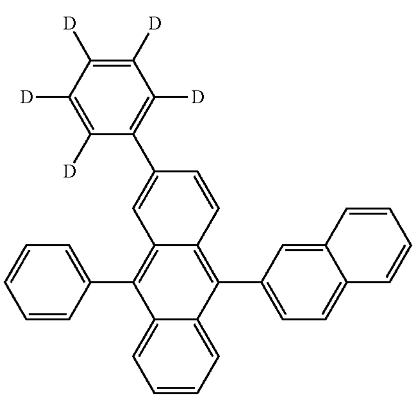
-continued
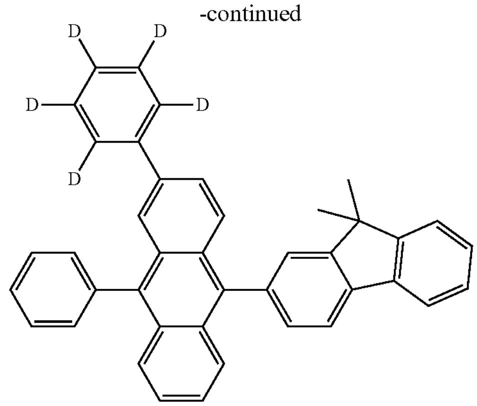
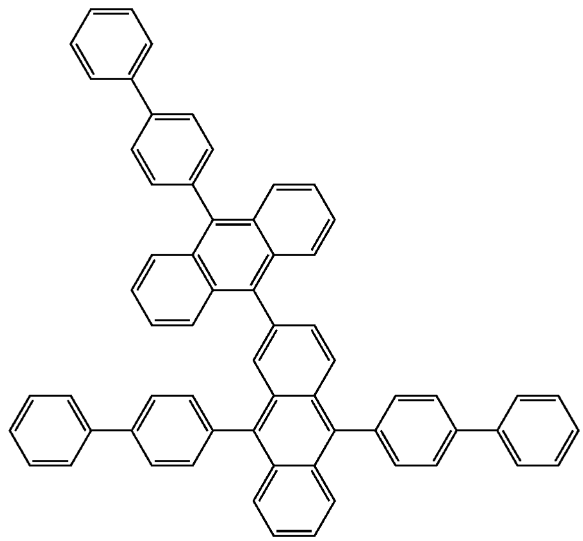
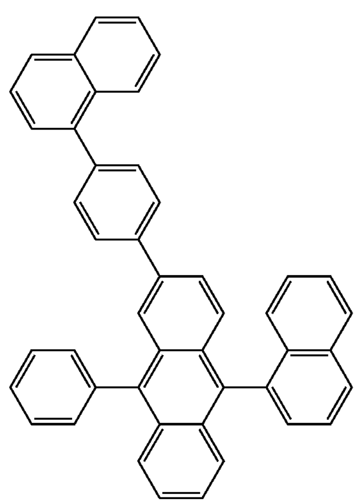

-continued
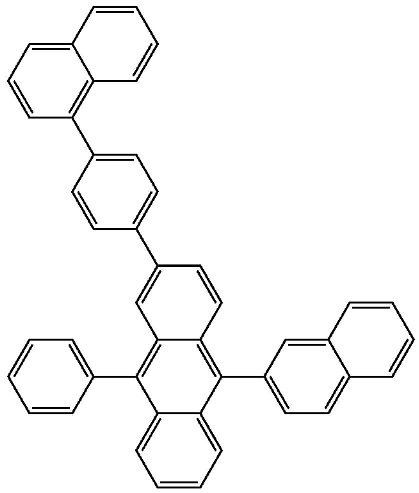
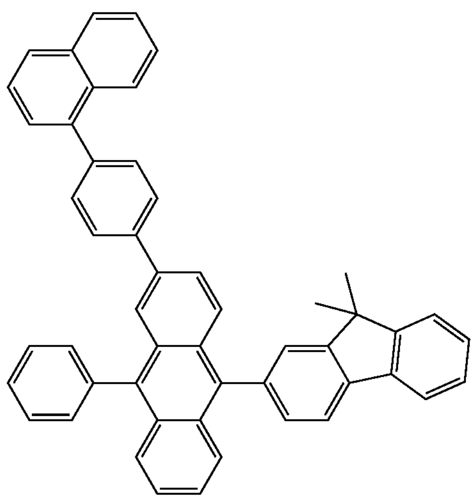
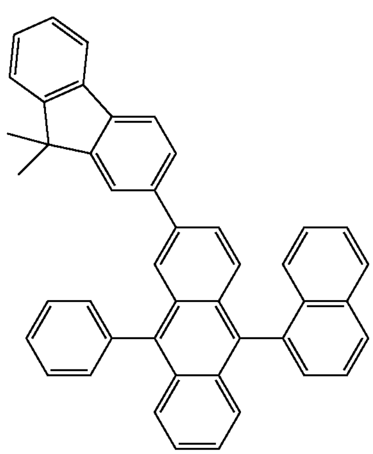
-continued
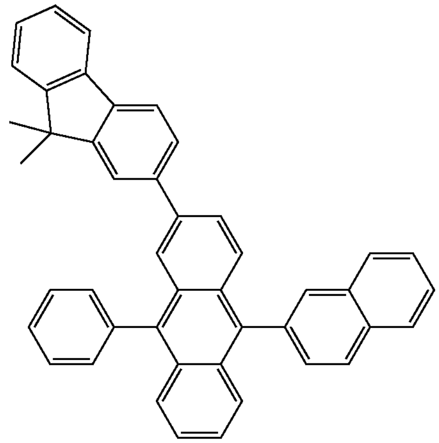
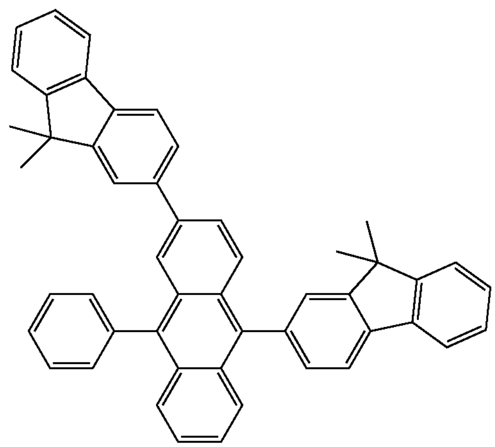
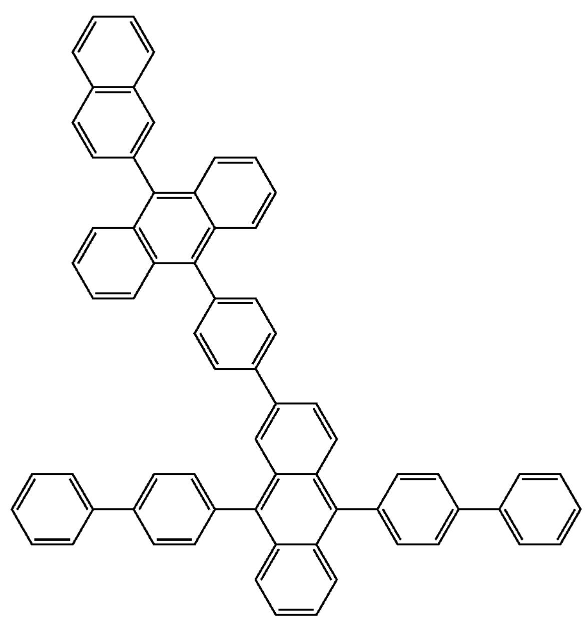

-continued
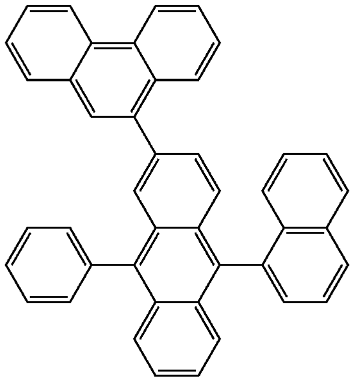
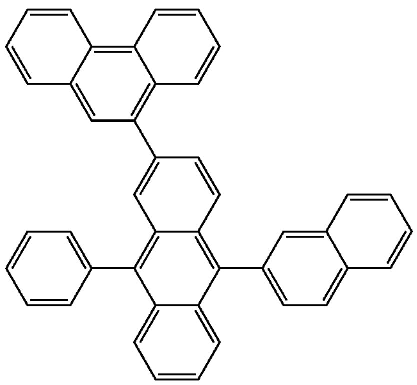
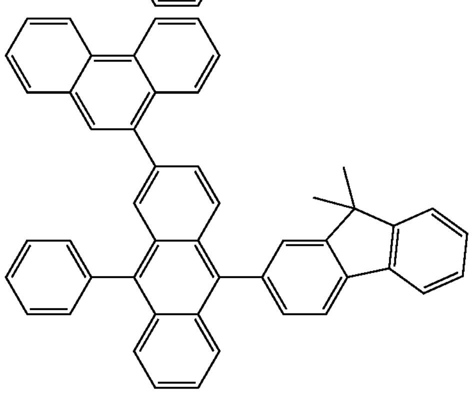
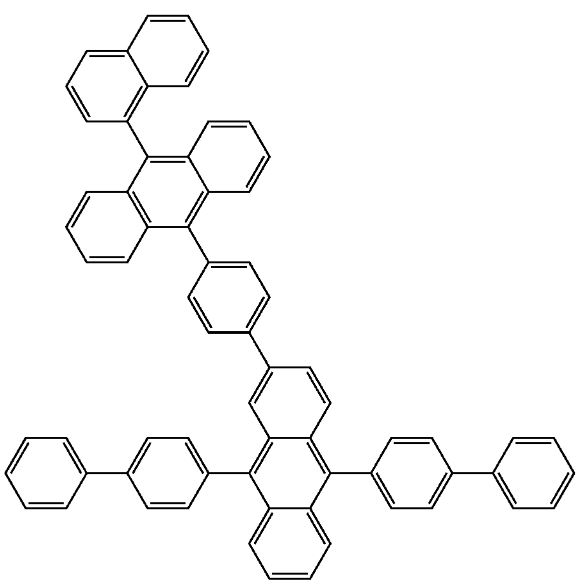
-continued
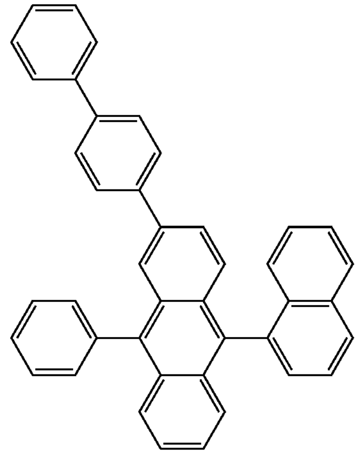
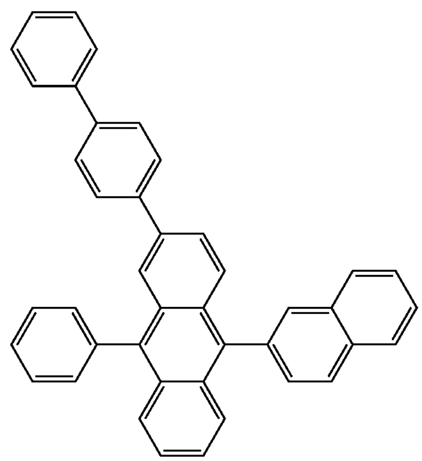
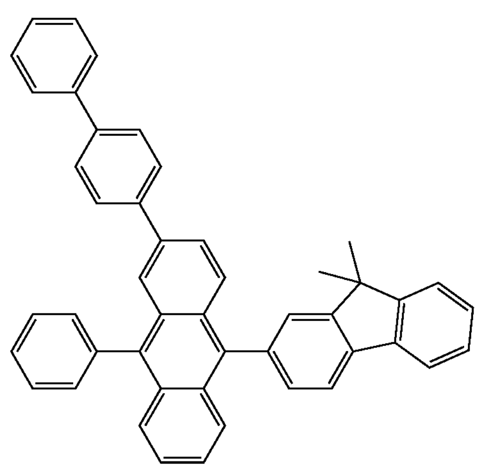

-continued
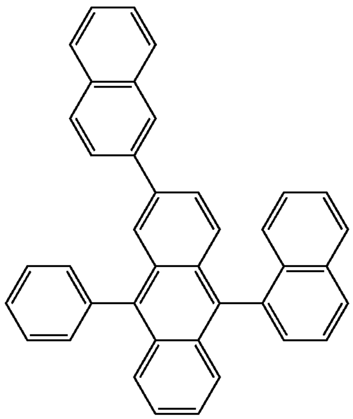
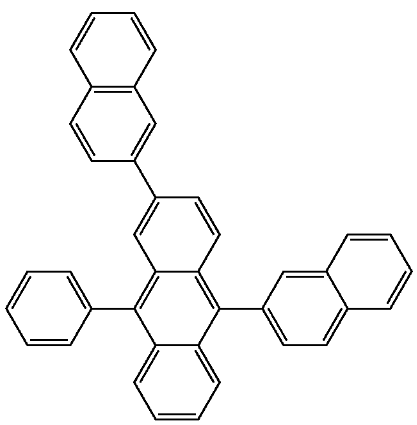
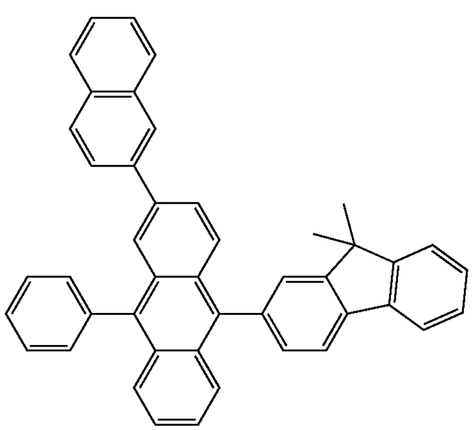
-continued
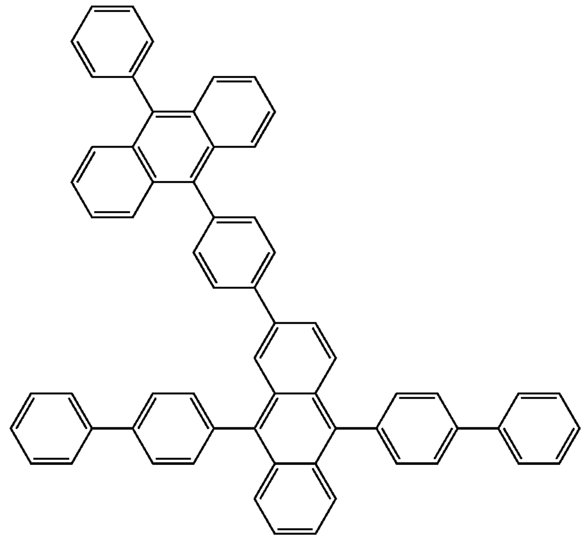
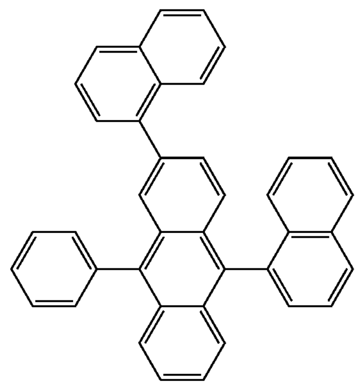
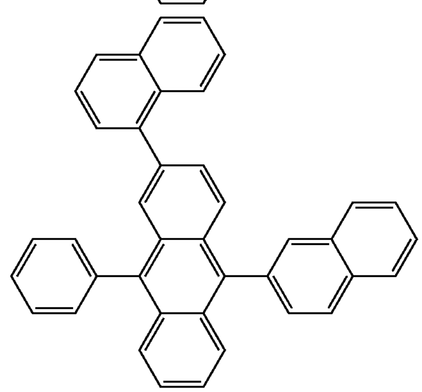
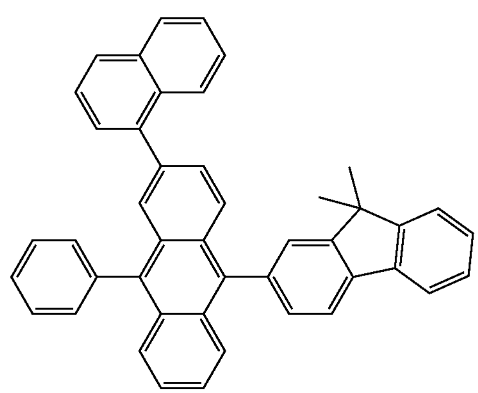

-continued
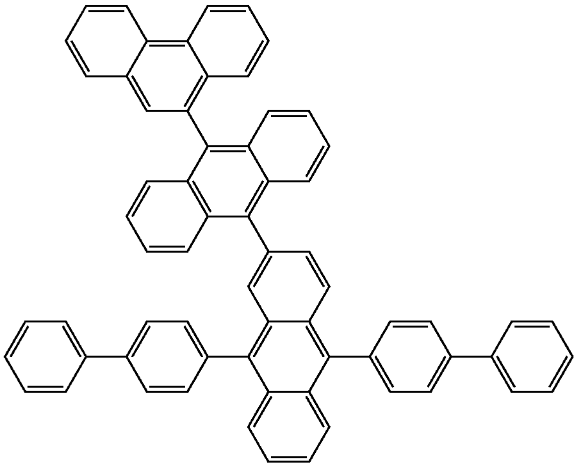
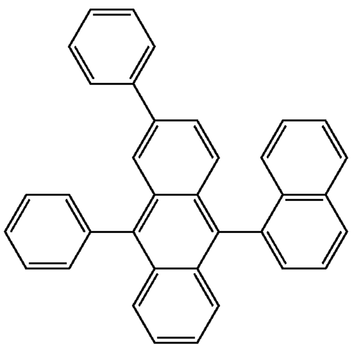
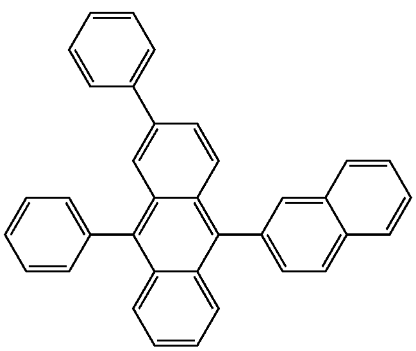
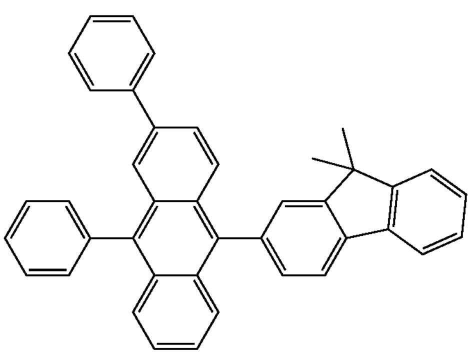
-continued
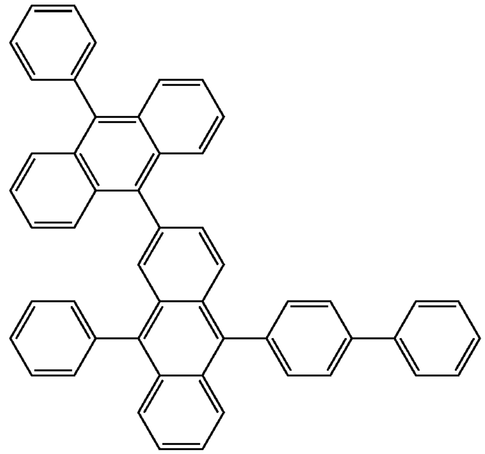
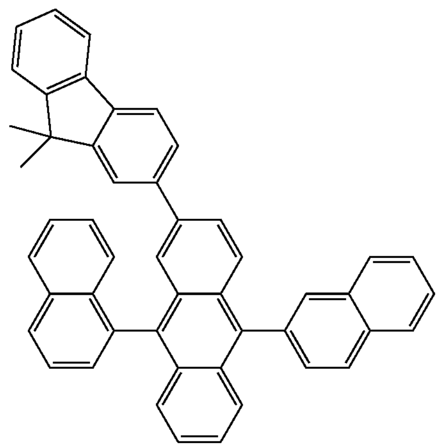
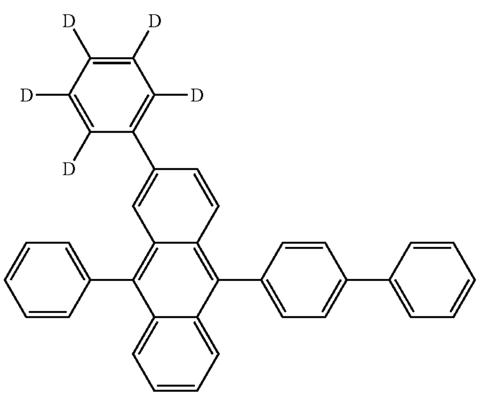
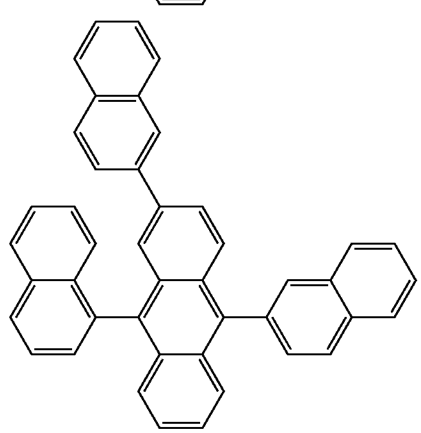

-continued
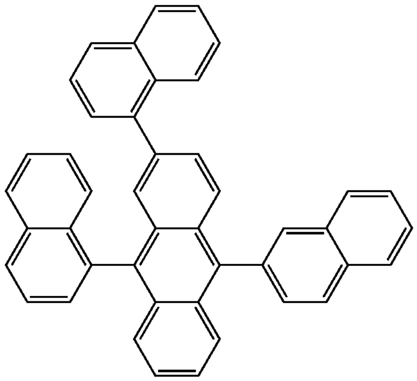
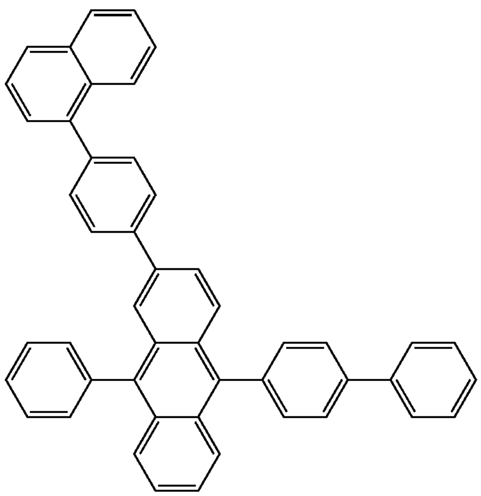
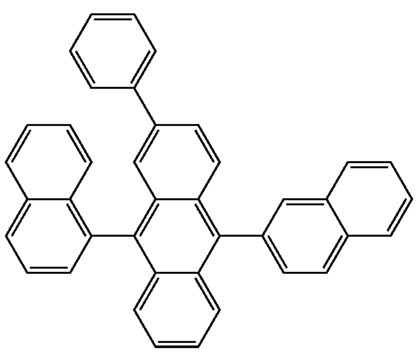
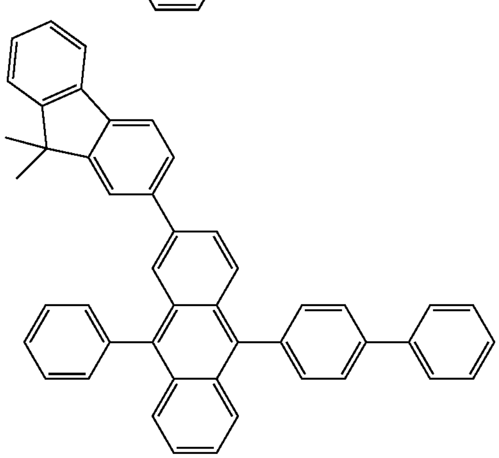
-continued
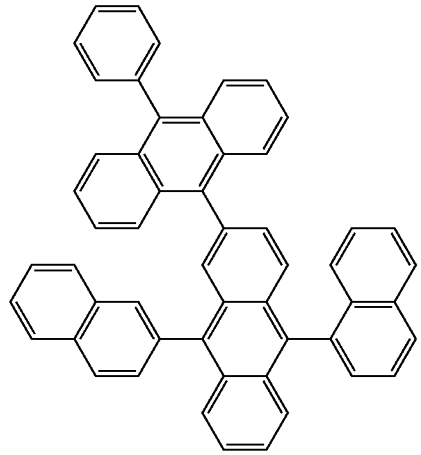
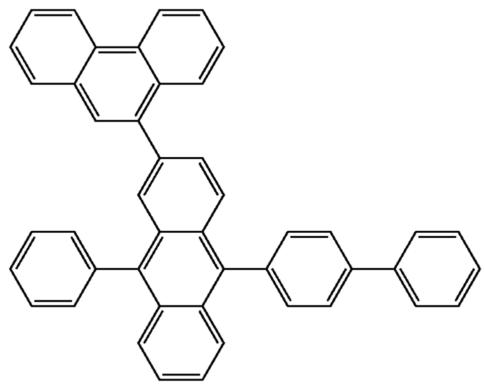
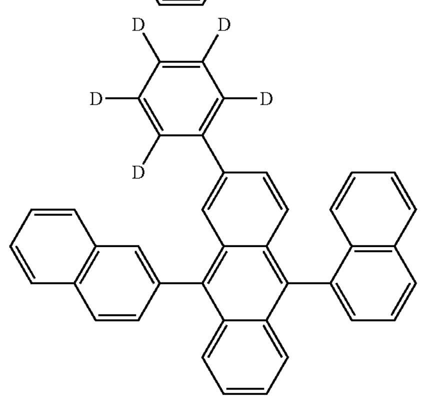
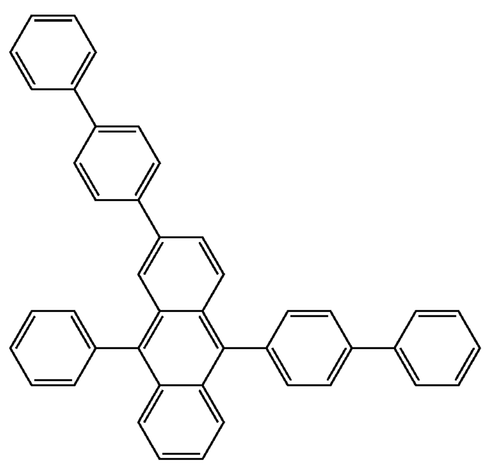

-continued
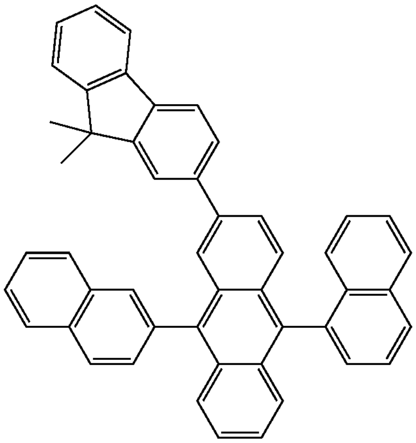
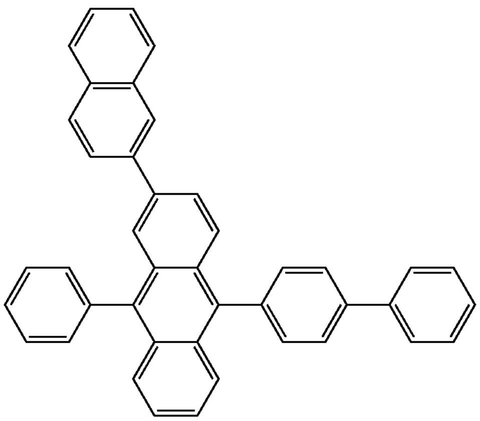
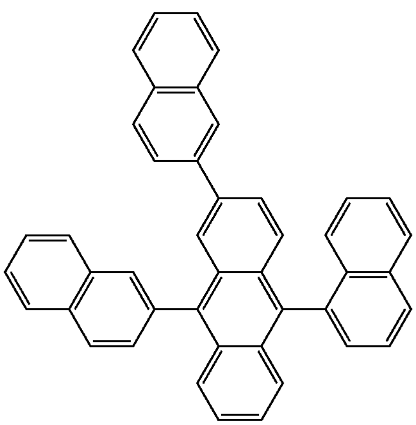
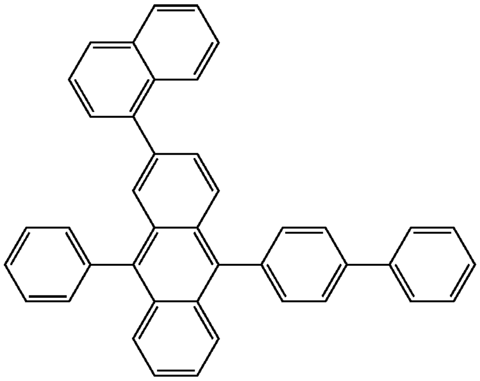
-continued
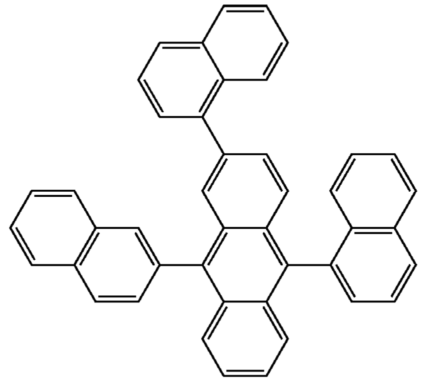
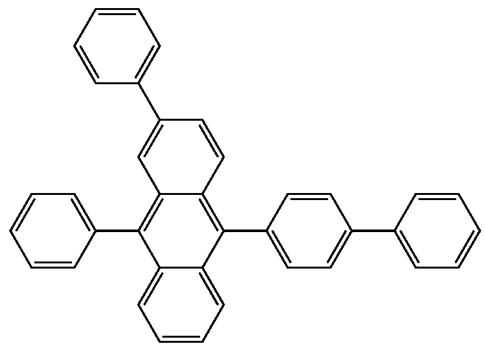
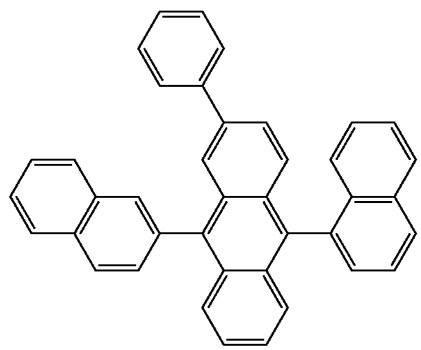
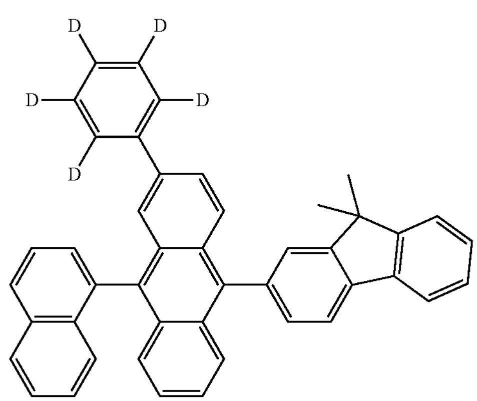

-continued
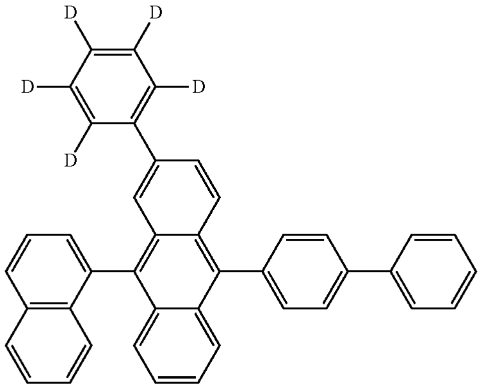
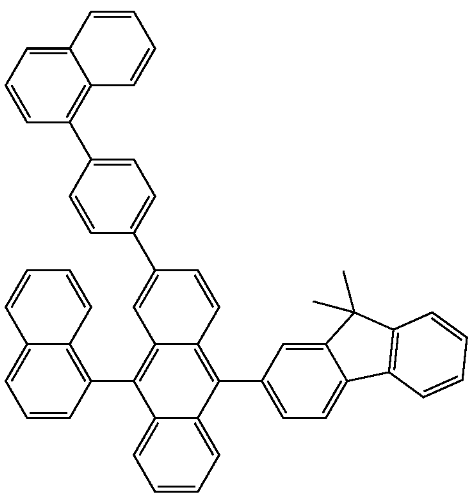
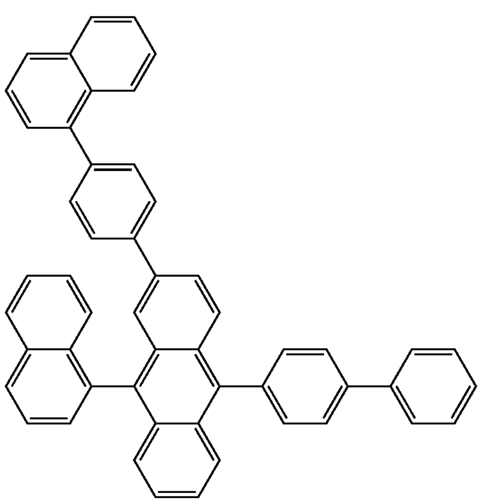
-continued
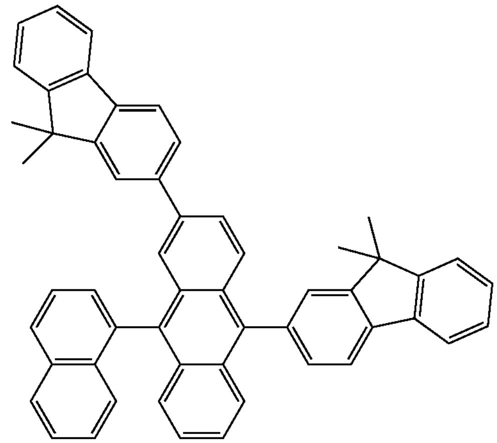
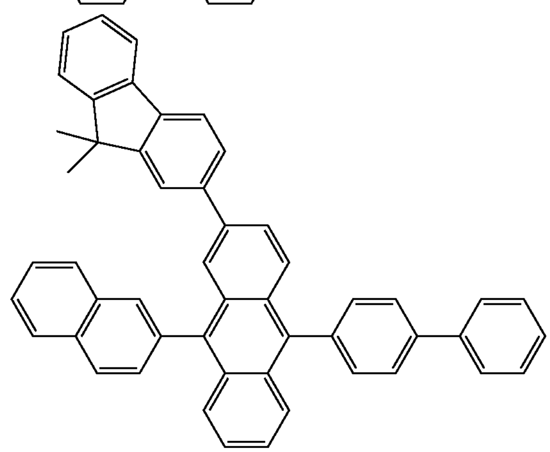
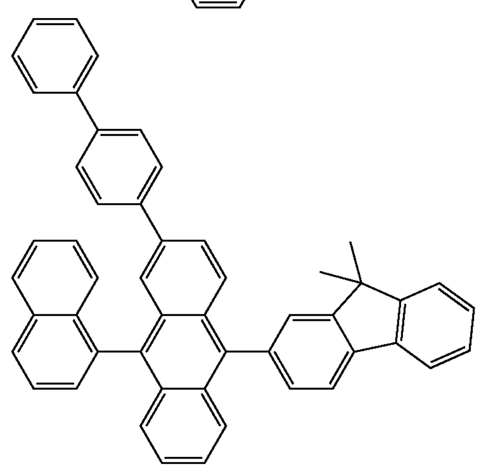
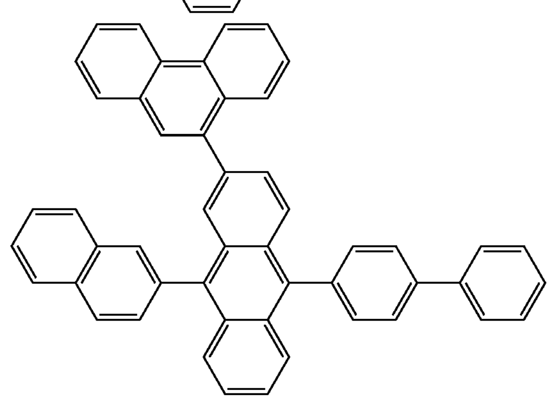

-continued
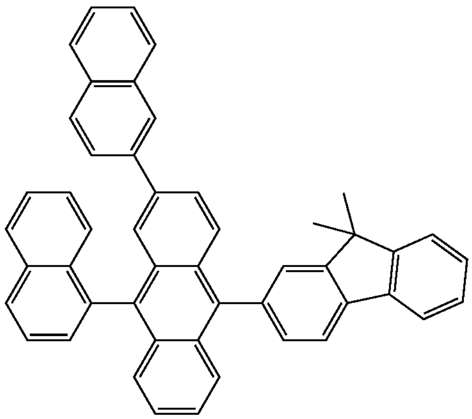
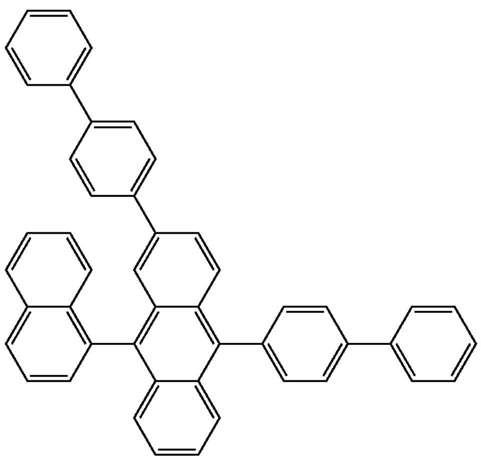
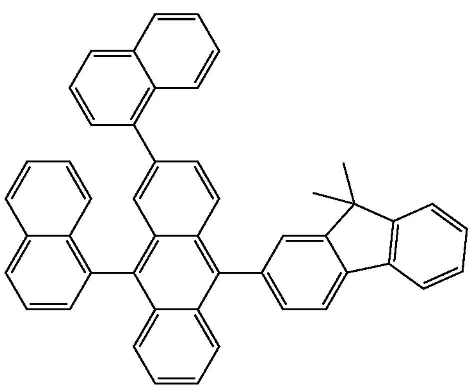
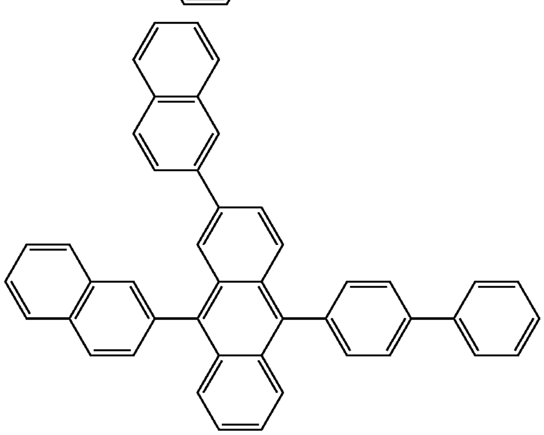
-continued
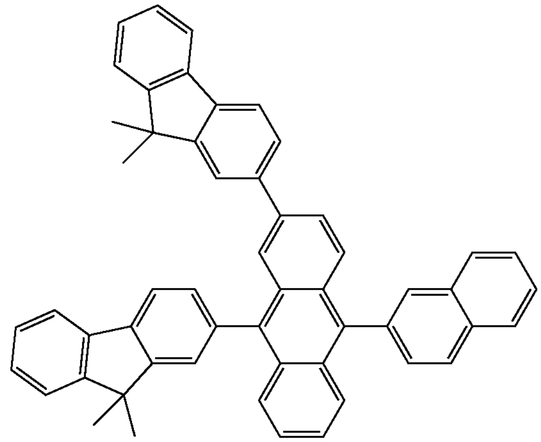
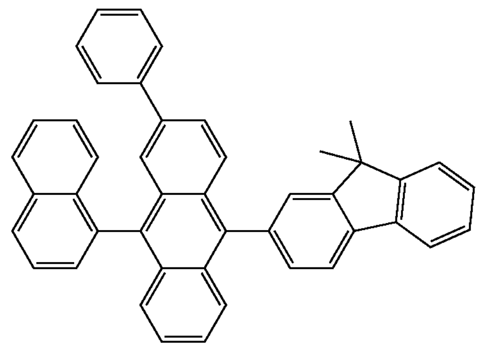
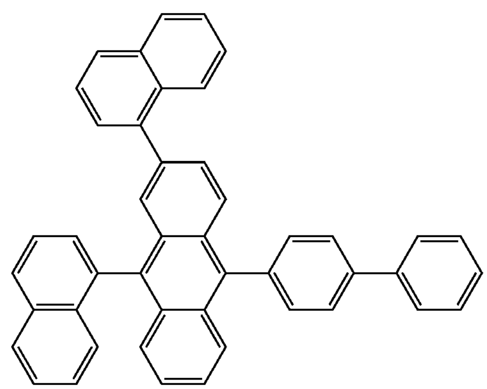
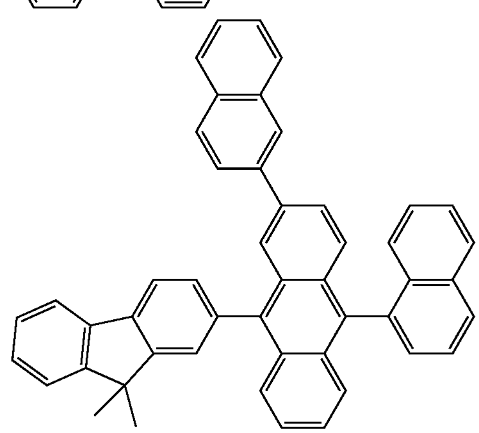

-continued
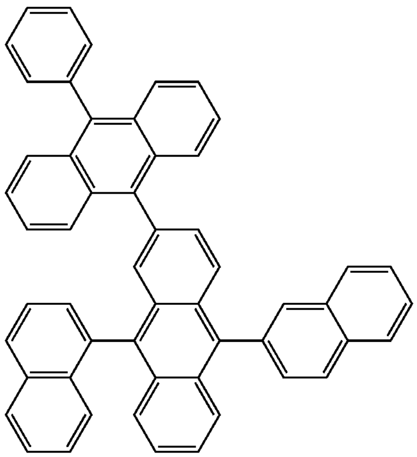
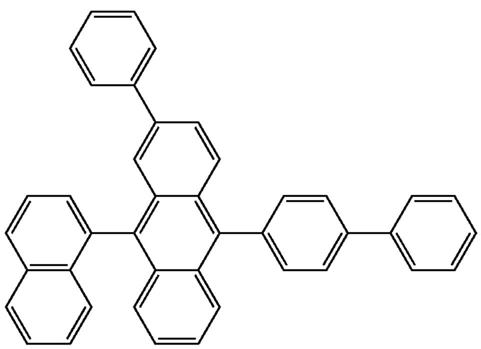
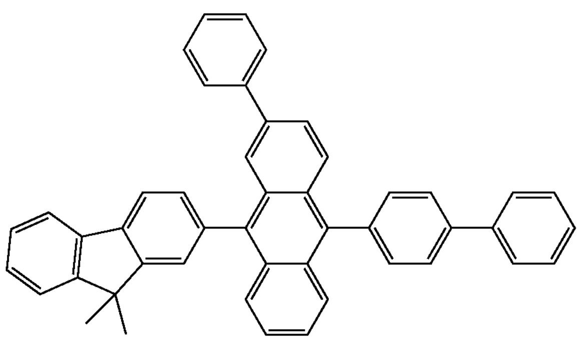
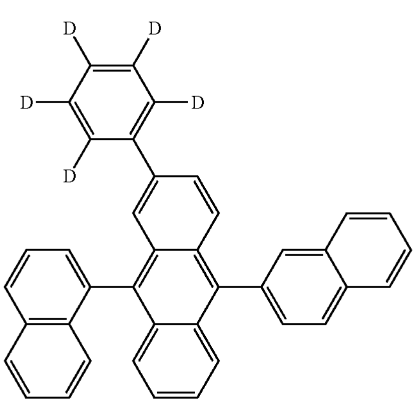
-continued
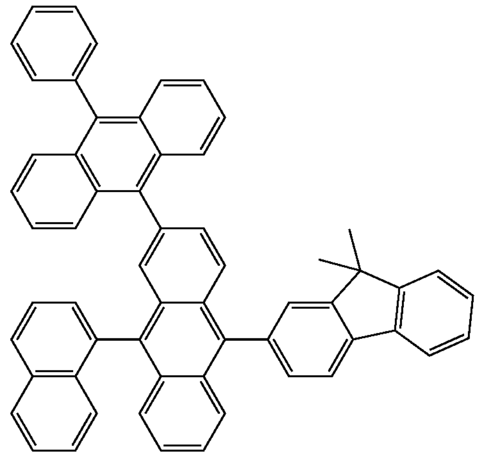
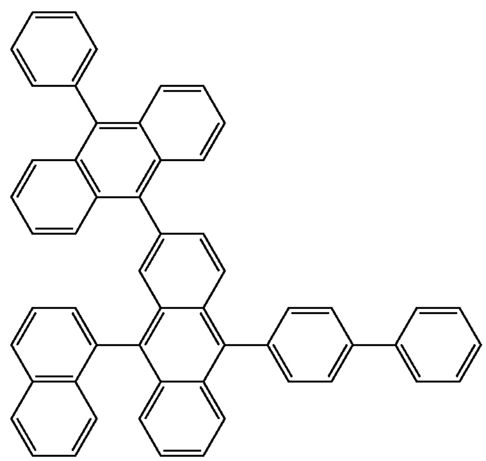
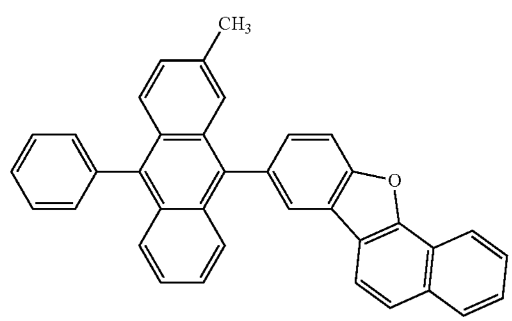
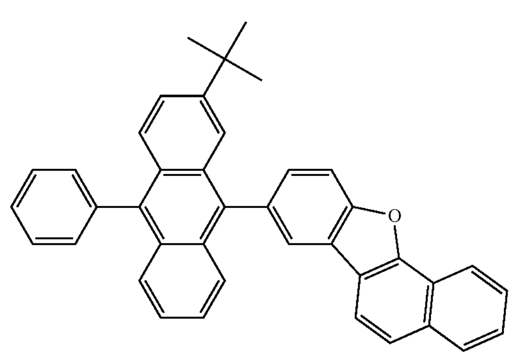

-continued
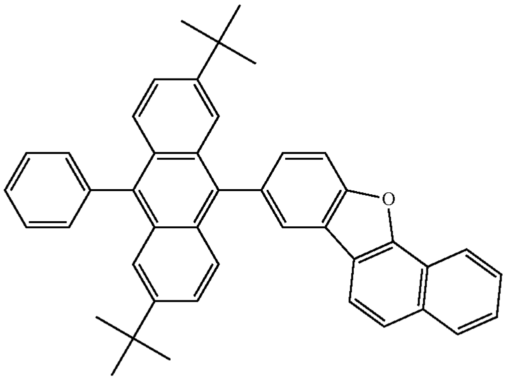
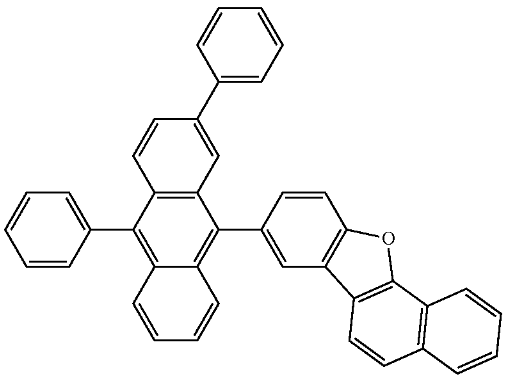
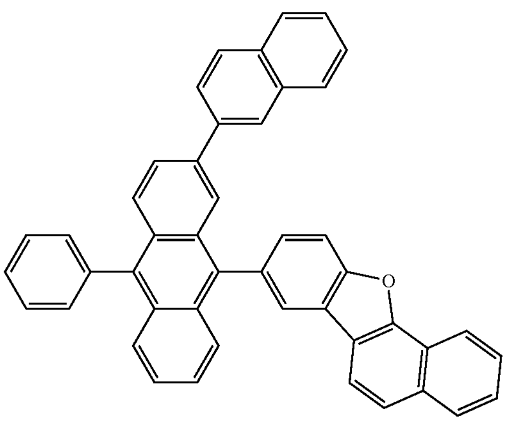
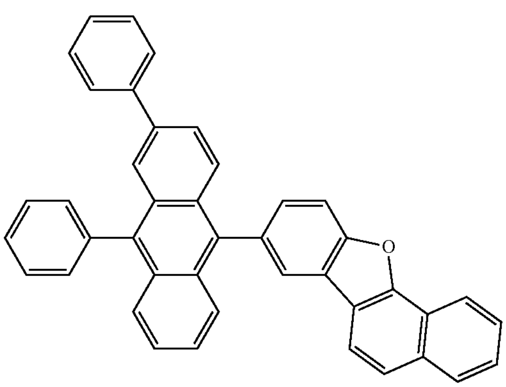
-continued
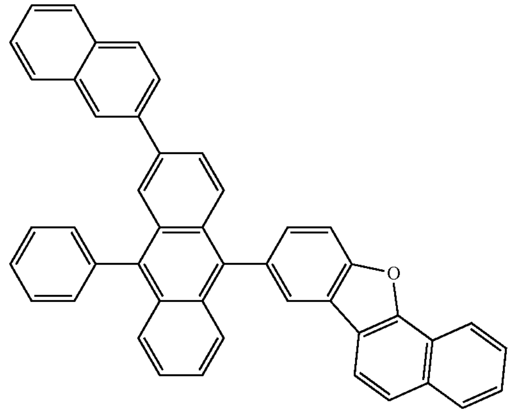
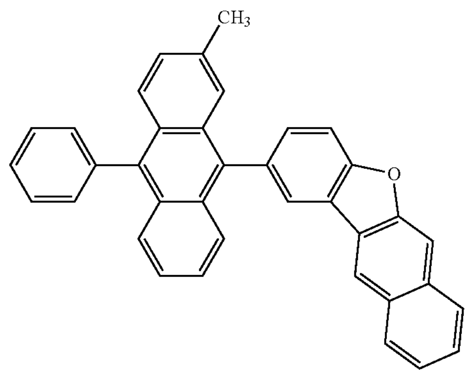
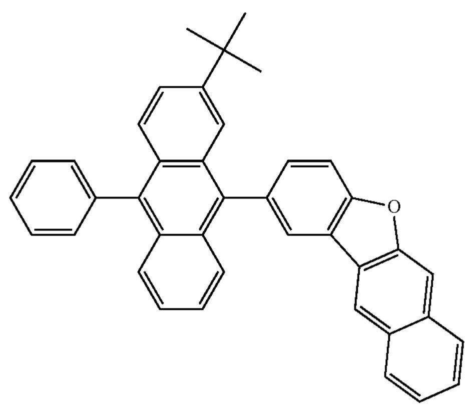
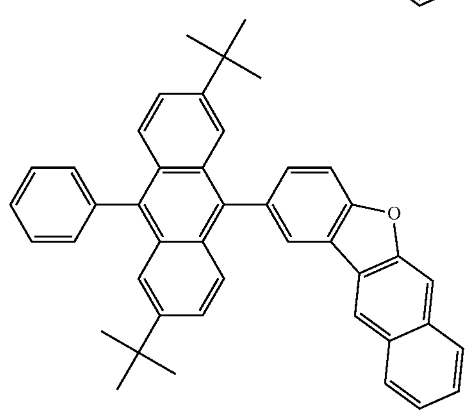

-continued

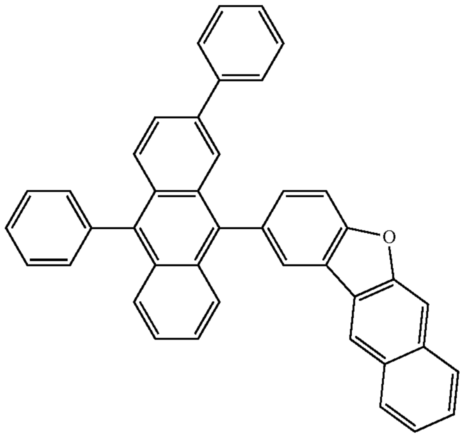

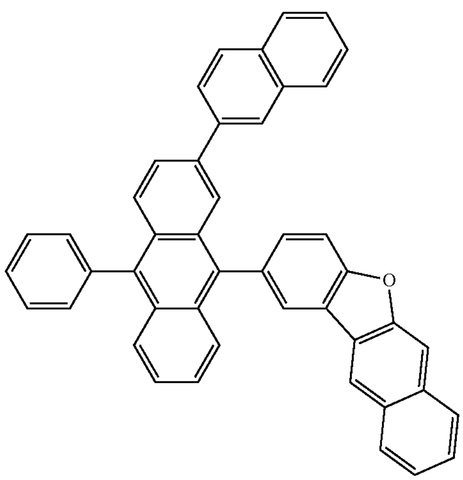

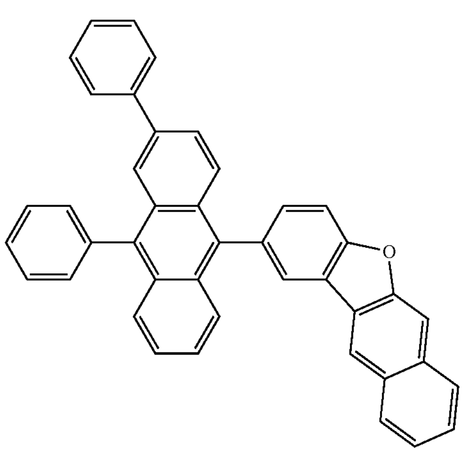

-continued

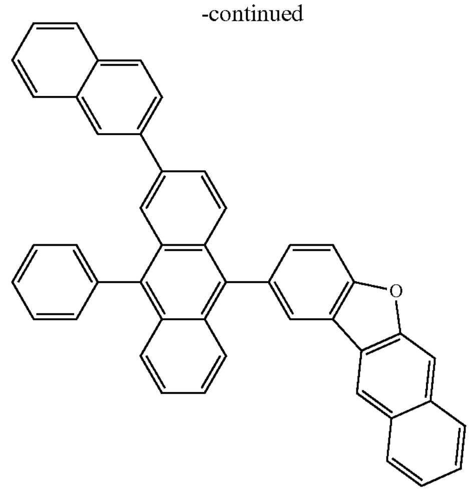

In one embodiment, when the light-emitting layer contains a compound represented by the formula (1) and a compound represented by the formula (10), the content of the compound represented by the formula (1) is preferably 1% by mass or more and 20% by mass or less based on the entire light-emitting layer.

Also, in one embodiment, when the light-emitting layer contains a compound represented by the formula (1) and a compound represented by the formula (10), the content of the compound represented by the formula (10) is preferably 80% by mass or more and 99% by mass or less based on the entire light-emitting layer.

The layer structure of an organic EL device according to one aspect of the present invention is explained below.

The organic EL device according to one aspect of the present invention has an organic layer between a pair of electrodes which consists of a cathode and an anode. The organic layer includes at least one layer composed of an organic compound. Alternatively, two or more layers composed of an organic compound are stacked in the organic layer. The organic layer may further contain an inorganic compound in addition to an organic compound.

In one embodiment, at least one organic layer is a light-emitting layer. For example, the organic layer may be configured as a single light-emitting layer, or may include other layers that are applicable in a layer structure of an organic EL device. Layers that are applicable in a layer structure of an organic EL device are not particularly limited, and examples of such layers include a hole transport region (hole transport layer, hole injection layer, electron blocking layer, exciton blocking layer, and the like) provided between an anode and a light-emitting layer, a light-emitting layer, a spacer layer, and an electron transport region (electron transport layer, electron injection layer, hole blocking layer, and the like) provided between a cathode and a light-emitting layer.

The organic EL device according to one aspect of the present invention may be a fluorescent or phosphorescent light emission-type monochromatic light-emitting device or a fluorescent/phosphorescent hybrid-type white light-emitting device, for example. Also, the organic EL device may be of a simple type having a single light-emitting unit or of a tandem type having two or more light-emitting units.

The "light-emitting unit" in this specification is the smallest unit that emits light by the recombination of injected holes and electrons. The light-emitting unit includes an organic layer, where at least one organic layer is a light-emitting layer.

The "light-emitting layer" in this specification is an organic layer having a light-emitting function. The light-emitting layer is a phosphorescent light-emitting layer or a fluorescent light-emitting layer, for example, and may be a single layer or two or more layers.

The light-emitting unit may be of a stacked type having two or more phosphorescent and/or fluorescent light-emitting layers, and in such a case, a spacer layer may be inserted between the respective light-emitting layers to prevent the excitons formed in the phosphorescent light-emitting layer from diffusing into the fluorescent light-emitting layer, for example.

A device structure: anode/light-emitting unit/cathode, for example, can be mentioned as a simple-type organic EL device.

Typical layer structures of the light-emitting unit are as follows. The layers in parentheses are optional.

(a) (Hole injection layer/) hole transport layer/fluorescent light-emitting layer (/electron transport layer/electron injection layer)

(b) (Hole injection layer/) hole transport layer/phosphorescent light-emitting layer (/electron transport layer/electron injection layer)

(c) (Hole injection layer/) hole transport layer/first fluorescent light-emitting layer/second fluorescent light-emitting layer (/electron transport layer/electron injection layer) (d) (Hole injection layer/) hole transport layer/first phosphorescent light-emitting layer/second phosphorescent light-emitting layer (/electron transport layer/electron injection layer)

(e) (Hole Injection layer/) hole transport layer/phosphorescent light-emitting layer/spacer layer/fluorescent light-emitting layer (/electron transport layer/electron injection layer)

(f) (Hole injection layer/) hole transport layer/first phosphorescent light-emitting layer/second phosphorescent light-emitting layer/spacer layer/fluorescent light-emitting layer (/electron transport layer/electron Injection layer)

(g) (Hole injection layer/) hole transport layer/first phosphorescent light-emitting layer/spacer layer/second phosphorescent light-emitting layer/spacer layer/fluorescent light-emitting layer (/electron transport layer/electron injection layer)

(h) (Hole injection layer/) hole transport layer/phosphorescent light-emitting layer/spacer layer/first fluorescent light-emitting layer/second fluorescent light-emitting layer (/electron transport layer/electron injection layer)

(i) (Hole injection layer/) hole transport layer/electron blocking layer/fluorescent light-emitting layer (/electron transport layer/electron injection layer)

(j) (Hole injection layer/) hole transport layer/electron blocking layer/phosphorescent light-emitting layer (/electron transport layer/electron injection layer)

(k) (Hole injection layer/) hole transport layer/exciton blocking layer/fluorescent light-emitting layer (/electron transport layer/electron injection layer)

(l) (Hole injection layer/) hole transport layer/exciton blocking layer/phosphorescent light-emitting layer (/electron transport layer/electron injection layer)

(m) (Hole injection layer/) first hole transport layer/second hole transport layer/fluorescent light-emitting layer (/electron transport layer/electron injection layer)

(n) (Hole injection layer/) first hole transport layer/second hole transport layer/fluorescent light-emitting layer (/first electron transport layer/second electron transport layer/electron injection layer)

(o) (Hole injection layer/) first hole transport layer/second hole transport layer/phosphorescent light-emitting layer (/electron transport layer/electron injection layer)

(p) (Hole injection layer/) first hole transport layer/second hole transport layer/phosphorescent light-emitting layer (first electron transport layer/second electron transport layer/electron injection layer)

(q) (Hole injection layer/) hole transport layer/fluorescent light-emitting layer/hole blocking layer (/electron transport layer/electron injection layer)

(r) (Hole injection layer/) hole transport layer/phosphorescent light-emitting layer/hole blocking layer (/electron transport layer/electron injection layer)

(s) (Hole injection layer/) hole transport layer/fluorescent light-emitting layer/exciton blocking layer (/electron transport layer/electron injection layer)

(t) (Hole injection layer/) hole transport layer/phosphorescent light-emitting layer/exciton blocking layer (/electron transport layer/electron injection layer)

However, the layer structure of the organic EL device according to one aspect of the present invention is not limited to the structures above. For example, when the organic EL device has a hole injection layer and a hole transport layer, the hole injection layer is preferably provided between the hole transport layer and the anode. Also, when the organic EL device has an electron injection layer and an electron transport layer, the electron injection layer is preferably provided between the electron transport layer and the cathode. Each of the hole injection layer, hole transport layer, electron transport layer, and electron injection layer may consist of a single layer or two or more layers.

The two or more phosphorescent light-emitting layers, and the phosphorescent and fluorescent light-emitting layers may consist of light-emitting layers having different colors. For example, the light-emitting unit (f) may have a structure: hole transport layer/first phosphorescent light-emitting layer (red light emission)/second phosphorescent light-emitting layer (green light emission)/spacer layer/fluorescent light-emitting layer (blue light emission)/electron transport layer.

An electron blocking layer may be provided between the respective light-emitting layers and the hole transport or spacer layer. Also, a hole blocking layer may be provided between the respective light-emitting layers and the electron transport layer. The electrons or holes can be trapped in the light-emitting layer by providing an electron blocking layer or a hole blocking layer, and the charge recombination rate in the light-emitting layer is increased and the light-emitting efficiency is improved thereby.

A device structure: anode/first light-emitting unit/intermediate layer/second light-emitting unit/cathode, for example, can be mentioned as a typical device structure of a tandem-type organic EL device.

Each of the first light-emitting unit and the second light-emitting unit can be independently selected from the aforementioned light-emitting units, for example.

In general, an intermediate layer is also called an intermediate electrode, an intermediate conductive layer, a charge generating layer, an electron withdrawing layer, a connecting layer, a connector layer, or an intermediate insulating layer. The intermediate layer is a layer which supplies electrons to the first light-emitting unit and holes to the second light-emitting unit, and is formed with known materials.

FIG. 1 shows a schematic view of an example of the layer structure of the organic EL device. The organic EL device 1 has a substrate 2, an anode 3, a cathode 4, and a light-emitting unit (organic layer) 10 provided between the anode 3 and the cathode 4. The light-emitting unit 10 has at least one light-emitting layer 5.

A hole transport region (hole injection layer, hole transport layer, and the like) 6 may be formed between the light-emitting layer 5 and the anode 3, and an electron transport region (electron injection layer, electron transport layer, and the like) 7 may be formed between the light-emitting layer 5 and the cathode 4. Also, an electron blocking layer (not shown) may be provided on the anode 3 side of the light-emitting layer 5, and a hole blocking layer (not shown) may be provided on the cathode 4 side of the light-emitting layer 5. Electrons and holes can be trapped in the light-emitting layer 5 and the efficiency of exciton generation in the light-emitting layer 5 can be further improved thereby.

FIG. 2 shows a schematic view of another example of the layer structure of the organic EL device. In the light-emitting unit 20 of the organic EL device 11 shown in FIG. 2, the hole transport layer in the hole transport region 6 and the electron transport layer in the electron transport region 7 in the light-emitting unit 10 of the organic EL device 1 of FIG. 1 have a double-layer structure, respectively. The hole transport region 6 has a first hole transport layer **6*a* on the anode side and a second hole transport layer 6*b* on the cathode side. The electron transport region 7 has a first electron transport layer 7*a* on the anode side and a second hole transport layer 7*b* on the cathode side. Explanation of other numerals is omitted since they are the same as the numerals in FIG. 1**.

The functions, materials, and the like of the organic EL device described herein are explained below.

(Substrate)

The substrate is used as a support of the organic EL device. The substrate preferably has a transmission of a light in the visible light region having a wavelength from 400 to 700 nm of 50% or more, and is preferably a flat and smooth substrate. Soda-lime glass, aluminosilicate glass, quartz glass, plastic, and the like, for example, can be mentioned as the material of the substrate. A flexible substrate is also useful as the substrate. A flexible substrate is a bendable (flexible) substrate, and a plastic substrate and the like, for example, can be mentioned as such a substrate. Specific examples of the materials for forming a plastic substrate include polycarbonate, polyarylate, polyethersuffone, polypropylene, polyester, polyvinyl fluoride, polyvinyl chloride, polyimide, polyethylene naphthalate, and the like. An inorganic evaporated film is also useful.

(Anode)

The anode is a metal, an alloy, a conductive compound, a mixture thereof, and the like, for example, and those having a large work function (specifically 4.0 eV or more) are preferably used. Specific examples of the materials for the anode include indium oxide-tin oxide (ITO: Indium Tin Oxide), indium oxide-tin oxide containing silicon or silicon oxide, indium oxide-zinc oxide, indium oxide containing tungsten oxide or zinc oxide, graphene, and the like. Gold, silver, platinum, nickel, tungsten, chromium, molybdenum, iron, cobalt, copper, palladium, titanium, and nitrides of these metals (e.g., titanium nitride), and the like can also be mentioned.

The anode is normally formed by forming a film with these materials onto the substrate by means of a sputtering method. For example, an indium oxide-zinc oxide film can be formed by a sputtering method with the use of a target obtained by adding 1 to 10% by mass of zinc oxide to Indium oxide. Also, an indium oxide film containing tungsten oxide or zinc oxide can be formed by a sputtering method with the use of a target obtained by adding 0.5 to 5% by mass of tungsten oxide or 0.1 to 1% by mass of zinc oxide to indium oxide, for example.

A vacuum vapor deposition method, a coating method, an inkjet method, a spin coating method, and the like, for example, can be mentioned as other methods for forming the anode. For example, a coating method, an inkjet method, or the like is applicable when using a silver paste or the Hike.

The hole injection layer formed in contact with the anode is formed with the use of a material that is capable of easily injecting holes irrespective of the work function of the anode. Therefore, ordinary electrode materials such as a metal, an alloy, a conductive compound, and mixtures thereof can be used in the anode. Specifically, materials with a small work function, for example, alkali metals such as lithium and cesium; magnesium; alkaline earth metals such as calcium and strontium; alloys containing these metals (e.g., magnesium-silver, aluminum-lithium); rare earth metals such as europium and ytterbium; and alloys containing a rare earth metal can also be used in the anode.

(Hole Injection Layer)

The hole injection layer contains a highly hole-injecting substance and has the function of injecting holes from the anode to the organic layer. Examples of the highly hole-injecting substance include molybdenum oxides, titanium oxides, vanadium oxides, rhenium oxides, ruthenium oxides, chromium oxides, zirconium oxides, hafnium oxides, tantalum oxides, silver oxides, tungsten oxides, manganese oxides, aromatic amine compounds, electron-attracting (acceptor) compounds, and polymeric compounds (oligomers, dendrimers, polymers, and the like). Among these examples, aromatic amine compounds and acceptor compounds are preferable, and acceptor compounds are more preferable.

Specific examples of the aromatic amine compounds include 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris(N-(4-diphenylaminophenyl)-N-phenylaminobenzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

As the acceptor compounds, heterocyclic derivatives having an electron-attracting group, quinone derivatives having an electron-attracting group, arylborane derivatives, heteroarylborane derivatives, and the like are preferable, for example, and specific examples include hexacyanohexaazatriphenylene, 2,3,5,6-tetrafluoro-7,7,8,8-tetracyanoquinodimethane (abbreviation: F4TCNQ), and 1,2,3-tris[(cyano)(4-cyano-2,3,5,6-tetrafluorophenyl)methylene]cyclopropane.

When an acceptor compound is used, the hole injection layer preferably further contains a matrix material. Materials known as the materials for organic EL devices can be used as the matrix material, and, for example, electron-donating (donor) compounds are preferably used, and the aforementioned aromatic amine compounds are more preferably used.

(Hole Transport Layer)

The hole transport layer is a layer containing a highly hole-transporting substance and has a function of transporting holes from the anode to the organic layer.

As a highly hole-transporting substance, a substance having a hole mobility of $10^{-6}$ $cm^2/(V \cdot s)$ or more is preferable, and examples include aromatic amine compounds, carbazole derivatives, anthracene derivatives, and polymeric compounds.

Specific examples of the aromatic amine compounds include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)-triphenylamine (abbreviation: BAFLP), 4,4'-bis[N-(9,9-dimethylfluoren-2-yl)-N-phenylamino]phenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB).

Specific examples of the carbazole derivatives include 4,4'-di(9-carbazolyl)biphenyl (abbreviation: CBP), 9-[4-(9-carbazolyl)phenyl]-10-phenylanthracene (abbreviation: CzPA), and 9-phenyl-3-[4-(10-phenyl-9-anthryl)phenyl]-9H-carbazole (abbreviation: PCzPA).

Specific examples of the anthracene derivatives include 2-t-butyl-9,10-di(2-naphthyl)anthracene (abbreviation: t-BuDNA), 9,10-di(2-naphthyl)anthracene (abbreviation: DNA), and 9,10-diphenylanthracene (abbreviation: DPAnth).

Specific examples of the polymeric compounds include poly(N-vinylcarbazole) (abbreviation: PVK), and poly(4-vinyltriphenylamine) (abbreviation: PVTPA).

Other substances can also be used in the hole transport layer as long as the substance is a compound having higher hole-transporting properties than electron-transporting properties.

The hole transport layer may be a single layer or stacked layers of two or more layers. In the case of stacked layers, a layer containing a highly hole-transporting substance having higher energy gap is preferably arranged on the side closer to the light-emitting layer.

(Light-Emitting Layer)

The light-emitting layer contains a highly light-emitting substance (dopant material). Various materials can be used as the dopant material, and a fluorescent light-emitting compound (fluorescent dopant), a phosphorescent light-emitting compound (phosphorescent dopant), and the like can be used, for example. A fluorescent light-emitting compound is a compound capable of emitting light from a singlet excited state, and a layer containing this compound is called a fluorescent light-emitting layer. Also, a phosphorescent light-emitting compound is a compound capable of emitting light from a triplet excited state, and a layer containing this compound is called a phosphorescent light-emitting layer.

The light-emitting layer normally contains a dopant material, and a host material which efficiently enables the dopant material to emit light. A dopant material may be called a guest material, an emitter, or a light-emitting material in some documents. Also, a host material may be called a matrix material in some documents.

A single light-emitting layer may contain two or more dopant materials and two or more host materials. Also, there may be two or more light-emitting layers.

In this specification, a host material combined with a fluorescent dopant is called a "fluorescent host", and a host material combined with a phosphorescent dopant is called a "phosphorescent host". A fluorescent host and a phosphorescent host are not distinguished from one another by the molecular structure alone. A phosphorescent host is a material for forming a phosphorescent light-emitting layer containing a phosphorescent dopant, but it does not mean that a phosphorescent host cannot be used as a material for forming a fluorescent light-emitting layer. The same also applies to a fluorescent host.

The light-emitting layer preferably contains a compound represented by the formula (1) (hereinafter, the compound represented by the formula (1) may be called "compound (1)"), more preferably, the compound represented by the formula (1) is contained as a dopant material. The compound (1) is preferably contained as a fluorescent dopant in the light-emitting layer.

The content of the compound (1) contained as a dopant material in the light-emitting layer is not particularly limited, but it is preferably from 0.1 to 70% by mass, more preferably from 0.1 to 30% by mass, even more preferably from 1 to 30% by mass, furthermore preferably from 1 to 20% by mass, particularly preferably from 1 to 10% by mass, for example, from the viewpoint of sufficient light emission and concentration quenching.

(Fluorescent Dopant)

As the fluorescent dopants other than the compound (1), fused polycyclic aromatic derivatives, styrylamine derivatives, fused ring amine derivatives, boron-containing compounds, pyrrole derivatives, indole derivatives, carbazole derivatives, and the like can be mentioned, for example. Among these, fused ring amine derivatives, boron-containing compounds, and carbazole derivatives are preferable.

As the fused ring amine derivatives, diaminopyrene derivatives, diaminochrysene derivatives, diaminoanthracene derivatives, diaminofluorene derivatives, diaminofluorene derivatives in which one or more benzofuro skeletons are fused, and the like, can be mentioned, for example.

As the boron-containing compounds, pyrromethene derivatives, triphenylborane derivatives, and the like can be mentioned, for example.

As a blue fluorescent dopant, pyrene derivatives, styrylamine derivatives, chrysene derivatives, fluoranthene derivatives, fluorene derivatives, diamine derivatives, triarylamine derivatives, and the like can be mentioned, for example. Specific examples include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA).

As a green fluorescent dopant, aromatic amine derivatives, and the like can be mentioned, for example. Specific examples include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-4-(9H-carbazol-9-yl)phenyl-N-phenylanthracen-2-amine (abbreviation: 2YGABPhA), and N,N,9-triphenylanthracen-9-amine (abbreviation: DPhAPhA).

As a red fluorescent dopant, tetracene derivatives, diamine derivatives, and the like can be mentioned. Specific examples include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-diamine (abbreviation: p-mPhAFD).

(Phosphorescent Dopant)

As the phosphorescent dopant, phosphorescent light-emitting heavy metal complexes, and phosphorescent light-emitting rare earth metal complexes can be mentioned, for example.

As the heavy metal complex, iridium complexes, osmium complexes, platinum complexes, and the like can be mentioned, for example. The heavy metal complex is preferably an ortho-metalated complex of a metal selected from iridium, osmium, and platinum.

As the rare earth metal complex, terbium complexes, europium complexes, and the like can be mentioned, for example. Specific examples include tris(acetylacetonato)(monophenanthroline)terbium (III) (abbreviation: $Tb(acac)_3(Phen)$), tris(1,3-diphenyl-1,3-propanedionato)(monophenanthroline)europium (III) (abbreviation: $Eu(DBM)_3(Phen)$), and tris[1-(2-thenoyl)-3,3,3-trifluoroacetonato](monophenanthrolne)europium (III) (abbreviation: $Eu(TTA)_3(Phen)$). These rare earth metal complexes are preferable as a phosphorescent dopant since the rare earth metal ions emit light by the electron transition between different multiple states.

As the blue phosphorescent dopant, iridium complexes, osmium complexes, platinum complexes, and the like can be mentioned, for example. Specific examples include bis[2-(4',6'-difluorophenyl)pyridinato-N,C2']iridium (III) tetrakis(1-pyrazolyl)borate (abbreviation: FIr6), bis[2-(4',6'-difluorophenyl)pyridinato-N,C2']iridium (III) picolinate (abbreviation: Flrpic), bis[2-(3',5'-bistrifluoromethylphenyl)pyridinato-N,C2']iridium (III) picolinate (abbreviation: $Ir(CF3ppy)_2(pic)$), and bis(2-(4',6'-difluorophenyl)pyridinato-N,C2'iridium (III) acetylacetonate (abbreviation: Flracac).

As the green phosphorescent dopant, iridium complexes and the like can be mentioned, for example. Specific examples include tris(2-phenylpyridinato-N,C2')iridium (III) (abbreviation: $Ir(ppy)_3$), bis(2-phenylpyridinato-N,C2')ridlum (III) acetylacetonate (abbreviation: $Ir(ppy)_2(acac)$), bis(1,2-diphenyl-1H-benzimidazolato)iridium (III) acetylacetate (abbreviation: $Ir(pbi)_2(acac)$), and bis(benzo[h]quinolinato)irldium (III) acetylacetonate (abbreviation: $Ir(bzq)_2(acac)$).

As the red phosphorescent dopant, iridium complexes, platinum complexes, terbium complexes, europium complexes, and the like can be mentioned, for example. Specific examples include bis[2-(2'-benzo[4,5-a]thienyl)pyndinato-N,C3]iridium (III) acetylacetonate (abbreviation: $Ir(btp)_2(acac)$), bis(1-phenylisoquinolinato-N,C2')iridium (Ill) acetylacetonate (abbreviation: $Ir(piq)_2(acac)$), (acetylacetonato)bis[2,3-bis(4-fluorophenyl)quinoxalinato]iridium (III) (abbreviation: $Ir(Fdpq)_2(acac)$), and 2,3,7,8,12,13,17,18-octaethyl-21H,23H-porphyrin platinum (II) (abbreviation: PtOEP).

(Host Material)

As the host material, metal complexes such as aluminum complexes, beryllium complexes, and zinc complexes; heterocyclic compounds such as indole derivatives, pyridine derivatives, pyrimidine derivatives, triazine derivatives quinoline derivatives, isoquinoline derivatives, quinazoline derivatives, dibenzofuran derivatives, dibenzothiophene derivatives, oxadiazole derivatives, benzimidazole derivatives, and phenanthroline derivatives; fused aromatic compounds such as naphthalene derivatives, triphenylene derivatives, carbazole derivatives, anthracene derivatives, phenanthrene derivatives, pyrene derivatives, chrysene derivatives, naphthacene derivatives, and fluoranthene derivatives; aromatic amine compounds such as triarylamine derivatives and fused polycyclic aromatic amine derivatives can be mentioned, for example. Two or more host materials can be used in combination.

Specific examples of the metal complexes include tris(8-quinolinolato)aluminum (III) (abbreviation: Alq), tris(4-methyl-8-quinolinolato)aluminum (III) (abbreviation: Almq3), bis(10-hydroxybenzo[h]quinolinato)beryllium (II) (abbreviation: BeBq2), bis(2-methyl-8-quinolinolato)(4-phenyolato)aluminum (III) (abbreviation: BAIq), bis(8-quinolinolato)znc (II) (abbreviation: Znq), bis[2-(2-benzoxazolyl)phenolato]zinc (II) (abbreviation: ZnPBO), and bis[2-(2-benzothiazolyl)phenolato]zinc (II) (abbreviation: ZnBTZ).

Specific examples of the heterocyclic compounds include 2-(4-biphenylyl)-5-(4-tert-butylphenyl)-1,3,4-oxadlazole (abbreviation: PBD), 1,3-bis[5-(p-tert-butylphenyl)-1,3,4-oxadlazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproin (abbreviation: BCP).

Specific examples of the fused aromatic compounds include 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene.

Specific examples of the aromatic amine compounds include N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{-4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(9,9-dimethyfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB).

As the fluorescent host, compounds having a higher singlet level than the fluorescent dopant are preferable, and heterocyclic compound, fused aromatic compounds, and the like can be mentioned as such compounds, for example. As the fused aromatic compounds, anthracene derivatives, pyrene derivatives, chrysene derivatives, naphthacene derivatives, and the like are preferable, for example.

As the phosphorescent host, compounds having a higher triplet level than the phosphorescent dopant are preferable, and metal complexes, heterocyclic compounds, fused aromatic compounds, and the like can be mentioned as such compounds, for example. Among these compounds, indole derivatives, carbazole derivatives, pyridine derivatives, pyrimidine derivatives, triazine derivatives, quinoline derivatives, isoquinoline derivatives, quinazoline derivatives, dibenzofurane derivatives, dibenzothiophene derivatives, naphthalene derivatives, triphenylene derivatives, phenanthrene derivatives, fluoranthene derivatives, and the like are preferable, for example.

(Electron Transport Layer)

The electron transport layer contains a highly electron-transporting substance. The highly electron-transporting substance is preferably a substance having an electron mobility of $10^{-6}$ $cm^2/Vs$ or more, and metal complexes, aromatic heterocyclic compounds, aromatic hydrocarbon compounds, polymeric compounds, and the like can be mentioned as such substances, for example.

As the metal complex, aluminum complexes, beryllium complexes, zinc complexes, and the like can be mentioned, for example. Specific examples include tris(8-quinoinolato) aluminum (III) (abbreviation: Alq), tris(4-methyl-8-quinolinolato)aluminum (abbreviation: Almq3), bis(10-hydroxybenzo[h]quinolinato)beryllium (abbreviation: BeBq2), bis (2-methyl-8-quinolinolato)(4-phenylphenolato)aluminum (III) (abbreviation: BAIq), bis(8-quinonolato)zinc (II) (abbreviation: Znq), bis[2-(2-benzoxazolyl)phenolato]zinc (II) (abbreviation: ZnPBO), and bis[2-(2-benzothiazolyl)phenolato]zinc (II) (ZnBTZ).

As the aromatic heterocyclic compounds, imidazole derivatives such as benzimidazole derivatives, imidazopyridine derivatives, and benzimidazophenanthridine derivatives; azine derivatives such as pyrimidine derivatives and triazine derivatives; compounds containing a nitrogen-containing six-membered ring structure (including those having a phosphine oxide-based substituent in the heterocyclic ring) such as quinoline derivatives, isoquinoline derivatives, and phenanthroline derivatives, and the like can be mentioned, for example. Specific examples include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazol-2-yl)stilbene (abbreviation: BzOs).

As the aromatic hydrocarbon compounds, anthracene derivatives, fluoranthene derivatives, and the like can be mentioned, for example.

Specific examples of the polymeric compounds include poly[(9,9-dihexylfluorene-2,7-diyl)-co-(pyridine-3,5-diyl)] (abbreviation: PF-Py), and poly[(9,9-dioctytfluorene-2,7-diyl)-co-(2,2'-bipyridine-6,6'-diyl)] (abbreviation: PF-BPy).

Other substances can also be used in the electron transport layer as long as the substance is a compound having higher electron-transporting properties than hole-transporting properties.

The electron transport layer may be a single layer or stacked layers of two or more layers. In the case of stacked layers, a layer containing a highly electron-transporting substance having a higher energy gap is arranged on the side closer to the light-emitting layer.

For example, as shown in FIG. 2, a structure comprising a first electron transport layer 7*a* on the anode side and a second electron transport layer 7*b* on the cathode side is possible.

The electron transport layer may contain, for example, metals such as alkali metals, magnesium, alkaline earth metals, and alloys containing two or more of these metals; and metal compounds such as alkali metal compounds, e.g. 8-quinolinolatolithlum (abbreviation: Liq), and alkaline earth metal compounds.

When the electron transport layer contains a metal such as an alkali metal, magnesium, an alkaline earth metal, or an alloy containing two or more of these metals, the content of the metal is preferably from 0.1 to 50% by mass, more preferably from 0.1 to 20% by mass, even more preferably from 1 to 10% by mass, although the content is not particularly limited.

When the electron transport layer contains a metal compound such as an alkali metal compound or an alkali earth metal compound, the content of the metal compound is preferably from 1 to 99% by mass, more preferably from 10 to 90% by mass. When the electron transport layer is stacked layers of two or more layers, the layer on the side of the light-emitting layer may be formed by these metal compounds alone.

The compound represented by the formula (1) is also preferably used in the electron transport layer.

(Electron Injection Layer)

The electron injection layer is a layer containing a highly electron-injecting substance, and has a function of efficiently injecting electrons from the cathode to the light-emitting layer. As the highly electron-injecting substance, alkali metals, magnesium, alkaline earth metals, compounds thereof, and the like can be mentioned, for example. Specific examples include lithium, cesium, calcium, lithium fluoride, cesium fluoride, calcium fluoride, and lithium oxide. Besides these substances, those obtained by adding an alkali metal, magnesium, an alkaline earth metal, or a compound thereof to an electron-transporting substance, such as a substance obtained by adding magnesium to Alq, can also be used.

A composite material containing an organic compound and a donor compound can also be used in the electron Injection layer. Since an organic compound receives electrons from the donor compound, such a composite material excels in electron-injecting and electron-transporting properties.

As the organic compound, substances having excellent transporting properties of the received electrons are preferable, and the metal complexes, aromatic heterocyclic compounds, and the like mentioned above as highly electron-transporting substances can be used, for example.

Any substance capable of donating electrons to the organic compound can be used as the donor compound, and alkali metals, magnesium, alkaline earth metals, rare earth metals, and the like can be mentioned, for example. Specific examples include lithium, cesium, magnesium, calcium, erbium, and ytterbium. Alkali metal oxides and alkaline earth metal oxides are preferable, and specific examples include lithium oxides, calcium oxides, and barium oxides. Lewis bases such as magnesium oxides can also be used. Organic compounds such as tetrathiafulvalene (abbreviation: TTF) can also be used.

(Cathode)

The cathode is a metal, an alloy, a conductive compound, a mixture thereof, or the like, and those having a small work function (specifically 3.8 eV or less) are preferably used. Examples of the materials of the cathode include alkali metals such as lithium and cesium; magnesium; alkaline earth metals such as calcium and strontium; alloys containing these metals (e.g., magnesium-silver, aluminum-lithium); rare earth metals such as europium and ytterbium; and alloys containing rare earth metals.

The cathode is normally formed by means of a vacuum vapor deposition method or a sputtering method. A coating method, an inkjet method, or the like is applicable when a silver paste or the like is used.

When an electron injection layer is provided, the cathode can be formed with the use of various conductive materials such as aluminum, silver, ITO, graphene, indium oxide-tin oxide containing silicon or silicon oxide, and the like, irrespective of the work function level. A film of these conductive materials can be formed by means of a sputtering method, an inkjet method, a spin-coating method, or the like.

(Insulating Layer)

Since an electric field is applied onto a thin film in an organic EL device, pixel defects due to leakage and short circuit are likely to be formed, and a thin-film insulating layer can be inserted between a pair of electrodes to prevent such defects.

Specific examples of the materials useful in an insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. Mixtures of these substances can also be used in the insulating layer. Also, the insulating layer may be stacked layers e of two or more layers containing these substances.

(Spacer Layer)

When a fluorescent light-emitting layer and a phosphorescent light-emitting layer are stacked, for example, a spacer layer is provided between these layers for the purpose of preventing the excitons produced in the phosphorescent light-emitting layer from diffusing to the fluorescent light-emitting layer, and of adjusting the carrier balance. The spacer layer may also be formed between two or more phosphorescent light-emitting layers.

Since the spacer layer is formed between two or more light-emitting layers, it is preferably formed with a substance having both electron-transporting properties and hole-transporting properties. Also, the spacer layer preferably has a triplet energy of 2.6 eV or more from the viewpoint of preventing the triplet energy in the adjacent phosphorescent light-emitting layers from diffusing.

As a substance useful in the spacer layer, substances equivalent to the aforementioned substances useful In the hole transport layer can be mentioned.

(Electron Blocking Layer, Hole Blocking Layer, Exciton Blocking Layer)

An electron blocking layer, a hole blocking layer, an exciton (triplet) blocking layer, and the like may be provided adjacent to the light-emitting layer.

The electron blocking layer is a layer having the function of blocking the electrons in the light-emitting layer from leaking into the hole transport layer. The hole blocking layer is a layer having the function of blocking the holes in the light-emitting layer from leaking into the electron transport layer. The exciton blocking layer is a layer having the function of blocking the excitons produced in the light-emitting layer from diffusing to the adjacent layer and trapping the excitons in the light-emitting layer.

(Layer Forming Method)

The method for forming each layer of the organic EL device is not particularly limited unless otherwise mentioned. Known methods such as a dry film-forming method and a wet film-forming method are applicable. Specific examples of the dry film-forming method include a vacuum vapor deposition method, a sputtering method, a plasma method, and an ion plating method. Specific examples of the wet film-forming method include various coating methods such as a spin-coating method, a dipping method, a flow-coating method, and an inkjet method.

(Film Thickness)

The film thickness of each layer of the organic EL device is not particularly limited unless otherwise mentioned. When the film thickness is too small, defects such as pinholes are likely to be formed and sufficient emission brightness cannot be obtained. Also, when the film thickness is too large, high drive voltage is required and the efficiency deteriorates. In light of these points, the film thickness is normally preferably from 0.1 nm to 10 μm, more preferably from 5 nm to 10 μm, even more preferably from 10 nm to 0.2 μm.

The compound represented by the formula (1) is also preferably used in a light-emitting layer of an organic EL device of a thermally activated delayed fluorescence (TADF) type.

For example, a case in which a delayed-fluorescence light-emitting material as a host material, a fluorescent light-emitting material as a dopant material, and a compound represented by the formula (1) are used in a light-emitting layer of an organic EL device of a thermally activated delayed fluorescence (TADF) type can be mentioned.

As another example, a case in which a delayed-fluorescence light-emitting material as a dopant material and a compound represented by the formula (1) are used In a light-emitting layer of an organic EL device of a thermally activated delayed fluorescence (TADF) type can be mentioned.

[Electronic Apparatus]

The electronic apparatus according to one aspect of the present invention comprises the aforementioned organic EL device according to one aspect of the present invention. Specific examples of the electronic apparatus include display parts such as organic EL panel modules; display devices such as TV, mobile phones, smartphones, and personal computers; light-emitting devices such as lighting and vehicle lights.

EXAMPLES

Now, the present Invention will be further explained in detail by reference to synthesis examples, examples, and comparative examples. However, the present invention is not in any way limited by the description of these examples.

Example 1

(Synthesis of Compound 1)

Compound 1 was synthesized in accordance with the following synthesis scheme.

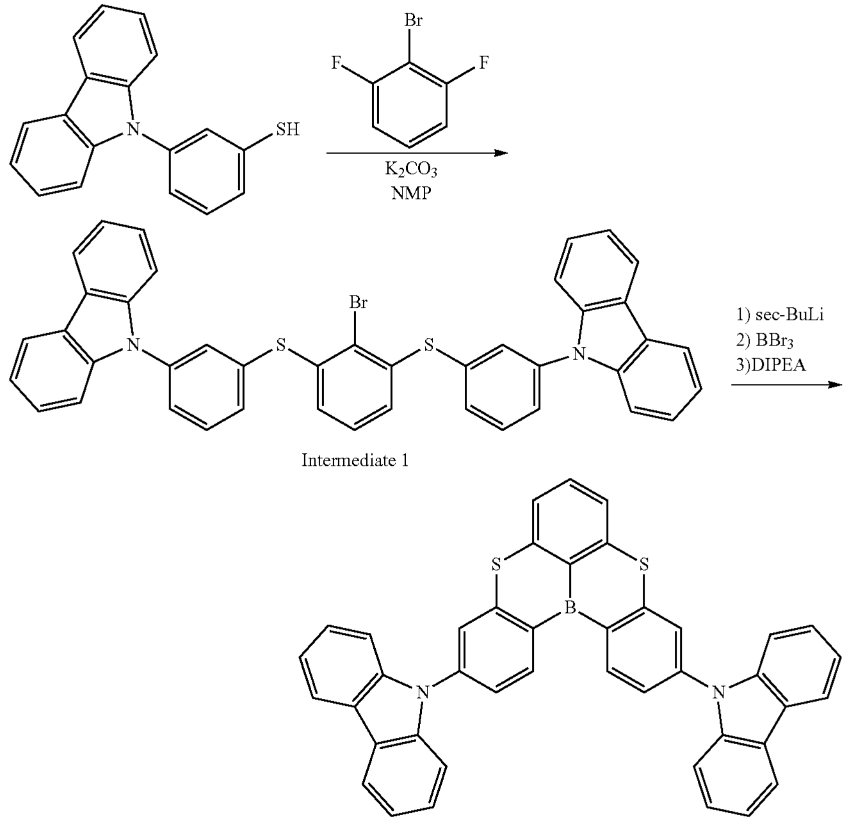

Compound 1

(1-1) Synthesis of Intermediate 1

Under an argon atmosphere, a solution of 2-bromo-1,3-difluorobenzene (10 g), 3-(9H-carbazol-9-yl)benzenethiol (29.3 g), potassium carbonate (28.6 g), and N-methyl-2-pyrrolidone (NMP) (104 mL) was agitated for 8 hours at 180° C. After the reaction, the reaction solution was cooled to room temperature, and NMP was distilled off under reduced pressure. Ethyl acetate was added to perform extraction, then the organic phase was washed with water and then dried with anhydrous sodium sulfate, and the solvent was distilled off under reduced pressure.

The obtained residue was purified through silica gel column chromatography and recrystallization to obtain Intermediate 1 (32 g, yield: 62%).

(1-2) Synthesis of Compound 1

Under an argon atmosphere, a flask containing the obtained Intermediate 1 (9.5 g) and xylene (54 mL) was cooled to −40° C., and 1.4 mol/L of a cyclohexane solution (10.1 mL) of sec-butyllithium (sec-BuLU) was added thereto dropwise. Subsequently, boron tribromide (BBrs) (1.5 mL) was added thereto, the temperature was increased to room temperature and agitation was performed for 1 hour, then the temperature was reduced to 0° C. and N,N-diisopropylethylamine (4.6 mL) was added thereto, and then the temperature was increased to 120° C. and agitation was performed for 2 hours. The obtained reaction solution was cooled to room temperature, extraction was performed with ethyl acetate, then the organic phase was washed with an aqueous sodium acetate solution cooled in an ice bath and then dried with anhydrous sodium sulfate, and the solvent was distilled off under reduced pressure.

Hexane was added to the obtained residue to cause reprecipitation, and the obtained solid was recrystallized with ethyl acetate to obtain Compound 1 (3.4 g, yield: 39%).

The molecular weight of Compound 1 was 632.606, and mass spectrum analysis of the obtained Compound 1 revealed an m/z (mass-to-charge ratio)=632. The obtained compound was thereby identified as Compound 1.

Example 2

(Production of Organic EL Device)

A glass substrate (manufactured by Geomatec Co., Ltd.) with a size of 25 mm×75 mm×1.1 mm thickness having a transparent ITO electrode (anode) was subjected to ultrasonic cleaning for 5 minutes in isopropyl alcohol, and then to UV ozone cleaning for 30 minutes. The thickness of the ITO film was 130 nm.

The cleaned glass substrate with a transparent electrode was mounted on a substrate holder of a vacuum vapor deposition apparatus, and Compound HI was vapor-deposited onto the surface on which the transparent electrode was formed so as to cover the transparent electrode to form a 5 nm-thick Compound HI film. This HI film functions as a hole Injection layer.

Following the formation of the HI film, Compound HT1 was vapor-deposited onto the HI film to form an 80 nm-thick HT1 film. This HT1 film functions as a first hole transport layer.

Following the formation of the HT1 film, Compound HT2 was vapor-deposited onto the HT1 film to form a 10 nm-thick HT2 film. This HT2 film functions as a second hole transport layer.

BH-1 (host material) and Compound 1 (dopant material) were vapor-codeposited onto the HT2 film in a manner such that the proportion (weight ratio) of Compound 1 would be 4% to form a 25 nm-thick light-emitting layer.

Compound HBL was vapor-deposited onto this light-emitting layer to form a 10 nm-thick electron transport layer. Compound ET, which is an electron-injecting material, was vapor-deposited onto this electron transport layer to form a 15 nm-thick electron injection layer. LIF was vapor-deposited onto this electron Injection layer to form a 1 nm-thick LIF film. Metal Al was vapor-deposited onto this LiF film to form an 80 nm-thick metal cathode.

An organic EL device was thus produced. The compounds used are as follows.

HI

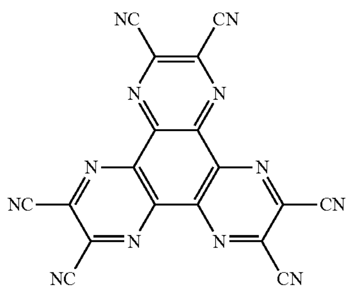

HT1

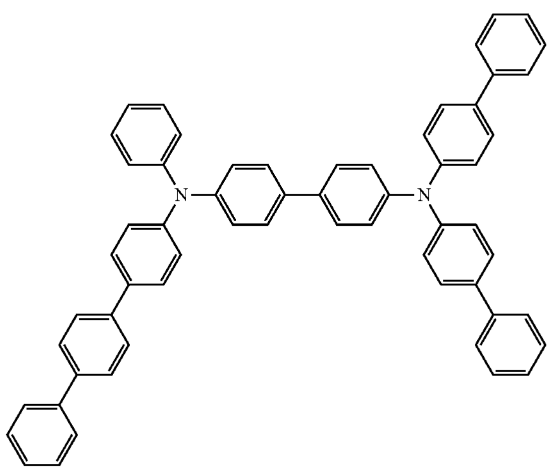

HT2

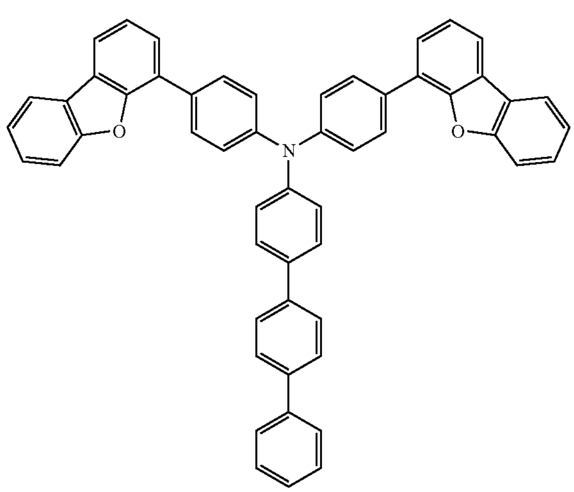

-continued

BH-1

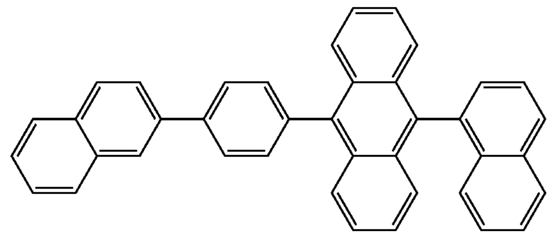

HBL

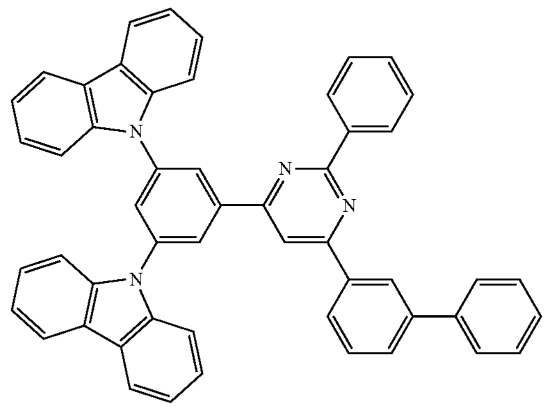

ET

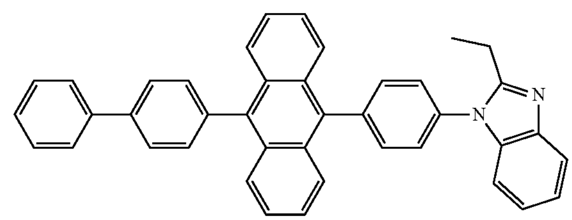

(Evaluation of Organic EL Device)

Initial characteristics of the obtained organic EL device driven in room temperature at a constant DC (direct current) of 10 mA/cm$^2$ were measured. The results of measuring the voltage are shown in Table 1. The values of voltage shown in Table 1 are relative values obtained by assuming the voltage of Comparative Example 1 as 100%.

A voltage was applied to the organic EL device so that the current density would be 10 mA/cm$^2$, and the EL light emission spectrum was measured with the use of a spectroradiometer CS-1000 (manufactured by Konika Minolta Inc.) The external quantum efficiency EQE (%) was calculated based on the obtained spectral radiance spectrum. The results are shown in Table 1. The values of external quantum efficiency shown in Table 1 are relative values obtained by assuming the external quantum efficiency of Comparative Example 1 as 100%.

Ovality of Compound 1 contained in the light-emitting layer was evaluated. Specifically, Gaussian 09 (TD-DTF B3LYP/6-31*opt) was employed as a computational chemistry means, and the most stable structure at ground state and the below-described surface area were calculated to calculate the ovality.

Ovality is defined by the following formula:

$$\text{Ovality}=S/S'$$

S: Surface area of the most stable structure at ground state

S': Surface area of a sphere having a volume equivalent to the volume of the most stable structure at ground state Comparative Example 1

An organic EL device was produced in the same manner as in Example 2 except that Comparative Compound 1 below was used in place of Compound 1, and evaluation was performed. The results are shown in Table 1.

Comparative Compound 1

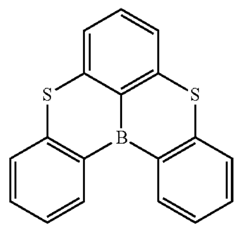

TABLE 1

| | Example 2 | Comparative Example 1 |
|---|---|---|
| Ovality | 1.82515 | 1.45658 |
| Voltage [V] | 97 | 100 |
| EQE [%] | 137 | 100 |

The results in Table 1 show that Example 2 using Compound 1 achieved a higher EQE value compared to Comparative Example 1 using Comparative Compound 1. Multiple factors are assumed to lie regarding the high EQE achieved by Example 2, and one factor is considered to be the ovality of the molecular structure. Improvement of the light extraction efficiency from the device can be mentioned as one of the factors for improving the light-emitting efficiency of an organic EL device. The light extraction efficiency can be improved by arranging (orienting) the dopant molecules in parallel to the device substrate in the light-emitting layer. Enhancement of the molecular length and planarity are generally considered to enable better orientation of molecules. However, a general and universal method applicable to all structures has not been clearly established, and various means have been applied by varying the types and positions of the substituents In the molecular structure, and the like.

Here, ovality can be taken notice of as an Indicator of a molecular shape. Ovality. Indicates the ellipticity or ovality of a molecular shape, and can be calculated by a computational chemistry method. In general, molecules having higher ovality has higher planarity and longer molecular length. Dopant molecules having higher ovality of the molecular shape are therefore more likely to be oriented. High EQE is considered to have been achieved in Example 1 which uses Compound 1 as the dopant by the easy specific orientation of Compound 1 achieved by the high ovality realized by the specific structure of Compound 1, and by maintaining other characteristics that affect the EQE within a certain range without greatly deteriorating the same.

Example 3

(Synthesis of Compound 2)

Compound 2 was synthesized in accordance with the following synthesis example.

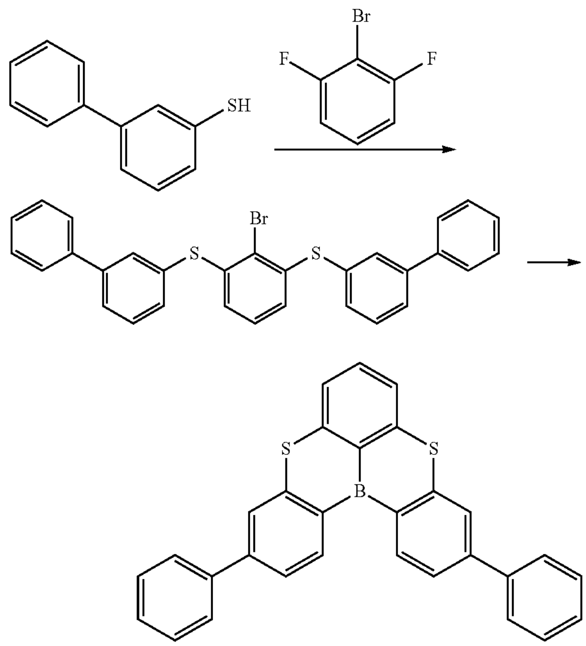

Compound 2

Synthesis was performed in the same manner as in Example 1 except that [1,1'-biphenyl]-3-thiol was used in place of 3-(9H-carbazol-9-yl)benzenethiol to obtain Compound 2 (yield: 15%). The obtained compound was identified as Compound 2 by an analysis using a high performance liquid chromatograph-mass spectrometer.

Example 4

(Synthesis of Compound 3)

Compound 3 was synthesized in accordance with the synthesis example below.

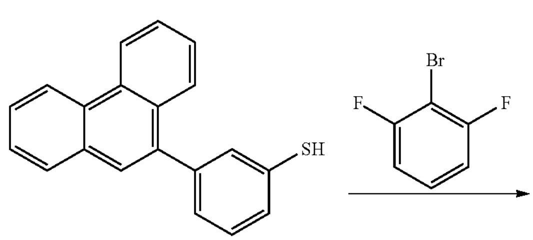

-continued

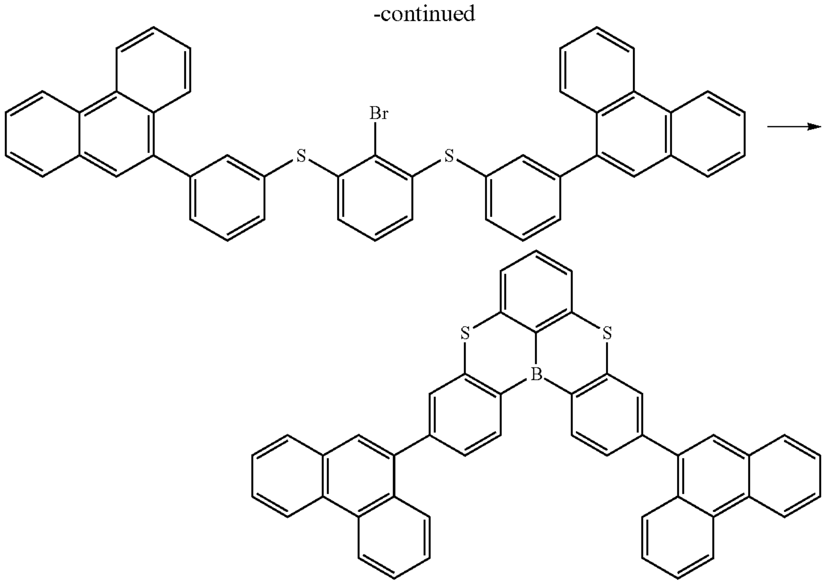

Compound 3

Synthesis was performed in the same manner as in Example 1 except that 3-(phenanthren-9-yl)benzenethiol was used in place of 3-(9H-carbazol-9-yl)benzenethiol to obtain Compound 3 (yield: 9%). The obtained compound was identified as Compound 3 by an analysis using a high performance liquid chromatograph-mass spectrometer.

Example 5

(Synthesis of Compound 4)

Compound 4 was synthesized in accordance with the following synthesis example.

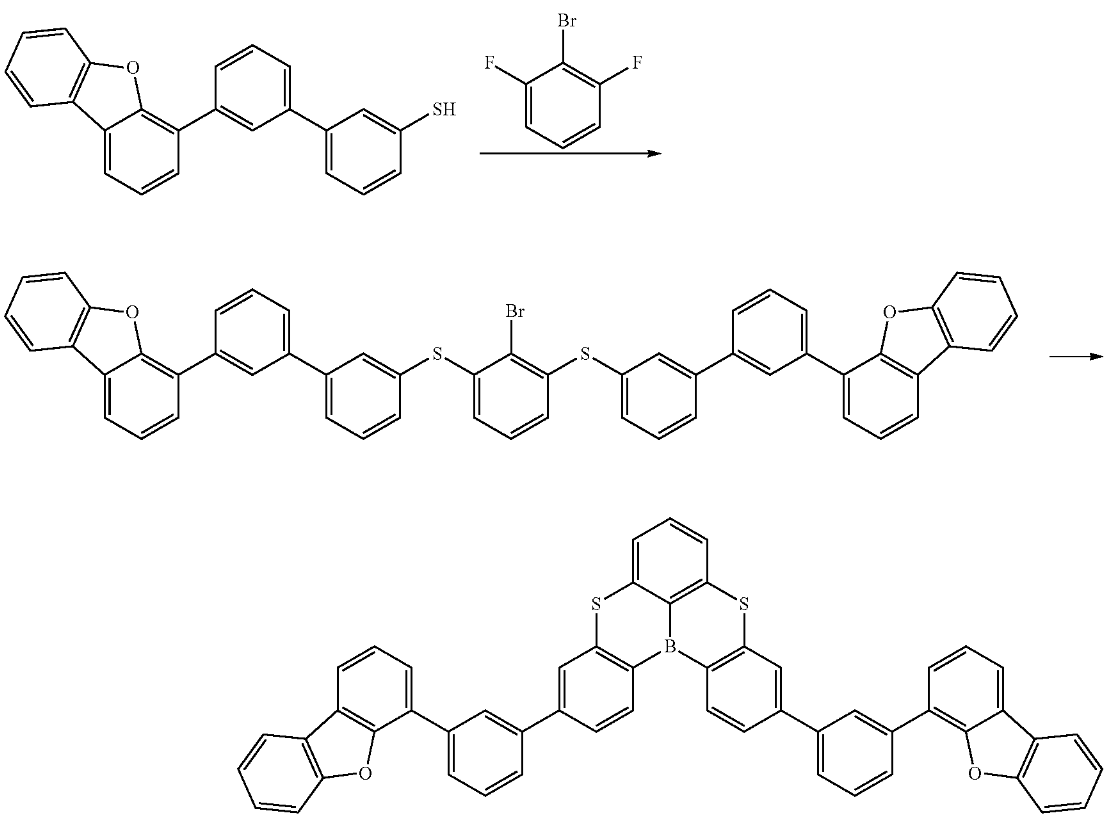

Compound 4

Synthesis was performed in the same manner as in Example 1 except that 3'-(dibenzo[b,d]furan-4-yl)-[1,1'-biphenyl]-3-thiol was used in place of 3-(9H-carbazol-9-yl) benzenethiol to obtain Compound 4 (yield: 15%). The obtained compound was identified as Compound 4 by an analysis using a high performance liquid chromatograph-mass spectrometer.

Example 6

(Production of Organic EL Device)

A glass substrate (manufactured by Geomatec Co., Ltd.) with a size of 25 mm×75 mm×1.1 mm thickness having a transparent ITO electrode (anode) was subjected to ultrasonic cleaning for 5 minutes in isopropyl alcohol, and then to UV ozone cleaning for 30 minutes. The thickness of the ITO film was 130 nm.

The cleaned glass substrate with a transparent electrode was mounted on a substrate holder of a vacuum vapor deposition apparatus, and Compound HI was vapor-deposited onto the surface on which the transparent electrode was formed so as to cover the transparent electrode to form a 5 nm-thick Compound HI film. This HI film functions as a hole injection layer.

Following the formation of the HI film, Compound HT3 was vapor-deposited onto the HI film to form a 20 nm-thick HT3 film. This HT3 film functions as a first hole transport layer.

Following the formation of the HT3 film, Compound HT4 was vapor deposited onto the HT3 film to form a 5 nm-thick HT4 film. This HT4 film functions as a second hole transport layer.

Following the formation of the HT4 film, Compound CBP was vapor-deposited onto the HT4 film to form a 5 nm-thick CBP film. This CBP film functions as a third hole transport layer.

Then, Compound 2 and Compound TADF1 were vapor-codeposited onto the CBP film in a manner such that the proportion (weight ratio) of Compound 2 would be 76% to form a 25 nm-thick light-emitting layer.

Compound HB1 was vapor-deposited onto this light-emitting layer to form a 5 nm-thick hole blocking layer.

Compound ET was furthermore vapor-deposited onto this HB1 layer to form a 50 nm-thick ET film. This ET film functions as an electron transport layer.

LiF was vapor-deposited onto this electron transport layer to form a 1 nm-thick LiF film.

Metal Al was vapor-deposited onto this LIF film to form an 80 nm-thick metal cathode.

An organic EL device was thus produced. The compounds used are as follows.

HT3

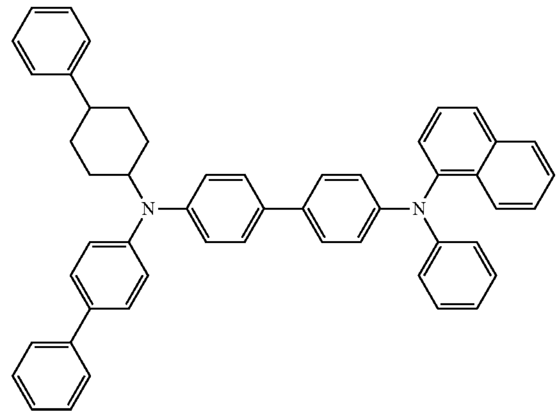

HT4

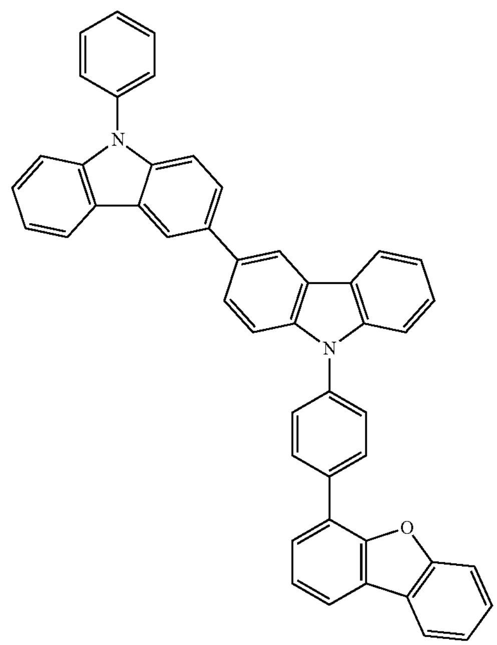

CBP

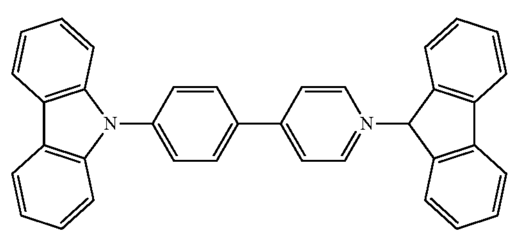

-continued

TADF1

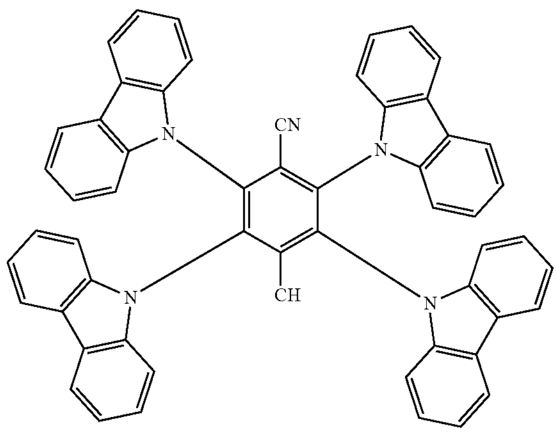

HB1

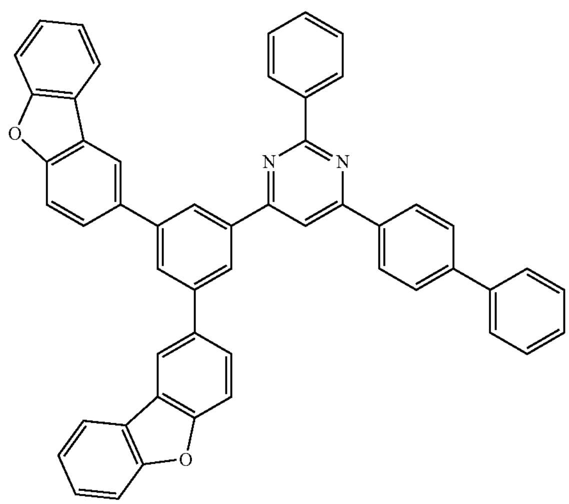

Comparative Compound 2

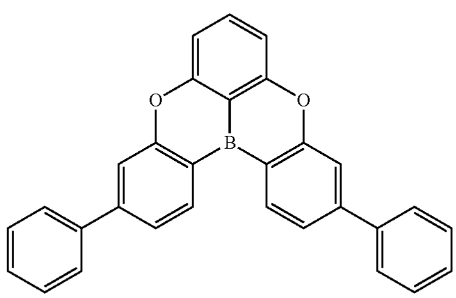

Examples 7 to 8, and Comparative Examples 2 to 3

Organic EL devices were produced in the same manner as in Example 6 except that Compounds 3,4, Comparative Compound 1, and Comparative Compound 2 were used, respectively, in place of Compound 2.

(Evaluation of Organic EL Devices)

Voltage and external quantum efficiency (EQE) of the organic EL devices produced in Examples 6 to 8 and Comparative Examples 2 to 3 were evaluated in the same manner as In Example 2. The results are shown in Table 2. The results of the voltage (unit V) and the external quantum efficiency (unit: %) shown In Table 2 are relative values calculated by assuming the values of Comparative Example 2 as 100%.

TABLE 2

| | Example 6 | Example 7 | Example 8 | Comparative Example 2 | Comparative Example 3 |
|---|---|---|---|---|---|
| Voltage [V] | 90 | 87 | 87 | 100 | 112 |
| EQE [%] | 125 | 131 | 131 | 100 | 86 |

The results shown in Table 2 explain that Example 6 (Compound 2), Example 7 (Compound 3), and Example 8 (Compound 4) achieved lower voltage and higher EQE compared to Comparative Example 2 (Comparative Compound 1) and Comparative Example 3 (Comparative Compound 2).

Example 9 and Comparative Examples 3, 4

Orbital energy (unit: eV) of LUMO (lowest unoccupied molecular orbital) was calculated by molecular orbital calculation with respect to Compound 2, Comparative Compound 1, and Comparative Compound 3 below. The molecular orbital calculation was performed by employing Gaussian 98 at B3LYP/6-31G*level. The results are shown in Table 3.

Comparative Compound 3

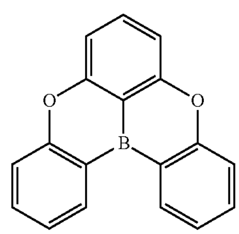

TABLE 3

| | Example 9 | Comparative Example 3 | Comparative Example 4 |
|---|---|---|---|
| Compound | Compound 2 | Comparative Compound 1 | Comparative Compound 3 |
| LUMO calculated value [eV] | 2.00 | 1.90 | 1.67 |

Compound 2 (Example 9) and Comparative Compound 1 (Comparative Example 3) which contain a sulfur atom in the structure of the compound had high LUMO values. Good electron injection from the electron transport layer and improvement of voltage and efficiency of the organic EL device are therefore considered to be achieved when such a compound is used in a light-emitting layer of a thermally activated delayed fluorescence (TADF) type organic EL device. This applies to every compound according to one aspect of the present invention which contains a sulfur atom in the structure.

Also, since the compound according to one aspect of the present invention with a sulfur atom-containing structure represented by the formula (1) has a high LUMO value, and since the structure has substituents and the conjugation length of the molecule is extended, charge transport properties are considered to improve and voltage and efficiency of the organic EL device are considered to be furthermore enhanced when the compound is used in an organic EL device.

Several embodiments and/or examples of the present invention have been explained in detail above, but those skilled in the art can readily apply many modifications to these exemplary embodiments and/or examples without substantially deviating from the novel teachings and effects of the present invention. Thus, all such modifications are included within the scope of the present invention.

The contents of the documents mentioned in this specification and of the applications on the basis of which this application claims priority under the Paris Convention are incorporated herein by reference in its entirety.

EXPLANATION OF NUMERALS

1, 11. Organic EL device
2. Substrate
3. Anode
4. Cathode
5. Light-emitting layer
6. Hole transport region (hole injection layer, hole transport layer, and the like)
6*a*. First hole transport layer
6*b*. Second hole transport layer
7. Electron transport region (electron injection layer, electron transport layer, and the like)
7*a*. First electron transport layer
7*b*. Second electron transport layer
10, 20. Light-emitting unit (organic layer)

The invention claimed is:

1. A compound represented by the following formula (4-1) or (4-2):

(4-1)

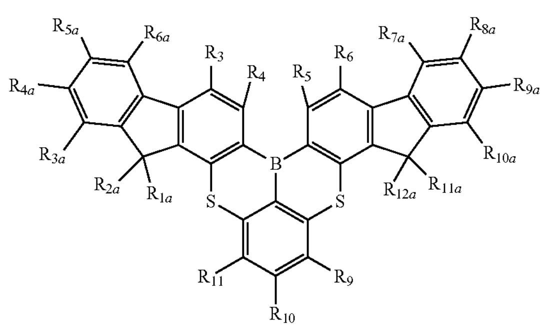

(4-2)

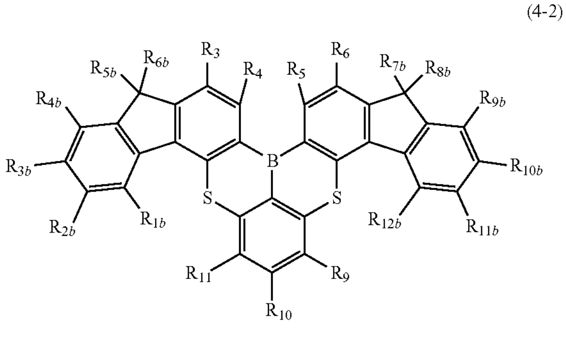

wherein in the formula (4-1), $R_3$ to $R_6$ and $R_9$ to $R_{11}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms;

one or more sets selected from $R_{1a}$ and $R_{2a}$, and $R_{11a}$ and $R_{12a}$, and one or more sets of two or more adjacent groups among $R_{1a}$ to $R_{12a}$ form a substituted or unsubstituted saturated or unsaturated ring, or do not form a substituted or unsubstituted saturated or unsaturated ring;

$R_{1a}$ to $R_{12a}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms;

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different;

in the formula (4-2), $R_3$ to $R_6$ and $R_9$ to $R_{11}$ are as defined in the formula (4-1);

one or more sets selected from $R_{5b}$ and $R_{6b}$, and $R_{7b}$ and $R_{8b}$, and one or more sets of two or more adjacent groups among $R_{1b}$ to $R_{12b}$ form a substituted or unsubstituted saturated or unsaturated ring, or do not form a substituted or unsubstituted saturated or unsaturated ring;

$R_{1b}$ to $R_{12b}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms;

$R_{31}$ to $R_{37}$ are each independently a hydrogen atom, a substituted or unsubstituted alkyl group having 1 to 50 carbon atoms, a substituted or unsubstituted cycloalkly group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different.

2. A compound represented by the following formula (5-1) or (5-2):

(5-1)

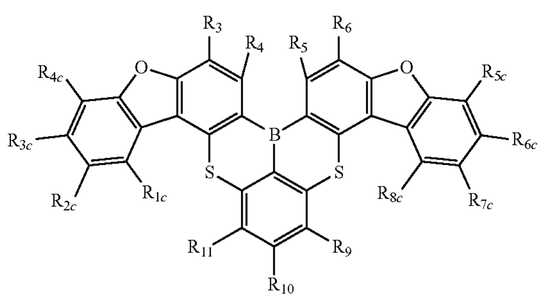

(5-2)

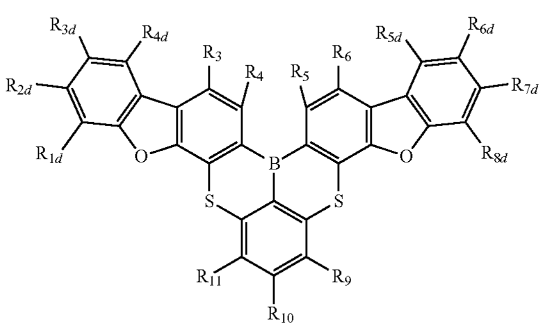

wherein in the formula (5-1), $R_3$ to $R_6$ and $R_9$ to $R_{11}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms;

one or more sets of two or more adjacent groups among $R_{1c}$ to $R_{8c}$ form a substituted or unsubstituted saturated or unsaturated ring, or do not form a substituted or unsubstituted saturated or unsaturated ring;

$R_{1c}$ to $R_{8c}$ which do not form the substituted or unsubstituted saturated or unsaturated ring are each independently a hydrogen atom, a substituted or unsubstituted alkyl group having 1 to 50 carbon atoms, a substituted or unsubstituted haloalkly group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —$Si(R_{31})(R_{32})(R_{33})$, —$C(=O)R_{34}$, —$COOR_{35}$, —$N(R_{36})(R_{37})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms;

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different;

in the formula (5-2), $R_3$ to $R_6$ and $R_9$ to $R_{11}$ are as defined in the formula (5-1);

one or more sets of two or more adjacent groups among $R_{1d}$ to $R_{8d}$ form a substituted or unsubstituted saturated or unsaturated ring, or do not form a substituted or unsubstituted saturated or unsaturated ring;

$R_{1d}$ to $R_{8d}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkly group having 3 to 50 ring carbon atoms, a substituted or unsubstituted alkoxy group having 1 to 50 carbon atoms, a substituted or unsubstituted aikylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms;

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different.

3. A compound represented by the following formula (6-1) or (6-2)

(6-1)

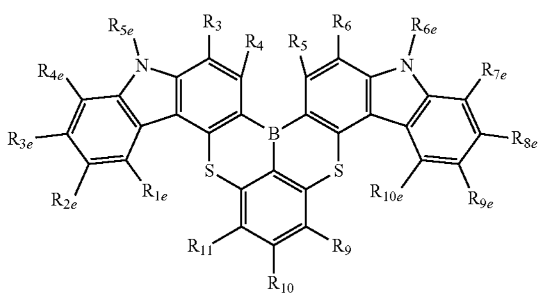

(6-2)

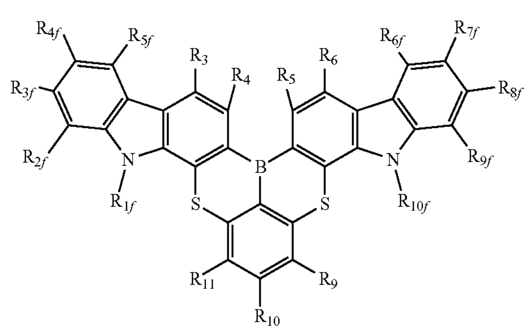

wherein in the formula (6-1), $R_3$ to $R_6$ and $R_9$ to $R_{11}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms;

one or more sets of two or more adjacent groups among $R_{1e}$ to $R_{10e}$ form a substituted or unsubstituted saturated or unsaturated ring, or do not form a substituted or unsubstituted saturated or unsaturated ring;

$R_{1e}$ to $R_{10e}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms;

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different;

in the formula (6-2), $R_3$ to $R_5$ and $R_9$ to $R_{11}$ are as defined in the formula (6-1);

one or more sets of two or more adjacent groups among $R_{1f}$ to $R_{10f}$ form a substituted or unsubstituted saturated or unsaturated ring, or do not form a substituted or unsubstituted saturated or unsaturated ring;

$R_{1f}$ to $R_{10f}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkly group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)R34, —COOR$_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms;

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different.

4. A compound represented by the following formula (7):

(7)

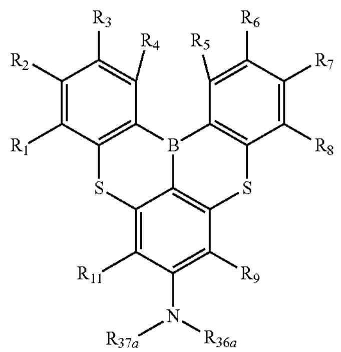

wherein in the formula (7), one or more sets of two or more adjacent groups among $R_1$ to $R_8$ form a substituted or unsubstituted heterocyclic ring or a ring represented by the formula (2) below, or do not form a substituted or unsubstituted heterocyclic ring or a ring represented by formula the (2);

$R_1$ to $R_8$ which do not form the substituted or unsubstituted heterocyclic ring or the ring represented by the formula (2), and $R_9$ and $R_{11}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)$R_{34}$, —COOR$_{35}$, —N($R_{36}$)($R_{37}$), a halogen atom, a cyano group, a nitro group, a substituted or unsubstituted aryl group having 6 to 50 ring carbon atoms, a substituted or unsubstituted monovalent heterocyclic group having 5 to 50 ring atoms, or a group represented by the formula (3) below;

$R_{31}$ to $R_{37}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; and when the respective $R_{31}$ to $R_{37}$ are present in a number of two or more, the respective two or more $R_{31}$ to $R_{37}$ present may be the same or different; and $R_{36a}$ and $R_{37a}$ are each independently a substituted or unsubstituted aryl group having 6 to 50 ring carbon atoms;

with the proviso that at least one set of two or more adjacent groups among $R_1$ to $R_8$ forms a substituted or unsubstituted heterocyclic ring, or forms a ring represented by the formula (2), or at least one of $R_1$ to $R_4$ is a group represented by the formula (3); when two or more substituted or unsubstituted heterocyclic rings are formed, the respective two or more substituted or unsubstituted heterocyclic rings may be the same or different when two or more rings represented by the formula (2) are formed, the respective two or more rings represented by the formula (2) may be the same or different and when two or more groups represented by the formula (3) are formed, the respective two or more groups represented by the formula (3) may be the same or different:

(2)

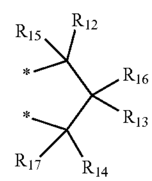

in the formula (2), the two valence bonds * are bonded to adjacent two groups among $R_1$ to $R_8$ in the formula (7), respectively;

one or more sets selected from $R_{12}$ and $R_{13}$, $R_{13}$ and $R_{14}$, $R_{12}$ and $R_{15}$, $R_{13}$ and $R_{16}$, and $R_{14}$ and $R_{17}$ form a substituted or unsubstituted saturated or unsaturated ring, or do not form a substituted or unsubstituted saturated or unsaturated ring;

$R_{12}$ to $R_{14}$, $R_{15}$, $R_{16}$ and $R_{17}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, —Si($R_{31}$)($R_{32}$)($R_{33}$), —C(═O)R34, —COOR$_{35}$, —N($R_{36}$)($R_{37}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{31}$ to $R_{37}$ are as defined in the formula (7):

$$-L_{11}-Ar_{11} \tag{3}$$

in the formula (3), $L_{11}$ is a single bond, a substituted or unsubstituted alkylene group having 1 to 30 carbon atoms, a substituted or unsubstituted arylene group having 6 to 30 ring carbon atoms, or a substituted or unsubstituted divalent heterocyclic group having 5 to 30 ring atoms; and $Ar_{11}$ is a substituted or unsubstituted aryl group having 6 to 50 ring carbon atoms, or a substituted or unsubstituted monovalent heterocyclic group having 5 to 50 ring atoms.

5. The compound according to claim 1, wherein the substituent in the case of "substituted or unsubstituted" is selected from the group consisting of an alkyl group having 1 to 50 carbon atoms, a haloalkyl group having 1 to 50 carbon atoms, an alkenyl group having 2 to 50 carbon atoms, an alkynyl group having 2 to 50 carbon atoms, a cycloalkyl group having 3 to 50 ring carbon atoms, an alkoxy group having 1 to 50 carbon atoms, an alkylthio group having 1 to 50 carbon atoms, an aryloxy group having 6 to 50 ring carbon atoms, an arylthio group having 6 to 50 ring carbon atoms, an aralkyl group having 7 to 50 carbon atoms, $—Si(R_{41})(R_{42})(R_{43})$, $C(=O)R_{44}$, $—COOR_{45}$, $—S(=O)_2R_{46}$, $—P(=O)(R_{47})(R_{48})$, $—Ge(R_{49})(R_{50})(R_{51})$, $—N(R_{52})(R_{53})$ (wherein, $R_{41}$ to $R_{53}$ are each independently a hydrogen atom, an alkyl group having 1 to 50 carbon atoms, an aryl group having 6 to 50 ring carbon atoms, or a monovalent heterocyclic group having 5 to 50 ring atoms; when the $R_{41}$ to $R_{53}$ are present in a number of two or more, the respective two or more $R_{41}$ to $R_{53}$ may be the same or different), a hydroxy group, a halogen atom, a cyano group, a nitro group, an aryl group having 6 to 50 ring carbon atoms, and a monovalent heterocyclic group having 5 to 50 ring atoms.

6. The compound according to claim 1, wherein the substituent in the case of "substituted or unsubstituted" is selected from the group consisting of an alkyl group having 1 to 50 carbon atoms, an aryl group having 6 to 50 ring carbon atoms, and a monovalent heterocyclic group having 5 to 50 ring atoms.

7. The compound according to claim 1, wherein the substituent in the case of "substituted or unsubstituted" is selected from the group consisting of an alkyl group having 1 to 18 carbon atoms, an aryl group having 6 to 18 ring carbon atoms, and a monovalent heterocyclic group having 5 to 18 ring atoms.

8. The compound according to claim 1 which is a material for an organic electroluminescence device.

9. A material for an organic electroluminescence device comprising the compound according to claim 1.

10. An organic electroluminescence device having a cathode, an anode, and at least one organic layer provided between the cathode and the anode, at least one layer of the at least one organic layer comprising the compound according to claim 1.

11. The organic electroluminescence device according to claim 10, wherein at least one layer of the at least one organic layer is a light-emitting layer.

12. The organic electroluminescence device according to claim 11, wherein the light-emitting layer further contains a compound represented by following formula (10)

(10)

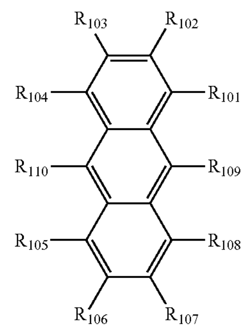

[in the formula (10), one or more sets of two or more adjacent groups among $R_{101}$ to $R_{110}$ form a substituted or unsubstituted saturated or unsaturated ring, or do not form a substituted or unsubstituted saturated or unsaturated ring;

$R_{101}$ to $R_{110}$ which do not form the substituted or unsubstituted saturated or unsaturated ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkylthio group having 1 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted aralkyl group having 7 to 50 carbon atoms, $—Si(R_{121})(R_{122})(R_{123})$, $—C(=O)R_{124}$, $—COOR_{125}$, $—N(R_{126})(R_{127})$, a halogen atom, a cyano group, a nitro group, a substituted or unsubstituted aryl group having 6 to 50 ring carbon atoms, a substituted or unsubstituted monovalent heterocyclic group having 5 to 50 ring atoms, or a group represented by the formula (31) below; and $R_{121}$ to $R_{127}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted monovalent heterocyclic group having 5 to 50 ring atoms; when the $R_{121}$ to $R_{127}$ are present in a number of two or more, the respective two or more $R_{121}$ to $R_{127}$ may be the same or different;

with the proviso that at least one of $R_{101}$ to $R_{110}$ which does not form the substituted or unsubstituted saturated or unsaturated ring is a group represented by the formula (31); when two or more groups represented by the formula (31) are present, the respective two or more groups represented by the formula (31) may be the same or different $$-L_{101}-Ar_{101} \tag{31}$$

(in the formula (31), $L_{101}$ is a single bond, a substituted or unsubstituted arylene group having 6 to 30 ring carbon atoms, or a substituted or unsubstituted divalent heterocyclic group having 5 to 30 ring atoms; and $Ar_{101}$ is a substituted or unsubstituted aryl group having 6 to 50 ring carbon atoms, or a substituted or unsubstituted monovalent heterocyclic group having 5 to 50 ring atoms)].

13. The organic electroluminescence device according to claim 12, wherein the compound represented by the formula (10) is represented by the following formula (10-1) or (10-2)

(10-1)

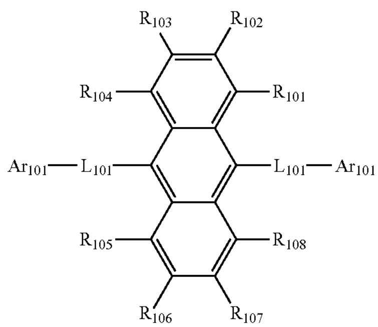

(10-2)

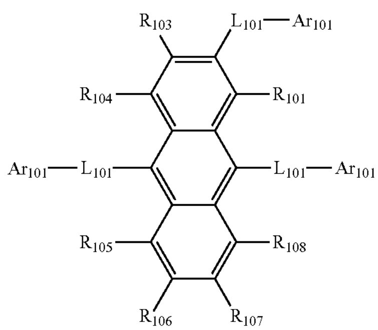

(in the formula (10-1), $R_{101}$ to $R_{108}$, $L_{101}$, and $Ar_{101}$ are as defined in the formula (10); and in the formula (10-2), $R_{101}$, $R_{103}$ to $R_{108}$, $L_{101}$, and $Ar_{101}$ are as defined in the formula (10)).

14. The organic electroluminescence device according to claim 12, wherein the compound represented by the formula (10) is represented by the following formula (10-3)

(10-3)

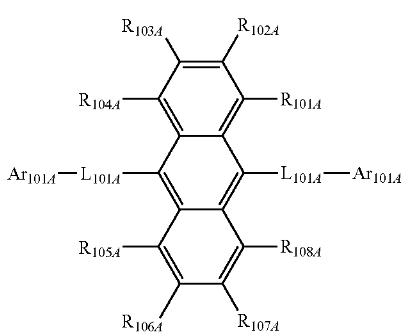

(in the formula (10-3), $R_{101A}$ to $R_{106A}$ are each independently a hydrogen atom, or a substituted or unsubstituted aryl group having 6 to 50 ring carbon atoms;

$L_{101A}$ is a single bond, or a substituted or unsubstituted arylene group having 6 to 30 ring carbon atoms, where the two $L_{101A}$ may be the same or different; and $Ar_{101A}$ is a substituted or unsubstituted aryl group having 6 to 50 ring carbon atoms, where the two $Ar_{101A}$, may be the same or different).

15. The organic electroluminescence device according to claim 12, wherein the compound represented by the formula (10) is represented by the following formula (10-4)

(10-4)

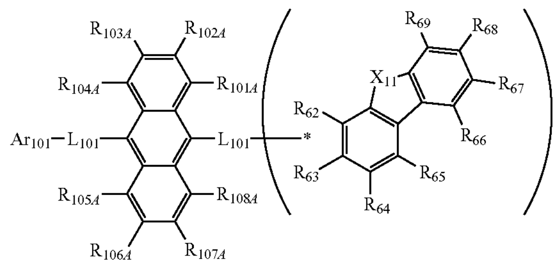

(in the formula (10-4), $L_{101}$ and $Ar_{101}$ are as defined in the formula (10);

$R_{101A}$ to $R_{108A}$ are each independently a hydrogen atom, or a substituted or unsubstituted aryl group having 6 to 50 ring carbon atoms;

$X_{11}$ is O, S, or $N(R_{61})$;

$R_{61}$ is a hydrogen atom, a substituted or unsubstituted alkyl group having 1 to 50 carbon atoms, or a substituted or unsubstituted aryl group having 6 to 50 ring carbon atoms;

one of $R_{62}$ to $R_{69}$ is a valence bond bonded to $L_{101}$;

one or more sets of two or more adjacent groups among $R_{62}$ to $R_{69}$ not bonded to $L_{101}$ form a substituted or unsubstituted saturated or unsaturated ring, or do not form a substituted or unsubstituted saturated or unsaturated ring; and $R_{62}$ to $R_{69}$ which are not bonded to $L_{101}$ and do not form a substituted or unsubstituted saturated or unsaturated ring are each independently a hydrogen atom, a substituted or unsubstituted alkyl group having 1 to 50 carbon atoms, or a substituted or unsubstituted aryl group having 6 to 50 ring carbon atoms).

16. The organic electroluminescence device according to claim 15, wherein the compound represented by the formula (10) is represented by the following formula (10-6)

(10-6)

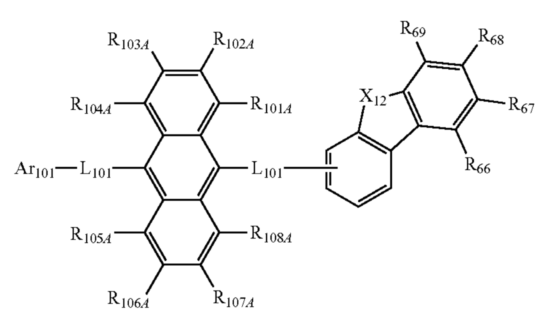

(in the formula (10-6), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4); and $X_{12}$ is O or S).

17. The organic electroluminescence device according to claim 15, wherein the compound represented by the formula (10) is represented by the following formula (10-7)

(10-7)

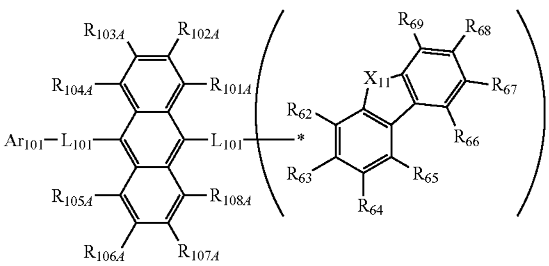

(in the formula (10-7), $L_{101}$ and $Ar_{101}$ are as defined in the formula (10);

$R_{101A}$ to $R_{108A}$ are as defined in the formula (10-4);

$X_{11}$ is as defined in the formula (10-4); and $R_{62}$ to $R_{69}$ are as defined in the formula (10-4), with the proviso that the groups of any one set selected from $R_{66}$ and $R_{67}$, $R_{67}$ and $R_{68}$, and $R_{68}$ and $R_{69}$ are bonded to one another and form a substituted or unsubstituted saturated or unsaturated ring).

18. The organic electroluminescence device according to claim 15, wherein the compound represented by the formula (10) is represented by the following formula (10-8)

(10-8)

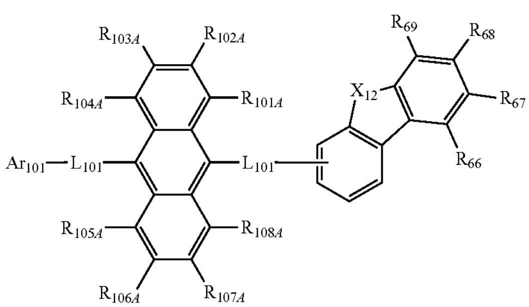

(in the formula (10-8), $L_{101}$ and $Ar_{101}$ are as defined in the formula (10);

$R_{101A}$ to $R_{108A}$ are as defined in the formula (10-4);

$X_{12}$ is O or S; and $R_{66}$ to $R_{69}$ are as defined in the formula (10-4), with the proviso that the groups of any one set selected from $R_{66}$ and $R_{67}$, $R_{67}$ and $R_{68}$, and $R_{66}$ and $R_{69}$ are bonded to one another and form a substituted or unsubstituted saturated or unsaturated ring).

19. The organic electroluminescence device according to claim 17, wherein the groups of any one set selected from $R_{66}$ and $R_{67}$, $R_{67}$ and $R_{66}$, and $R_{68}$ and $R_{69}$ are bonded to one another and form a ring represented by the formula (10-8-1) or (10-8-2) below;

$R_{66}$ to $R_{69}$ which do not form the ring represented by the formula (10-8-1) or (10-8-2) do not form a substituted or unsubstituted saturated or unsaturated ring (10-8-1)

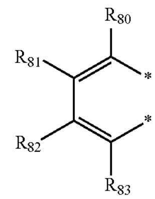

(10-8-2)

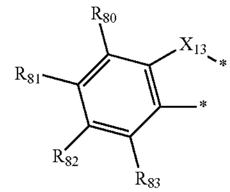

(in the formulae (10-8-1) and (10-8-2), the two valance bonds * are bonded to the groups of any one set selected from $R_{66}$ and $R_{67}$, $R_{67}$ and $R_{68}$, and $R_{68}$ and $R_{69}$, respectively;

$R_{80}$ to $R_{83}$ are each independently a hydrogen atom, a substituted or unsubstituted alkyl group having 1 to 50 carbon atoms, or a substituted or unsubstituted aryl group having 6 to 50 ring carbon atoms; and $X_{13}$ is O or S).

20. The organic electroluminescence device according to claim 15, wherein the compound represented by the formula (10) is represented by the following formula (10-9)

(10-9)

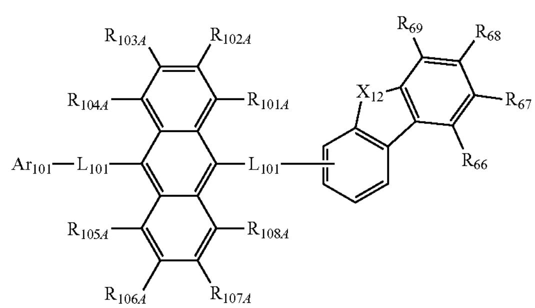

(in the formula (10-9), $L_{101}$, and $Ar_{101}$ are as defined in the formula (10);

$R_{101A}$ to $R_{108A}$ are as defined in the formula (10-4);

$R_{66}$ to $R_{69}$ are as defined in the formula (10-4), with the proviso that none of $R_{66}$ and $R_{67}$, $R_{67}$ and $R_{68}$, and $R_{69}$ and $R_{67}$ are bonded to one another or form a substituted or unsubstituted saturated or unsaturated ring; and $X_{12}$ is O or S).

21. The organic electroluminescence device according to claim 12, wherein the compound represented by the formula (10) is represented by the following formula (10-4A)

(10-4A)

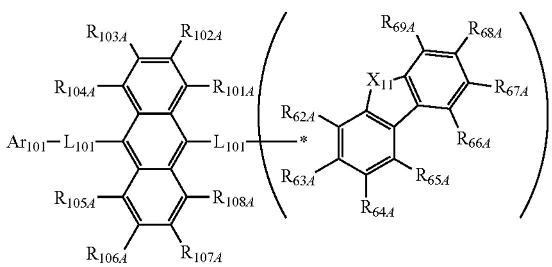

(in the formula (10-4A), $L_{101}$ and $Ar_{101}$ are as defined in the formula (10);

$R_{101A}$ to $R_{108A}$ are each independently a hydrogen atom, or a substituted or unsubstituted aryl group having 6 to 50 ring carbon atoms;

$X_{11}$ is O, S, or $N(R_{61})$;

$R_{61}$ is a hydrogen atom, a substituted or unsubstituted alkyl group having 1 to 50 carbon atoms; or a substituted or unsubstituted aryl group having 6 to 50 ring carbon atoms;

one or more sets of two or more adjacent groups among $R_{62A}$ to $R_{69A}$ form a substituted or unsubstituted saturated or unsaturated ring, or do not form a substituted or unsubstituted saturated or unsaturated ring, with the proviso that two adjacent groups among $R_{62A}$ to $R_{69A}$ form a ring represented by the formula (10-4A-1) below; and $R_{62A}$ to $R_{69A}$ which do not form a substituted or unsubstituted saturated or unsaturated ring are each independently a hydrogen atom, a substituted or unsubstituted alkyl group having 1 to 50 carbon atoms, or a substituted or unsubstituted aryl group having 6 to 50 ring carbon atoms)

(10-4A-1)

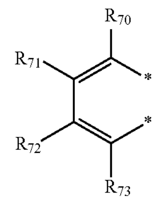

(in the formula (10-4A-1), the two valence bonds * are bonded to two adjacent groups among $R_{62A}$ to $R_{69A}$, respectively;

one of $R_{70}$ to $R_{73}$ is a valence bond bonded to $L_{101}$;

$R_{70}$ to $R_{73}$ not bonded to $L_{101}$ are each independently a hydrogen atom, a substituted or unsubstituted alkyl group having 1 to 50 carbon atoms, or a substituted or unsubstituted aryl group having 6 to 50 ring carbon atoms).

22. The organic electroluminescence device according claim 11 comprising a hole transport layer between the anode and the light-emitting layer.

23. The organic electroluminescence device according to claim 11 comprising an electron transport layer between the cathode and the light-emitting layer.

24. An electronic apparatus comprising the organic electroluminescence device according to claim 10.

* * * * *